United States Patent
Ushikubo et al.

(10) Patent No.: US 8,617,725 B2
(45) Date of Patent: Dec. 31, 2013

(54) LIGHT-EMITTING ELEMENT, LIGHT-EMITTING DEVICE, AND ELECTRONIC APPLIANCE

(75) Inventors: Takahiro Ushikubo, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 13/355,826

(22) Filed: Jan. 23, 2012

(65) Prior Publication Data

US 2012/0211728 A1    Aug. 23, 2012

Related U.S. Application Data

(63) Continuation of application No. 12/199,100, filed on Aug. 27, 2008, now Pat. No. 8,101,289.

(30) Foreign Application Priority Data

Aug. 31, 2007   (JP) ................................ 2007-227015

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 564/26; 564/432; 564/434

(58) Field of Classification Search
USPC .................. 428/690, 917; 313/504, 505, 506; 257/40, E51.05, E51.026, E51.032; 564/26, 426, 434
See application file for complete search history.

(56) References Cited

U.S. PATENT DOCUMENTS

| | | | |
|---|---|---|---|
| 5,635,308 | A | 6/1997 | Inoue et al. |
| 7,252,894 | B2 | 8/2007 | Yu et al. |
| 7,351,999 | B2 | 4/2008 | Li |
| 7,663,140 | B2 | 2/2010 | Yamazaki et al. |
| 7,674,914 | B2 | 3/2010 | Egawa et al. |
| 7,842,945 | B2 | 11/2010 | Egawa et al. |
| 7,879,464 | B2 | 2/2011 | Kawakami et al. |
| 7,919,196 | B2 | 4/2011 | Kim et al. |

(Continued)

FOREIGN PATENT DOCUMENTS

| | | |
|---|---|---|
| EP | 0 681 019 A2 | 11/1995 |
| EP | 1 734 038 A1 | 12/2006 |

(Continued)

OTHER PUBLICATIONS

Burrows, P.E. et al, "Color-Tunable Organic Light-Emitting Devices," Applied Physics Letters, vol. 69, No. 20, Nov. 11, 1996, pp. 2959-2961.

(Continued)

*Primary Examiner* — Jennifer A Chriss
*Assistant Examiner* — Gregory Clark
(74) *Attorney, Agent, or Firm* — Husch Blackwell LLP

(57) ABSTRACT

By use of a 2,9,10-triaryl anthracene derivative in which a diarylamino-substituted aryl group is bonded to the 2-position of a 9,10-diarylanthracene for a light-emitting element, a light-emitting element having high efficiency can be obtained. The emission wavelength of the anthracene derivative is suitable for use in a white light-emitting element. By use of the anthracene derivative for a white light-emitting element, a white light-emitting element having high efficiency can be obtained.

21 Claims, 48 Drawing Sheets

(56) References Cited

U.S. PATENT DOCUMENTS

| | | |
|---|---|---|
| 7,919,783 B2 | 4/2011 | Ushikubo et al. |
| 7,965,032 B2 | 6/2011 | Bae et al. |
| 8,030,646 B2 | 10/2011 | Suzuki et al. |
| 8,076,671 B2 | 12/2011 | Yamazaki et al. |
| 8,106,392 B2 | 1/2012 | Egawa et al. |
| 8,110,980 B2 | 2/2012 | Egawa et al. |
| 8,198,801 B2 | 6/2012 | Kim et al. |
| 8,222,634 B2 | 7/2012 | Lee et al. |
| 2002/0180369 A1* | 12/2002 | Koyama .................... 315/169.1 |
| 2003/0189401 A1 | 10/2003 | Kido et al. |
| 2004/0056589 A1* | 3/2004 | Yamazaki et al. ............ 313/506 |
| 2005/0211958 A1 | 9/2005 | Conley et al. |
| 2005/0260442 A1 | 11/2005 | Yu et al. |
| 2005/0271899 A1 | 12/2005 | Brown et al. |
| 2006/0019116 A1 | 1/2006 | Conley et al. |
| 2006/0159952 A1 | 7/2006 | Ricks et al. |
| 2006/0240278 A1 | 10/2006 | Hatwar et al. |
| 2007/0075632 A1 | 4/2007 | Kawakami et al. |
| 2007/0108892 A1 | 5/2007 | Bae et al. |
| 2007/0122656 A1 | 5/2007 | Klubek et al. |
| 2007/0200490 A1 | 8/2007 | Kawamura et al. |
| 2007/0205412 A1 | 9/2007 | Bae et al. |
| 2008/0006821 A1 | 1/2008 | Suzuki et al. |
| 2008/0103315 A1* | 5/2008 | Egawa et al. ................. 548/442 |
| 2008/0130278 A1 | 6/2008 | Ushikubo et al. |
| 2009/0004506 A1* | 1/2009 | Nomura et al. ............... 428/690 |
| 2009/0009101 A1 | 1/2009 | Kang et al. |
| 2012/0205684 A1 | 8/2012 | Yamazaki et al. |

FOREIGN PATENT DOCUMENTS

| | | |
|---|---|---|
| EP | 2 364 964 A1 | 9/2011 |
| JP | 8-12600 | 1/1996 |
| JP | 2000-68057 | 3/2000 |
| JP | 2001-230082 | 8/2001 |
| JP | 2003-146951 | 5/2003 |
| JP | 2003-267973 | 9/2003 |
| JP | 2003-313156 | 11/2003 |
| JP | 2004-91334 | 3/2004 |
| JP | 2004-95850 | 3/2004 |
| JP | 2004-273163 | 9/2004 |
| JP | 2006-12793 | 1/2006 |
| JP | 2007-56006 | 3/2007 |
| TW | 200600565 | 1/2006 |
| WO | WO 2005/090512 A1 | 9/2005 |
| WO | WO 2005/115059 * | 12/2005 |
| WO | WO 2007/013537 A1 | 2/2007 |
| WO | WO 2007/046658 A1 | 4/2007 |
| WO | WO 2007/081179 A1 | 7/2007 |
| WO | WO 2007/083918 A1 | 7/2007 |
| WO | WO 2007/102683 A1 | 9/2007 |
| WO | WO 2008/143440 A1 | 11/2008 |

OTHER PUBLICATIONS

Shen, Z. et al, "Three-Color, Tunable, Organic Light-Emitting Devices," Science, vol. 276, Jun. 27, 1997, pp. 2009-2011.

Gu, G. et al, "High-Efficiency, Low-Drive-Voltage, Semitransparent Stacked Organic Light-Emitting Device," Applied Physics Letters, vol. 73, No. 17, Oct. 26, 1998, pp. 2399-2401.

Chang, C.-C. et al, "Highly Efficient White Organic Electroluminescent Devices Based on Tandem Architecture," Applied Physics Letters, vol. 87, No. 25, Dec. 12, 2005, pp. 253501-1-253501-3.

Kanno, H. et al, "Stacked White Organic Light-Emitting Devices Based on a Combination of Fluorescent and Phosphorescent Emitters," Applied Physics Letters, vol. 89, Jul. 11, 2006, pp. 023503-1-023503-3.

Search Report re European application No. EP 12000191.2, dated Mar. 23, 2012.

Kido, J. et al, "Multilayer White Light-Emitting Organic Electroluminescent Device," Science, vol. 267, Mar. 3, 1995, pp. 1332-1334.

Kido, J. et al, "Single-Layer White Light-Emitting Organic Electroluminescent Devices Based on Dye-Dispersed Poly(N-Vinylcarbazole)," Appl. Phys. Lett. (Applied Physics Letters), vol. 67, No. 16, Oct. 16, 1995, pp. 2281-2283.

Extended European Search Report re Application No. EP 08014472.8, dated Dec. 17, 2008.

Office Action re Taiwanese application No. TW 097132836, dated Oct. 7, 2013 (with English translation).

* cited by examiner

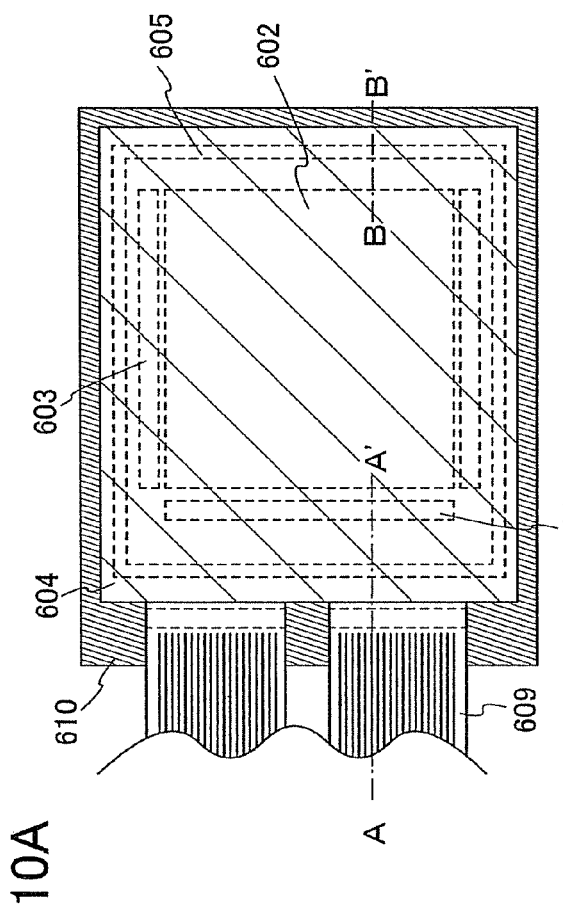
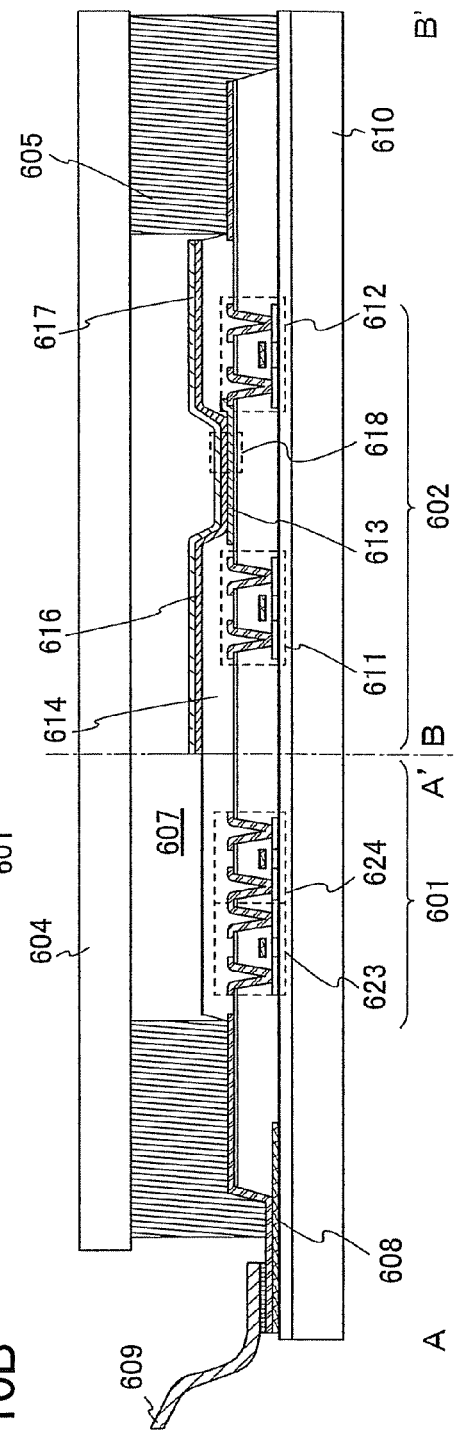
FIG. 10A
FIG. 10B

LIGHT-EMITTING ELEMENT, LIGHT-EMITTING DEVICE, AND ELECTRONIC APPLIANCE

This application is a continuation of copending application Ser. No. 12/199,100 filed on Aug. 27, 2008 now U.S. Pat. No. 8,101,289.

BACKGROUND OF THE INVENTION

1. Field of the Invention

The present invention relates to a light-emitting device and an electronic appliance each having a light-emitting element that utilizes electroluminescence.

2. Description of the Related Art

Compared with inorganic compounds, organic compounds provide materials that have a variety of structures and make it possible to synthesize materials that have a variety of functions depending on molecular designs. Because of these advantages, photo electronics and electronics using functional organic materials have been attracting attention in recent years.

Examples of electronic devices in which organic compounds are used as functional organic materials include solar cells, light-emitting elements, organic transistors, and the like. These are devices in which electric properties and optical properties of organic compounds are utilized. In particular, tremendous progress in light-emitting elements has been made.

It is said that a light-emitting element has a mechanism of light emission as follows: by application of a voltage between a pair of electrodes with a light-emitting layer interposed therebetween, electrons injected from a cathode and holes injected from an anode are recombined with each other in an emission center of a light-emitting layer to form molecular excitons, and the molecular excitons release energy when they relax to a ground state; accordingly light is emitted. A singlet excited state and a triplet excited state are known as excited states, and it is considered that light can be emitted through either excited state.

Further, in such a light-emitting element, since the pair of electrodes and the light-emitting layer are formed as films, surface light emission can easily be achieved by forming a large-area element. Since this is a feature which is difficult to obtain in light sources such as incandescent lamps and LEDs (point light sources) or fluorescent lamps (line light sources), the above-described light-emitting element has a high utility value as a light source such as a lighting apparatus.

Considering these fields of application, it can be said that the development of a light-emitting element such as that described above which is a white light-emitting element is an important subject. If a white light-emitting element with sufficient luminance, emission efficiency, element life, and chromaticity can be obtained, by combining it with a color filter, a quality full color display can be manufactured. Further, application to white light sources such as backlights and lighting apparatuses can also be considered.

For example, research and development of a white light-emitting element that has an emission spectrum with peaks in the wavelength ranges of red, green, and blue (hereinafter referred to as "3-wavelength-type white light-emitting elements") is also underway (e.g., see Non-Patent Document 1 and Non-Patent Document 2). In Non-Patent Document 1, a structure in which three light-emitting layers, a red one, a green one, and a blue one, are layered is described. In Non-Patent Document 2, a structure in which light-emitting materials which exhibit red, green, and blue light emission are included in the one light-emitting layer is described.

However, it cannot be said that these 3-wavelength white light-emitting elements have characteristics sufficient for practical use in terms of emission efficiency and element life, and greater improvements of them are necessary. Further, it is known that light-emitting elements such as the one described in Non-Patent Document 1 cannot emit stable white light in many cases because, for example, the spectrum varies depending on the density of the flowing current.

[Non-Patent Document 1] J. Kido (and two other authors), Science, vol. 267, pp. 1332-1334, 1995.

[Non-Patent Document 2] J. Kido (and two other authors), Applied Physics Letters, vol. 67 (16), pp. 2281-2283, 1995.

SUMMARY OF THE INVENTION

In view of the foregoing problems, it is an object of the present invention to provide a light-emitting element having high emission efficiency. In particular, it is an object of the present invention to provide a white light-emitting element having high emission efficiency.

Further, it is another object of the present invention to provide a light-emitting device and an electronic appliance each having low power consumption.

The present inventors have found that by use of, for a light-emitting element, a 2,9,10-triaryl anthracene derivative in which a diarylamino-substituted aryl group is bonded to the 2-position of a 9,10-diarylanthracene, a light-emitting element having high efficiency can be obtained. Further, the present inventors have found that a light-emitting element having a long life can also be obtained. In particular, the present inventors have found that the emission wavelength of the 2,9,10-triaryl anthracene derivative in which a diarylamino-substituted aryl group is bonded to the 2-position of a 9,10-diarylanthracene is suitable for use in a white light-emitting element, and that a white light-emitting element having high efficiency can be obtained by combining this anthracene derivative with another light-emitting substance. Further, the present inventors have found that a white light-emitting element having a long life can be obtained.

A light-emitting element according to the present invention has a plurality of layers between a pair of electrodes. A first light-emitting layer includes a 2,9,10-triaryl anthracene derivative in which a diarylamino-substituted aryl group is bonded to the 2-position of a 9,10-diarylanthracene. A second light-emitting layer contains a second light-emitting-substance that is different from the 2,9,10-triaryl anthracene derivative. In addition, by supplying a current, light emission of a color mixture of an emission color of the 2,9,10-triaryl anthracene derivative and an emission color of the second light-emitting substance can be exhibited from the light-emitting element.

Thus, one aspect of the present invention is a light-emitting element including a first light-emitting layer and a second light-emitting layer between a pair of electrodes. The first light-emitting layer includes a 2,9,10-triaryl anthracene derivative in which a diarylamino-substituted aryl group is bonded to the 2-position of a 9,10-diarylanthracene. The second light-emitting layer includes a second light-emitting substance different from the 2,9,10-triaryl anthracene derivative. Light emission of a color mixture of an emission color of the 2,9,10-triaryl anthracene derivative and the emission color of the second light-emitting substance is exhibited.

Further, one aspect of the present invention is a light-emitting element including a first light-emitting layer and a second light-emitting layer between a pair of electrodes. The first light-emitting layer includes an anthracene derivative represented by a general formula (1). The second light-emitting layer includes a second light-emitting substance. An emission color of the second light-emitting substance is different from an emission color of the anthracene derivative represented by the general formula (1). Light emission of a color mixture of the emission color of the anthracene derivative represented by the general formula (1) and the emission color of the second light-emitting substance is exhibited.

Further, one aspect of the present invention is a light-emitting element including a first light-emitting layer and a second light-emitting layer between a pair of electrodes. The first light-emitting layer includes an anthracene derivative represented by a general formula (2). The second light-emitting layer includes a second light-emitting substance. An emission color of the second light-emitting substance is different from an emission color of the anthracene derivative represented by the general formula (2). Light emission of a color mixture of the emission color of the anthracene derivative represented by the general formula (2) and the emission color of the second light-emitting substance is exhibited.

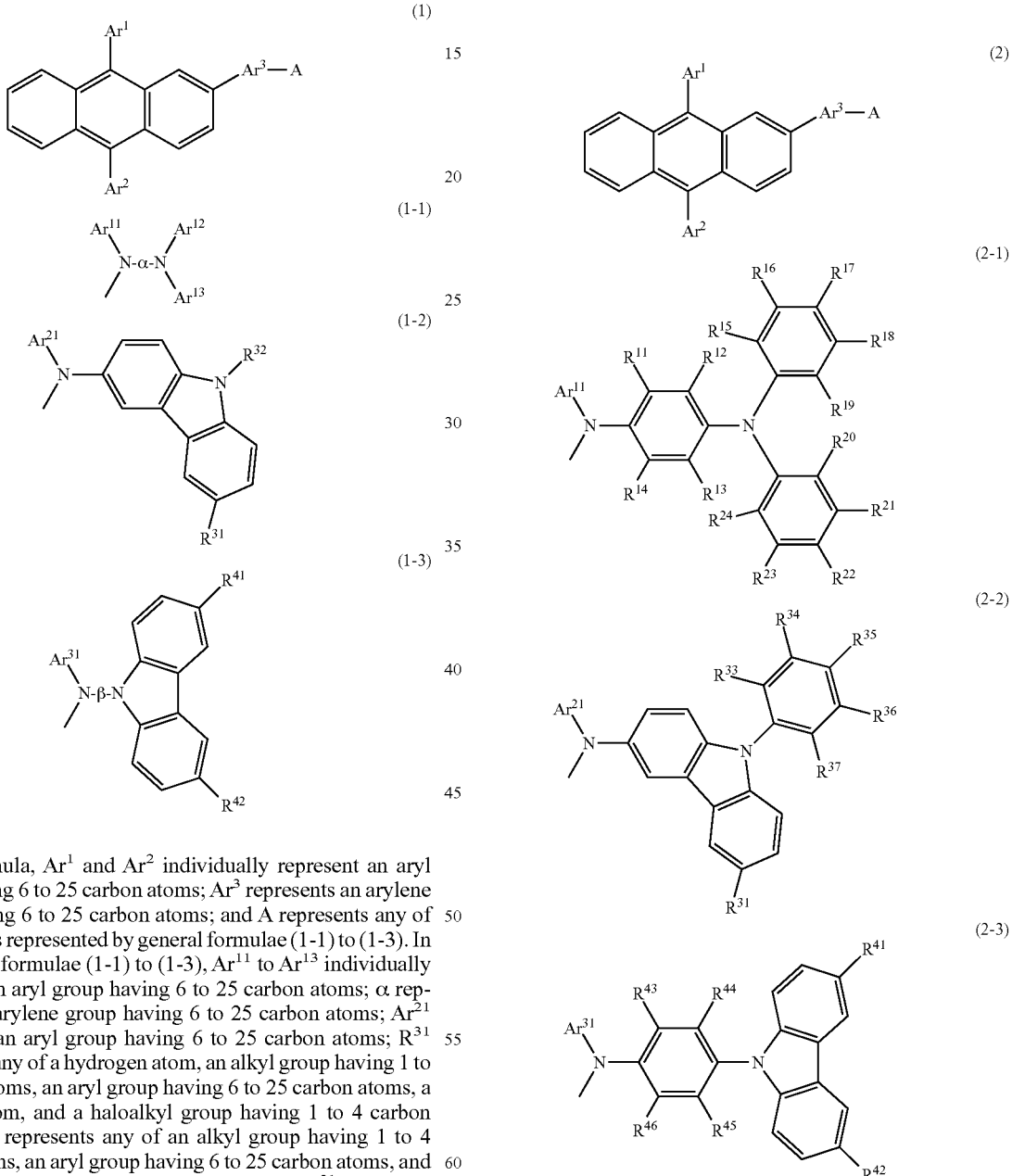

In the formula, $Ar^1$ and $Ar^2$ individually represent an aryl group having 6 to 25 carbon atoms; $Ar^3$ represents an arylene group having 6 to 25 carbon atoms; and A represents any of substituents represented by general formulae (1-1) to (1-3). In the general formulae (1-1) to (1-3), $Ar^{11}$ to $Ar^{13}$ individually represent an aryl group having 6 to 25 carbon atoms; α represents an arylene group having 6 to 25 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $R^{32}$ represents any of an alkyl group having 1 to 4 carbon atoms, an aryl group having 6 to 25 carbon atoms, and a haloalkyl group having 1 to 4 carbon atoms; $Ar^{31}$ represents an aryl group having 6 to 25 carbon atoms; β represents an arylene group having 6 to 25 carbon atoms; and $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms.

In the formula, $Ar^1$ and $Ar^2$ individually represent an aryl group having 6 to 25 carbon atoms; $Ar^3$ represents an arylene group having 6 to 25 carbon atoms; and A represents any of substituents represented by general formulae (2-1) to (2-3). In the general formulae (2-1) to (2-3), $Ar^{11}$ represents an aryl group having 6 to 25 carbon atoms; $R^{11}$ to $R^{24}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $R^{33}$ to $R^{37}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{31}$ represents an aryl group having 6 to 25 carbon atoms; $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms; and $R^{43}$ to $R^{46}$ individually represent any of a hydrogen atom, an alkyl group having 1 to 4 carbon atoms, an aryl group having 6 to 15 carbon atoms, a halogen atom, and a haloalkyl group having 1 to 4 carbon atoms.

Further, one aspect of the present invention is a light-emitting element including a first light-emitting layer and a second light-emitting layer between a pair of electrodes. The first light-emitting layer includes an anthracene derivative represented by a general formula (3). The second light-emitting layer includes a second light-emitting substance. An emission color of the second light-emitting substance is different from an emission color of the anthracene derivative represented by the general formula (3). Light emission of a color mixture of the emission color of the anthracene derivative represented by the general formula (3) and the emission color of the second light-emitting substance is exhibited.

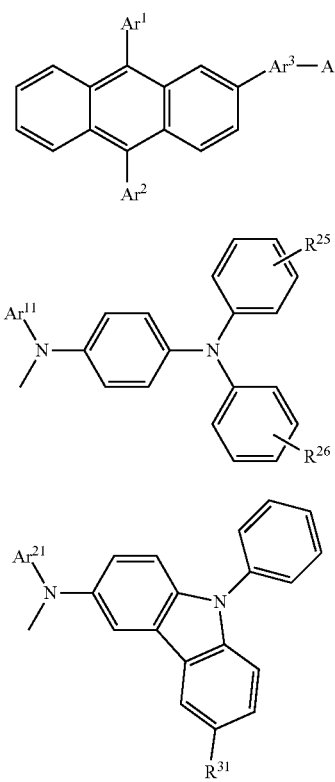

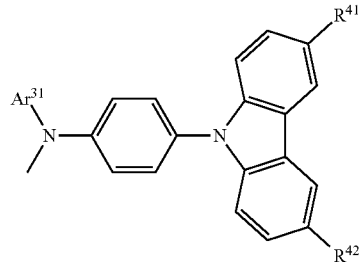

In the formula, $Ar^1$ and $Ar^2$ individually represent an aryl group having 6 to 25 carbon atoms; $Ar^3$ represents an arylene group having 6 to 25 carbon atoms; and A represents any of substituents represented by general formulae (3-1) to (3-3). In the general formulae (3-1) to (3-3), $Ar^{11}$ represents an aryl group having 6 to 25 carbon atoms; $R^{25}$ and $R^{26}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $Ar^{31}$ represents an aryl group having 6 to 25 carbon atoms; and $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms.

Further, one aspect of the present invention is a light-emitting element including a first light-emitting layer and a second light-emitting layer between a pair of electrodes. The first light-emitting layer includes an anthracene derivative represented by a general formula (4). The second light-emitting layer includes a second light-emitting substance. An emission color of the second light-emitting substance is different from an emission color of the anthracene derivative represented by the general formula (4). Light emission of a color mixture of the emission color of the anthracene derivative represented by the general formula (4) and the emission color of the second light-emitting substance is exhibited.

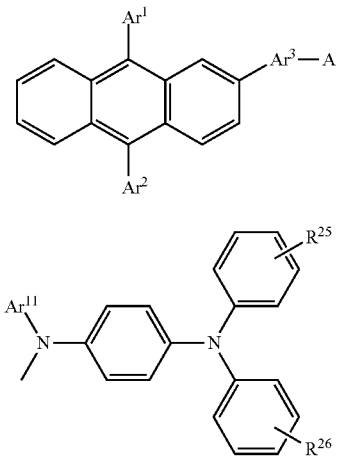

(4-2)

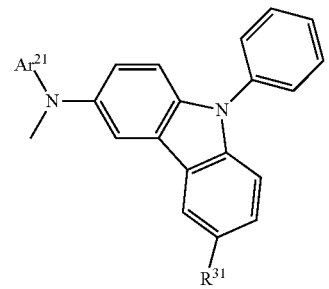

(4-3)

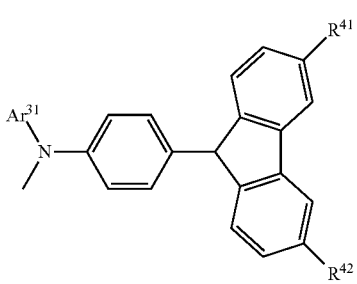

In the formula, $Ar^1$ and $Ar^2$ individually represent an aryl group having 6 to 25 carbon atoms; $Ar^3$ represents an arylene group having 6 to 25 carbon atoms; and A represents any of substituents represented by general formulae (4-1) to (4-3). In general formulae (4-1) to (4-3), $Ar^{11}$ represents any of a phenyl group, a 1-naphthyl group, and a 2-naphthyl group; $R^{25}$ and $R^{26}$ individually represent any of a hydrogen atom, an alkyl group having 1 to 4 carbon atoms, and an aryl group having 6 to 15 carbon atoms; $Ar^{21}$ represents any of a phenyl group, a 1-naphthyl group, and a 2-naphthyl group; $R^{31}$ represents any of a hydrogen atom, an alkyl group having 1 to 4 carbon atoms, and an aryl group having 6 to 25 carbon atoms; $Ar^{31}$ represents any of a phenyl group, a 1-naphthyl group, and a 2-naphthyl group; and $R^{41}$ and $R^{42}$ individually represent any of a hydrogen atom, an alkyl group having 1 to 4 carbon atoms, and an aryl group having 6 to 25 carbon atoms.

Further, one aspect of the present invention is a light-emitting element including a first light-emitting layer and a second light-emitting layer between a pair of electrodes. The first light-emitting layer includes an anthracene derivative represented by a general formula (5). The second light-emitting layer includes a second light-emitting substance. An emission color of the second light-emitting substance is different from an emission color of the anthracene derivative represented by the general formula (5). Light emission of a color mixture of the emission color of the anthracene derivative represented by the general formula (5) and the emission color of the second light-emitting substance is exhibited.

(5)

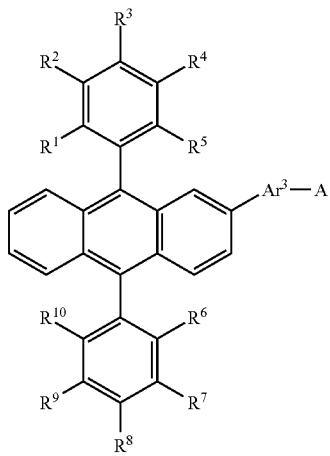

(5-1)

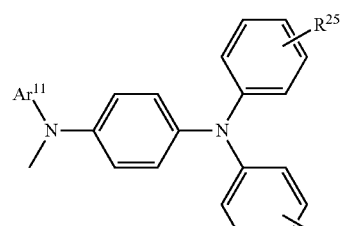

(5-2)

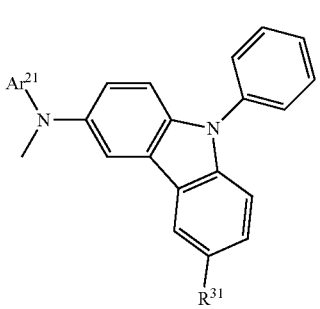

(5-3)

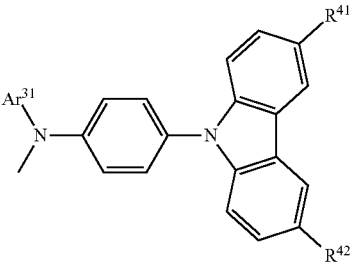

In the formula, $R^1$ to $R^{10}$ individually represent a hydrogen atom; an alkyl group having 1 to 4 carbon atoms; an aryl group having 6 to 15 carbon atoms; a halogen atom; a haloalkyl group having 1 to 4 carbon atoms; $Ar^3$ represents an arylene group having 6 to 25 carbon atoms; and A represents any of substituents represented by general formulae (5-1) to (5-3). In the general formulae (5-1) to (5-3), $A^{11}$ represents any of a phenyl group, a 1-naphthyl group, and a 2-naphthyl group; $R^{25}$ and $R^{26}$ individually represent any of a hydrogen atom, an alkyl group having 1 to 4 carbon atoms, and an aryl group having 6 to 15 carbon atoms; $Ar^{21}$ represents any of a phenyl group, a 1-naphthyl group, and a 2-naphthyl group; $R^{31}$ represents any of a hydrogen atom, an alkyl group having 1 to 4 carbon atoms, and an aryl group having 6 to 25 carbon atoms; $Ar^{31}$ represents any of a phenyl group, a 1-naphthyl group, and a 2-naphthyl group; and $R^{41}$ and $R^{42}$ individually represent any of a hydrogen atom, an alkyl group having 1 to 4 carbon atoms, and an aryl group having 6 to 25 carbon atoms.

In the above structures, $Ar^3$ is preferably any of substituents represented by general formulae (11-1) to (11-5).

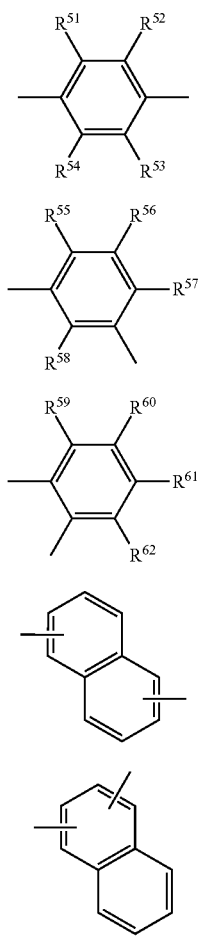

In the formula, $R^{51}$ to $R^{62}$ individually represent any of a hydrogen atom, an alkyl group having 1 to 4 carbon atoms, an aryl group having 6 to 15 carbon atoms, a halogen atom, and a haloalkyl group having 1 to 4 carbon atoms.

Further, in the above structures, the anthracene derivative in which $Ar^1$ and $Ar^2$ have the same structure is preferably used.

Further, in the above structures, the emission color of the anthracene derivative and the emission color of the second light-emitting substance are preferably complementary colors. When these emission colors are complementary colors, white light can be emitted from the whole light-emitting element.

Further, in a light-emitting element according to the present invention, a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. In addition, the first cathode and the second anode are in contact with each other. The first light-emitting layer includes a 2,9,10-triaryl anthracene derivative in which a diarylamino-substituted aryl group is bonded to the 2-position of 9,10-diarylanthracene. The second light-emitting layer includes a second light-emitting substance different from the 2,9,10-triaryl anthracene derivative. In addition, the first light-emitting element exhibits a first emission spectrum having at least two peaks. The third light-emitting layer includes a third light-emitting substance. The fourth light-emitting layer includes a fourth light-emitting substance. In addition, the second light-emitting element exhibits a second emission spectrum having at least two peaks. In addition, by supplying a current, a light-emitting element that exhibits an emission spectrum formed by combination of the first emission spectrum and the second emission spectrum can be obtained.

Thus, one aspect of the present invention is a light-emitting element in which a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. The first cathode and the second anode are in contact with each other. The first light-emitting layer includes a 2,9,10-triaryl anthracene derivative. The second light-emitting layer includes a second light-emitting substance different from the 2,9,10-triaryl anthracene derivative. The first light-emitting element exhibits a first emission spectrum having at least two peaks. The third light-emitting layer includes a third light-emitting substance. The fourth light-emitting layer includes a fourth light-emitting substance. The second light-emitting element exhibits a second emission spectrum having at least two peaks. An emission spectrum formed by combination of the first emission spectrum and the second emission spectrum is exhibited.

Further, one aspect of the present invention is a light-emitting element in which a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. The first cathode and the second anode are in contact with each other. The first light-emitting layer includes an anthracene derivative represented by the general formula (1). The second light-emitting layer includes a second light-emitting substance. The first light-emitting element exhibits a first emission spectrum having at least two peaks. The third light-emitting layer includes a third light-emitting substance. The fourth light-emitting layer includes a fourth light-emitting substance. The second light-emitting element exhibits a second emission spectrum having at least two peaks. An emission spectrum foliated by combination of the first emission spectrum and the second emission spectrum is exhibited.

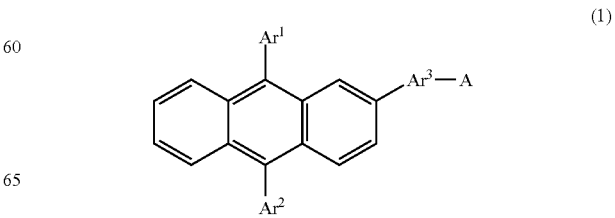

-continued (1-1)

Ar$^{11}$   Ar$^{12}$
   \\ /
   N-α-N
   /    \\
         Ar$^{13}$ (1-2)

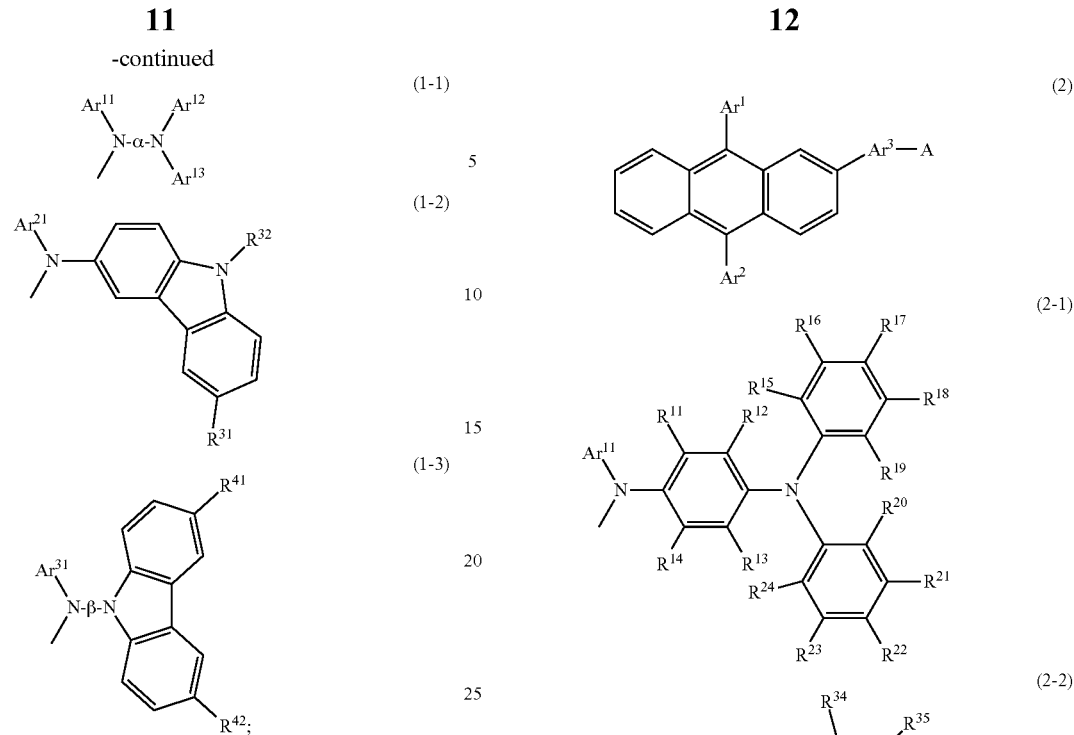

(1-3)

In the formula, Ar$^1$ and Ar$^2$ individually represent an aryl group having 6 to 25 carbon atoms; Ar$^3$ represents an arylene group having 6 to 25 carbon atoms; and A represents any of substituents represented by the general formulae (1-1) to (1-3). In the general formulae (1-1) to (1-3), Ar$^{11}$ to Ar$^{13}$ individually represent an aryl group having 6 to 25 carbon atoms; α represents an arylene group having 6 to 25 carbon atoms; Ar$^{21}$ represents an aryl group having 6 to 25 carbon atoms; R$^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; R$^{32}$ represents any of an alkyl group having 1 to 4 carbon atoms, an aryl group having 6 to 25 carbon atoms, and a haloalkyl group having 1 to 4 carbon atoms; Ar$^{31}$ represents an aryl group having 6 to 25 carbon atoms; β represents an arylene group having 6 to 25 carbon atoms; and R$^{41}$ and R$^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms.

Further, one aspect of the present invention is a light-emitting element in which a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. The first cathode and the second anode are in contact with each other. The first light-emitting layer includes an anthracene derivative represented by the general formula (2). The second light-emitting layer includes a second light-emitting substance. The first light-emitting element exhibits a first emission spectrum having at least two peaks. The third light-emitting layer includes a third light-emitting substance. The fourth light-emitting layer includes a fourth light-emitting substance. The second light-emitting element exhibits a second emission spectrum having at least two peaks. An emission spectrum formed by combination of the first emission spectrum and the second emission spectrum is exhibited.

In the formula, Ar$^1$ and Ar$^2$ individually represent an aryl group having 6 to 25 carbon atoms; Ar$^3$ represents an arylene group having 6 to 25 carbon atoms; and A represents any of substituents represented by the general formulae (2-1) to (2-3). In the general formulae (2-1) to (2-3), Ar$^{11}$ represents an aryl group having 6 to 25 carbon atoms; R$^{11}$ to R$^{24}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; Ar$^{21}$ represents an aryl group having 6 to 25 carbon atoms; R$^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $R^{33}$ to $R^{37}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{31}$ represents an aryl group having 6 to 25 carbon atoms; $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms; and $R^{43}$ to $R^{46}$ individually represent any of a hydrogen atom, an alkyl group having 1 to 4 carbon atoms, an aryl group having 6 to 15 carbon atoms, a halogen atom, and a haloalkyl group having 1 to 4 carbon atoms.

Further, one aspect of the present invention is a light-emitting element in which a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. The first cathode and the second anode are in contact with each other. The first light-emitting layer includes an anthracene derivative represented by the general formula (3). The second light-emitting layer includes a second light-emitting substance. The first light-emitting element exhibits a first emission spectrum having at least two peaks. The third light-emitting layer includes a third light-emitting substance. The fourth light-emitting layer includes a fourth light-emitting substance. The second light-emitting element exhibits a second emission spectrum having at least two peaks. An emission spectrum formed by combination of the first emission spectrum and the second emission spectrum is exhibited.

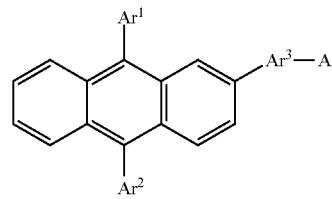

(3)

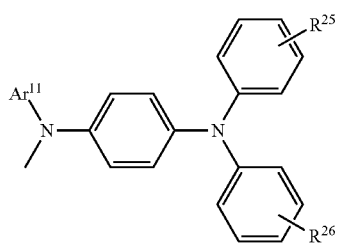

(3-1)

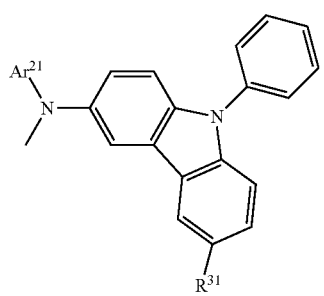

(3-2)

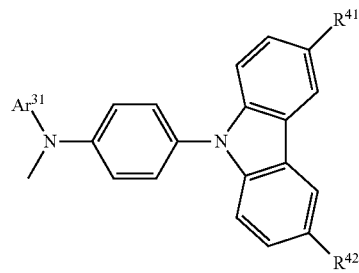

(3-3)

In the formula, $Ar^1$ and $Ar^2$ individually represent an aryl group having 6 to 25 carbon atoms; $Ar^3$ represents an arylene group having 6 to 25 carbon atoms; and A represents any of substituents represented by the general formulae (3-1) to (3-3). In the general formulae (3-1) to (3-3), $Ar^{11}$ represents an aryl group having 6 to 25 carbon atoms; $R^{25}$ and $R^{26}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $Ar^{31}$ represents an aryl group having 6 to 25 carbon atoms; and $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms.

Further, one aspect of the present invention is a light-emitting element in which a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. The first cathode and the second anode are in contact with each other. The first light-emitting layer includes an anthracene derivative represented by the general formula (4). The second light-emitting layer includes a second light-emitting substance. The first light-emitting element exhibits a first emission spectrum having at least two peaks. The third light-emitting layer includes a third light-emitting substance. The fourth light-emitting layer includes a fourth light-emitting substance. The second light-emitting element exhibits a second emission spectrum having at least two peaks. An emission spectrum formed by combination of the first emission spectrum and the second emission spectrum is exhibited.

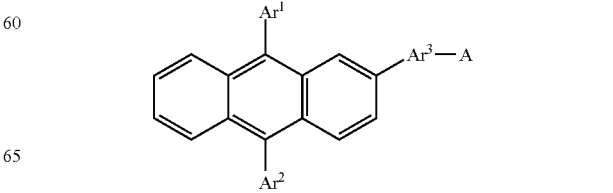

(4)

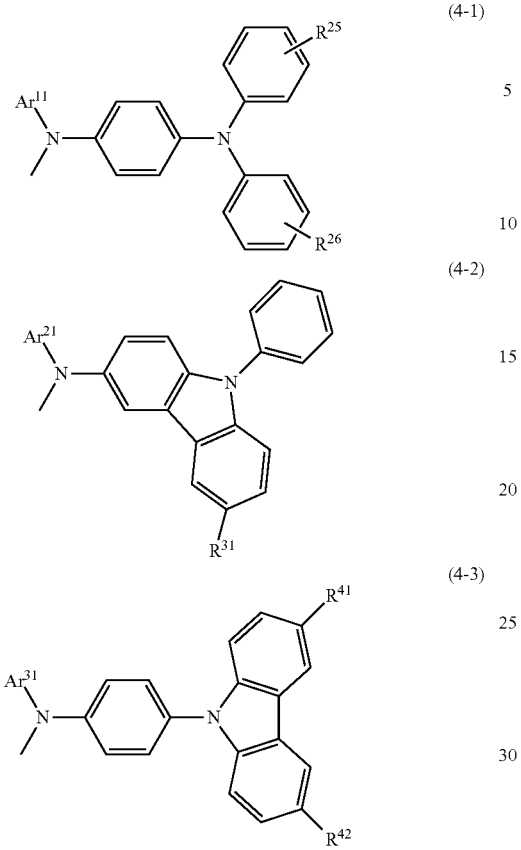

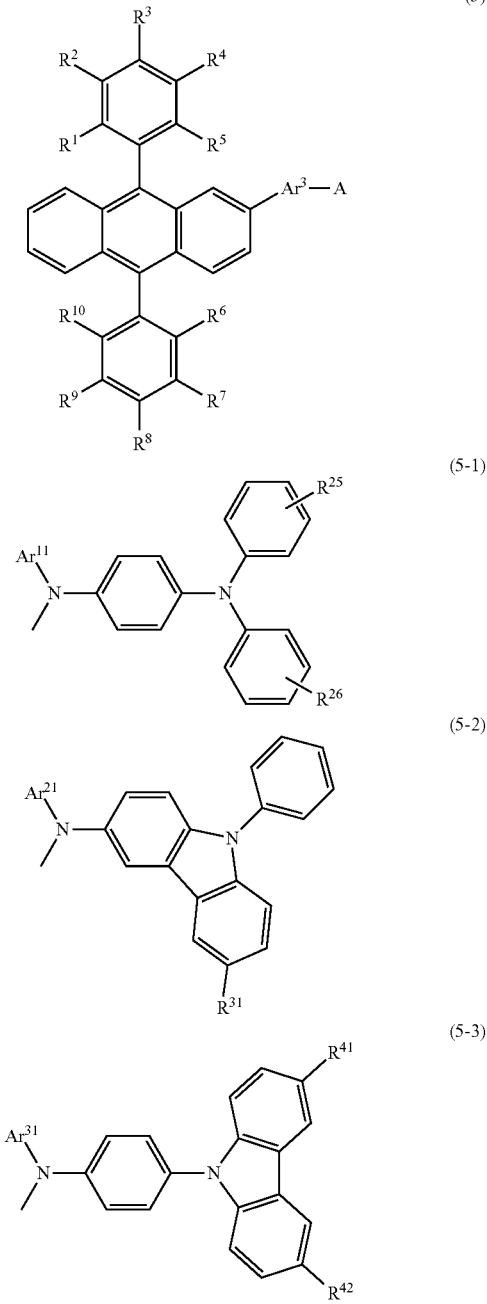

In the formula, $Ar^1$ and $Ar^2$ individually represent an aryl group having 6 to 25 carbon atoms; $Ar^3$ represents an arylene group having 6 to 25 carbon atoms; and A represents any of substituents represented by the general formulae (4-1) to (4-3). In general formulae (4-1) to (4-3), $Ar^{11}$ represents any of a phenyl group, a 1-naphthyl group, and a 2-naphthyl group; $R^{25}$ and $R^{26}$ individually represent any of a hydrogen atom, an alkyl group having 1 to 4 carbon atoms, and an aryl group having 6 to 15 carbon atoms; $Ar^{21}$ represents any of a phenyl group, a 1-naphthyl group, and a 2-naphthyl group; $R^{31}$ represents any of a hydrogen atom, an alkyl group having 1 to 4 carbon atoms, and an aryl group having 6 to 25 carbon atoms; $Ar^{31}$ represents any of a phenyl group, a 1-naphthyl group, and a 2-naphthyl group; and $R^{41}$ and $R^{42}$ individually represent any of a hydrogen atom, an alkyl group having 1 to 4 carbon atoms, and an aryl group having 6 to 25 carbon atoms.

Further, one aspect of the present invention is a light-emitting element in which a first light-emitting element that includes a first light-emitting layer and a second light-emitting layer between a first anode and a first cathode and a second light-emitting element that includes a third light-emitting layer and a fourth light-emitting layer between a second anode and a second cathode are connected in series to each other. The first cathode and the second anode are in contact with each other. The first light-emitting layer includes an anthracene derivative represented by the general formula (5). The second light-emitting layer includes a second light-emitting substance. The first light-emitting element exhibits a first emission spectrum having at least two peaks. The third light-emitting layer includes a third light-emitting substance. The fourth light-emitting layer includes a fourth light-emitting substance. The second light-emitting element exhibits a second emission spectrum having at least two peaks. An emission spectrum formed by combination of the first emission spectrum and the second emission spectrum is exhibited.

In the formula, $R^1$ to $R^{10}$ individually represent a hydrogen atom; an alkyl group having 1 to 4 carbon atoms; an aryl group having 6 to 15 carbon atoms; a halogen atom; a haloalkyl group having 1 to 4 carbon atoms; $Ar^3$ represents an arylene group having 6 to 25 carbon atoms; and A represents any of substituents represented by the general formulae (5-1) to (5-3). In the general formulae (5-1) to (5-3), $Ar^{11}$ represents any of a phenyl group, a 1-naphthyl group, and a 2-naphthyl group; $R^{25}$ and $R^{26}$ individually represent any of a hydrogen atom, an alkyl group having 1 to 4 carbon atoms, and an aryl group having 6 to 15 carbon atoms; $Ar^{21}$ represents any of a phenyl group, a 1-naphthyl group, and a 2-naphthyl group; $R^{31}$ represents any of a hydrogen atom, an alkyl group having 1 to 4 carbon atoms, and an aryl group having 6 to 25 carbon atoms; $Ar^{31}$ represents any of a phenyl group, a 1-naphthyl group, and a 2-naphthyl group; and $R^{41}$ and $R^{42}$ individually represent any of a hydrogen atom, an alkyl group having 1 to 4 carbon atoms, and an aryl group having 6 to 25 carbon atoms.

In the above structures, $Ar^3$ is preferably any of substituents represented by the general formulae (11-1) to (11-5).

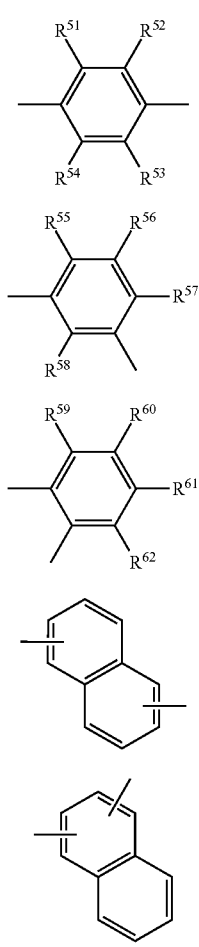

In the formula, $R^{51}$ to $R^{62}$ individually represent any of a hydrogen atom, an alkyl group having 1 to 4 carbon atoms, an aryl group having 6 to 15 carbon atoms, a halogen atom, and a haloalkyl group having 1 to 4 carbon atoms.

Further, in the above structures, the anthracene derivative in which $Ar^1$ and $Ar^2$ have the same structure is preferably used.

Further, in the above structures, the emission color of the anthracene derivative and the emission color of the second light-emitting substance are preferably complementary colors. When these emission colors are complementary colors, the first light-emitting element can exhibit white light.

Further, in the above structures, an emission color of the third light-emitting substance and an emission color of the fourth light-emitting substance are preferably complementary colors. When these emission colors are complementary colors, the second light-emitting element can exhibit white light.

Further, in the above structures, the peaks of the first emission spectrum and the peaks of the second emission spectrum preferably does not overlap each other. With such a structure, a light-emitting element that exhibits a broad emission spectrum can be obtained.

Further, the present invention also covers an light-emitting device using the light-emitting element of the present invention. Thus, the light-emitting device includes the aforementioned light-emitting element and a control unit configured to control light emitted from the light-emitting element. It is to be noted that the category of a light-emitting device in this specification includes image display devices, light emitting devices and light sources (e.g., lighting apparatuses). Further, the category of the light-emitting device also includes a module in which a connector such as a flexible printed circuit (FPC), a tape automated bonding (TAB) tape, or a tape carrier package (TCP) is attached to a panel; a module in which a printed wiring board is provided at an end of a TAB tape or a TCP; and also a module in which an integrated circuit (IC) is directly mounted on a light-emitting element by a chip on glass (COG) method.

Further, the present invention also covers an electronic appliance in which the light-emitting element of the present invention is used for its display portion. Thus, the electronic appliance of the present invention has a display portion, and the display portion includes the aforementioned light-emitting element and a control unit configured to control light emitted from the light-emitting element.

By applying the present invention, a light-emitting element having high efficiency can be obtained.

Further, by applying the present invention, a white light-emitting element having high efficiency can be obtained.

Further, by applying the present invention, a light-emitting element device and an electronic appliance each having low power consumption can be obtained.

BRIEF DESCRIPTION OF THE DRAWINGS

FIGS. 10A and 10B illustrate a light-emitting device according to an aspect of the present invention.

DETAILED DESCRIPTION OF THE INVENTION

Figure 1A:
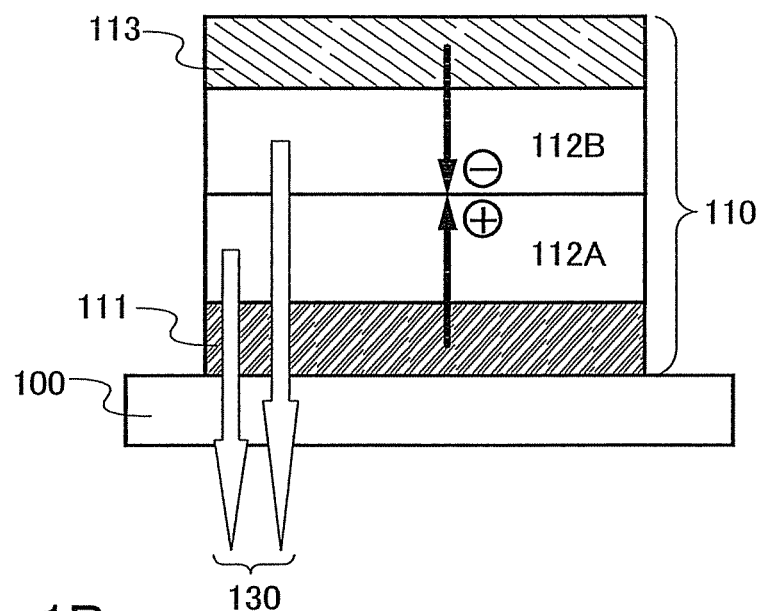
FIGS. 1A and 1B illustrate a light-emitting element according to an aspect of the present invention.

Hereinafter, embodiment modes of the present invention are described using the accompanying drawings. It is easily understood by those skilled in the art that a variety of changes may be made in forms and details without departing from the spirit and the scope of the present invention. Therefore, the present invention should not be limited to the description of the embodiment modes below. It is to be noted that in structures of the present invention described below, the same reference numerals are commonly given to the same components or components having similar functions throughout the drawings in some cases.

It is to be noted that in this specification, the term "peak" also refers to a shoulder peak. That is, in the case where a spectrum shows a shoulder, the shoulder is seen as a peak.

Further, at least one of a pair of electrodes of a light-emitting element may have a light-transmitting property so that emitted light can be extracted outside. Therefore, not only an element structure in which an electrode having a light-transmitting property is formed over a substrate and light is extracted through a substrate side, but also a structure in which light is extracted through the side opposite to the substrate side or a structure in which light is extracted through both the substrate side and the side opposite to the substrate side can be applied.

Embodiment Mode 1

Anthracene derivatives of the present invention used in the present invention are described in this embodiment mode.

In the present invention, a 2,9,10-triaryl anthracene derivative in which a diarylamino-substituted aryl group is bonded to the 2-position of a 9,10-diarylanthracene is used. The 2,9,10-triaryl anthracene derivative in which a diarylamino-substituted aryl group is bonded to the 2-position of a 9,10-diarylanthracene has high emission efficiency. Further, the 2,9,10-triaryl anthracene derivative is stable with respect to repeated redox reactions, and accordingly can be preferably used in the present invention.

As the 2,9,10-triaryl anthracene derivative in which a diarylamino-substituted aryl group is bonded to the 2-position of a 9,10-diarylanthracene, use of an anthracene derivative represented by a general formula (1) is particularly preferable.

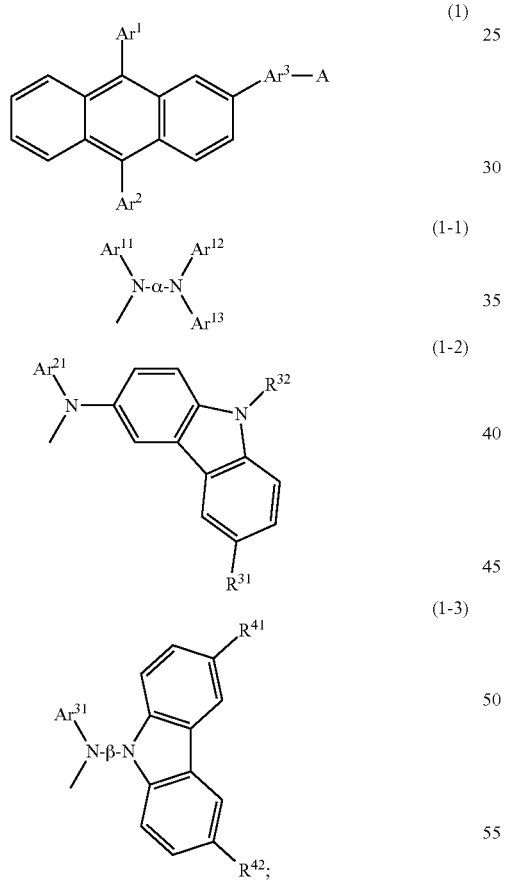

In the formula, $Ar^1$ and $Ar^2$ individually represent an aryl group having 6 to 25 carbon atoms; $Ar^3$ represents an arylene group having 6 to 25 carbon atoms; and A represents any of substituents represented by the general formulae (1-1) to (1-3). In the general formulae (1-1) to (1-3), $Ar^{11}$ to $Ar^{13}$ individually represent an aryl group having 6 to 25 carbon atoms; α represents an arylene group having 6 to 25 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $R^{32}$ represents any of an alkyl group having 1 to 4 carbon atoms, an aryl group having 6 to 25 carbon atoms, and a haloalkyl group having 1 to 4 carbon atoms; $Ar^{31}$ represents an aryl group having 6 to 25 carbon atoms; β represents an arylene group having 6 to 25 carbon atoms; and $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms.

As examples of substituents represented by $Ar^1$ and $Ar^2$ in the general formula (1), substituents represented by structural formulae (12-1) to (12-9) are given.

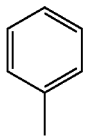

(12-1)

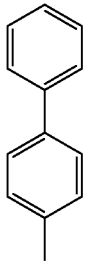

(12-2)

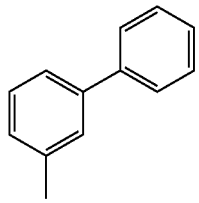

(12-3)

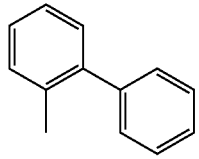

(12-4)

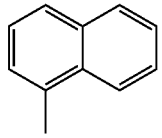

(12-5)

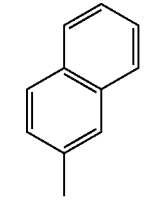

(12-6)

(12-7)
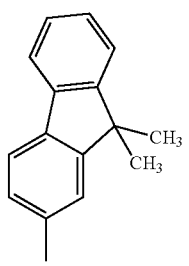
(12-8)
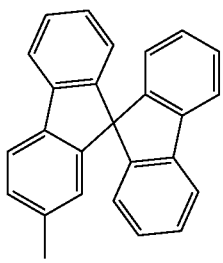
(12-9)
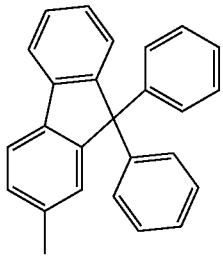
As examples of a substituent represented by Ar³ in the general formula (1), substituents represented by structural formulae (13-1) to (13-9) are given.
(13-1)
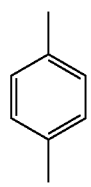
(13-2)
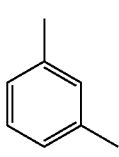
(13-3)
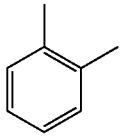
(13-4)
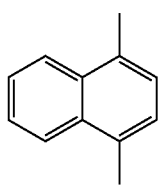
(13-5)
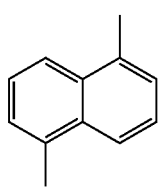
(13-6)
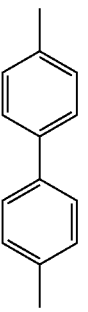
(13-7)
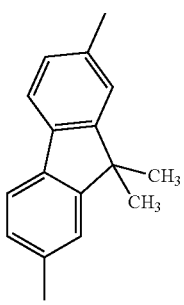
(13-8)
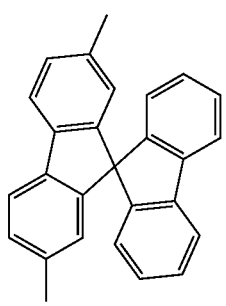
(13-9)
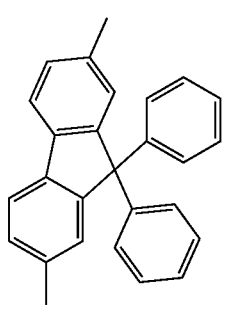
As examples of substituents represented by Ar¹¹ to Ar¹³ in the general formula (1-1), substituents represented by structural formulae (21-1) to (21-9) are given.

(21-1) 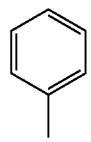
(21-2) 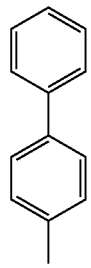
(21-3) 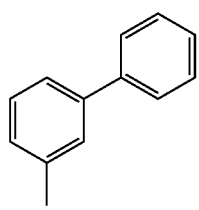
(21-4) 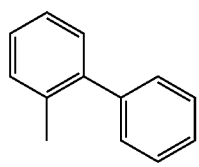
(21-5) 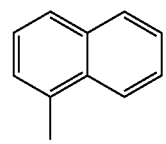
(21-6) 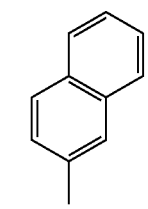
(21-7) 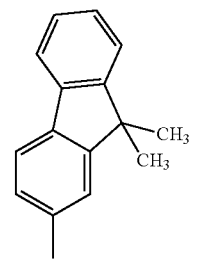
(21-8) 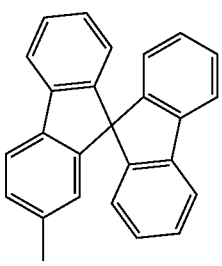
(21-9) 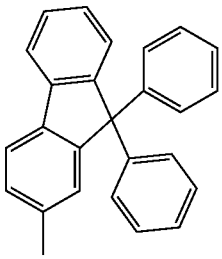
Further, as examples of a substituent represented by a in the general formula (1-1), substituents represented by structural formulae (22-1) to (22-9) are given.
(22-1) 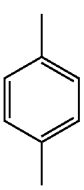
(22-2) 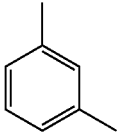
(22-3) 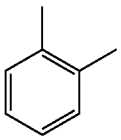
(22-4) 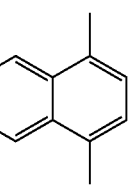
(22-5) 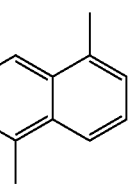

(22-6) 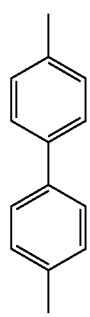
(22-7) 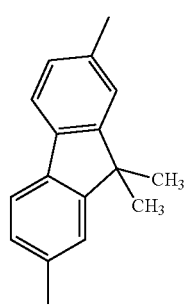
(22-8) 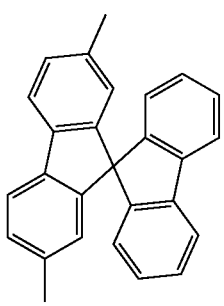
(22-9) 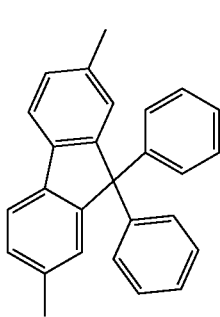
(31-1) 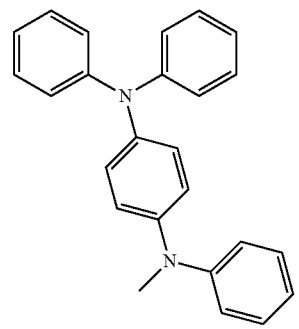
(31-2) 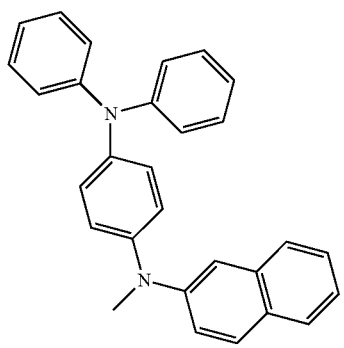
(31-3) 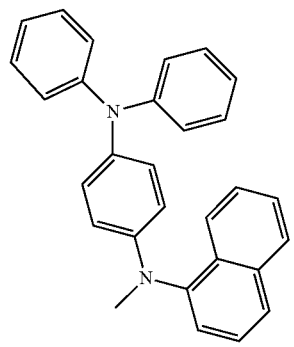
(31-4) 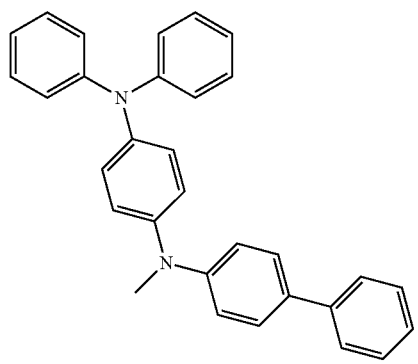
Accordingly, as examples of the substituent represented by the general formula (1-1), substituents represented by (31-1) to (31-23) are given.

(31-5)
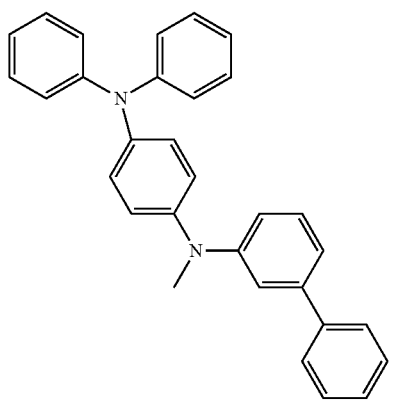
(31-6)
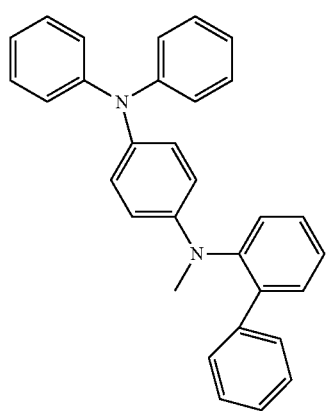
(31-7)
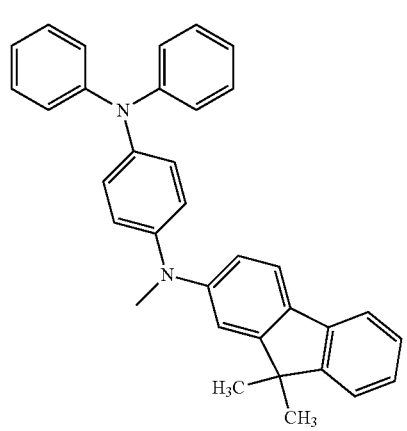
(31-8)
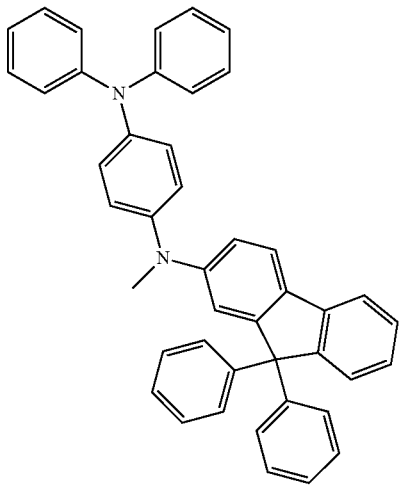
(31-9)
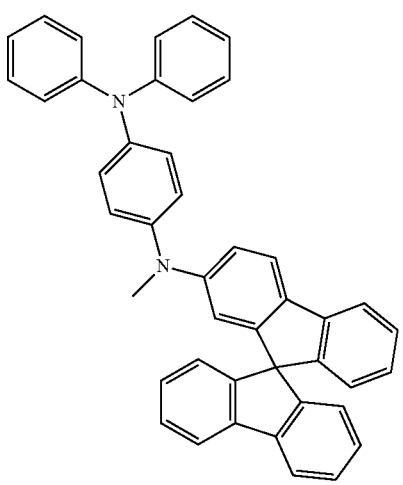
(31-10)
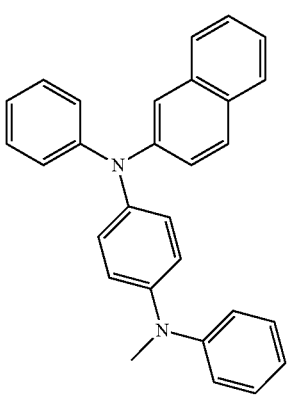

31
-continued
(31-11)
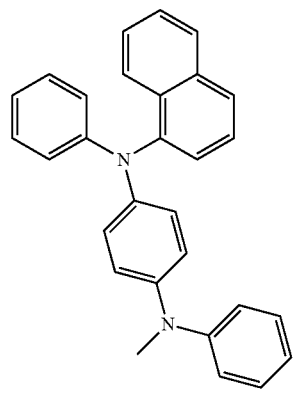
(31-12)
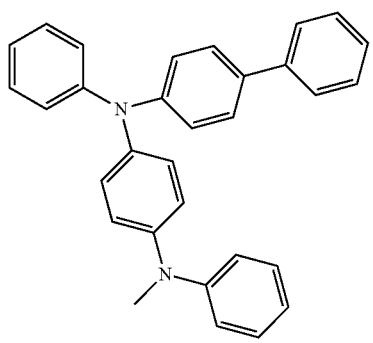
(31-13)
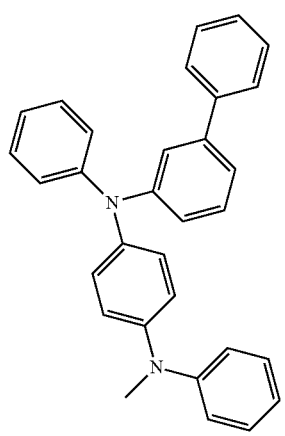
(31-14)
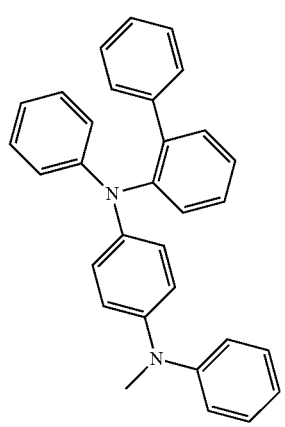
32
-continued
(31-15)
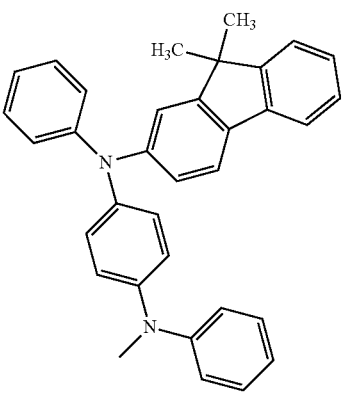
(31-16)
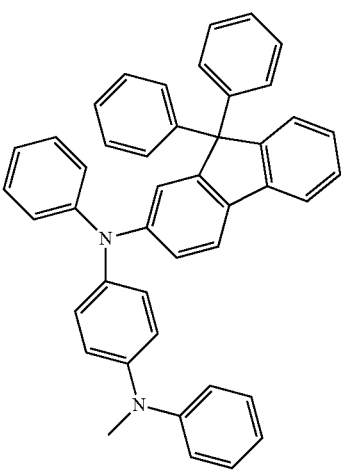
(31-17)
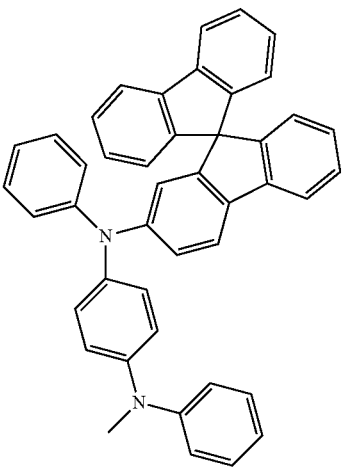

(31-18)
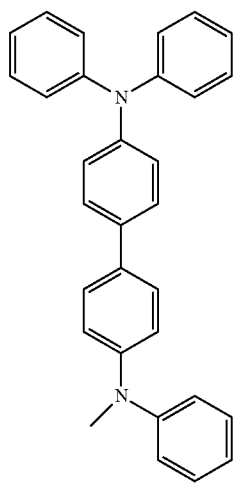
(31-19)
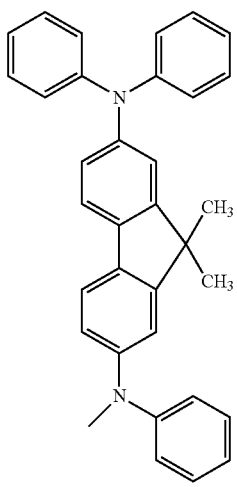
(31-20)
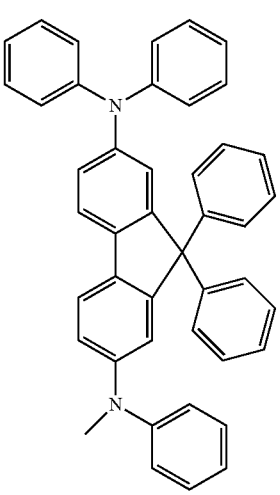
(31-21)
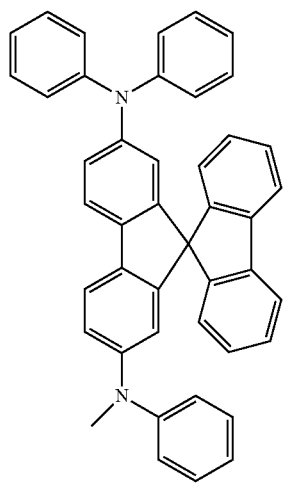
(31-22)
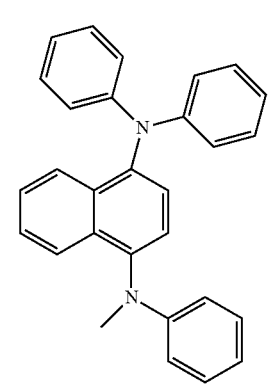
(31-23)
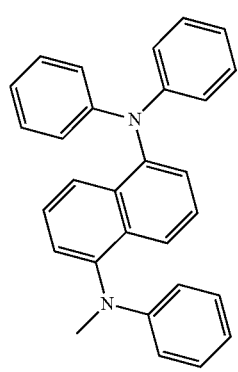
Further, as examples of a substituent represented by $Ar^{21}$ in the general formula (1-2), substituents represented by structural formulae (23-1) to (23-9) are given.
(23-1)
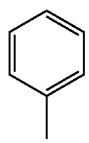

(23-2) 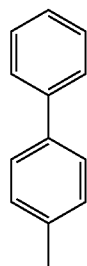
(23-3) 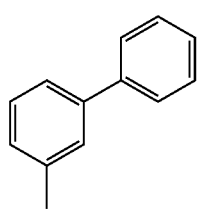
(23-4) 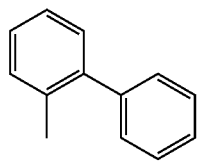
(23-5) 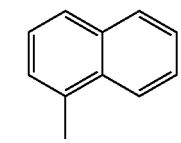
(23-6) 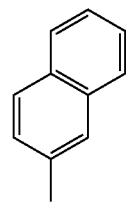
(23-7) 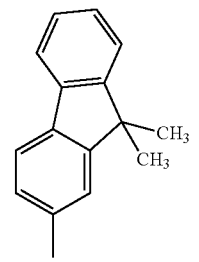
(23-8) 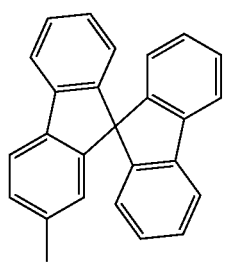
(23-9) 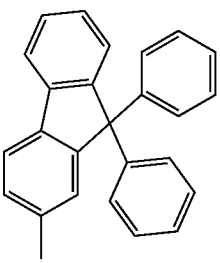
Further, as examples of a substituent represented by $R^{31}$ in the general formula (1-2), substituents represented by structural formulae (24-1) to (24-18) are given.
(24-1) H—
(24-2) CH$_3$—
(24-3) CH$_3$—CH$_2$—
(24-4) CH$_3$CH$_2$CH$_2$—
(24-5) (CH$_3$)$_2$CH—
(24-6) (CH$_3$)$_2$CHCH$_2$—
(24-7) CH$_3$CH$_2$CH(CH$_3$)—
(24-8) (CH$_3$)$_3$C—
(24-9) CH$_3$CH$_2$CH$_2$CH$_2$—
(24-10) 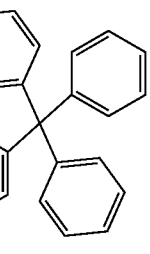

(24-11)
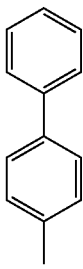
(24-12)
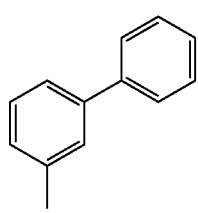
(24-13)
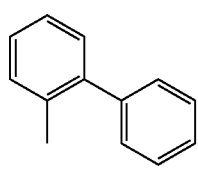
(24-14)
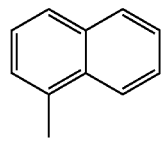
(24-15)
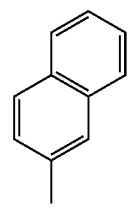
(24-16)
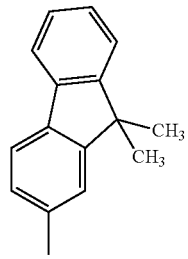
(24-17)
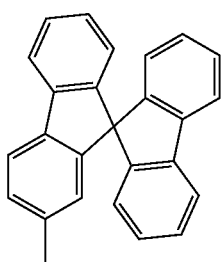
(24-18)
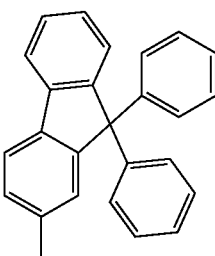
Further, as examples of a substituent represented by $R^{32}$ in the general formula (1-2), substituents represented by structural formulae (25-1) to (25-17) are given.
(25-1)
(25-2)
(25-3)
(25-4)
(25-5)
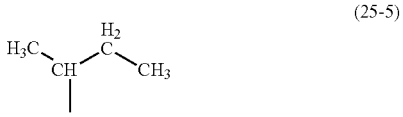
(25-6)
(25-7)
(25-8)
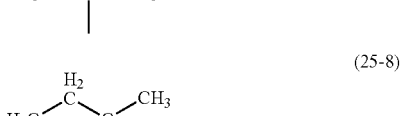
(25-9)
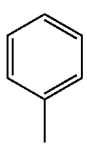

(25-10) 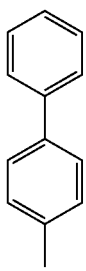
(25-11) 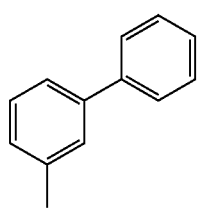
(25-12) 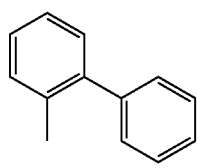
(25-13) 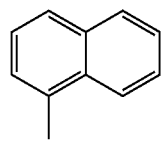
(25-14) 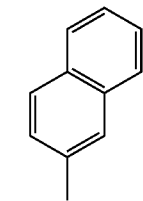
(25-15) 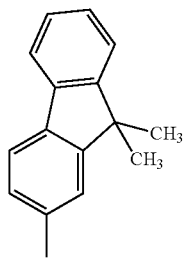
(25-16) 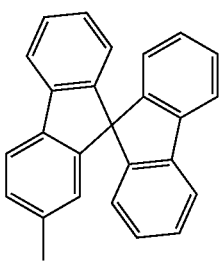
(25-17) 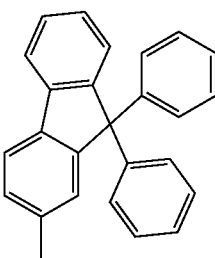
Accordingly, as examples of the substituent represented by the general formula (1-2), substituents represented by (32-1) to (32-42) are given.
(32-1) 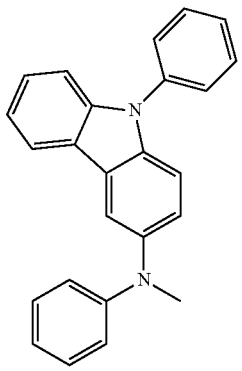
(32-2) 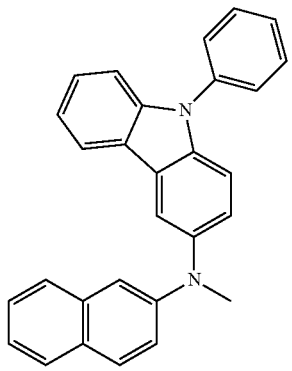
(32-3) 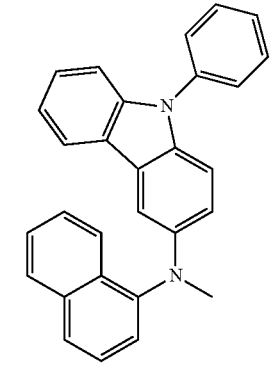

(32-4)
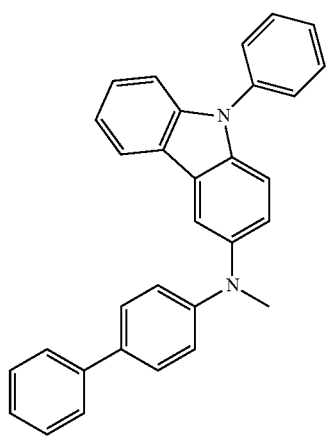
(32-5)
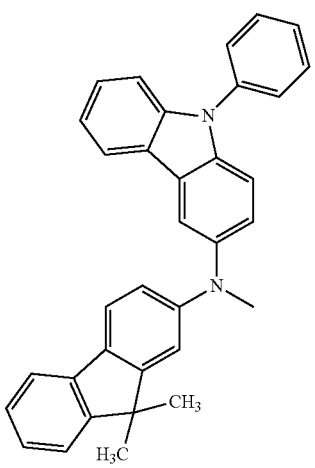
(32-6)
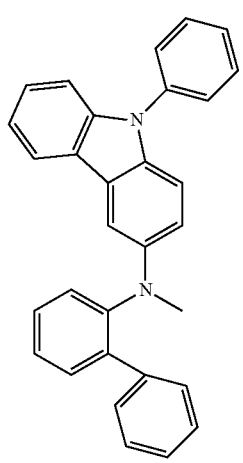
(32-7)
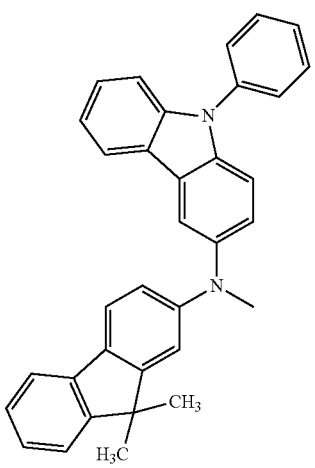
(32-8)
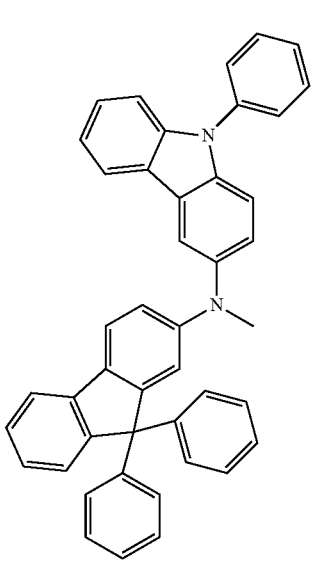
(32-9)
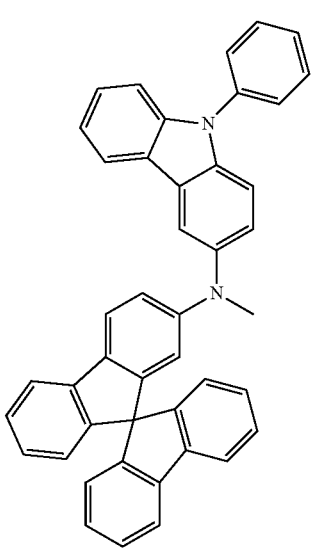

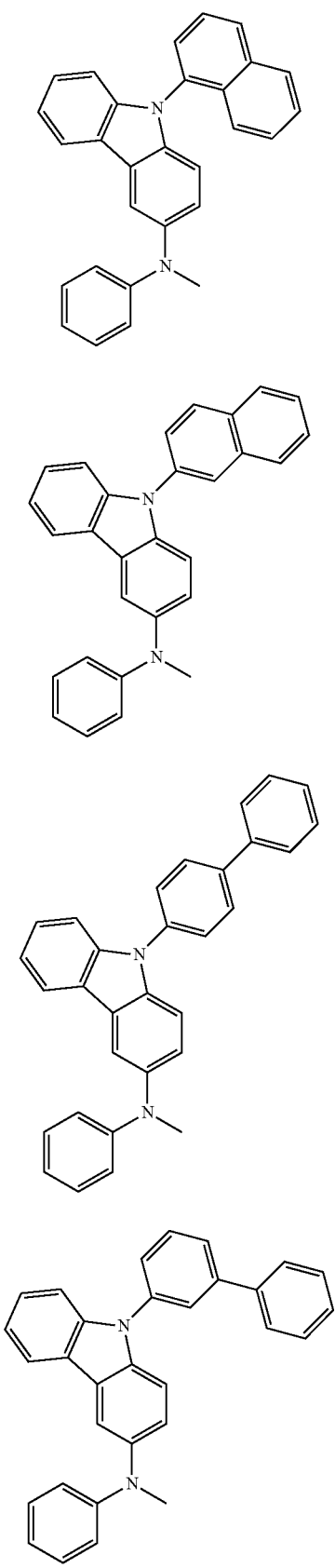
(32-10)
(32-11)
(32-12)
(32-13)
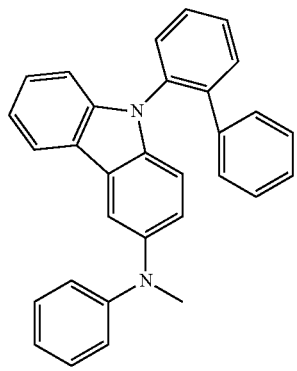
(32-14)
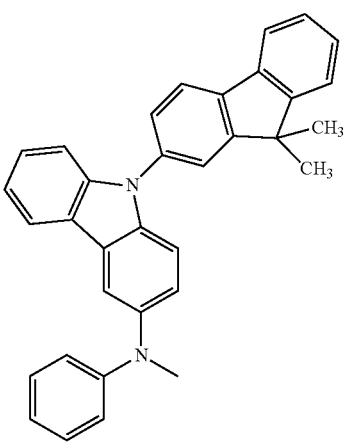
(32-15)
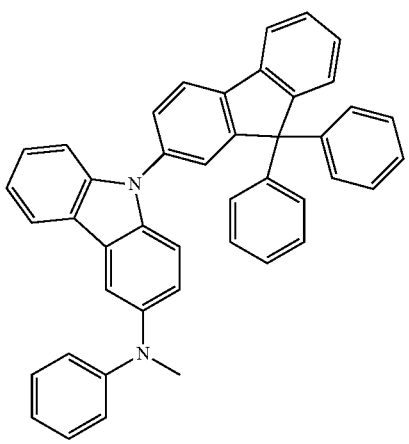
(32-16)

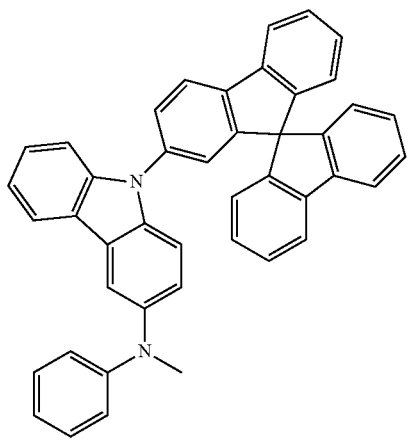
(32-17)
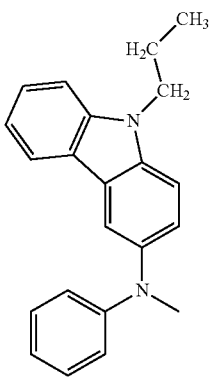
(32-18)
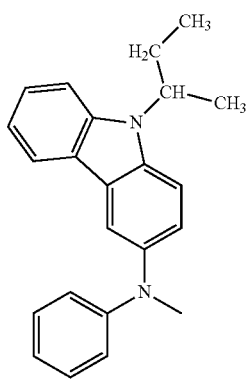
(32-19)
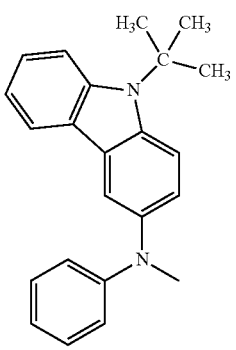
(32-20)
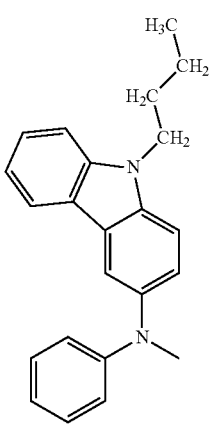
(32-21)
(32-22)
(32-23)
(32-24)

(32-25)
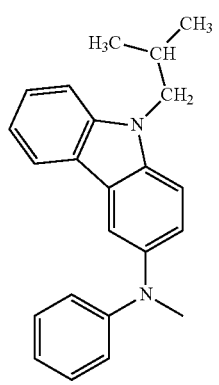
(32-26)
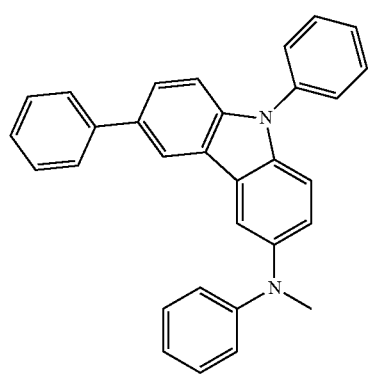
(32-27)
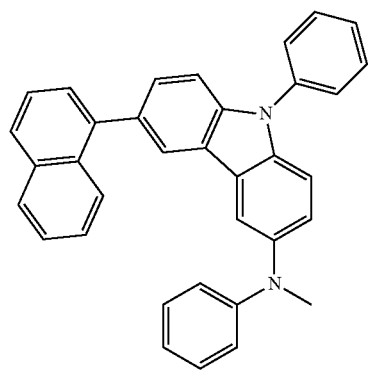
(32-28)
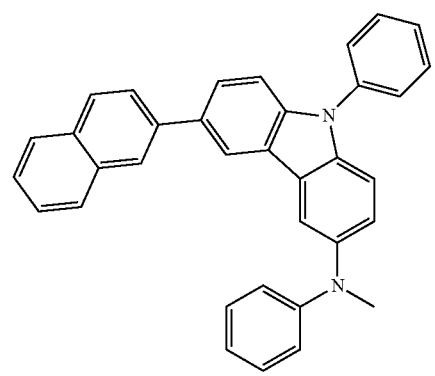
(32-29)
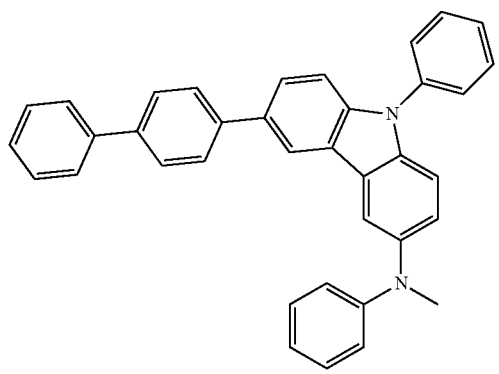
(32-30)
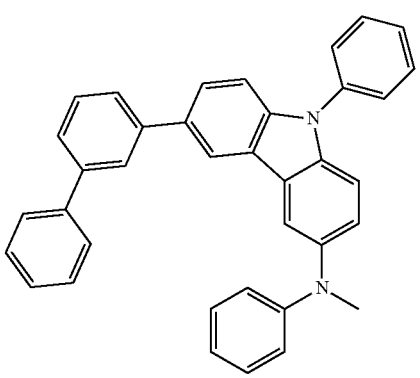
(32-31)
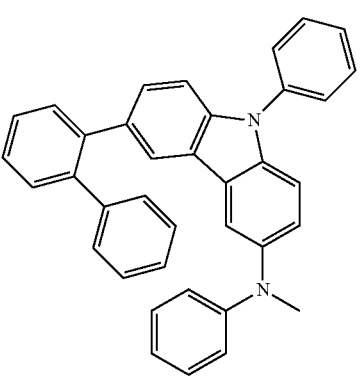
(32-32)
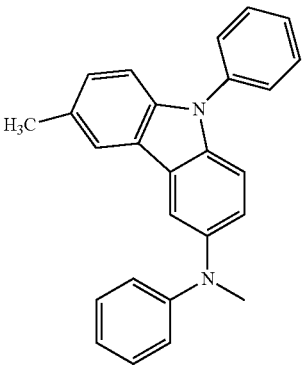

(32-33)
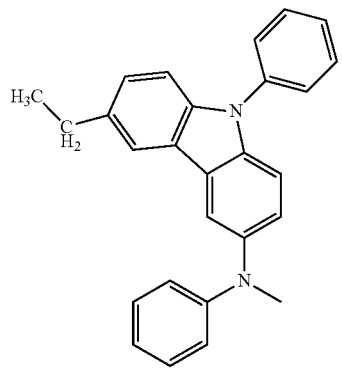
(32-34)
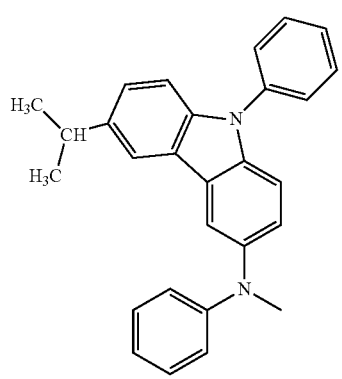
(32-35)
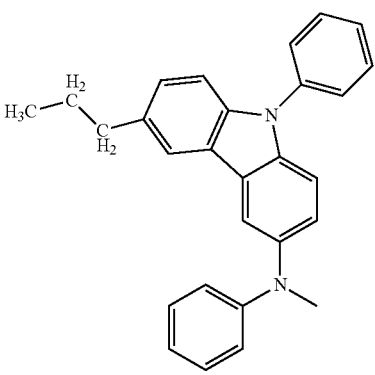
(32-36)
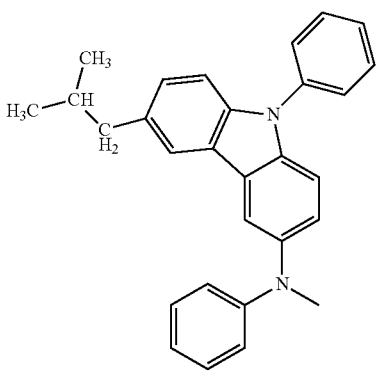
(32-37)
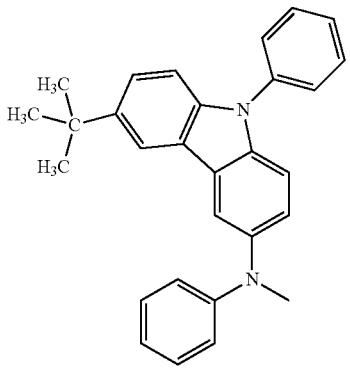
(32-38)
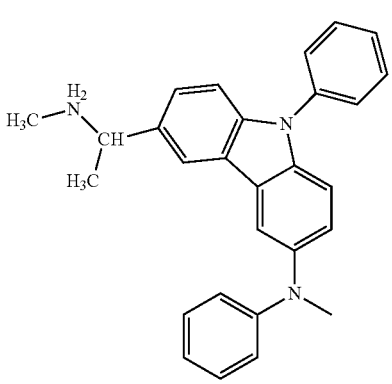
(32-39)
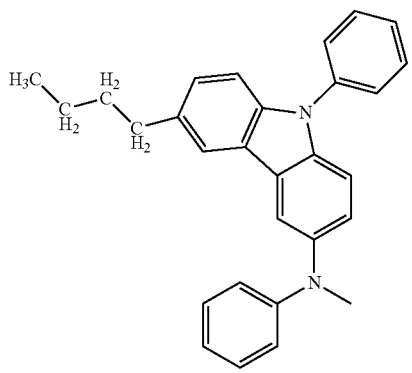
(32-40)
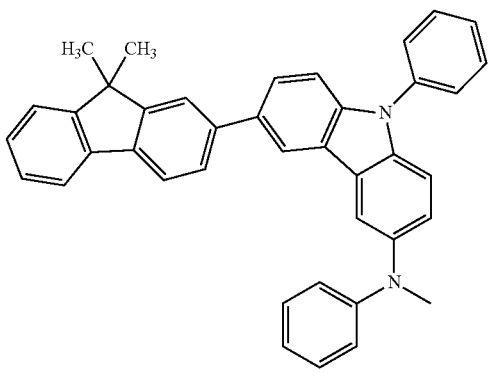

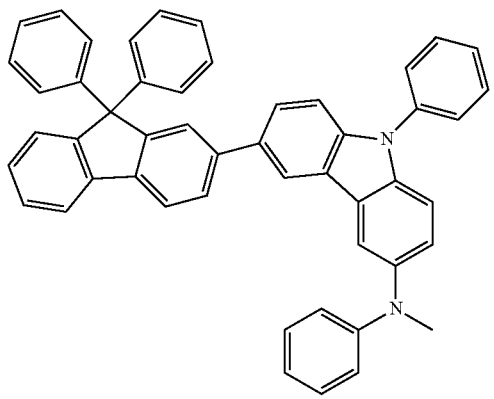
(32-41)
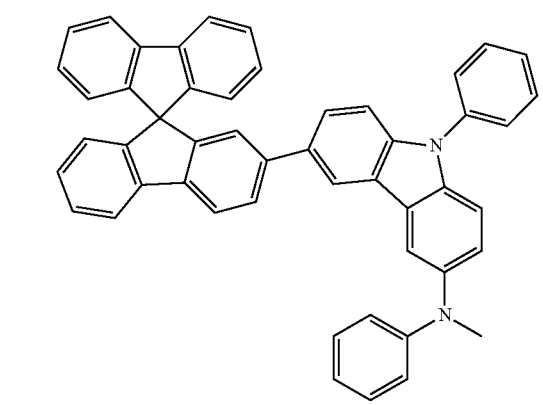
(32-42)
Further, as examples of a substituent represented by Ar$^{31}$ in the general formula (1-3), substituents represented by structural formulae (26-1) to (26-9) are given.
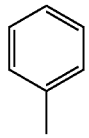
(26-1)
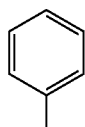
(26-2)
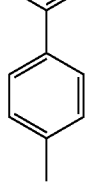
(26-3)
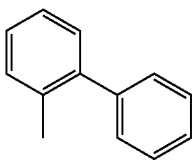
(26-4)
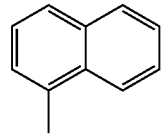
(26-5)
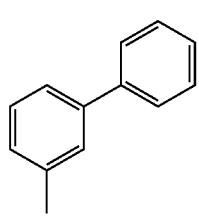
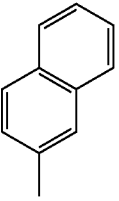
(26-6)
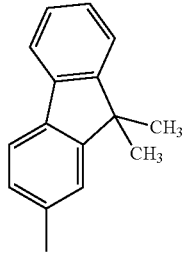
(26-7)
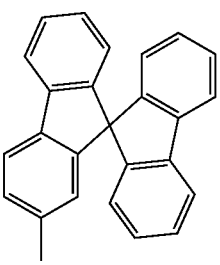
(26-8)
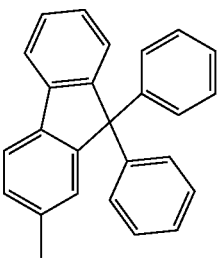
(26-9)
Further, as examples of a substituent represented by β in the general formula (1-3), substituents represented by structural formulae (27-1) to (27-9) are given.

(27-1) 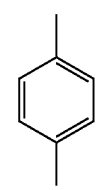
(27-2) 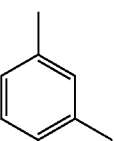
(27-3) 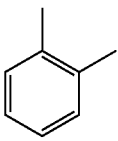
(27-4) 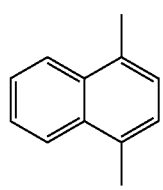
(27-5) 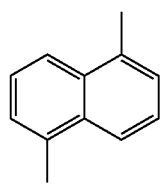
(27-6) 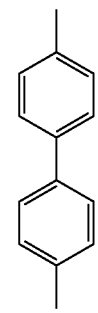
(27-7) 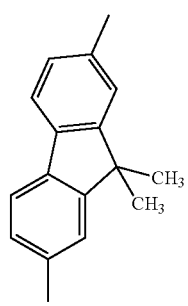
(27-8) 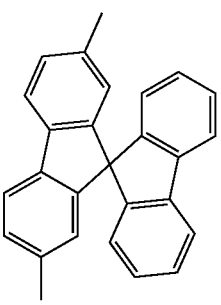
(27-9) 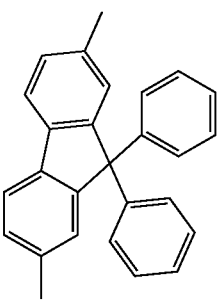
Further, as examples of substituents represented by $R^{41}$ and $R^{42}$ in the general formula (1-3), substituents represented by structural formulae (28-1) to (28-18) are given.
(28-1) 
(28-2) 
(28-3) 
(28-4) 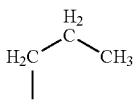
(28-5) 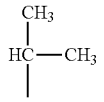
(28-6) 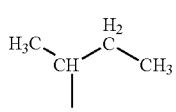
(28-7) 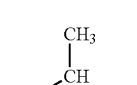
(28-8) 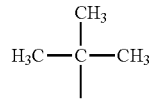

(28-9) 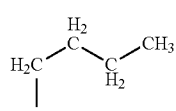
(28-10) 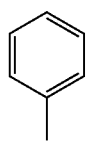
(28-11) 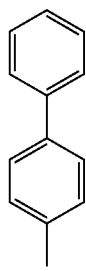
(28-12) 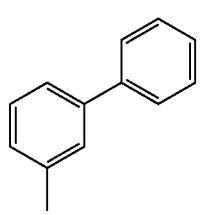
(28-13) 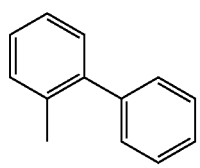
(28-14) 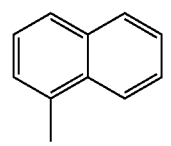
(28-15) 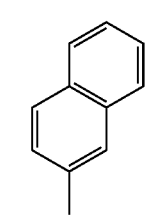
(28-16) 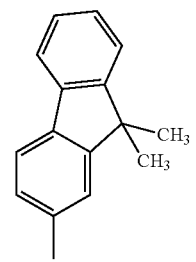
(28-17) 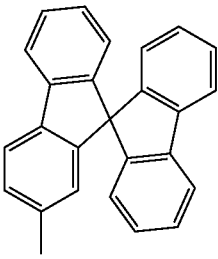
(28-18) 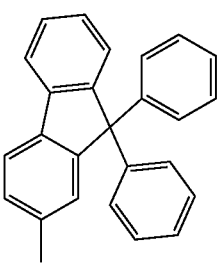
Accordingly, as examples of the substituent represented by the general formula (1-3), substituents represented by (33-1) to (33-34) are given.
(33-1) 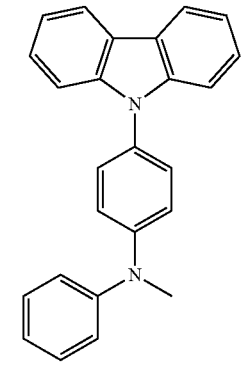
(33-2) 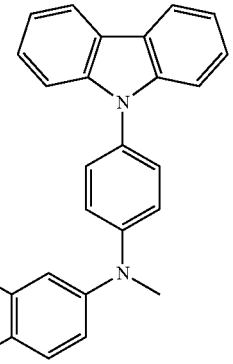

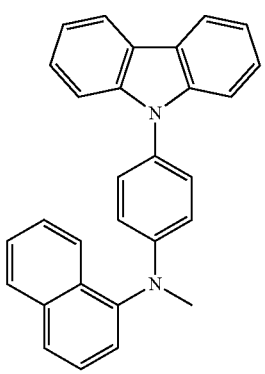
(33-3)
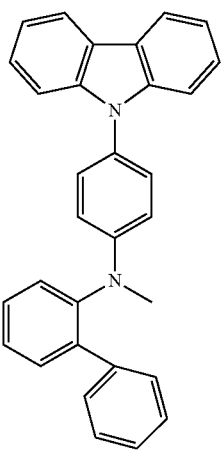
(33-6)
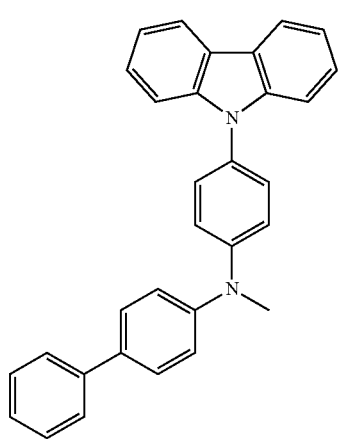
(33-4)
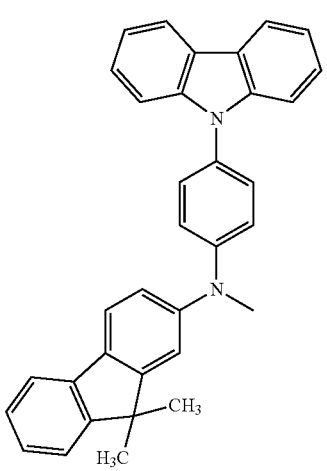
(33-7)
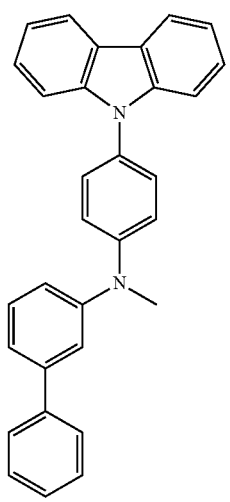
(33-5)
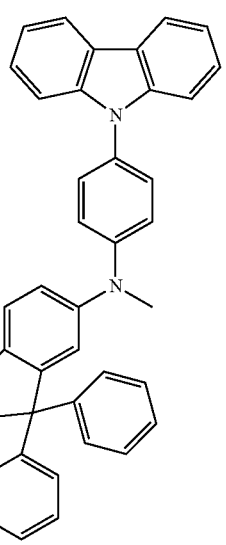
(33-8)

(33-9)
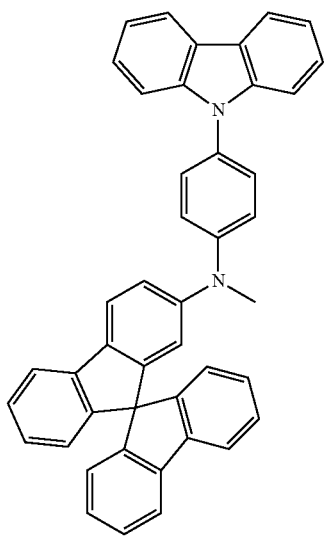
(33-10)
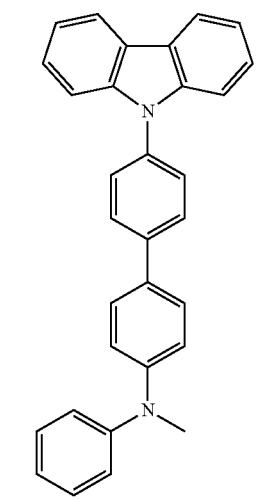
(33-11)
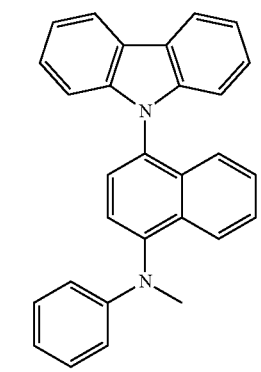
(33-12)
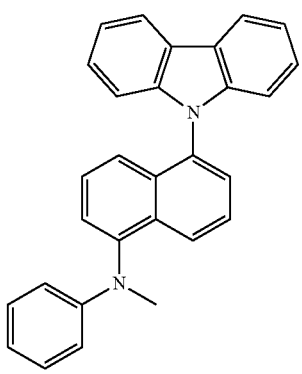
(33-13)
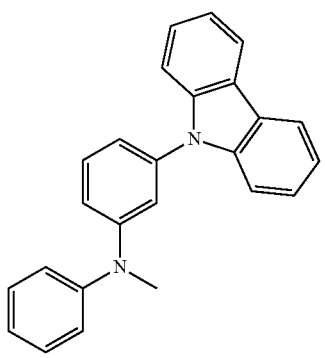
(33-14)
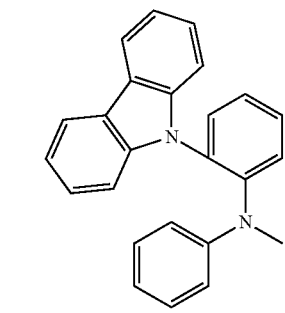
(33-15)
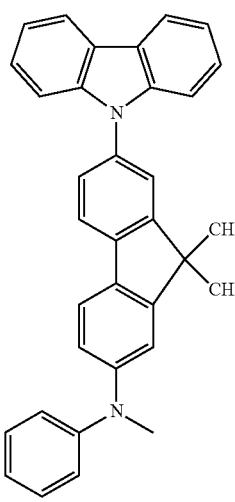

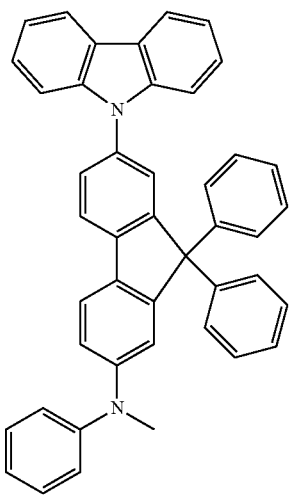
(33-16)
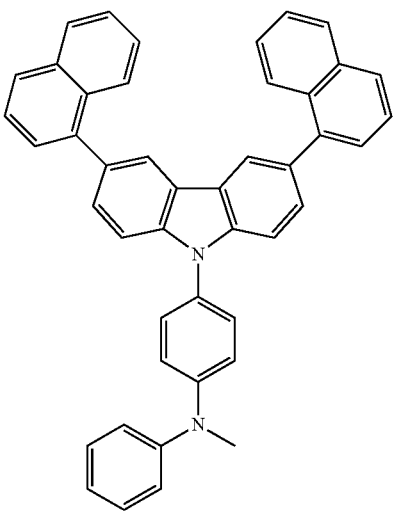
(33-19)
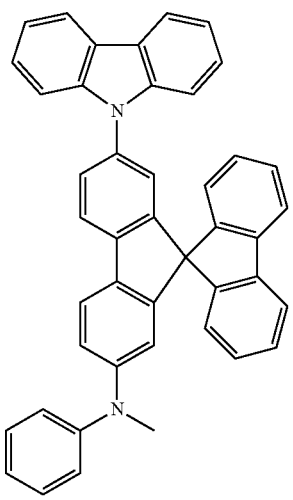
(33-17)
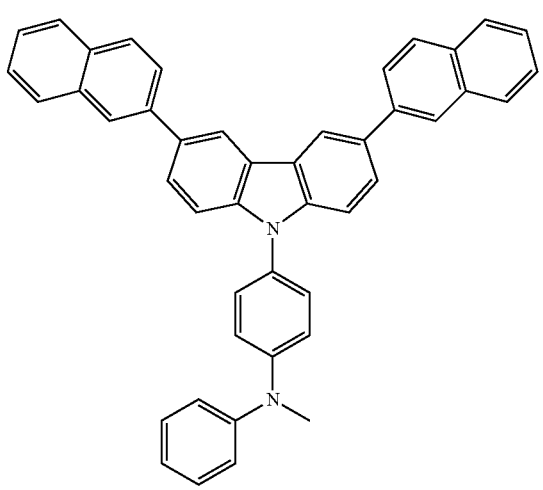
(33-20)
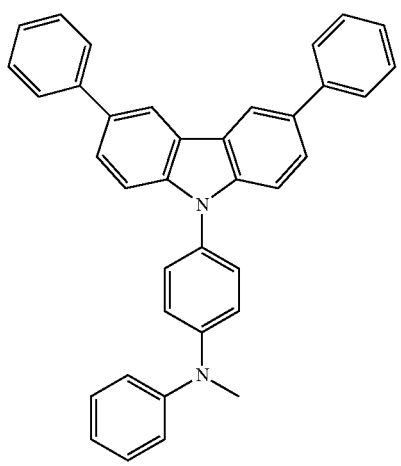
(33-18)
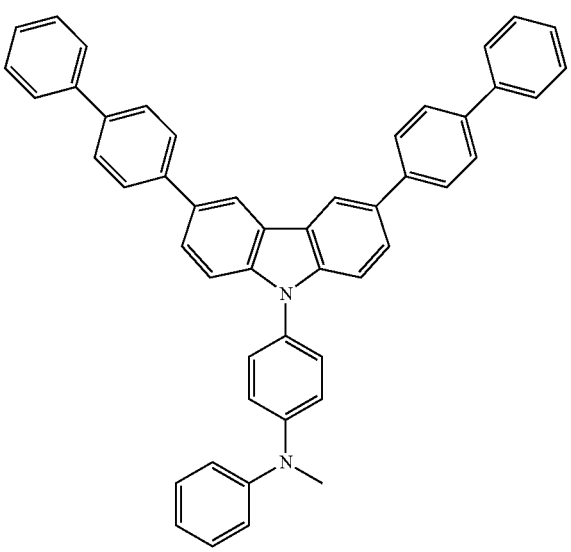
(33-21)

(33-22)
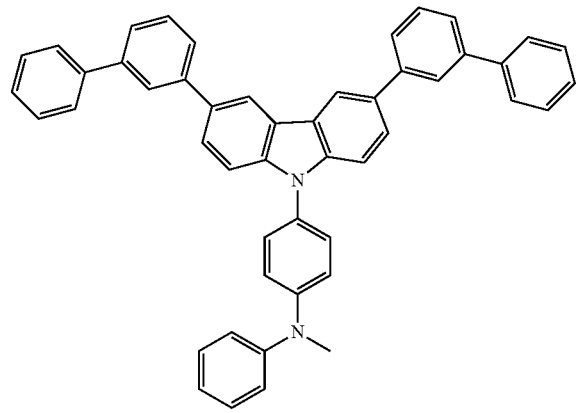
(33-25)
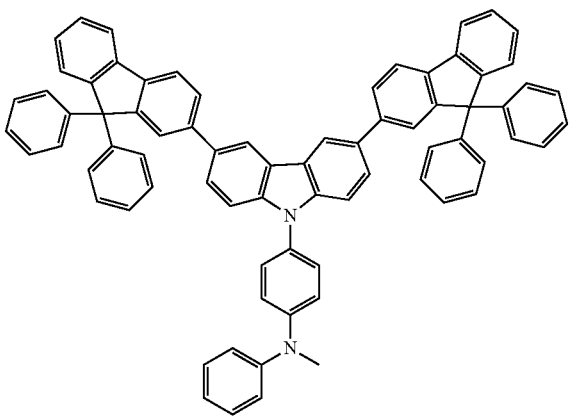
(33-23)
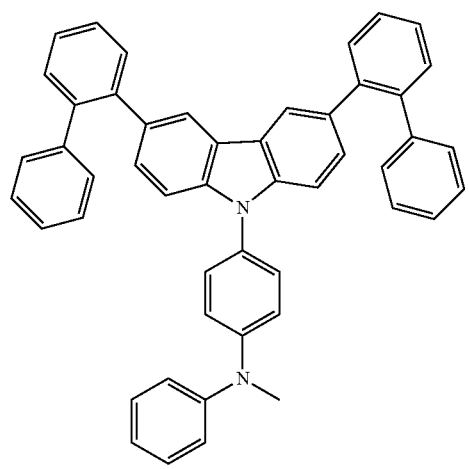
(33-26)
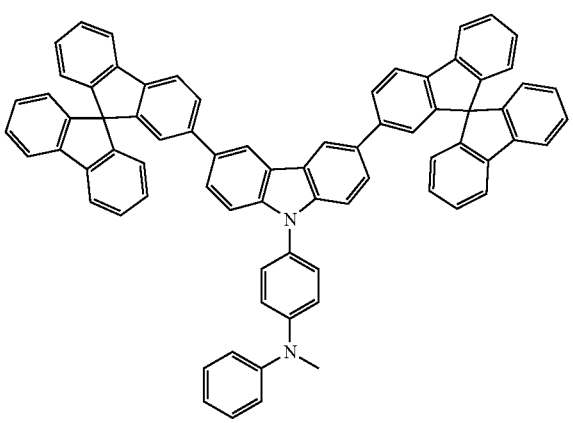
(33-24)
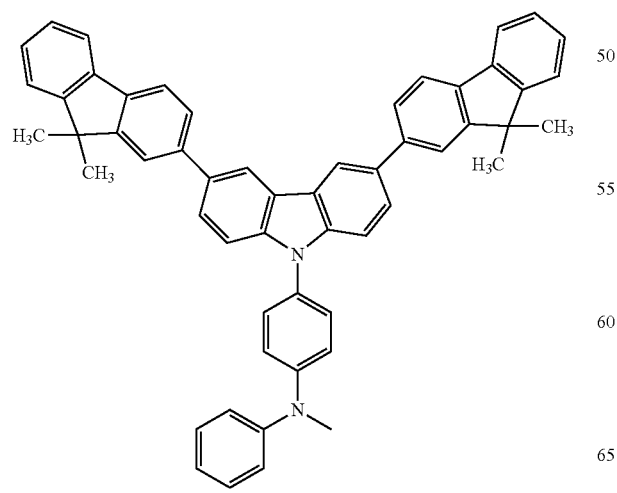
(33-27)
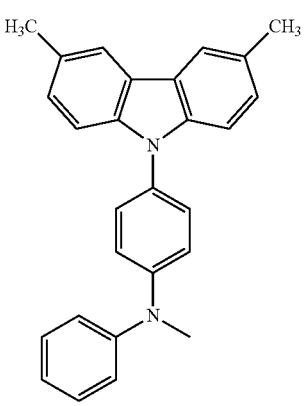

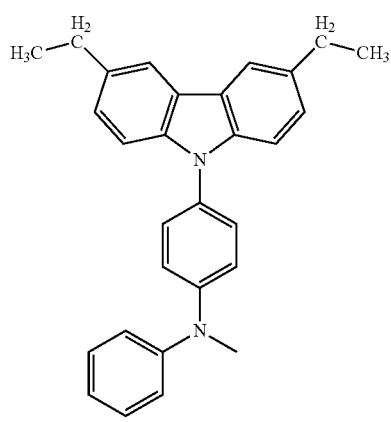
(33-28)
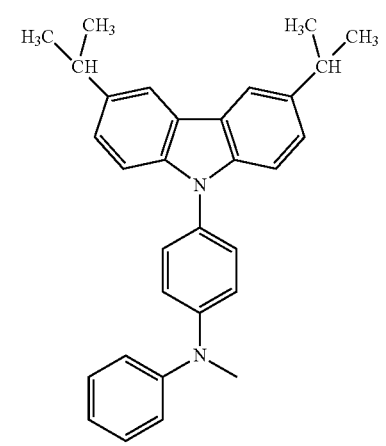
(33-29)
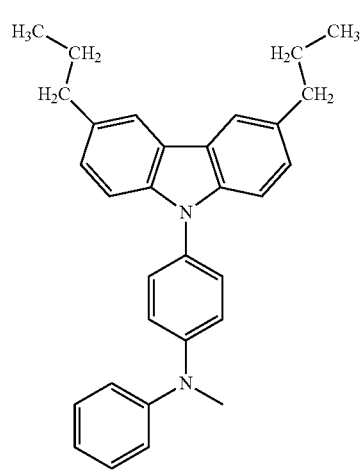
(33-30)
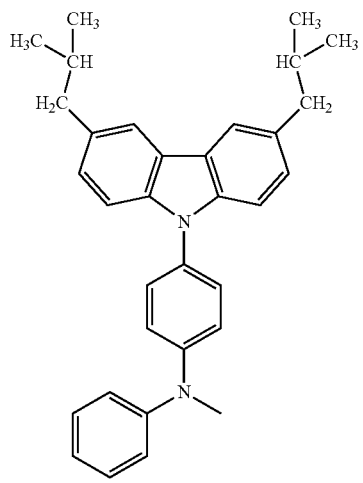
(33-31)
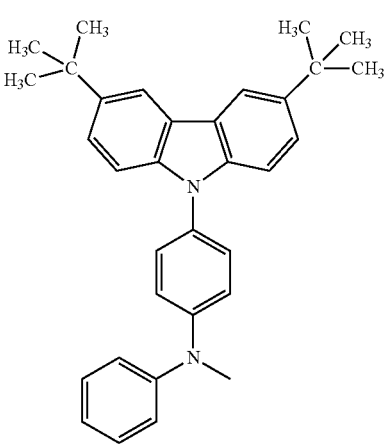
(33-32)
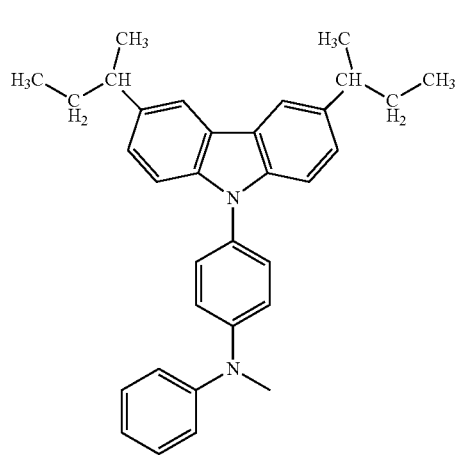
(33-33)

(33-34)

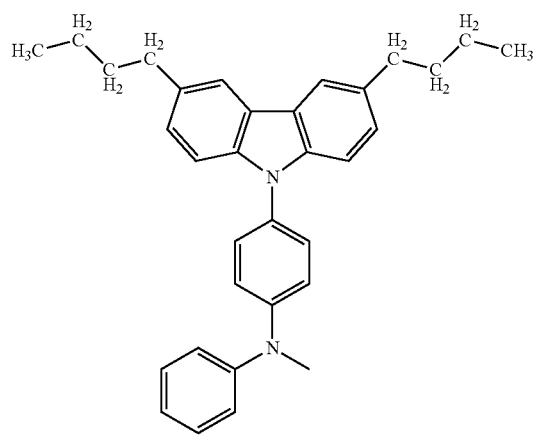

Further, among the anthracene derivatives represented by the general formula (1), an anthracene derivative represented by the general formula (2) is preferably used.

(2)

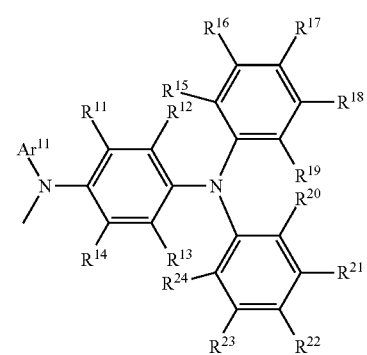

(2-1)

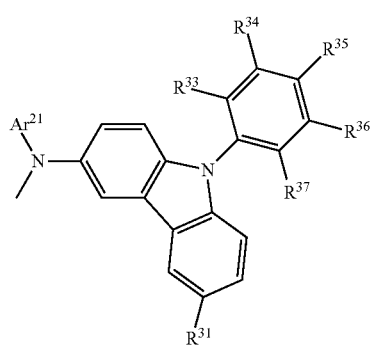

(2-2)

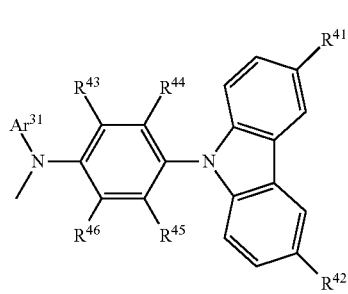

(2-3)

In the formula, $Ar^1$ and $Ar^2$ individually represent an aryl group having 6 to 25 carbon atoms; $Ar^3$ represents an arylene group having 6 to 25 carbon atoms; and A represents any of substituents represented by the general formulae (2-1) to (2-3). In the general formulae (2-1) to (2-3), $Ar^{11}$ represents an aryl group having 6 to 25 carbon atoms; $R^{11}$ to $R^{24}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $R^{33}$ to $R^{37}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{31}$ represents an aryl group having 6 to 25 carbon atoms; $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms; and $R^{43}$ to $R^{46}$ individually represent any of a hydrogen atom, an alkyl group having 1 to 4 carbon atoms, an aryl group having 6 to 15 carbon atoms, a halogen atom, and a haloalkyl group having 1 to 4 carbon atoms.

Further, among the anthracene derivatives represented by the general formula (1), an anthracene derivative represented by the general formula (3) is preferably used.

(3)

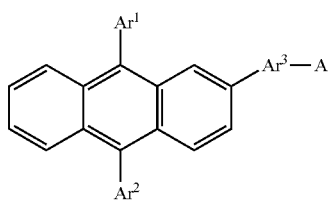

(3-1)

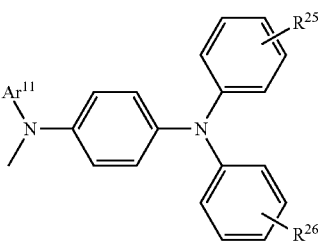

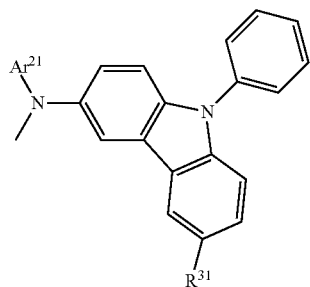
(3-2)

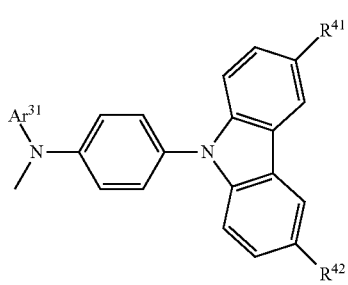
(3-3)

In the formula, $Ar^1$ and $Ar^2$ individually represent an aryl group having 6 to 25 carbon atoms; $Ar^3$ represents an arylene group having 6 to 25 carbon atoms; and A represents any of substituents represented by the general formulae (3-1) to (3-3). In the general formulae (3-1) to (3-3), $Ar^{11}$ represents an aryl group having 6 to 25 carbon atoms; $R^{25}$ and $R^{26}$ individually represent any of a hydrogen atom, an alkyl group having 1 to 4 carbon atoms, an aryl group having 6 to 15 carbon atoms, a halogen atom, and a haloalkyl group having 1 to 4 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; $Ar^{31}$ represents an aryl group having 6 to 25 carbon atoms; and $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms.

Further, among the anthracene derivatives represented by the general formula (1), an anthracene derivative represented by the general formula (4) is preferably used.

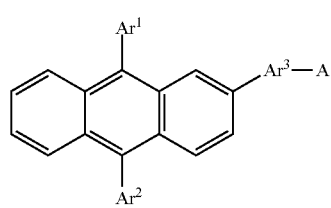
(4)

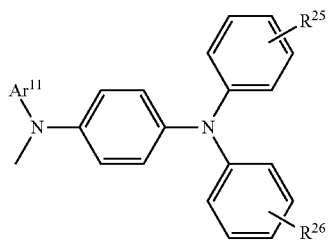
(4-1)

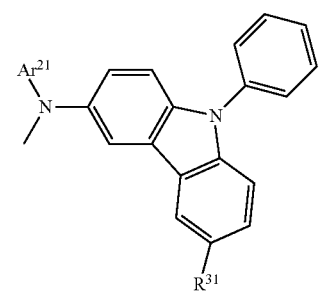
(4-2)

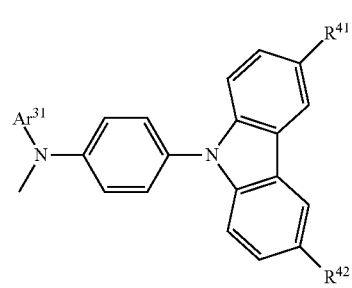
(4-3)

In the formula, $Ar^1$ and $Ar^2$ individually represent an aryl group having 6 to 25 carbon atoms; $Ar^3$ represents an arylene group having 6 to 25 carbon atoms; and A represents any of substituents represented by the general formulae (4-1) to (4-3). In general formulae (4-1) to (4-3), $Ar^{11}$ represents any of a phenyl group, a 1-naphthyl group, and a 2-naphthyl group; $R^{25}$ and $R^{26}$ individually represent any of a hydrogen atom, an alkyl group having 1 to 4 carbon atoms, and an aryl group having 6 to 15 carbon atoms; $Ar^{21}$ represents any of a phenyl group, a 1-naphthyl group, and a 2-naphthyl group; $R^{31}$ represents any of a hydrogen atom, an alkyl group having 1 to 4 carbon atoms, and an aryl group having 6 to 25 carbon atoms; $Ar^{31}$ represents any of a phenyl group, a 1-naphthyl group, and a 2-naphthyl group; and $R^{41}$ and $R^{42}$ individually represent any of a hydrogen atom, an alkyl group having 1 to 4 carbon atoms, and an aryl group having 6 to 25 carbon atoms.

Further, among the anthracene derivatives represented by the general formula (1), an anthracene derivative represented by the general formula (5) is preferably used.

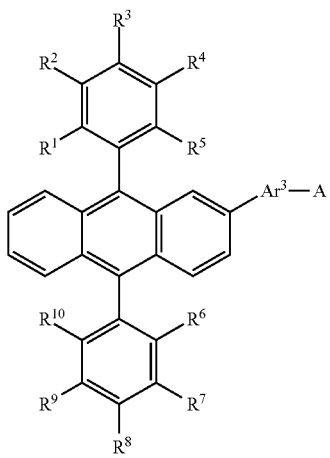

(5)

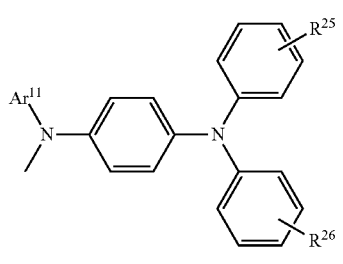

(5-1)

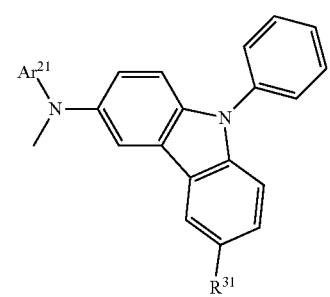

(5-2)

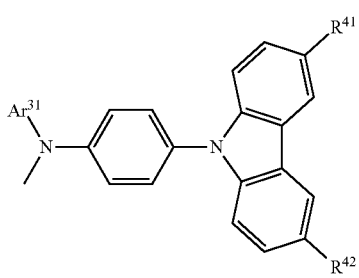

(5-3)

In the formula, $R^1$ to $R^{10}$ individually represent a hydrogen atom; an alkyl group having 1 to 4 carbon atoms; an aryl group having 6 to 15 carbon atoms; a halogen atom; a haloalkyl group having 1 to 4 carbon atoms; $Ar^3$ represents an arylene group having 6 to 25 carbon atoms; and A represents any of substituents represented by the general formulae (5-1) to (5-3). In the general formulae (5-1) to (5-3), $Ar^{11}$ represents any of a phenyl group, a 1-naphthyl group, and a 2-naphthyl group; $R^{25}$ and $R^{26}$ individually represent any of a hydrogen atom, an alkyl group having 1 to 4 carbon atoms, and an aryl group having 6 to 15 carbon atoms; $Ar^{21}$ represents any of a phenyl group, a 1-naphthyl group, and a 2-naphthyl group; $R^{31}$ represents any of a hydrogen atom, an alkyl group having 1 to 4 carbon atoms, and an aryl group having 6 to 25 carbon atoms; $Ar^{31}$ represents any of a phenyl group, a 1-naphthyl group, and a 2-naphthyl group; and $R^{41}$ and $R^{42}$ individually represent any of a hydrogen atom, an alkyl group having 1 to 4 carbon atoms, and an aryl group having 6 to 25 carbon atoms.

In the general formulae (1) to (5), $Ar^3$ is preferably any of the substituents represented by the general formulae (11-1) to (11-5) in terms of ease of synthesis.

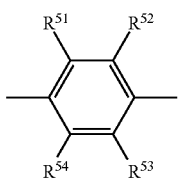

(11-1)

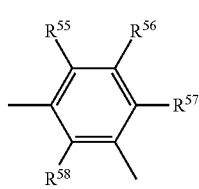

(11-2)

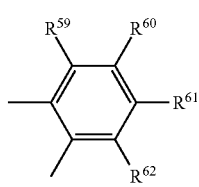

(11-3)

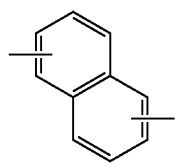

(11-4)

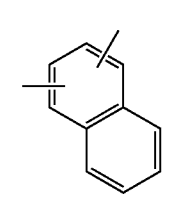

(11-5)

In the formula, $R^{51}$ to $R^{62}$ individually represent any of a hydrogen atom, an alkyl group having 1 to 4 carbon atoms, an aryl group having 6 to 15 carbon atoms, a halogen atom, and a haloalkyl group having 1 to 4 carbon atoms.

Further, in the general, formulae (1) to (5), $Ar^1$ and $Ar^2$ are preferably substituents having the same structure in terms of ease of synthesis.

Specific examples of the anthracene derivatives described above include, but are not limited to, anthracene derivatives represented by structural formulae (101) to (223).

(101)
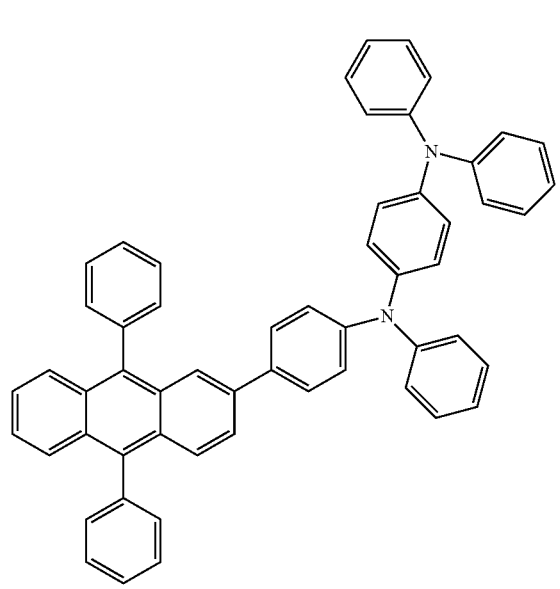
(102)
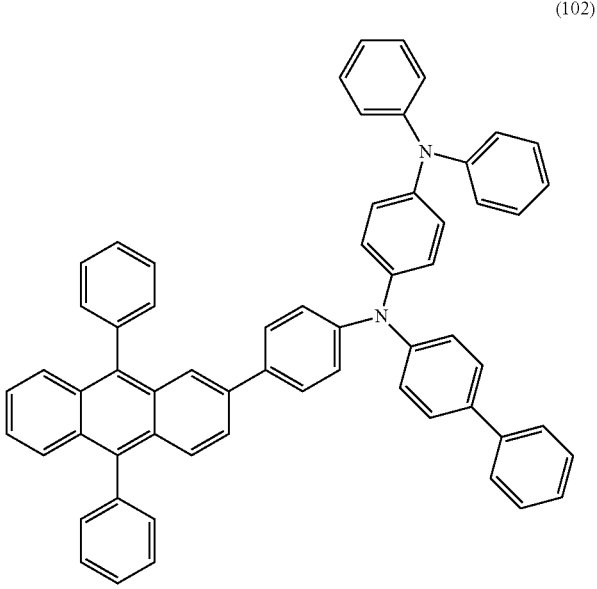
(103)
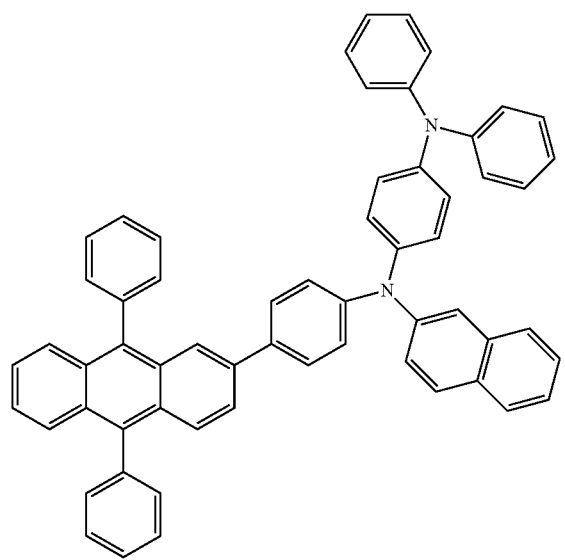
(104)
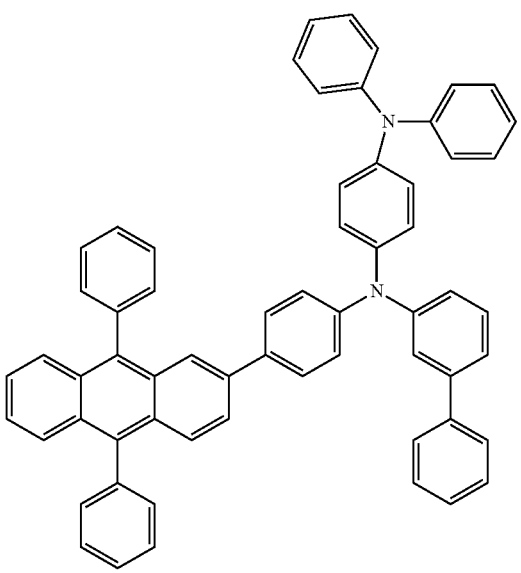

-continued
(105)
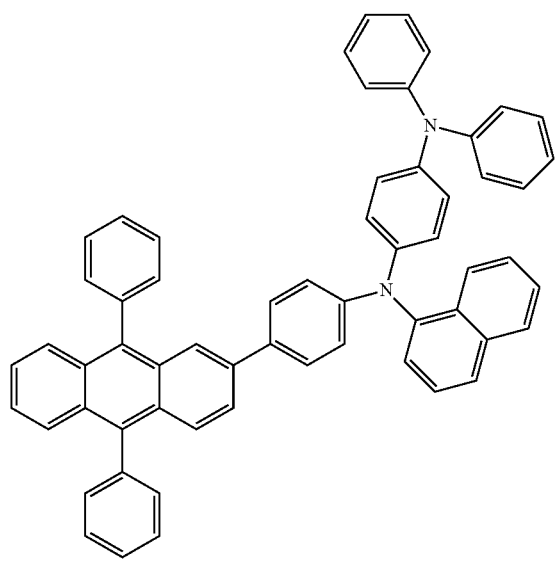
(106)
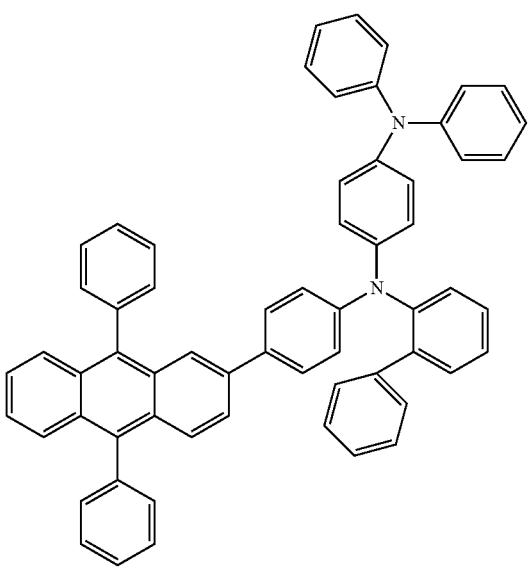
(107)
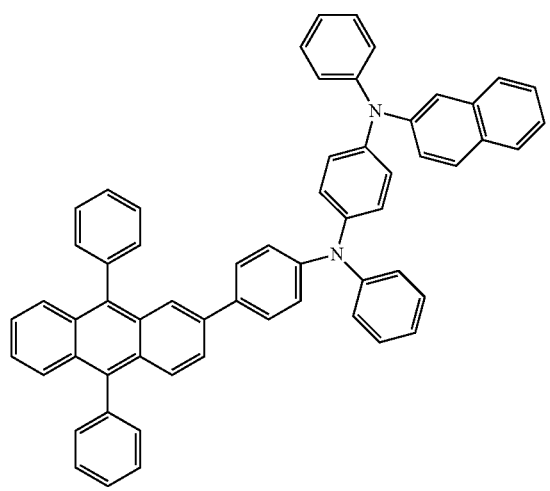
(108)
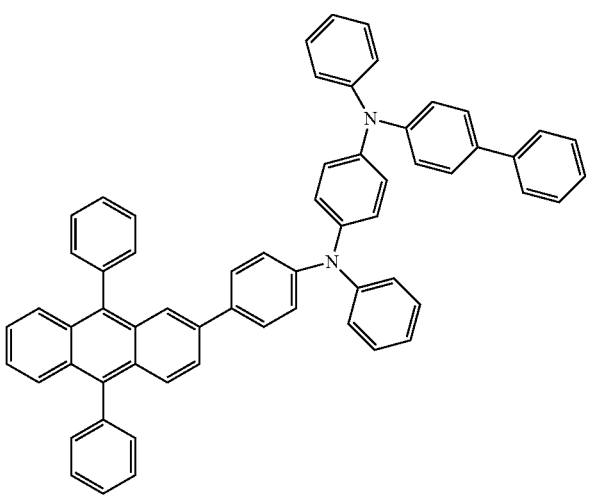
(109)
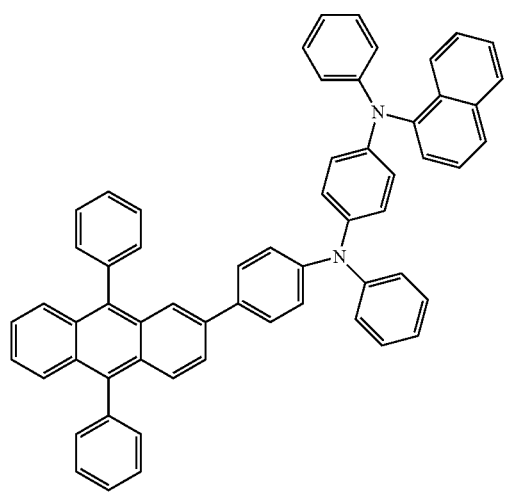
(110)
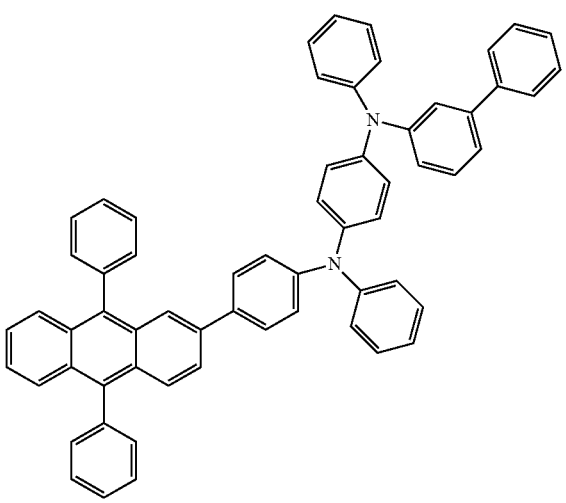

-continued
(111)
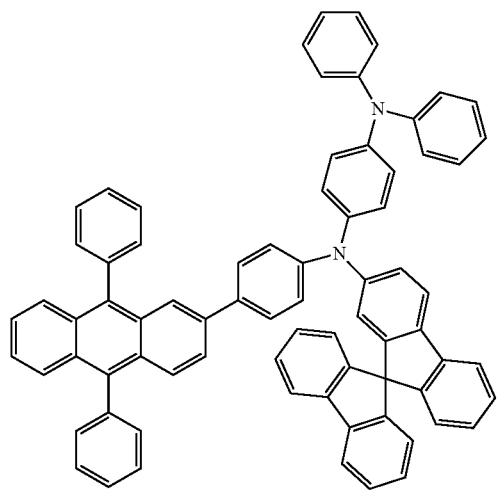
(112)
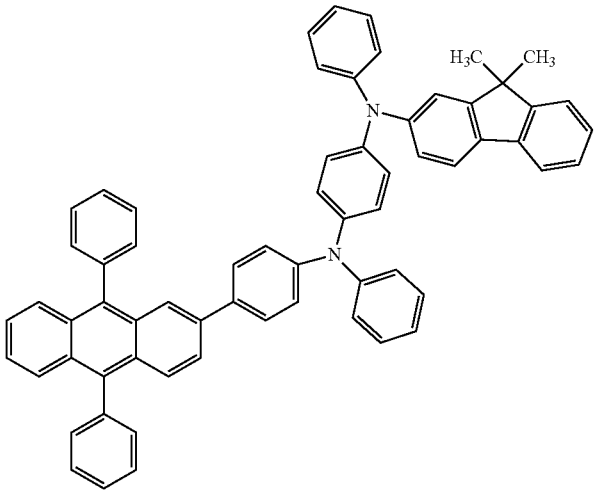
(113)
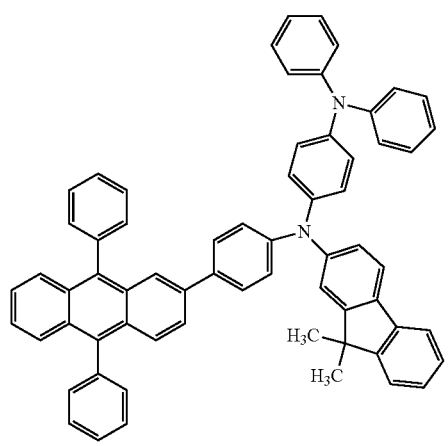
(114)
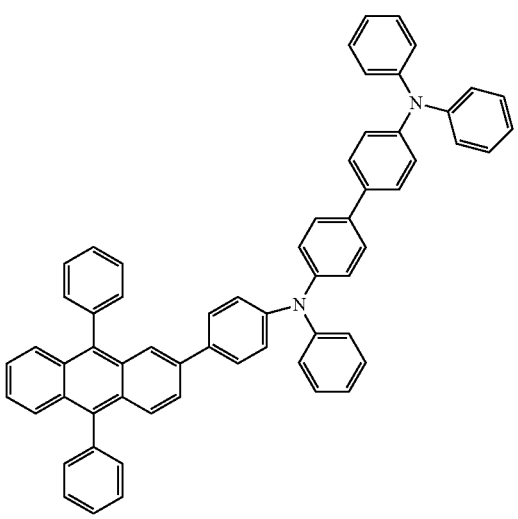
(115)
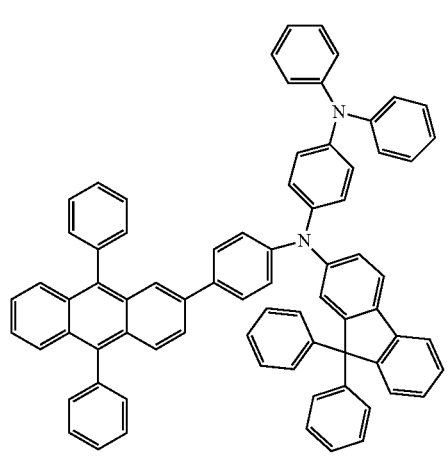
(116)
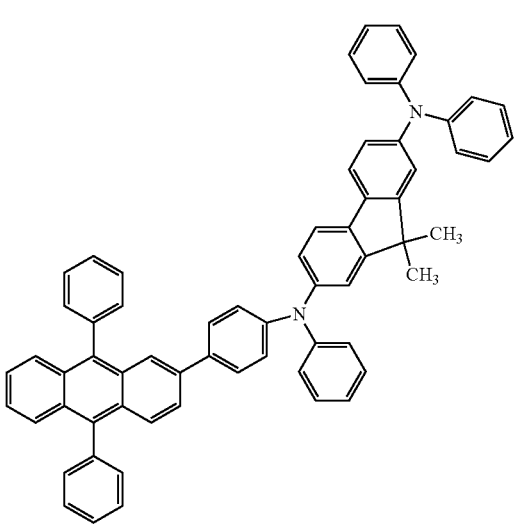

-continued
(117) 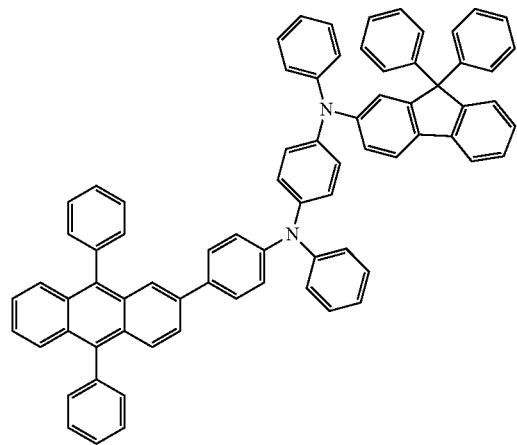
(118) 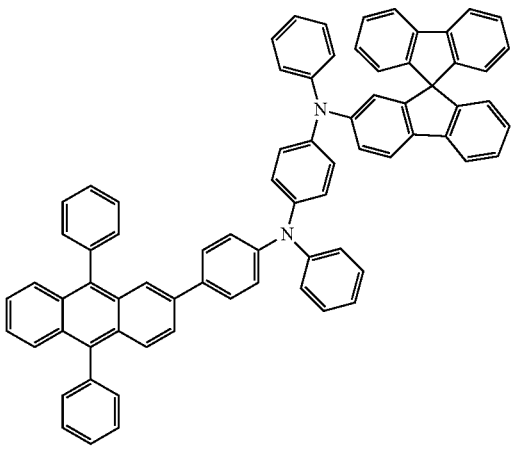
(119) 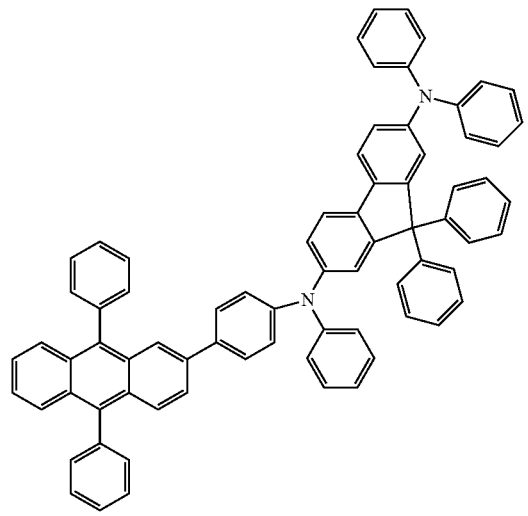
(120) 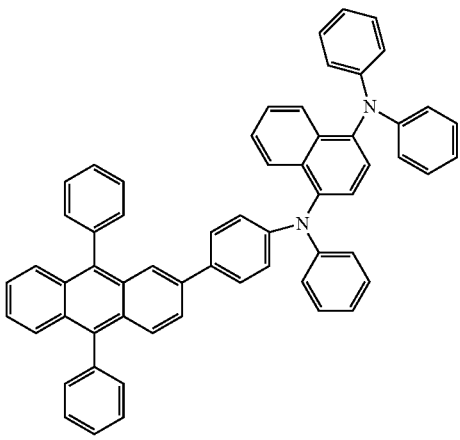
(121) 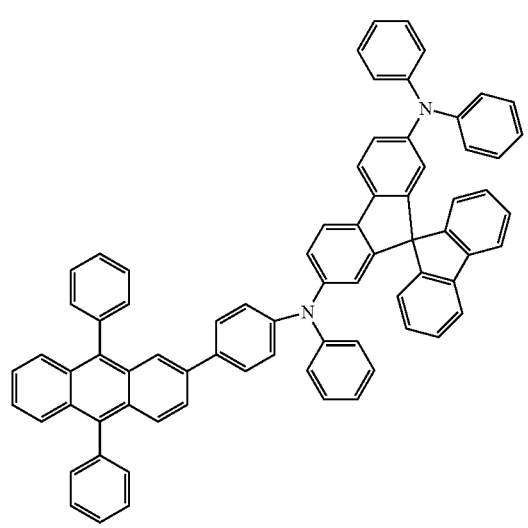
(122) 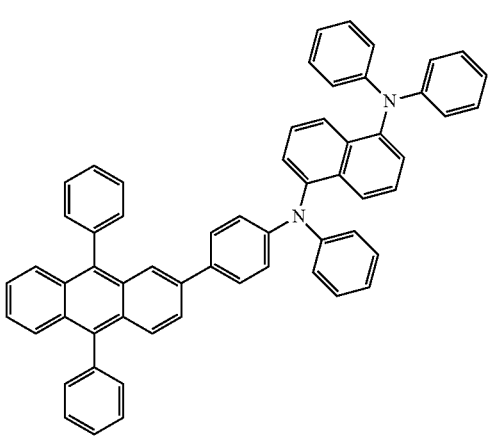

-continued
(123)
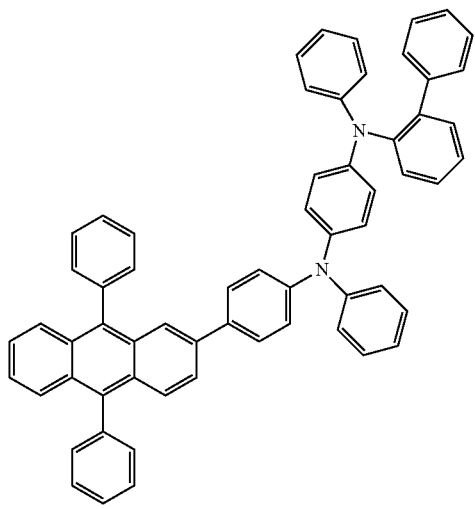
(124)
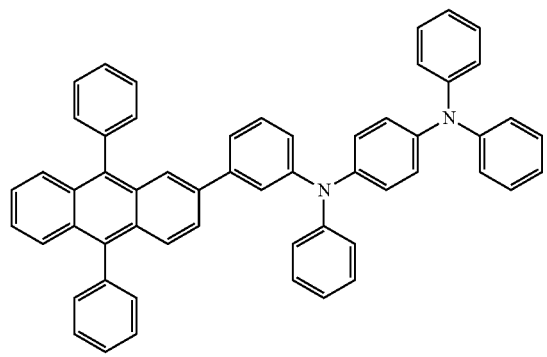
(125)
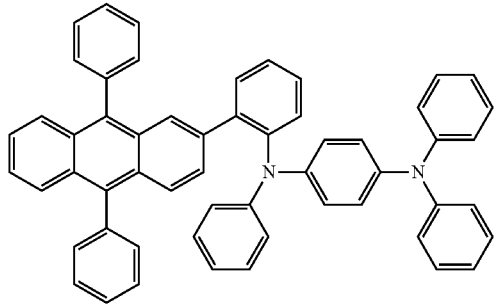
(126)
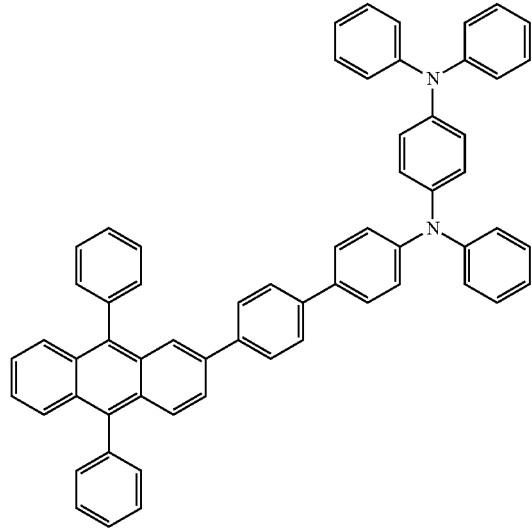
(127)
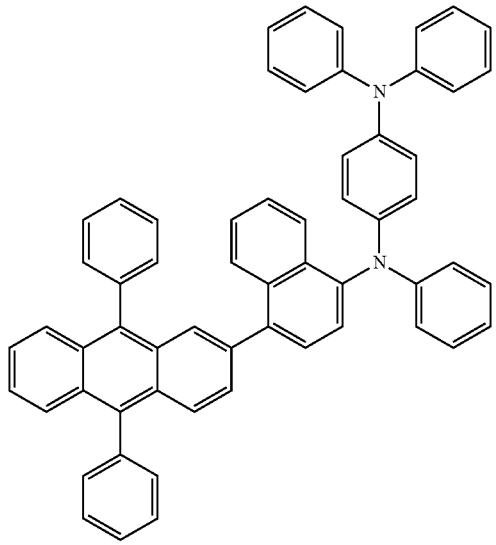
(128)
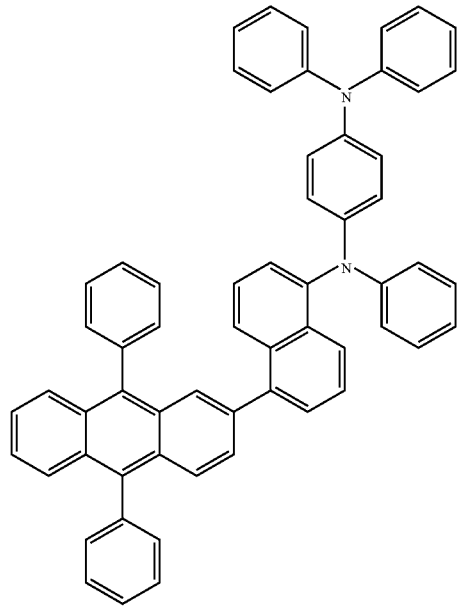

-continued
(129)
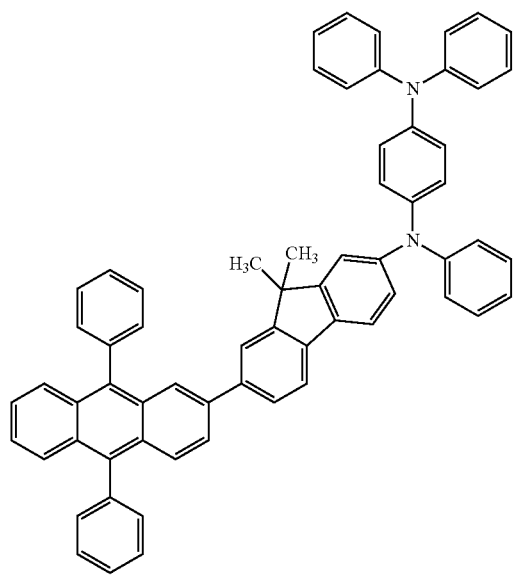
(130)
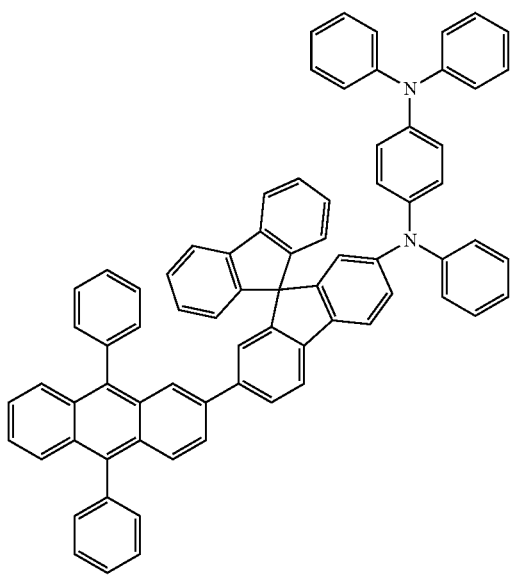
(131)
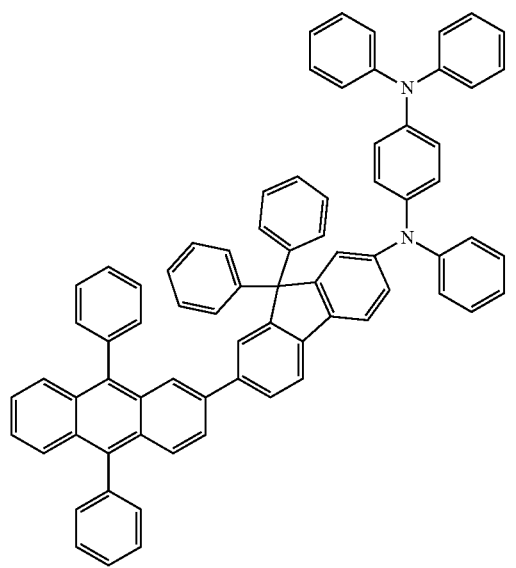
(132)
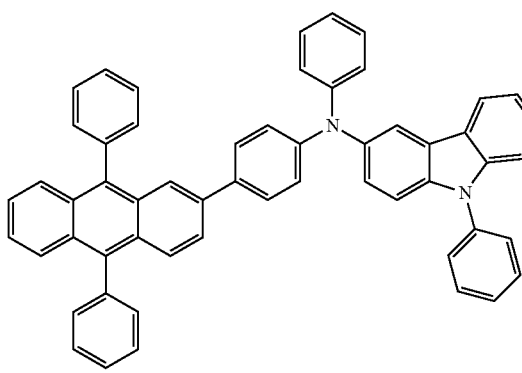
(133)
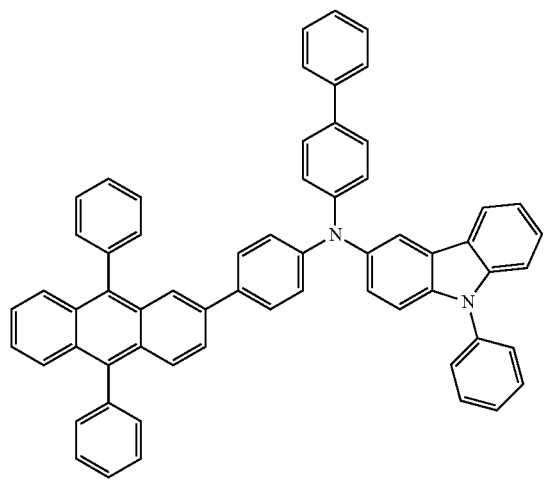
(134)
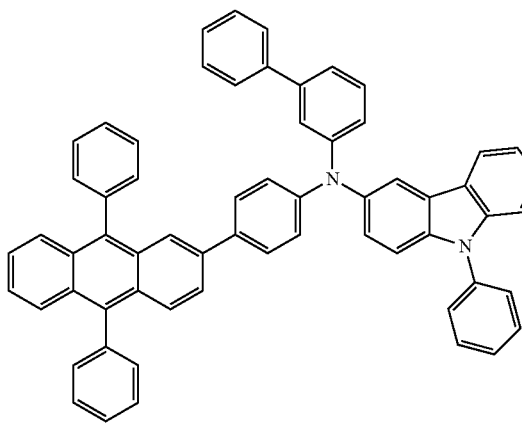

(135)
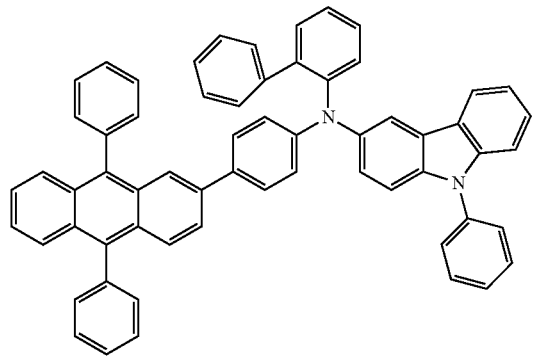
(136)
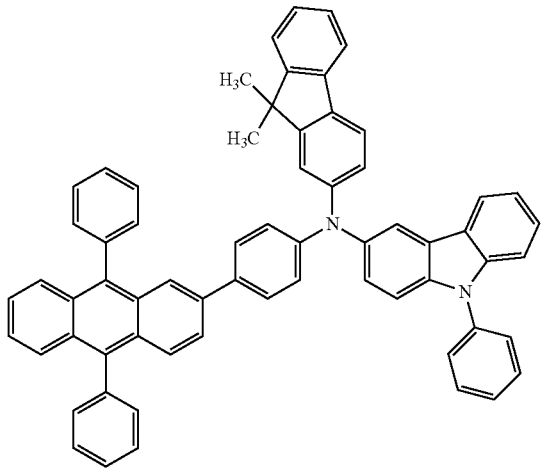
(137)
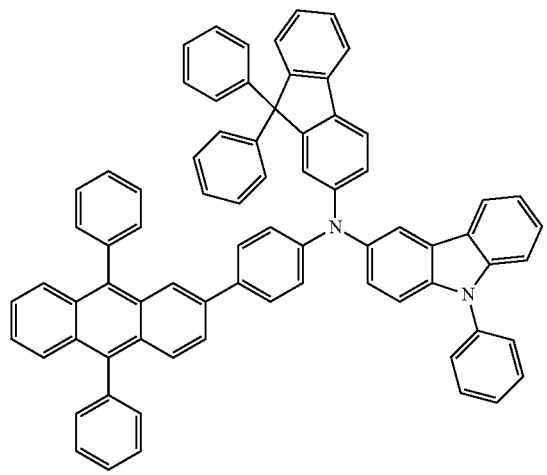
(138)
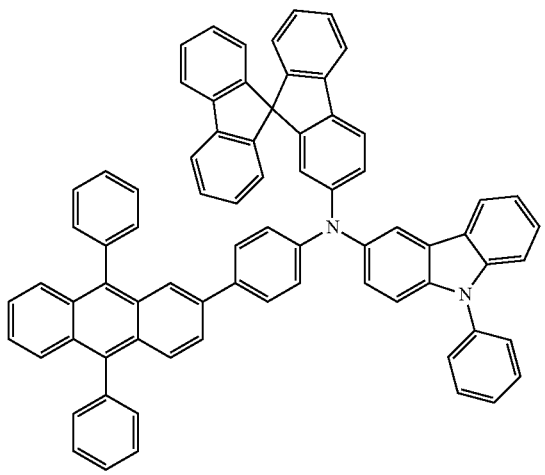
(139)
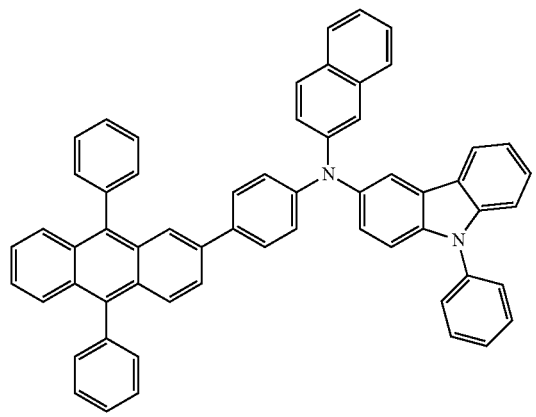
(140)
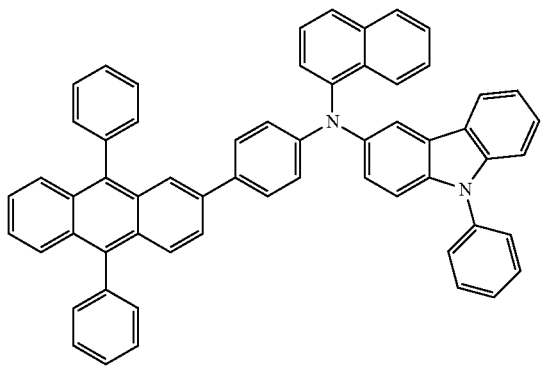

-continued
(141)
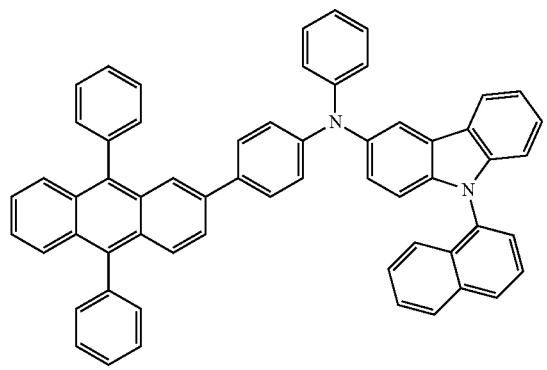
(142)
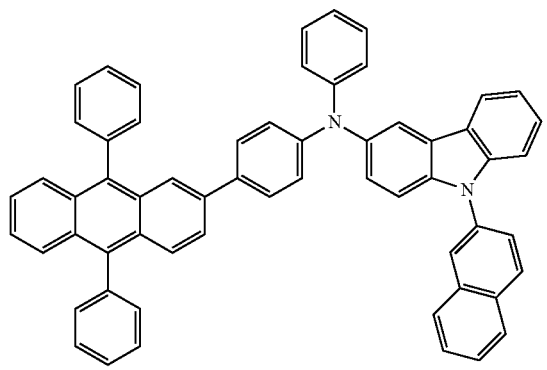
(143)
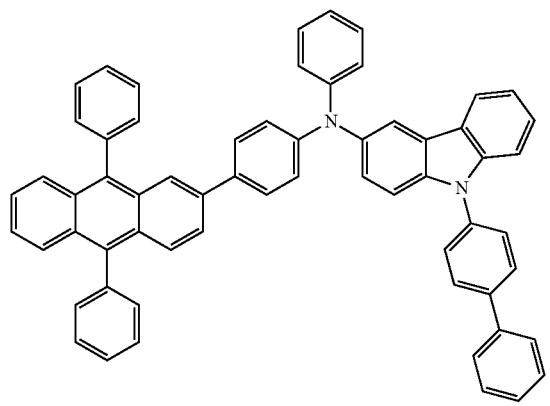
(144)
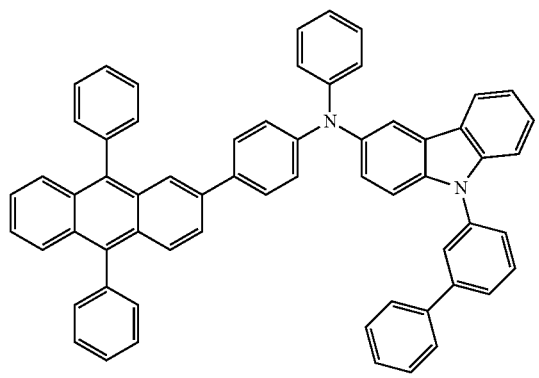
(145)
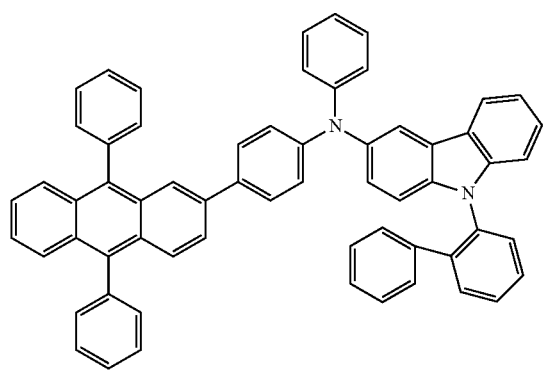
(146)
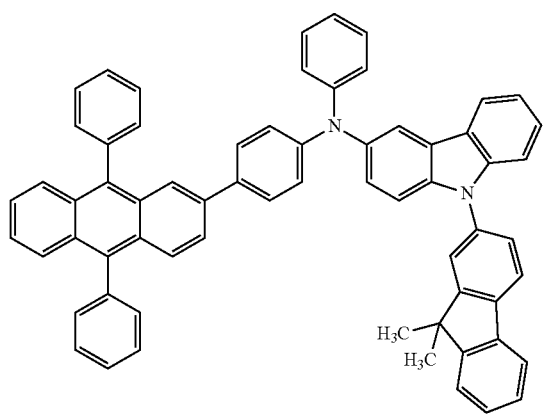

-continued
(147)
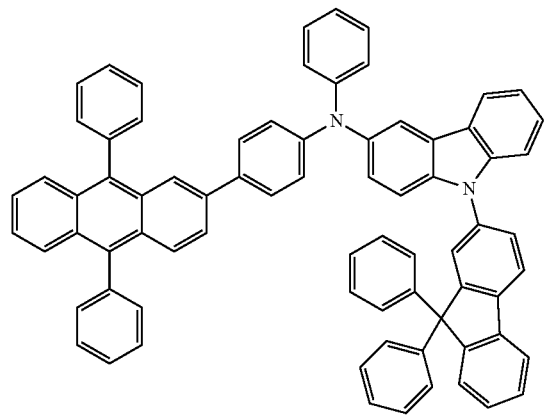
(148)
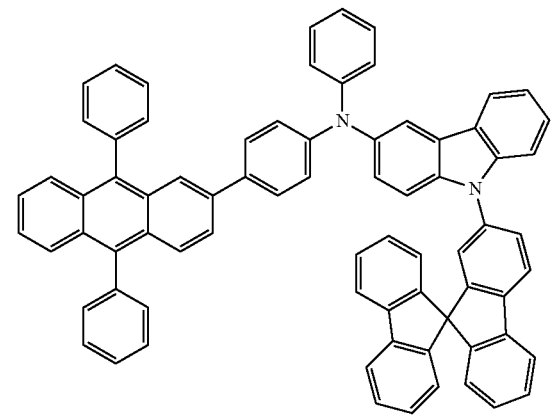
(149)
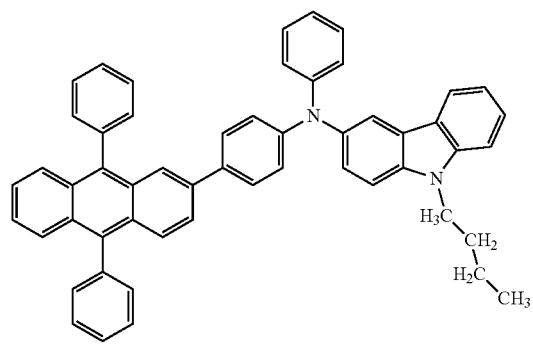
(150)
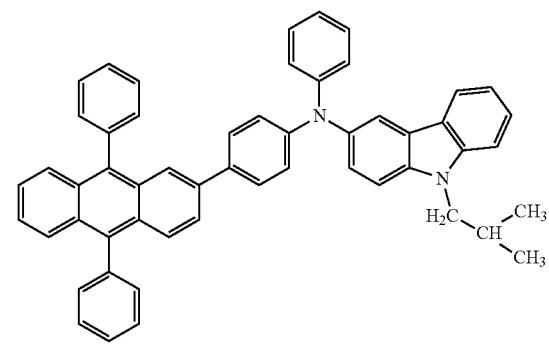
(151)
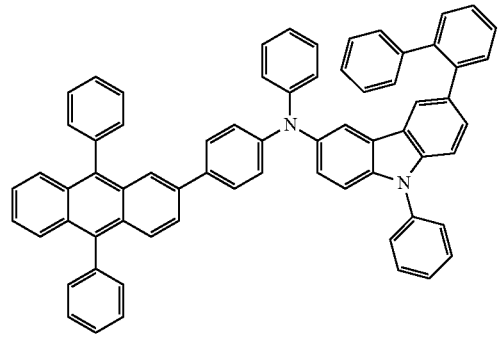
(152)
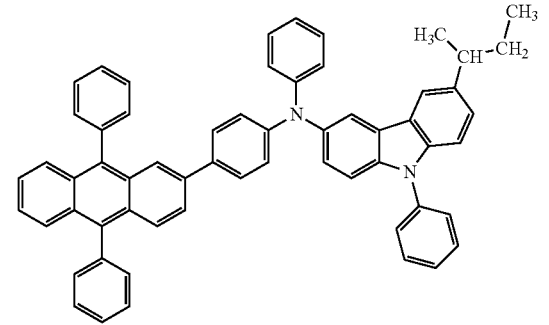
(153)
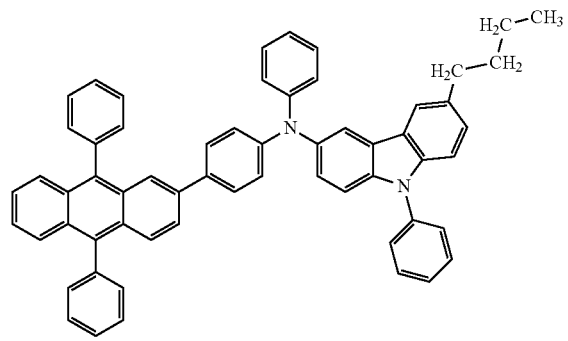
(154)
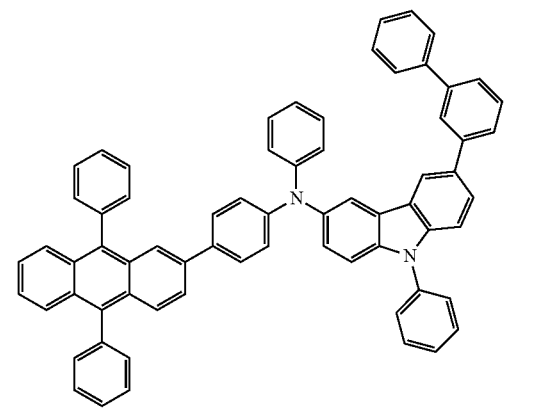

-continued
(155)
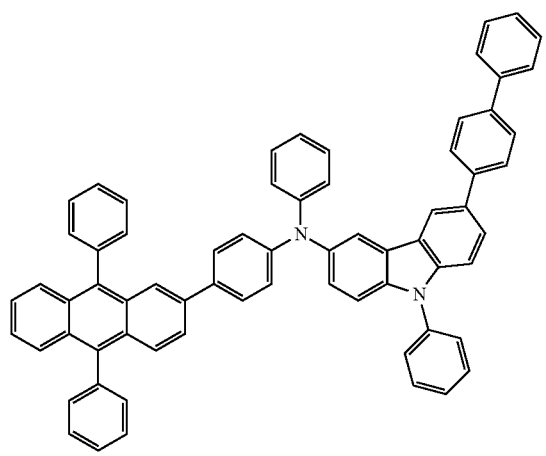
(156)
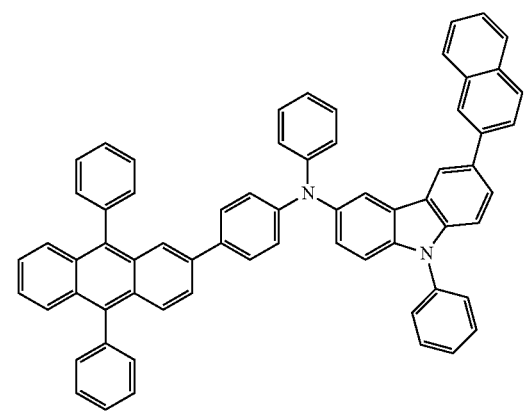
(157)
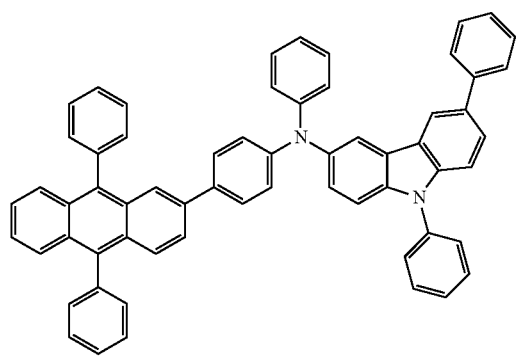
(158)
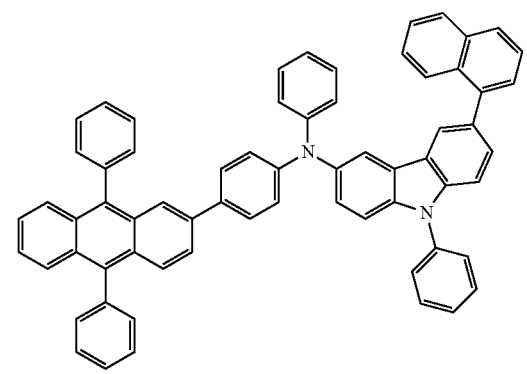
(159)
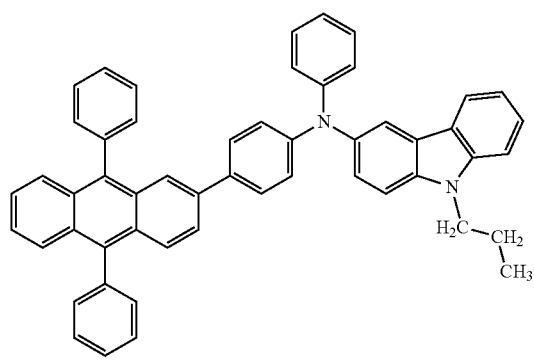
(160)
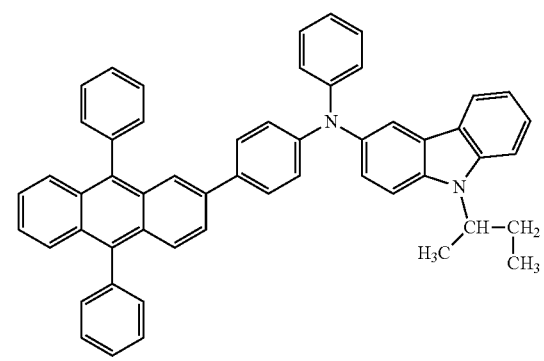
(161)
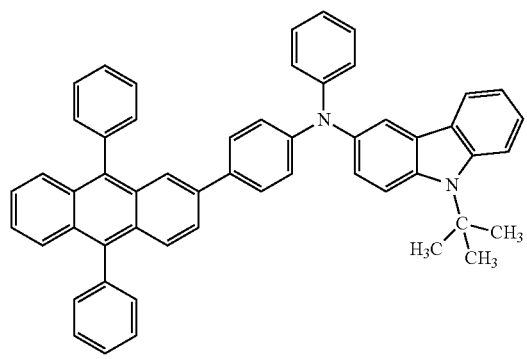
(162)
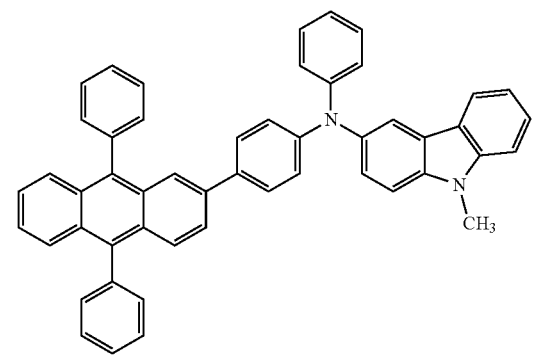

-continued
(163)
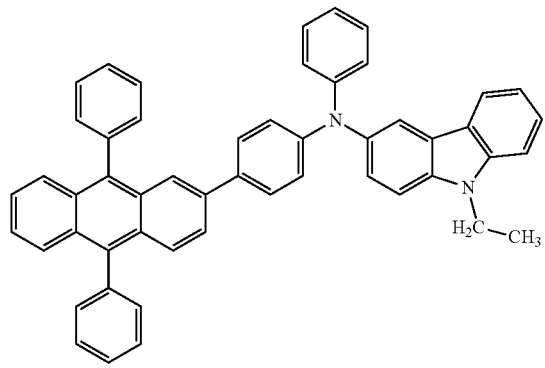
(164)
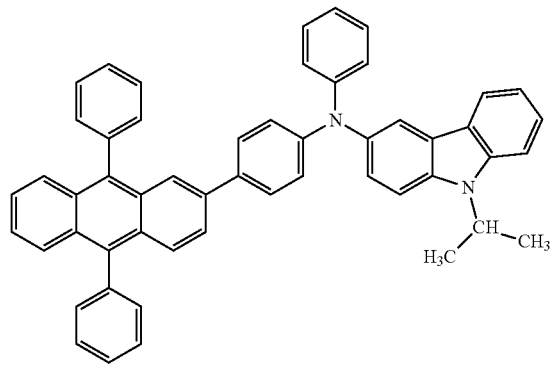
(165)
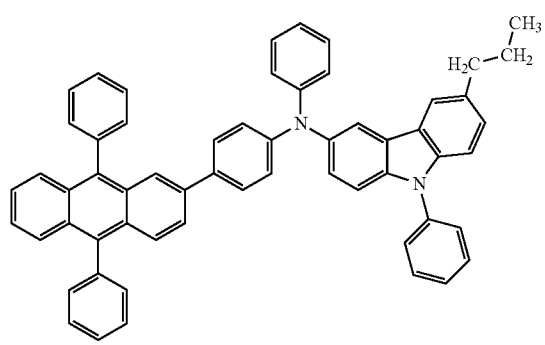
(166)
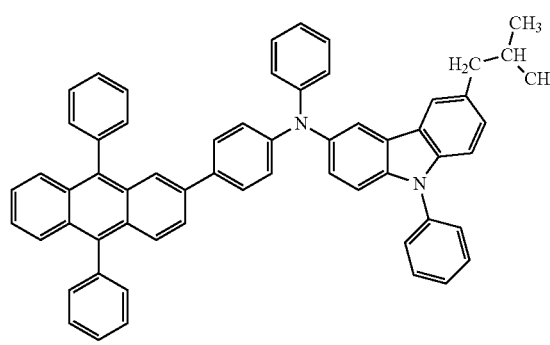
(167)
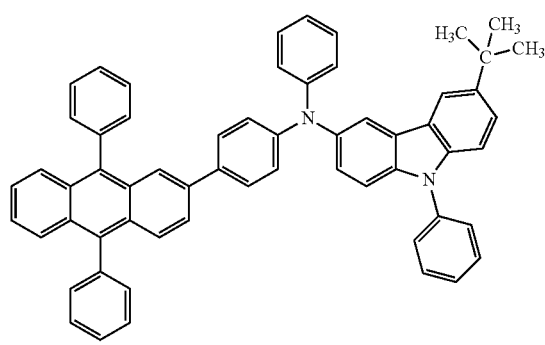
(168)
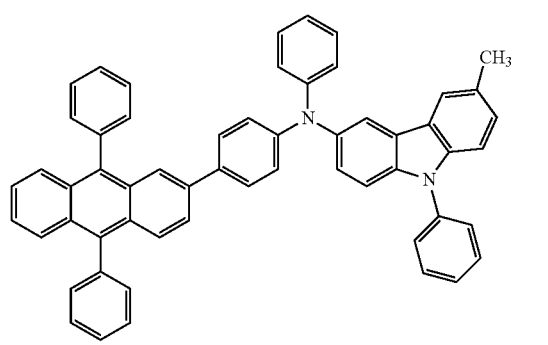
(169)
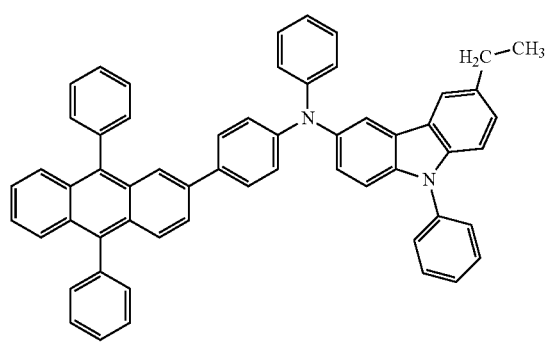
(170)
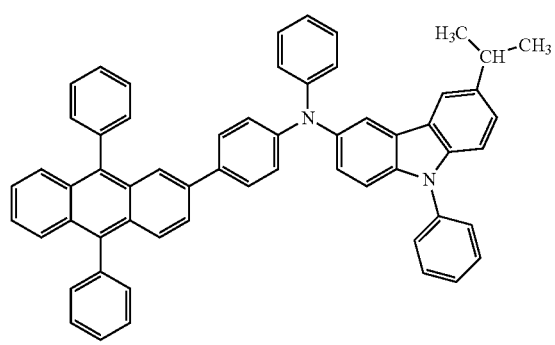

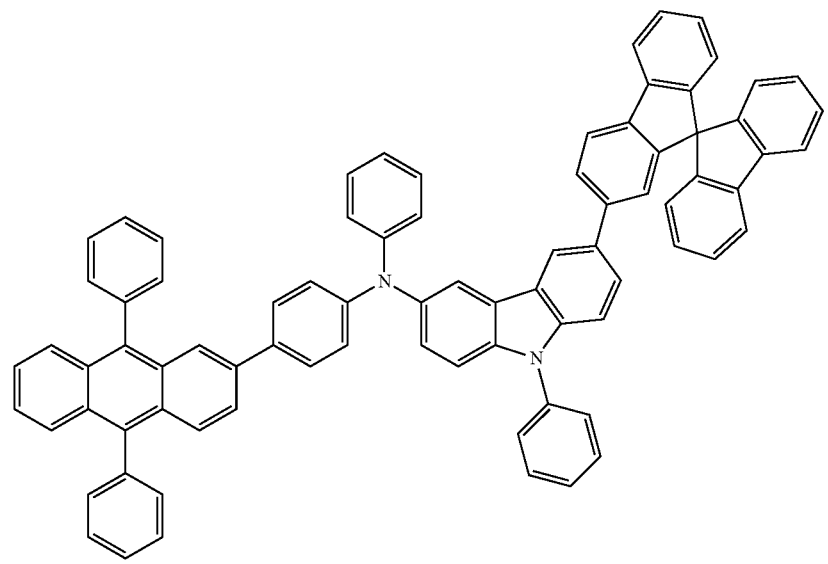
(171)
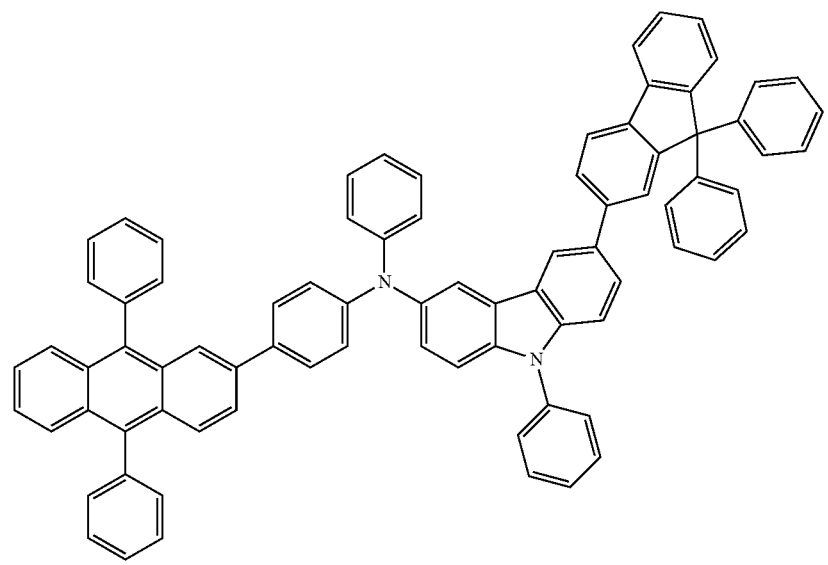
(172)

(173)
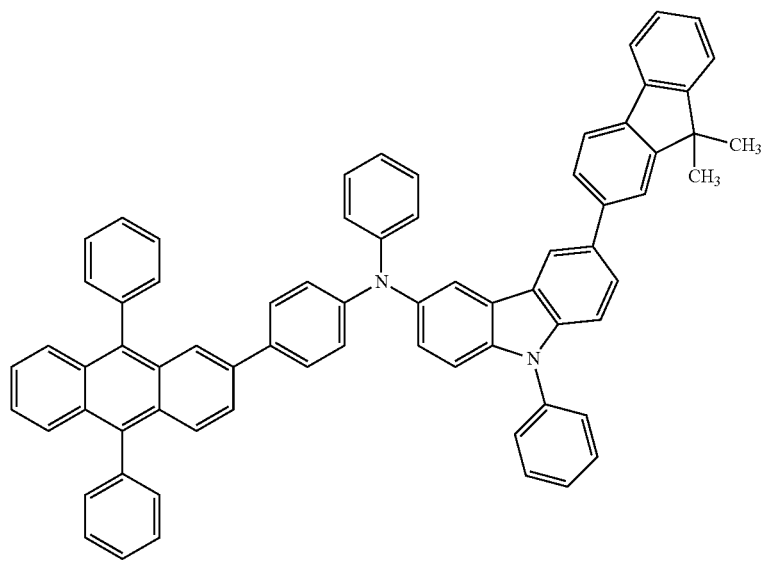
(174)
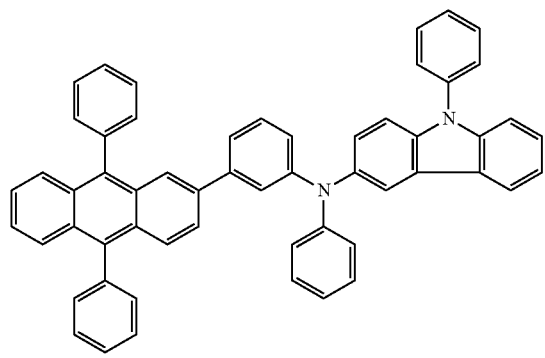
(175)
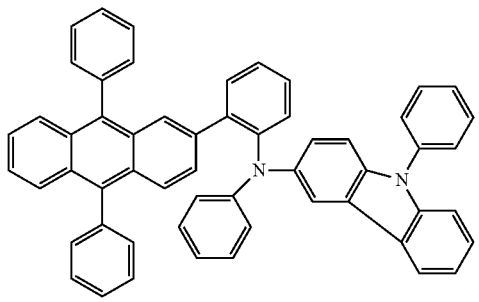
(176)
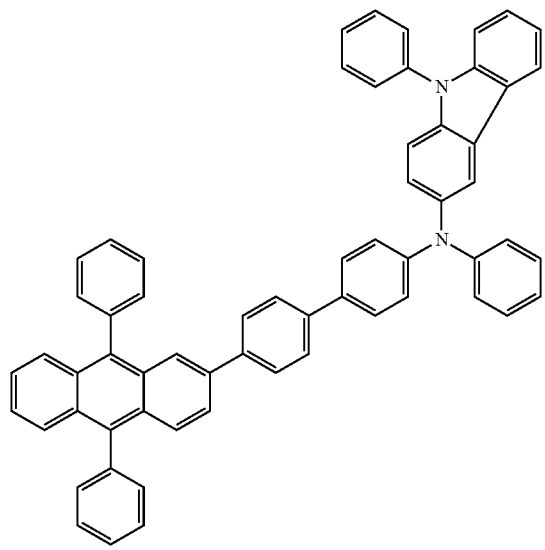
(177)
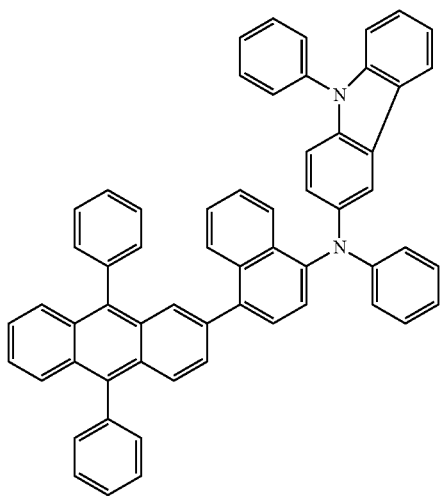

-continued
(178)
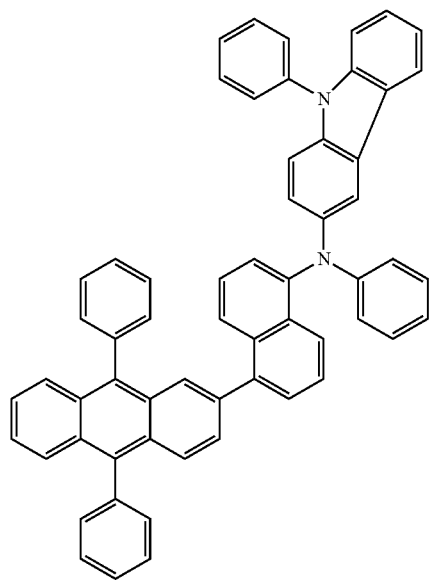
(179)
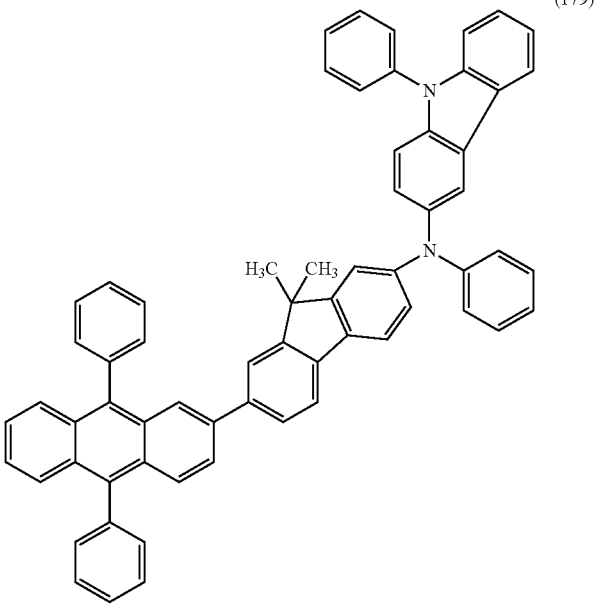
(180)
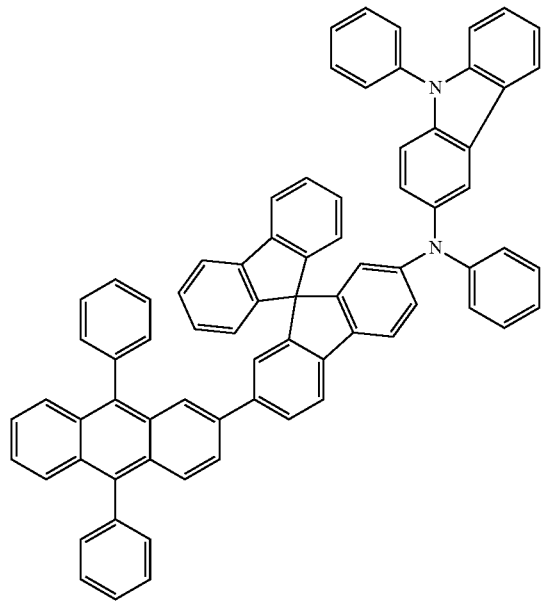
(181)
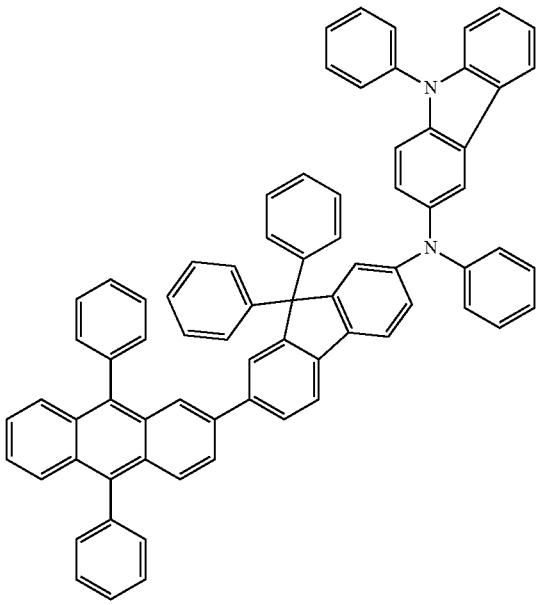
(182)
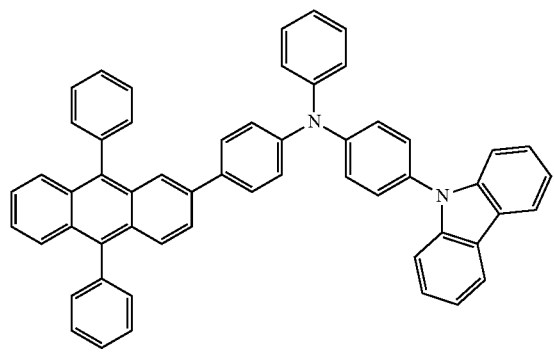
(183)
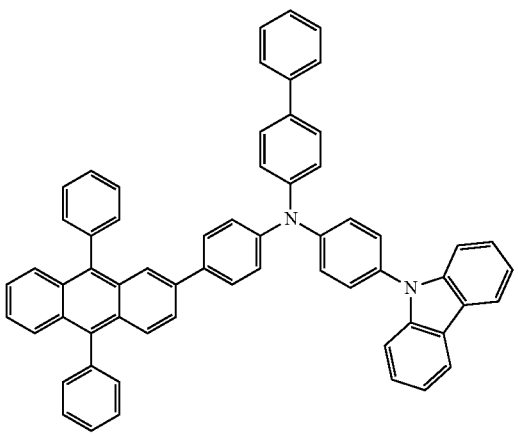

-continued
(184)
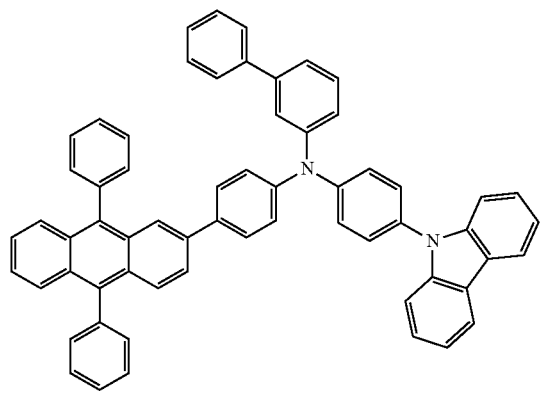
(185)
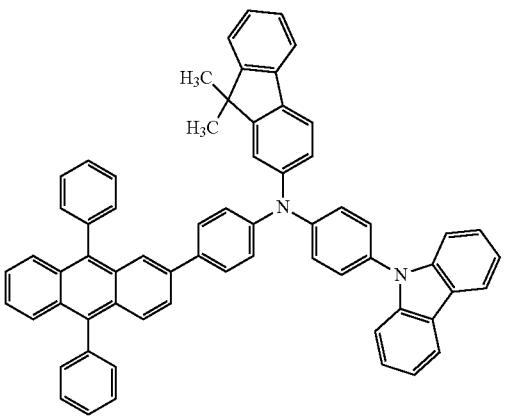
(186)
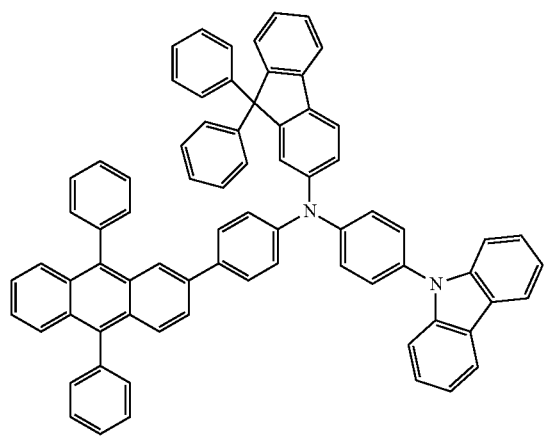
(187)
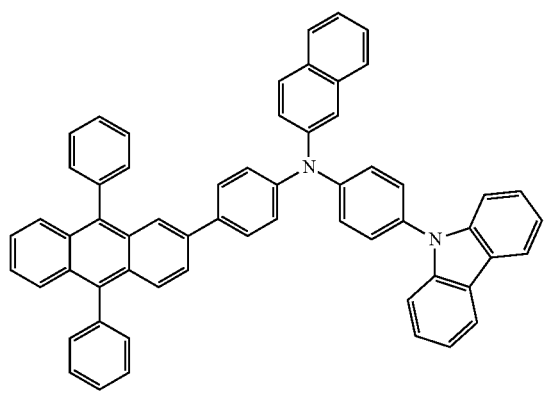
(188)
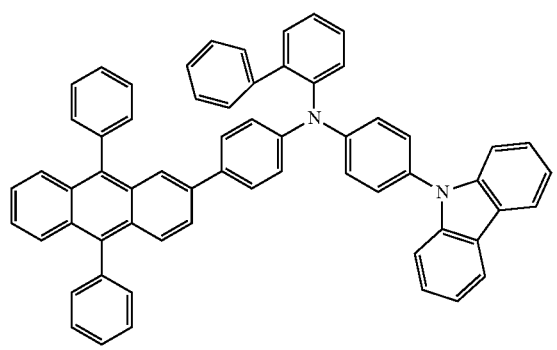
(189)
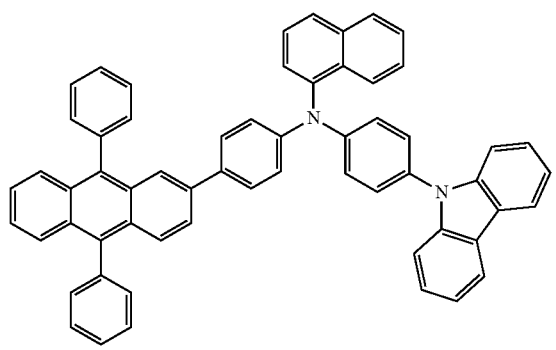
(190)
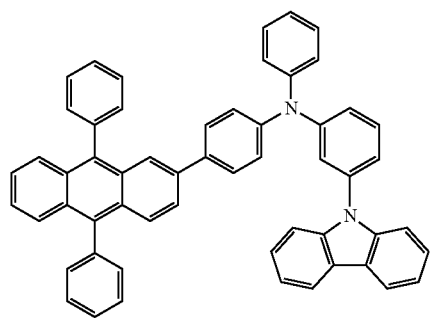
(191)
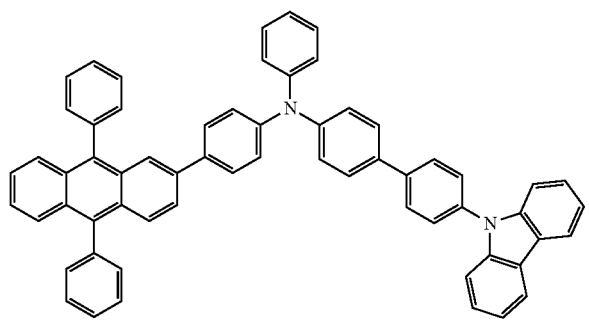

-continued
(192)
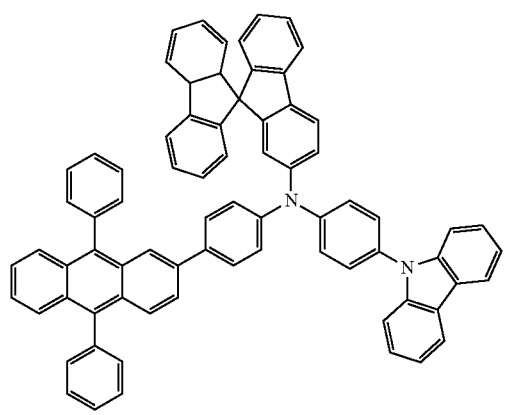
(193)
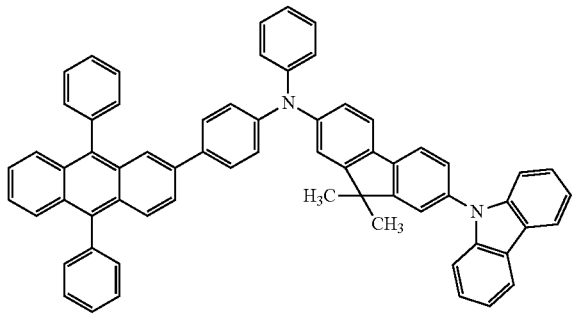
(194)
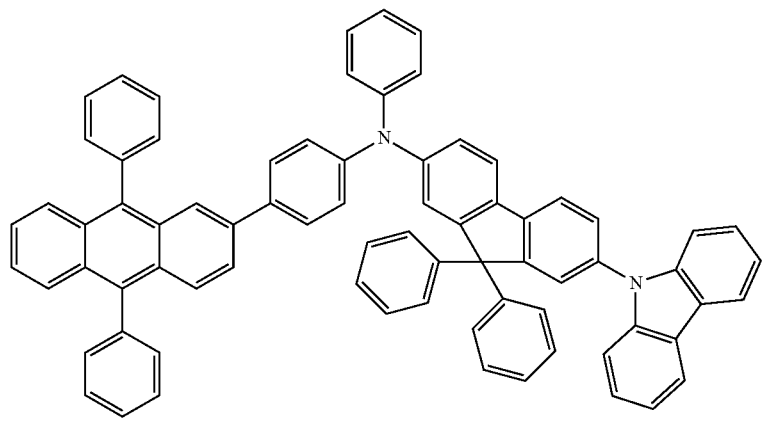
(195)
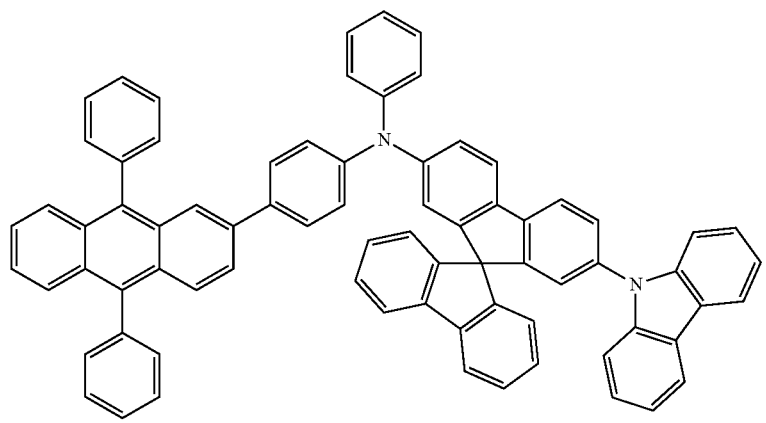

(196)
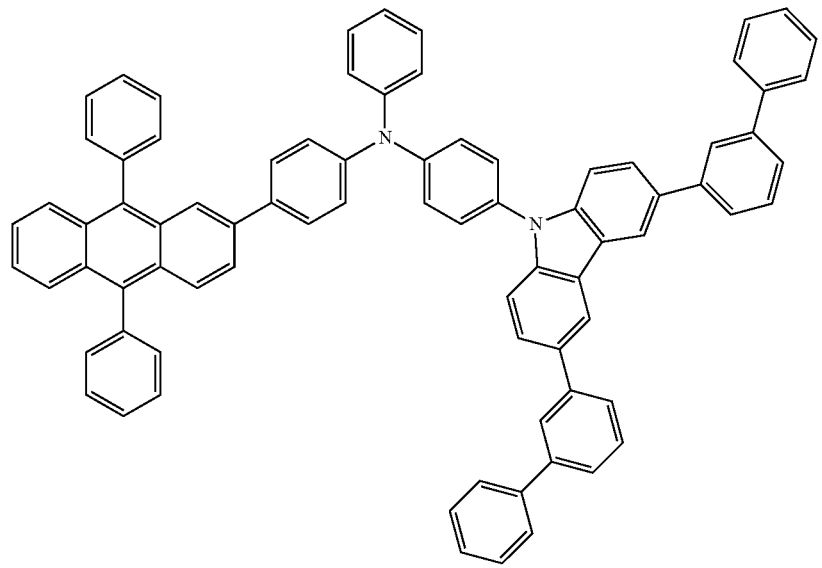
(197)
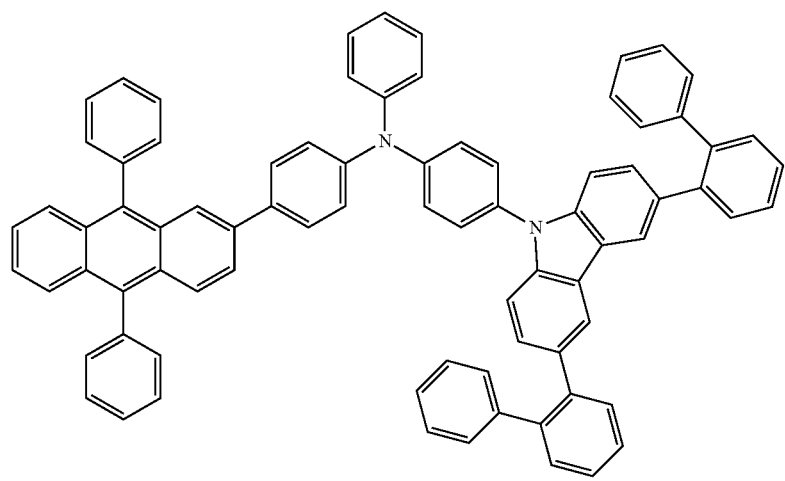
(198)
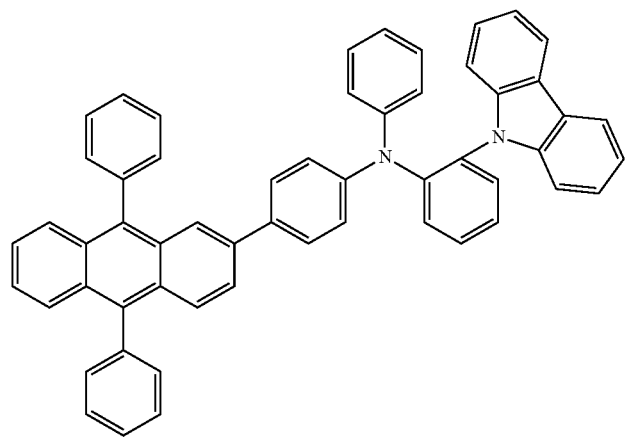

(199)
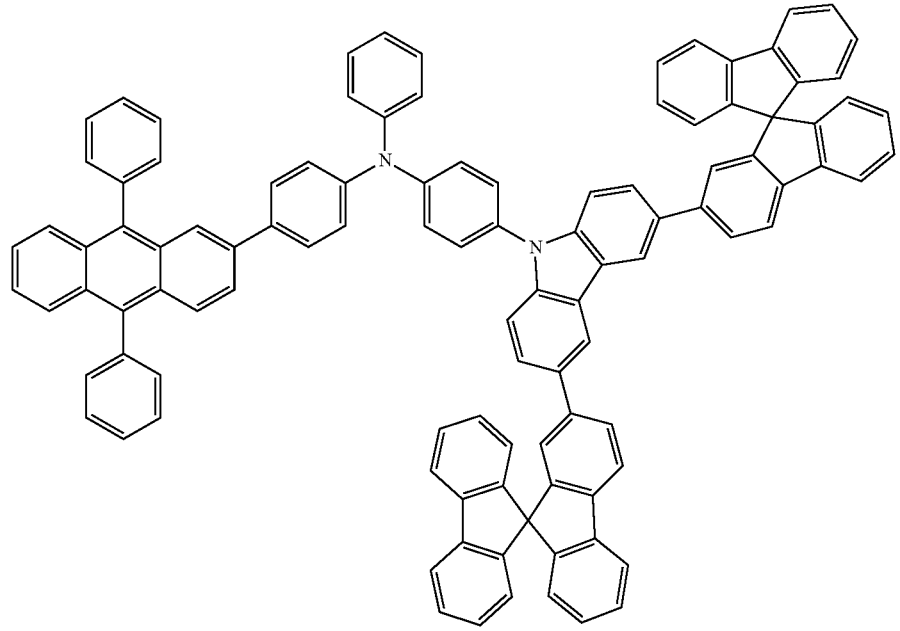
(200)
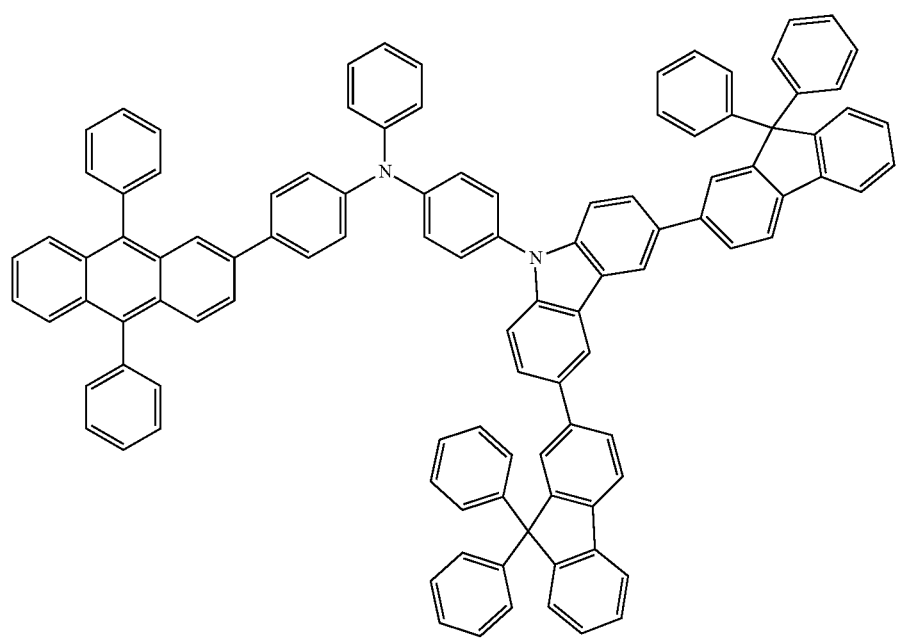

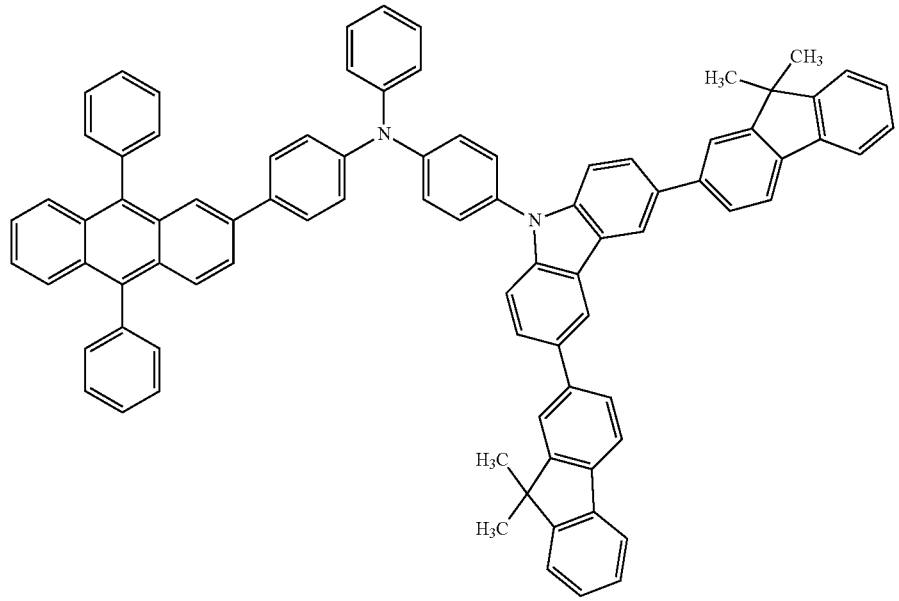
(201)
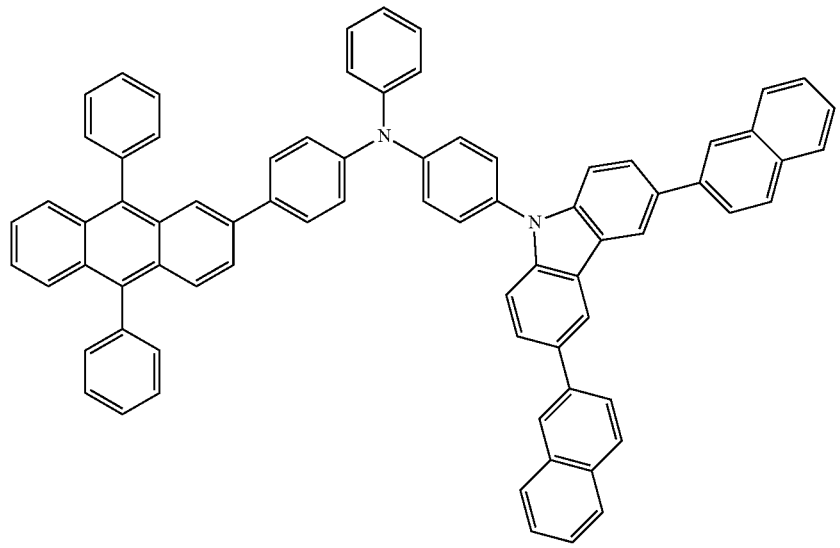
(202)

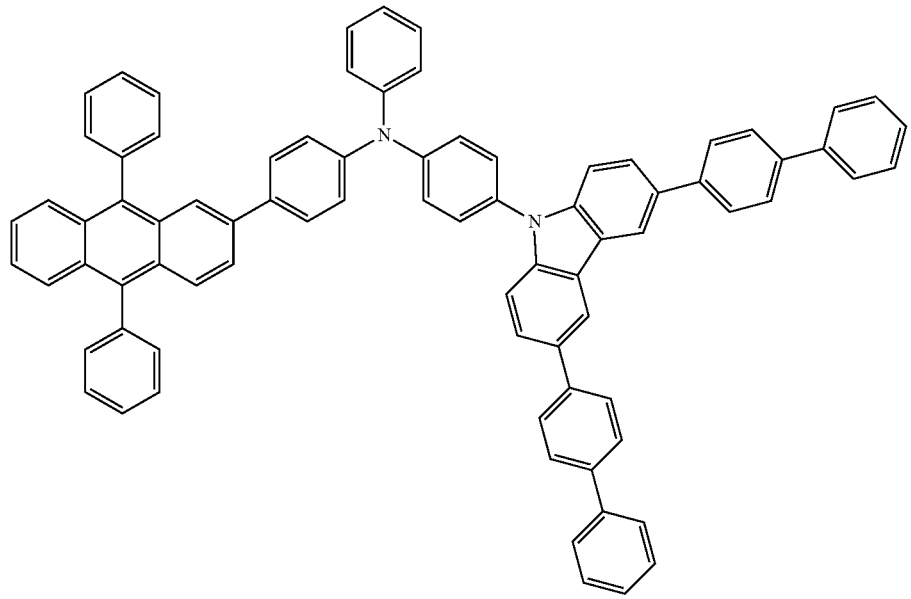
(203)
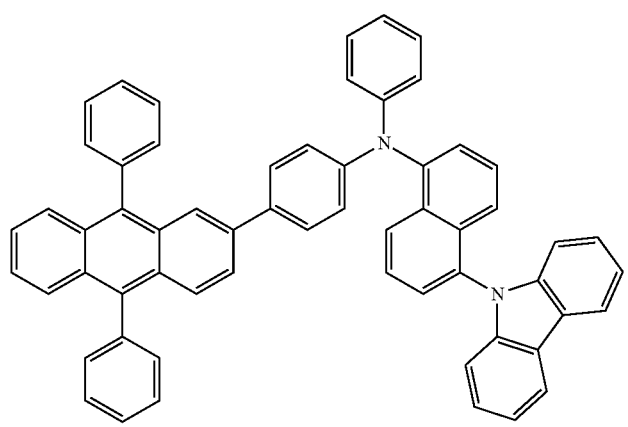
(204)
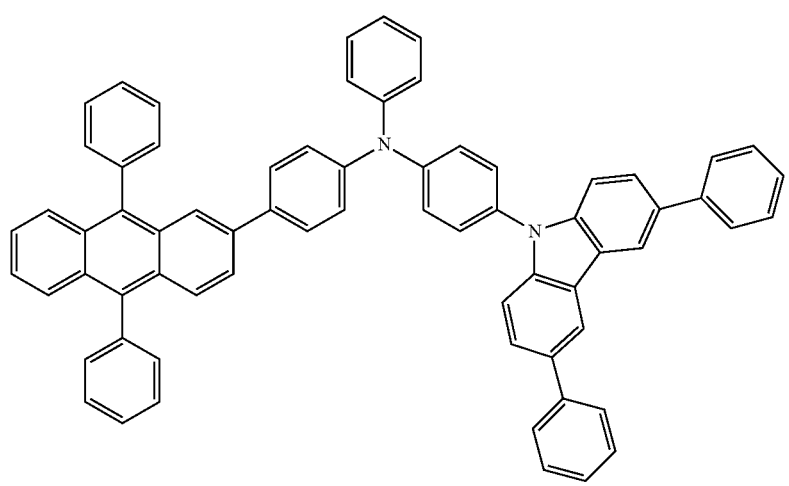
(205)

(206)
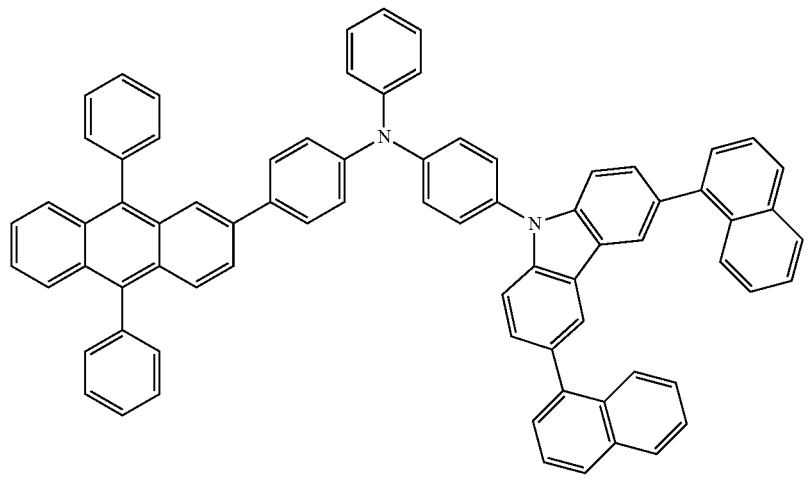
(207)
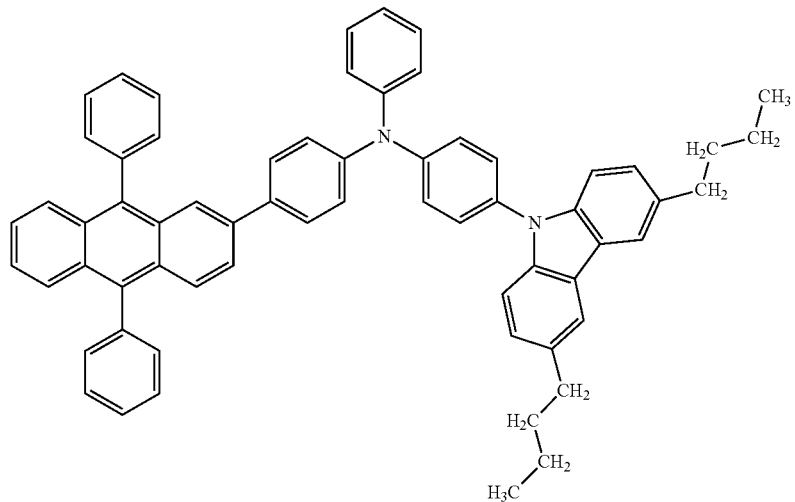
(208)
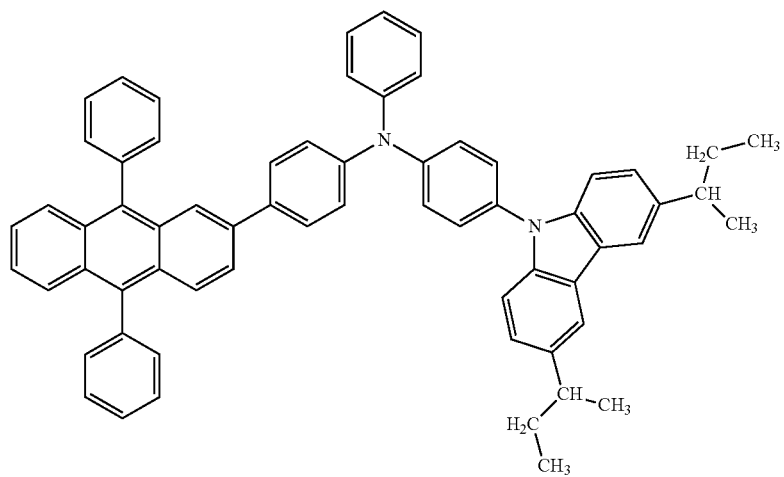

(209)
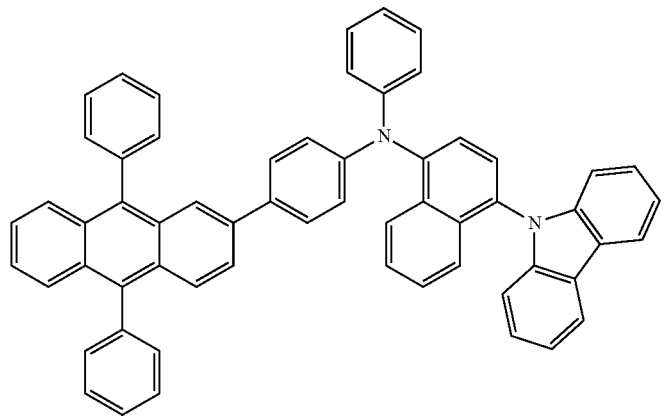
(210)
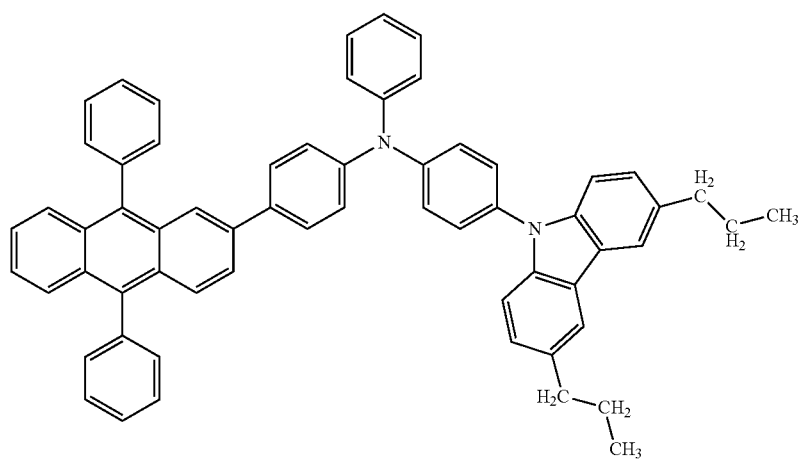
(211)
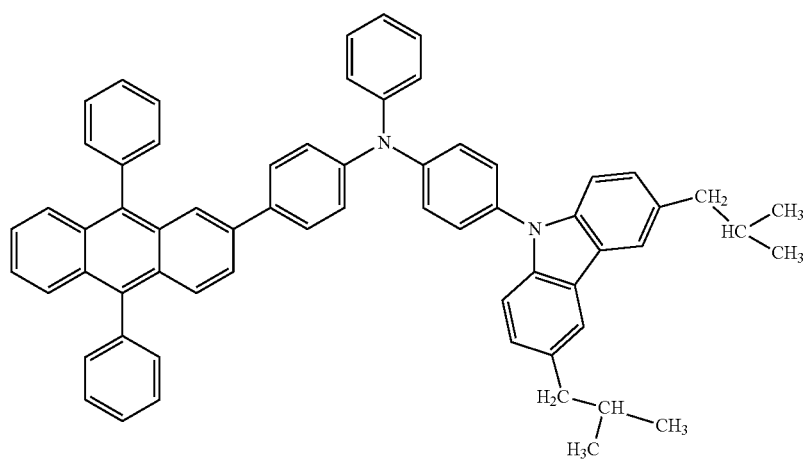

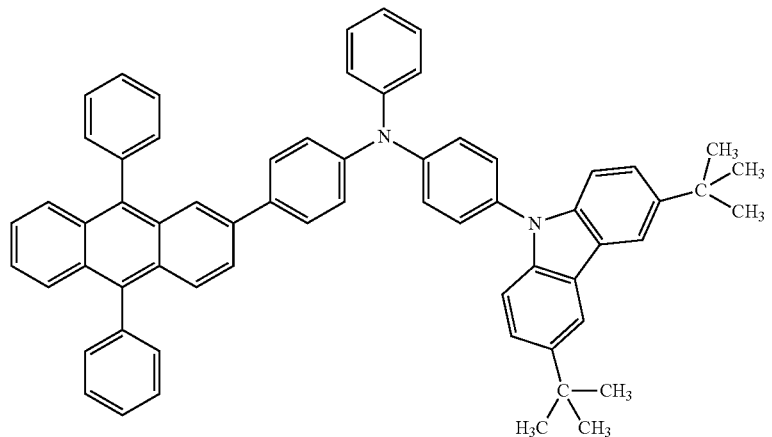
(212)
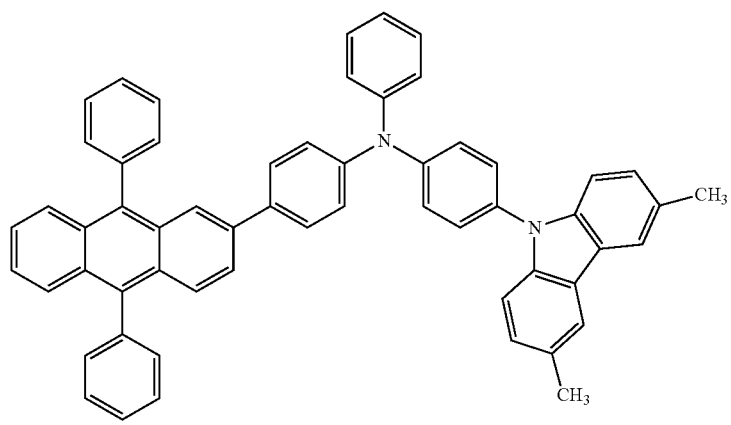
(213)
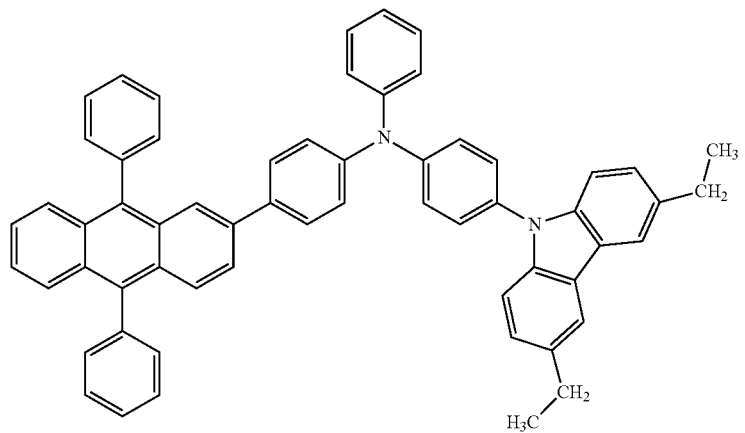
(214)

(215)
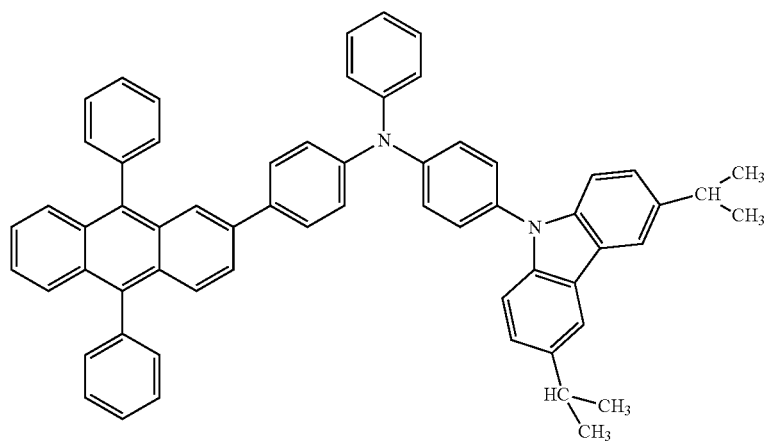
(216)
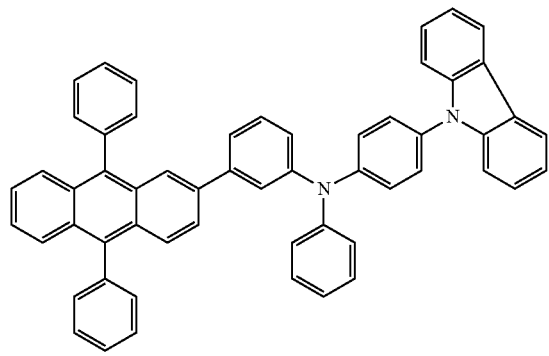
(217)
(218)
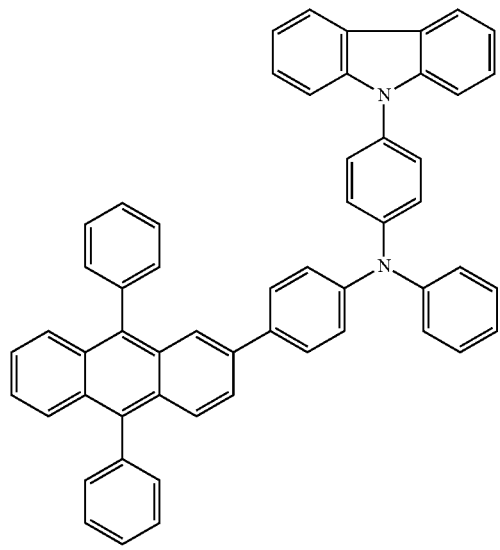
(219)
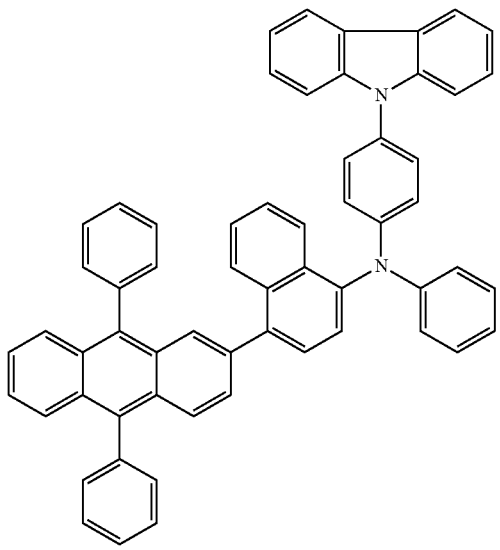

-continued (220)
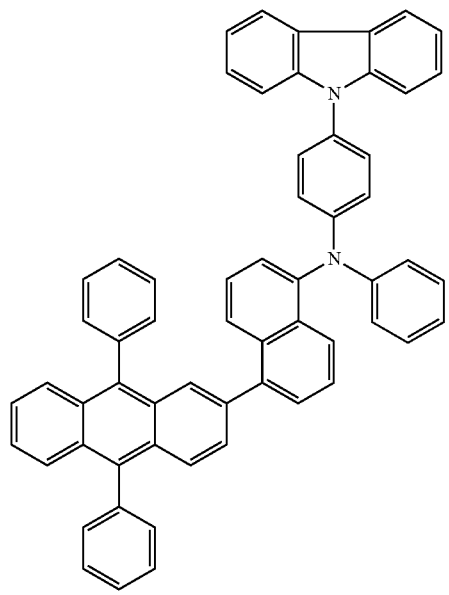

(221)
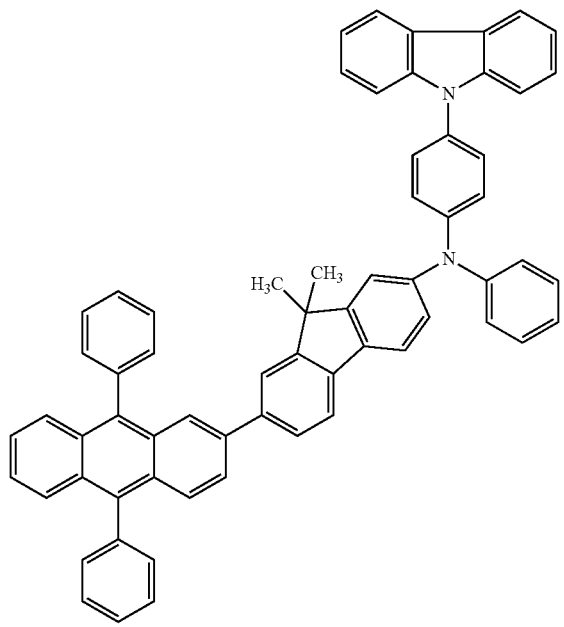

(222)
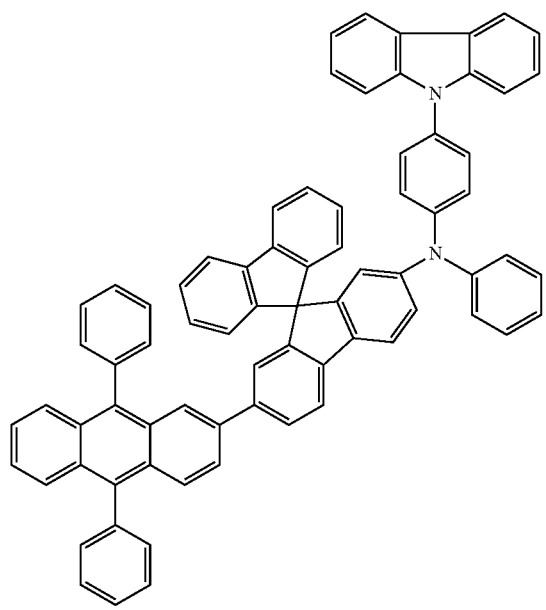

(223)
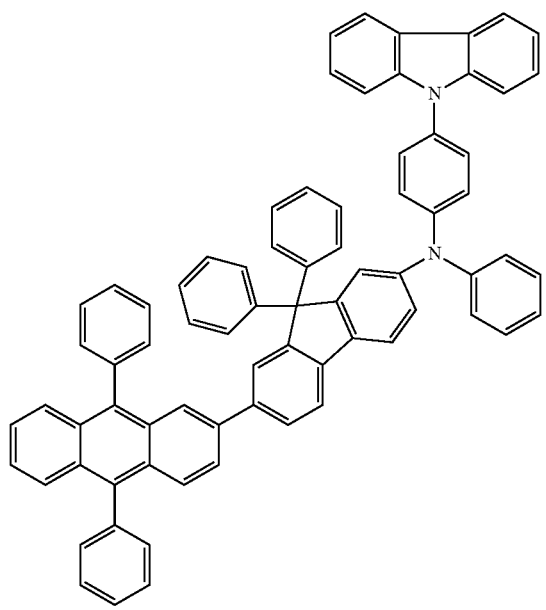

The anthracene derivatives represented by the structural formulae (101) to (131) are specific examples of the general formula (1) in the case where A is represented by the general formula (1-1). The anthracene derivatives represented by the structural formulae (132) to (181) are specific examples of the general formula (1) in the case where A is represented by the general formula (1-2). The anthracene derivatives represented by the structural formulae (182) to (223) are specific examples of the general formula (1) in the case where A is represented by the general formula (1-3).

A variety of reactions can be applied to a synthesis method of such anthracene derivatives. For example, the anthracene derivatives can be synthesized by synthesis reactions shown in reaction schemes (A-1) to (A-6) and (B-1) to (B-3) below.

(A-1)
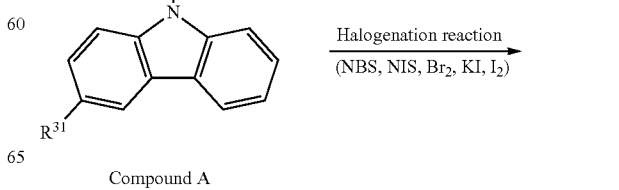

-continued

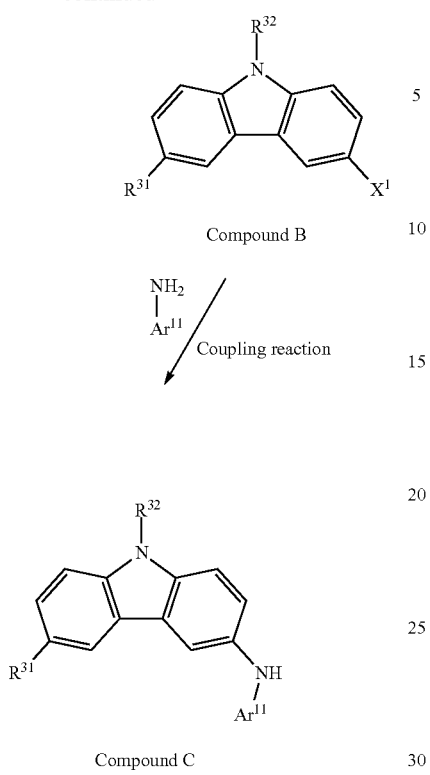

Compound B

Compound C

A compound having carbazole as a skeleton (a compound A) is reacted with a halogen or a halide, such as N-bromosuccinimide (NBS), N-iodosuccinimide (NIS), bromine ($Br_2$), potassium iodide (KI), or iodine ($I_2$), so that a compound having 3-halogenated carbazole as a skeleton (a compound B) is synthesized. Then, furthermore, with the use of a metal catalyst such as a palladium catalyst (a Pd catalyst), a metal compound such as copper iodide, or a metal such as copper, the compound B undergoes a coupling reaction with arylamine to give a compound C. In the synthesis scheme (A-1), a halogen element ($X^1$) is preferably iodine or bromine. In addition, $R^{31}$ represents any of a hydrogen atom, an alkyl group having 1 to 4 carbon atoms, and an aryl group having 6 to 25 carbon atoms. In addition, $R^{32}$ represents an alkyl group having 1 to 4 carbon atoms or an aryl group having 6 to 25 carbon atoms. In addition, $Ar^{11}$ represents an aryl group having 6 to 25 carbon atoms.

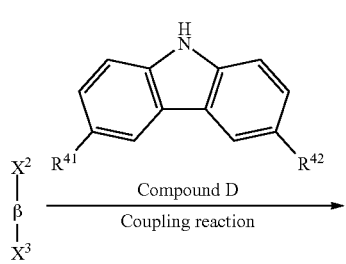

Compound D

-continued

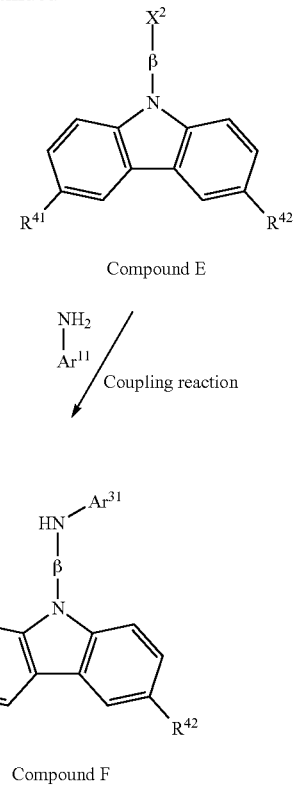

Compound E

Compound F

A compound having carbazole as a skeleton (a compound D) is reacted with a dihalide of an aromatic compound, so that a compound having N-(halogenated aryl) carbazole as a skeleton (a compound E) is synthesized. Then, furthermore, with the use of a metal catalyst such as palladium, a metal compound such as copper iodide, or a metal such as copper, the compound E undergoes a coupling reaction with arylamine to give a compound F. In the synthesis scheme (A-2), a halogen element (each of $X^2$ and $X^3$) of the dihalide of an aromatic compound is preferably iodine or bromine. In addition, $X^2$ and $X^3$ may be the same or different from each other. In addition, $R^{41}$ and $R^{42}$ individually represent any of a hydrogen atom, an alkyl group having 1 to 4 carbon atoms, and an aryl group having 6 to 25 carbon atoms. In addition, β represents an arylene group having 6 to 25 carbon atoms. In addition, $Ar^{31}$ represents an aryl group having 6 to 25 carbon atoms.

(A-2)

(A-3)

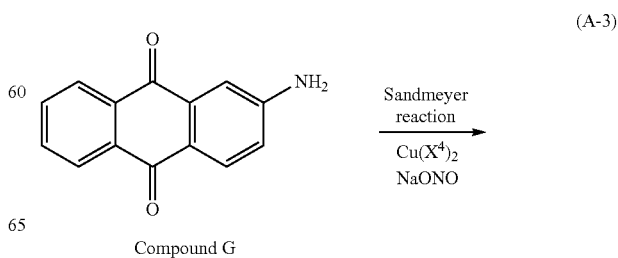

Compound G

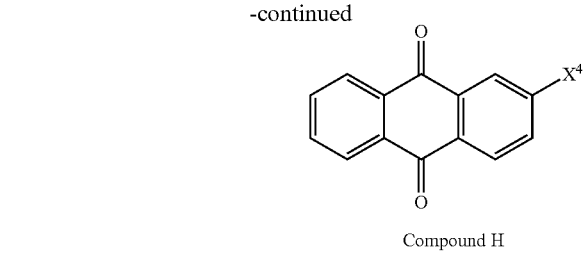

Compound H

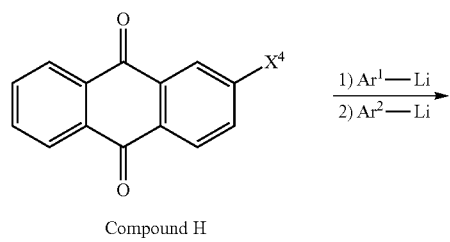

Compound H

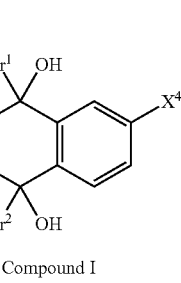

Compound I

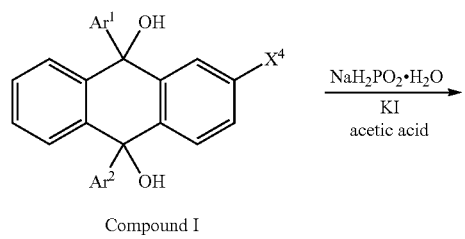

Compound I

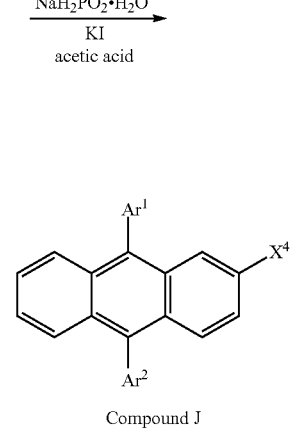

Compound J

A halide of anthraquinone (a compound H) is synthesized by a Sandmeyer reaction of 2-aminoanthraquinone (a compound G). The halide of anthraquinone (a compound H) is reacted with aryllithium to synthesize a diol of a 9,10-dihydroanthracene derivative (a compound I). The diol of a 9,10-dihydroanthracene derivative (the compound I) is subjected to dehydroxylation using sodium phosphinate monohydrate, potassium iodide, and acetic acid to synthesize 9,10-diarylanthracene halide (a compound J).

It is to be noted that in the synthesis schemes (A-3) to (A-5), $X^4$ represents a halogen element. In addition, $Ar^1$ and $Ar^2$ individually represent an aryl group having 6 to 25 carbon atoms.

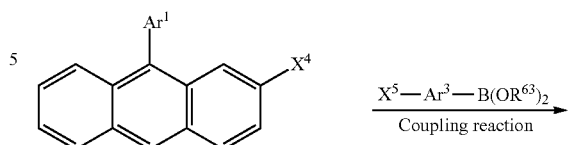

Compound J

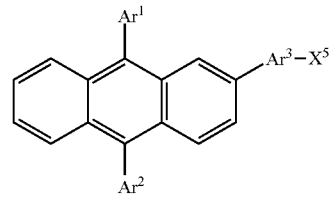

Compound K

By a coupling reaction of 9,10-diarylanthracene halide (the compound J) with an organic boron compound which is an arylene halide or boronic acid which is an aryl halide, a compound K is synthesized. In a synthesis scheme (A-6), $R^{63}$ represents hydrogen or an alkyl group having 1 to 4 carbon atoms. In addition, $Ar^1$ and $Ar^2$ individually represent an aryl group having 6 to 25 carbon atoms. In addition, $X^4$ and $X^5$ may be the same or different from each other and individually represent a halogen element. In particular, in terms of yield, a combination in which $X^4$ is iodine and $X^5$ is bromine is preferably used.

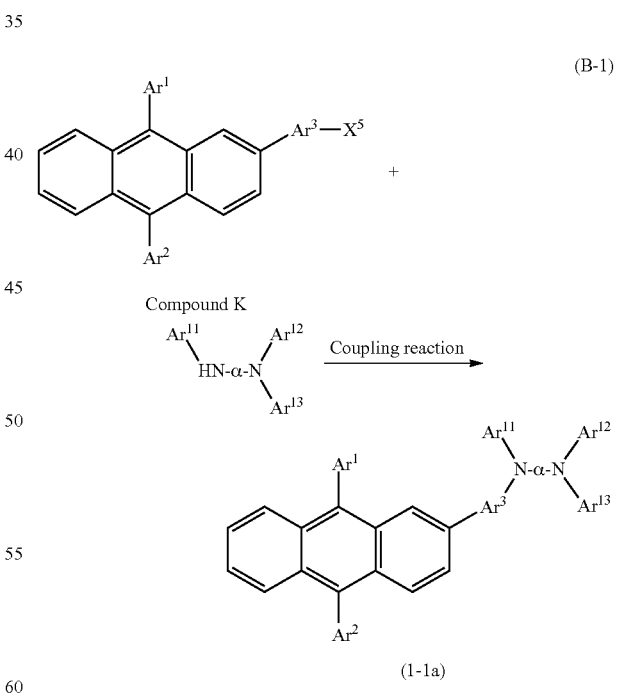

Using the compound K synthesized in the synthesis scheme (A-6), an anthracene derivative of the present invention can be synthesized by the reaction shown in the synthesis scheme (B-1). With the use of a metal catalyst such as a palladium catalyst, a metal compound such as copper iodide, or a metal such as copper, the compound K undergoes a coupling reaction with an arylamine compound to synthesize an anthracene derivative of the present invention represented by a general formula (1-1a). In the synthesis scheme (B-1), $Ar^1$ and $Ar^2$ individually represent an aryl group having 6 to 25 carbon atoms; $Ar^3$ represents an arylene group having 6 to 25 carbon atoms; $Ar^{11}$ to $Ar^{13}$ individually represent an aryl group having 6 to 25 carbon atoms; and α represents an arylene group having 6 to 25 carbon atoms. It is to be noted that the compound represented by the general formula (1-1a) corresponds to the case where A in the above-described general formula (1) is represented by the general formula (1-1).

general formula (1-2a) corresponds to the case where A in the above-described general formula (1) is represented by the general formula (1-2).

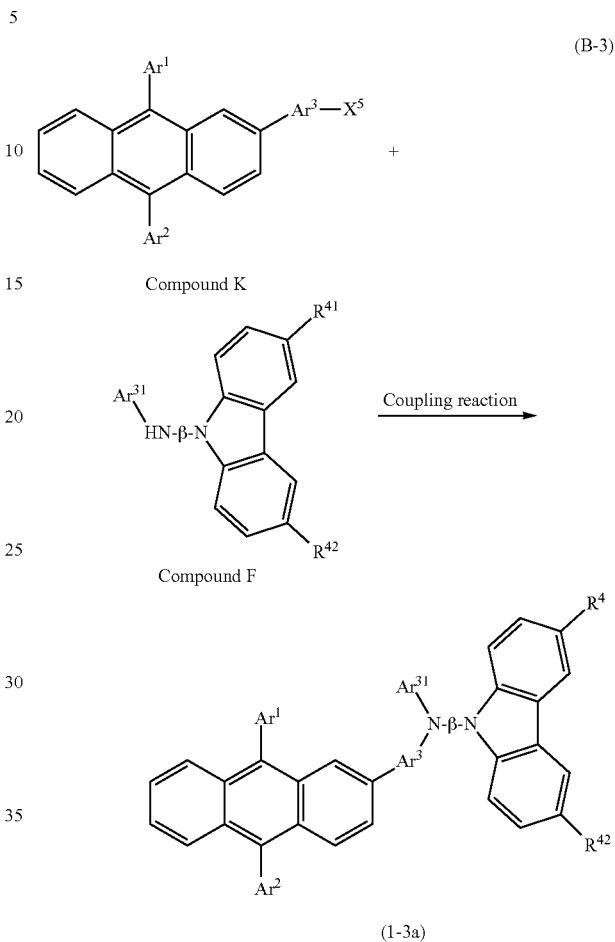

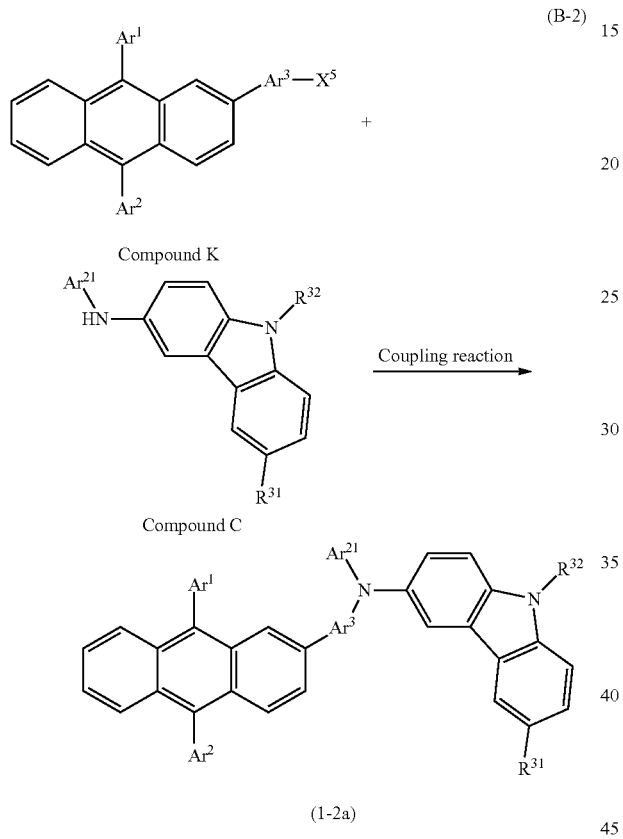

Using the compound C synthesized in the synthesis scheme (A-1) and the compound K synthesized in the synthesis scheme (A-6), an anthracene derivative of the present invention can be synthesized by a reaction shown in the synthesis scheme (B-2). With the use of a metal catalyst such as a palladium catalyst, a metal compound such as copper iodide, or a metal such as copper, the compound C undergoes a coupling reaction with the compound K to synthesize an anthracene derivative of the present invention represented by a general formula (1-2a). In the synthesis scheme (B-2), $Ar^1$ and $Ar^2$ individually represent an aryl group having 6 to 25 carbon atoms; $Ar^3$ represents an arylene group having 6 to 25 carbon atoms; $Ar^{21}$ represents an aryl group having 6 to 25 carbon atoms; $R^{31}$ represents any of a hydrogen atom, an alkyl group having 1 to 4 carbon atoms, an aryl group having 6 to 25 carbon atoms, a halogen atom, and a haloalkyl group having 1 to 4 carbon atoms; and $R^{32}$ represents any of an alkyl group having 1 to 4 carbon atoms, an aryl group having 6 to 25 carbon atoms, and a haloalkyl group having 1 to 4 carbon atoms. It is to be noted that the compound represented by the Using the compound F synthesized in the synthesis scheme (A-2) and the compound K synthesized in the synthesis scheme (A-6), an anthracene derivative of the present invention can be synthesized by a reaction shown in the synthesis scheme (B-3). With the use of a metal catalyst such as a palladium catalyst, a metal compound such as copper iodide, or a metal such as copper, the compound F undergoes a coupling reaction with the compound K to synthesize an anthracene derivative of the present invention represented by a general formula (1-3a). In the synthesis scheme (B-3), $Ar^1$ and $Ar^2$ individually represent an aryl group having 6 to 25 carbon atoms; $Ar^3$ represents an arylene group having 6 to 25 carbon atoms; $Ar^{31}$ represents an aryl group having 6 to 25 carbon atoms; represents an arylene group having 6 to 25 carbon atoms; and $R^{41}$ and $R^{42}$ individually represent any of a hydrogen atom, an alkyl group having 1 to 4 carbon atoms, an aryl group having 6 to 25 carbon atoms, a halogen atom, and a haloalkyl group having 1 to 4 carbon atoms. It is to be noted that the compound represented by the general formula (1-3a) corresponds to the case where A in the above-described general formula (1) is represented by the general formula (1-3).

The anthracene derivatives described in this embodiment mode have high emission quantum yield and emit blue to yellow green light. Thus, the anthracene derivatives are suitable for use in a light-emitting element. Further, the anthracene derivatives described in this embodiment are stable even with respect to repeated redox reactions. Accordingly, when any of the anthracene derivatives described in this embodiment mode is used for a light-emitting element, a light-emitting element having a long life can be obtained.

Although it is known that an anthracene derivative such as 9,10-diphenylanthracene can emit blue light, such an anthracene derivative has difficulty in emitting light efficiently in a light-emitting element since holes are difficult to enter the anthracene derivative. On the other hand, if an amine unit is introduced so that the anthracene derivative can easily accept holes, the emission wavelength is considerably shifted to the long wavelength side and thus short wavelength emission cannot easily be obtained. However, short wavelength light can efficiently be emitted from the anthracene derivatives described in this embodiment mode, since they have a molecular structure in which an anthracene skeleton that contributes to light emission and has an electron-transporting property and an amine unit A having a hole-transporting property are bonded to each other via an arylene group $Ar^3$.

Further, since the anthracene derivatives described in this embodiment mode each have only one amine unit A, they are not easily decomposed at vacuum evaporation and can easily be deposited by an evaporation method. Thus, the anthracene derivatives described in this embodiment mode are suitable for use in fabrication of a light-emitting element. Further, since the anthracene derivatives described in this embodiment mode each have only one amine unit A, they can be produced at low cost. Therefore, by use of any of the anthracene derivatives described in this embodiment mode for a light-emitting element, the cost of a light-emitting element can be reduced.

Embodiment Mode 2

Figure 1B:
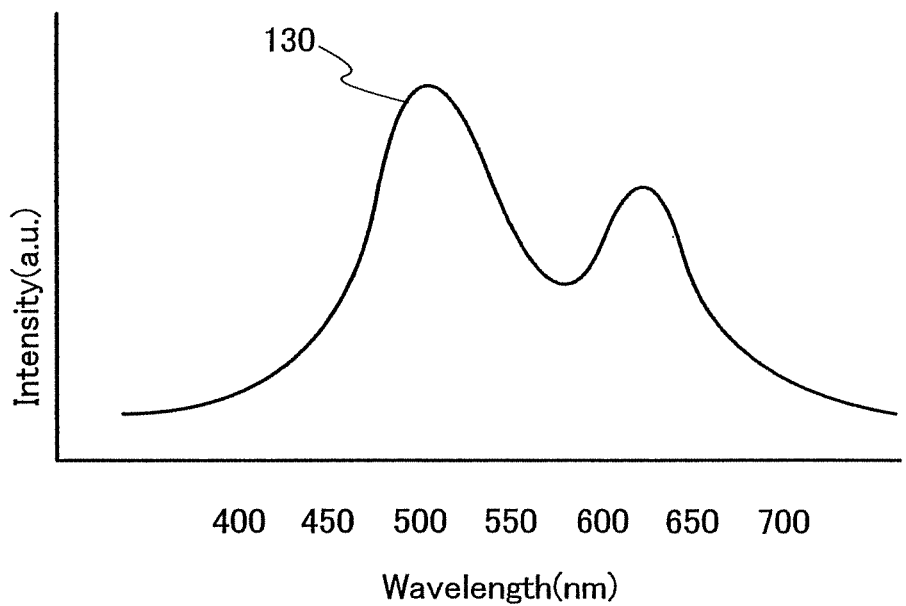

In this embodiment mode, an example of a structure of a light-emitting element of the present invention is described using FIGS. 1A and 1B.

In FIGS. 1A and 1B, a first light-emitting element 110 has a structure in which a first anode 111, a first light-emitting layer 112A, a second light-emitting layer 112B, and a first cathode 113 which are stacked in this order over a substrate 100. In FIGS. 1A and 1B, the first anode 111 is an electrode having a light-transmitting property and the first cathode 113 is an electrode having a light-reflecting property. It is to be noted that the first light-emitting layer 112A and second light-emitting layer 112B may be stacked in the inverse order.

The substrate 100 is used as a support of the light-emitting element. For the substrate 100, glass, plastic, or the like can be used, for example. It is to be noted that any other material may be used as long as it can function as a support in a fabrication process of a light-emitting element.

The first anode 111 and the first cathode 113 can be formed using any of a variety of metals, alloys, and conductive compounds, a mixture thereof, or the like. For example, indium tin oxide (ITO), indium tin oxide containing silicon or silicon oxide, indium zinc oxide (IZO), indium oxide containing tungsten oxide and zinc oxide (IWZO), and the like, which are materials with a high work function, are given. Such conductive metal oxides are generally deposited by sputtering, but may be formed by applying a sol-gel method or the like. For example, indium zinc oxide (IZO) can be deposited using a target in which 1 wt % to 20 wt % zinc oxide is added to indium oxide by a sputtering method. Further, indium oxide containing tungsten oxide and zinc oxide (IWZO) can be deposited using a target in which 0.5 wt % to 5 wt % tungsten oxide and 0.1 wt % to 1 wt % zinc oxide are contained in indium oxide by a sputtering method. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, any of elements belonging to Group 1 and 2 of the periodic table which are materials with a low work function, that is, alkali metals such a lithium (Li) and cesium (Cs) and alkaline earth metals such as magnesium (Mg), calcium (Ca), and strontium (Sr); alloys containing them (an alloy of magnesium and silver, or an alloy of aluminum and lithium); rare earth metals such as europium (Eu) and ytterbium (Yb); alloys containing them; and the like can also be used. Alternatively, aluminum (Al), silver (Ag), an alloy containing aluminum (e.g., AlSi), or the like can be used. Further, an alkali metal, an alkaline earth metal, or an alloy containing them can be deposited by a vacuum evaporation method. Further, an alloy containing an alkali metal or an alkaline earth metal can be deposited by a sputtering method. Further alternatively, a film of a silver paste or the like can be formed by an inkjet method or the like. Further, each of the first anode and the first cathode can be formed to have not only a single layer but also stacked layers.

Although the first anode and the first cathode can be formed using such conductive materials, a material with a high work function is preferably used for the anode in consideration of a carrier injection barrier. In addition, for the cathode, a material with a low work function is preferably used.

Further, one or both of the first anode and the cathode are formed to transmit light so that light emitted from the light-emitting layer can be extracted outside. For example, one or both of the first anode and the cathode are formed using a conductive material having a light-transmitting property such as ITO, or formed to a thickness of several nanometers to several tens of nanometers using silver, aluminum, or the like. Alternatively, one or both of the first anode and the cathode may be formed to have stacked layers of a thin film with reduced thickness of a metal such as silver or aluminum and a thin film of a conductive material having a light-transmitting property such as an ITO film. In addition, a variety of methods may be used for formation of the first anode and the cathode.

The first light-emitting layer 112A contains any of the anthracene derivatives described in Embodiment Mode 1. The anthracene derivatives described in Embodiment Mode 1 have an emission spectrum having a peak in the blue green to yellow green wavelength range, and light emission with high efficiency can be achieved. Therefore, by use of any of the anthracene derivatives described in Embodiment Mode 1, a light-emitting element with high emission efficiency can be obtained. Further, the anthracene derivatives described in Embodiment Mode 1 are stable with respect to repeated redox reactions and electrochemically stable. Therefore, by use of any of the anthracene derivatives described in Embodiment Mode 1, a light-emitting element that does not easily deteriorate and has a long life can be obtained. In addition, the light-emitting layer may be formed by dispersing any of the anthracene derivatives described in Embodiment Mode 1 (a guest substance) in another substance (a host substance). In this case, the anthracene derivative is preferably used for a host material, and 9-[4-(N-carbazolyl)phenyl]-10-phenylanthracene (abbreviation: CzPA) is electrochemically stable and thus preferably used.

Further, the second light-emitting layer 112B contains a light-emitting substance that is different from the anthracene derivatives described in Embodiment Mode 1. That is, the first light-emitting layer 112A and the second light-emitting layer 112B emit light of different colors. For the second light-emitting layer 112B, a variety of light-emitting substances can be used. For example, a fluorescent material or a phosphorescent material can be used.

In such a light-emitting element, when the first anode 111 side is positively biased and the first cathode 113 side is negatively biased, light in which light from the first light-emitting layer and light from the second light-emitting layer are combined with each other can be emitted. Emitted light in which light from the first light-emitting layer and light from the second light-emitting layer are combined with each other exhibits a first spectrum 130 having two peaks as shown in FIG. 1B. That is, the light-emitting element described in this embodiment mode exhibits a 2-wavelength emission spectrum.

It is to be noted that in this specification, the term "peak" also refers to a shoulder peak. That is, in the case where a spectrum shows a shoulder, the shoulder is seen as a peak.

For example, when an emission color of the light-emitting substance contained in the second light-emitting layer 112B and an emission color of the anthracene derivative described in Embodiment Mode 1 which is contained in the first light-emitting layer 112A are complementary colors, an emission color of the first light-emitting element is white. It is to be noted that the term "complementary" colors refer to colors that can produce an achromatic color when they are mixed.

The anthracene derivatives described in Embodiment Mode 1 emit blue to yellow green light. Therefore, when an anthracene derivative that emits blue light among the anthracene derivatives described in Embodiment Mode 1 is used for the first light-emitting layer 112A and a light-emitting substance that emits yellow to orange light is used for the second light-emitting layer 112B, a light-emitting element that emits white light can be obtained. Alternatively, when an anthracene derivative that emits blue green to green light is used for the first light-emitting layer 112A and a light-emitting substance that emits red light is used for the second light-emitting layer 112B, a light-emitting element that emits white light can be obtained.

Examples of a material that exhibits an emission spectrum having a peak in the red wavelength range (more than or equal to 600 nm and less than 700 nm) include 4H-pyran derivatives such as 4-(dicyanomethylene)-2,6-bis[p-(dimethylamino) styryl]-4H-pyran (abbreviation: BisDCM), {2-isopropyl-6-[2-(2,3,6,7-tetrahydro-1,1,7,7-tetramethyl-1H,5H-benzo[ij] quinolizin-9-yl)ethenyl]-4H-pyran-4-ylidene}propanedinitrile (abbreviation: DCJTI), and {2,6-bis [2-(2,3,6,7-tetrahydro-8-methoxy-1,1,7,7-tetramethyl-1H, 5H-benzo[ij]quinolizin-9-yl)ethenyl]-4H-pyran-4-ylidene}propanedinitrile (abbreviation: BisDCJTM) and phosphorescent materials such as bis[2,3-bis(4-fluorophenyl)quinoxalinato]iridium(III) acetylacetonate (abbreviation: Ir(Fdpq)$_2$(acac)) and tris(1-phenylisoquinolinato-N,C$^{2'}$) iridium(III) (abbreviation: Ir(piq)$_3$). Alternatively, a polymer such as poly(3-alkylthiophene) may be used. In particular, a 4H-pyran derivative such as BisDCM, DCJTI, or BisDCJTM has high emission efficiency and thus is preferable. In particular, each of DCJTI and BisDCJTM exhibits an emission spectrum having a peak at about 620 nm and thus is preferably combined with any of the anthracene derivatives described in Embodiment Mode 1 to form a white light-emitting element. In addition, any of the above light-emitting substances (a guest material) may be dispersed into another substance (a host material) to form the light-emitting layer. For the host material in this case, an aromatic amine compound such as 4,4'-bis[N-(1-naphthyl)-N-phenylamino]biphenyl (abbreviation: NPB) or 4-(9H-carbazol-9-yl)-4'-(10-phenyl-9-anthryl) triphenylamine (abbreviation: YGAPA) is preferably used. Alternatively, for the host material, a metal complex such as bis(8-quinolinolato)zinc (abbreviation: Znq$_2$) or bis[2-cinnamoyl-8-quinolinolato]zinc (abbreviation: Znsq$_2$) can be used. By use of any of these light-emitting substances that emit red light and any of the anthracene derivatives that emit blue green to green light which are described in Embodiment Mode 1, a white light-emitting element can be obtained.

Examples of a material that exhibits an emission spectrum having a peak in the yellow to orange wavelength range (more than or equal to 540 nm and less than 600 nm) include rubrene, (2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo [ij]quinolizin-9-yl)ethenyl]-4H-pyran-4-ylidene}propanedinitrile (abbreviation: DCM2), bis[2-(2-thienyl)pyridinato]iridium acetylacetonato (abbreviation: Ir(thp)$_2$(acac)), bis(2-phenylquinolinato)iridium acetylacetonato (abbreviation: Ir(pq)$_2$(acac)), and the like. In particular, a tetracene derivative such as rubrene has high efficiency and chemical stability and thus is preferable. In addition, any of these light-emitting substances (a guest material) may be dispersed into another substance (a host material) to form the light-emitting layer. For the host material in this case, an aromatic amine compound such as 4,4'-bis[N-(1-naphthyl)-N-phenylamino]biphenyl (abbreviation: NPB) or 4-(9H-carbazol-9-yl)-4'-(10-phenyl-9-anthryl)triphenylamine (abbreviation: YGAPA) is preferably used. Alternatively, a polymer such as poly(2,5-dialkoxy-1,4-phenylenevinylene) may be used. By use of any of these light-emitting substances that emit yellow to orange light and any of the anthracene derivatives that emit blue light described in Embodiment Mode 1, a white light-emitting element can be obtained.

It is to be noted that the emission colors of the light-emitting substances given above may change to some extent depending on the host material or the element structure.

Further, in FIGS. 1A and 1B, the first cathode 113 is a light-reflecting electrode, and light is extracted through the first anode and the substrate 100. In this case, the first light-emitting layer 112A that exhibits a longer wavelength emission spectrum than the second light-emitting layer 112B is preferably placed away from the light-reflecting electrode so that interference of light can be suppressed. Thus, any of the anthracene derivatives described in Embodiment Mode 1 may be used for the second light-emitting layer 112B. In such a case, the light-emitting substance contained in the first light-emitting layer 112A is preferably different from the anthracene derivatives described in Embodiment Mode 1.

Further, in the description of FIG. 1A, the first cathode 113 is a light-reflecting electrode. However, a structure in which the first cathode 113 is a light-transmitting electrode and further a light-reflecting film is fog wed above the first cathode may be employed. In this case, the thickness of each of the first cathode 113, the second light-emitting layer 112B, the first light-emitting layer 112A, and the like is preferably adjusted in consideration of interference of light. Further, preferably, a material with low resistance, for example, a conductive material containing aluminum (Al), silver (Ag), or the like is used for the light-reflecting electrode, and accordingly the power consumption of the light-emitting element can be reduced.

Further, a structure in which the first cathode 113 is not a light-reflecting electrode but a light-transmitting electrode and the first anode 111 is a light-reflecting electrode so that emitted light can be extracted in the direction opposite to that shown in FIG. 1A may be employed. Further, a structure in which the first anode 111 is not a light-reflecting electrode but a light-transmitting electrode, and a light-reflecting film is provided below the first anode may be employed.

Further, In FIGS. 1A and 1B, the anode is formed on the substrate side; however, the cathode may be provided on the substrate side.

Furthermore, light may be made more like natural light having a continuous spectrum by adjusting the thickness of each stacked layer to deliberately create slight interference of light so that the production of a sharp peak which juts out is suppressed and a trapezoidal emission spectrum is obtained. Further, by adjusting the thickness of each stacked layer to deliberately create slight interference of light, the position of a peak of an emission spectrum can be changed. By adjusting the thickness of each stacked layer so that a plurality of peak intensities that appears in an emission spectrum is made roughly the same, and further by decreasing the intervals between peaks, white light emission having an emission spectrum that is closer to a trapezoidal shape can be obtained.

By applying the present invention, a white color emission that is close to natural light having a continuous spectrum can be obtained by adjusting the thickness or material of each layer and utilizing interference of light. Therefore, the light-emitting element of the present invention is suitable for use in a lighting apparatus.

It is to be noted that this embodiment mode can be combined with any other embodiment mode described in this specification as appropriate.

Embodiment Mode 3

Figure 2A:
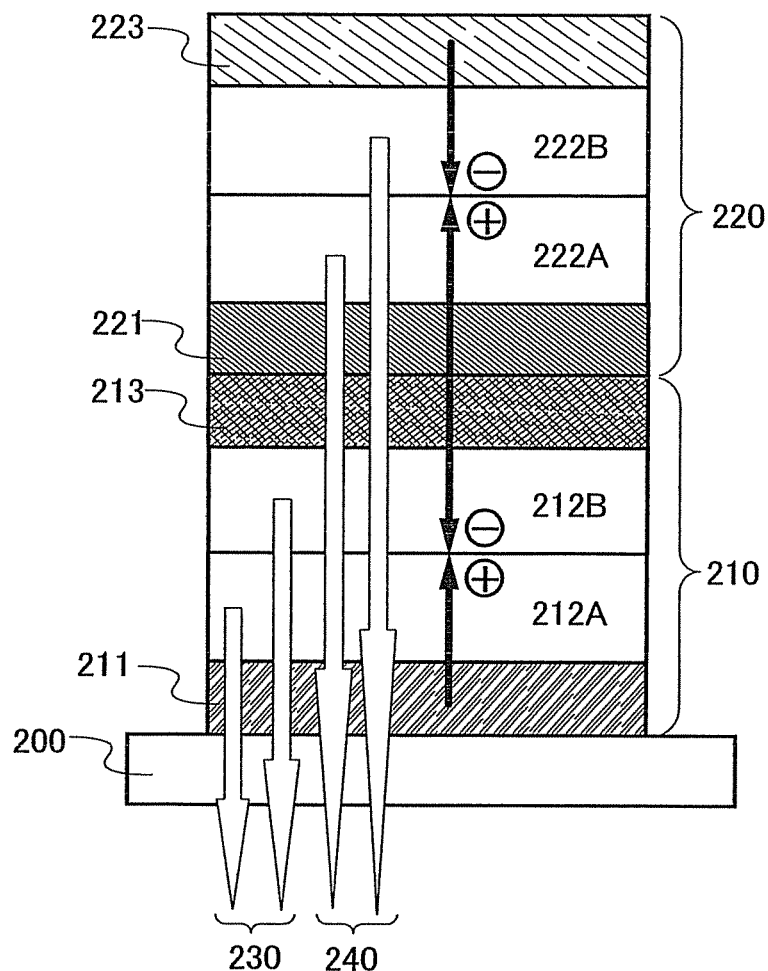
FIGS. 2A and 2B illustrate a light-emitting element according to an aspect of the present invention.
Figure 2B:
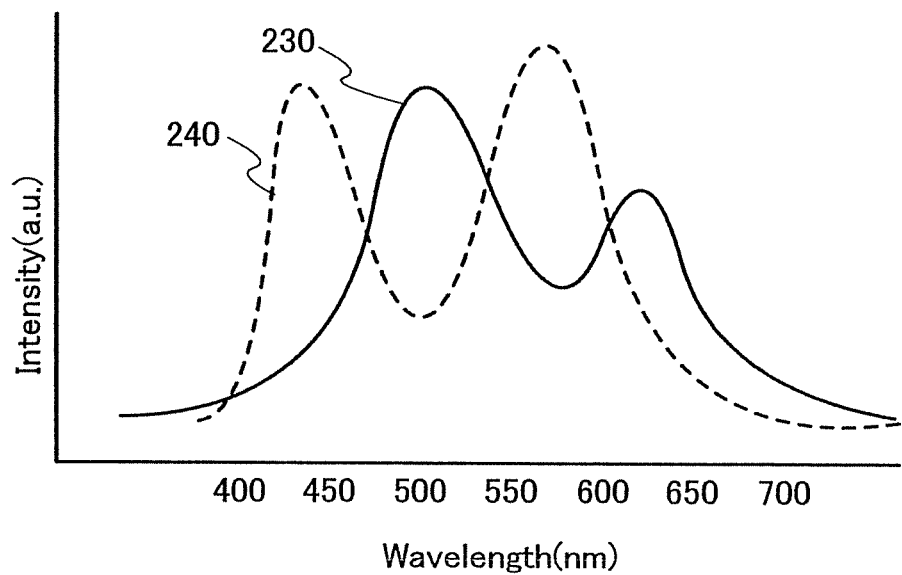

In this embodiment mode, an example of a structure of a light-emitting element of the present invention is described using FIGS. 2A and 2B.

In FIGS. 2A and 2B, a first light-emitting element 210 and a second light-emitting element 220 are stacked over a substrate 200. The first light-emitting element 210 and the second light-emitting element 220 are connected in series to each other. Hereinafter, a light-emitting element having a structure in which a plurality of light-emitting elements is stacked as shown in FIGS. 2A and 2B is referred to as a stacked type light-emitting element. The first light-emitting element 210 has a structure that is similar to the light-emitting element described in Embodiment Mode 2, and includes a first light-emitting layer 212A and a second light-emitting layer 212B between a first anode 211 and a first cathode 213. Further, the second light-emitting element 220 includes a third light-emitting layer 222A and a fourth light-emitting layer 222B between a second anode 221 and a second cathode 223. Further, in FIGS. 2A and 2B, the first anode 211 is an electrode having a light-transmitting property and the second cathode 223 is an electrode having a light-reflecting property.

As described in Embodiment Mode 1, the substrate 200 is used as a support of the light-emitting element. For the substrate 200, glass, plastic, or the like can be used, for example. It is to be noted that any other material may be used as long as it can function as a support in a fabrication process of a light-emitting element.

As described in Embodiment Mode 1, the first anode 211, the first cathode 213, the second anode 221, and the second cathode 223 can be formed using any of a variety of metals, alloys, and conductive compounds, a mixture thereof, or the like. For example, indium tin oxide (ITO), indium tin oxide containing silicon or silicon oxide, indium zinc oxide (IZO), indium oxide containing tungsten oxide and zinc oxide (IWZO), and the like, which are materials with a high work function, are given. Such conductive metal oxides are generally deposited by sputtering, but may be formed by applying a sol-gel method or the like. For example, indium zinc oxide (IZO) can be deposited using a target in which 1 wt % to 20 wt % zinc oxide is added to indium oxide by a sputtering method. Further, indium oxide containing tungsten oxide and zinc oxide (IWZO) can be deposited using a target in which 0.5 wt % to 5 wt % tungsten oxide and 0.1 wt % to 1 wt % zinc oxide are contained in indium oxide by a sputtering method. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, any of elements belonging to Group 1 and 2 of the periodic table which are materials with a low work function, that is, alkali metals such a lithium (Li) and cesium (Cs) and alkaline earth metals such as magnesium (Mg), calcium (Ca), and strontium (Sr); alloys containing them (an alloy of magnesium and silver, or an alloy of aluminum and lithium); rare earth metals such as europium (Eu) and ytterbium (Yb); alloys containing them; and the like can also be used. Alternatively, aluminum (Al), silver (Ag), an alloy containing aluminum (e.g., AlSi), or the like can be used. Further, an alkali metal, an alkaline earth metal, or an alloy containing them can be deposited by a vacuum evaporation method. Further, an alloy containing an alkali metal or an alkaline earth metal can be deposited by a sputtering method. Further alternatively, a film of a silver paste or the like can be formed by an inkjet method or the like. Further, each electrode can be formed to have not only a single layer but also stacked layers.

It is to be noted that a material with a high work function is preferably used for each anode in consideration of a carrier injection barrier. Further, for each cathode, a material with a low work function is preferably used.

Further, the electrodes located inside the stacked type light-emitting element are preferably electrodes having a light-transmitting property in terms of light extraction efficiency. That is, in the stacked type light-emitting element described in this embodiment mode, the anode in contact with the cathode and the cathode in contact with the anode preferably have a light-transmitting property. In other words, in the structure shown in FIGS. 2A and 2B, the first cathode 213 and the second anode 221 are preferably electrodes having a light-transmitting property.

Further, the electrodes located inside the stacked type light-emitting element can function even when they have lower conductivity than the electrodes located on the outer, sides of the stacked type light-emitting element.

Therefore, the cathode located inside the stacked type light-emitting element, that is, the cathode in contact with the anode needs to inject electrons and can be formed using an insulator such as lithium oxide, lithium fluoride, or cesium carbonate, or a semiconductor. Alternatively, the cathode may have a structure in which a donor material is added to a substance having a high electron-transporting property.

Examples of the substance having a high electron-transporting property includes metal complexes having a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryilium (abbreviation: BeBq$_2$), and bis(2-methyl-8-quinolinolato)(4-phenylphenolato)aluminum (abbreviation: BAlq), and the like. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) or the like can be used. Furthermore, in stead of the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances described here mainly are substances having an electron mobility of $10^{-6}$ cm$^2$/(V·s) or higher. It is to be noted that any substance other than the above substances may also be used as long it is a substance in which the electron-transporting property is higher than the hole-transporting property.

By adding the donor material, the electron-transporting property can be enhanced, and thus the driving voltage of the light-emitting element can be lowered. For the donor material, an alkali metal, an alkaline earth metal, a rare earth metal, a metal that belongs to Group 13 of the periodic table, or an oxide or a carbonate thereof can be used. Specifically, lithium (Li), cesium (Cs), magnesium (Mg), calcium (Ca), ytterbium (Yb), indium (In), lithium oxide, cesium carbonate, or the like is preferably used. Further, an organic compound such as tetrathianaphthacene may be used for the donor material.

Further, the anode located inside the stacked type light-emitting element, that is, the anode in contact with the cathode needs to, inject holes and can be formed using a semiconductor, such as molybdenum oxide, vanadium oxide, rhenium oxide, or ruthenium oxide, or an insulator. Alternatively, the anode may have a structure in which an accepter material is added to a substance having a high hole-transporting property.

Examples of the substance having a high hole-transporting property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]-1,1'-biphenyl (abbreviation: BSPB), and the like. These substances described here mainly are substances having a hole mobility of $10^{-6}$ cm$^2$/(V·s) or higher. However, any substance other than the above substances may also be used as long as it is a substance in which the hole-transporting property is higher than the electron-transporting property.

By adding the accepter material, the hole-transporting property can be enhanced, and thus the driving voltage of the light-emitting element can be lowered. As examples of the acceptor substance, 7,7,8,8-tetracyano-2,3,5,6-tetrafluoro-quinodimethane (abbreviation: F$_4$-TCNQ), chloranil, and the like can be given. In addition, a transition metal oxide can be given. In addition, oxides of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable since their electron-accepting properties are high. Among them, molybdenum oxide is especially preferable since it is stable in air, has a low hygroscopic property, and is easily treated.

Further, with the structure in which an accepter substance is added to a substance having a high hole-transporting property and/or the structure in which a donor substance is added to a substance having a high electron-transporting property, the driving voltage can be kept from increasing even in the case of making the first cathode and/or the second anode thicker. Thus, since making the first cathode and/or the second anode thicker can prevent short circuit caused by a minute foreign object, an impact, or the like, a highly reliable light-emitting element can be obtained. While an increase in driving voltage is suppressed, the thickness of the first cathode and/or the second anode can be optimized by optical design.

Further, the first light-emitting element 210 includes the first light-emitting layer 212A containing any of the anthracene derivatives described in Embodiment Mode 1 and the second light-emitting layer 212B containing a light-emitting substance having an emission color that is different from that of the first light-emitting layer 212A. It is to be noted that the first light-emitting layer 212A and the second light-emitting layer 212B may be stacked in the inverse order.

Further, the second light-emitting element 220 includes the third light-emitting layer 222A and the fourth light-emitting layer 222B. The third light-emitting layer 222A and the fourth light-emitting layer 222B emit light of different emission colors. It is to be noted that the third light-emitting layer 222A and the fourth light-emitting layer 222B may be stacked in the inverse order.

When the first anode 211 side is positively biased and the second cathode 223 side is negatively biased in the light-emitting elements as described above, a current with a given current density J flows through the light-emitting element. At this time, holes are injected from the first anode 211 to the first light-emitting layer and the second light-emitting layer, and electrons are injected from the first cathode 213 to the first light-emitting layer and the second light-emitting layer, and when the electrons and the holes recombine, light can be emitted from the first light-emitting element 210. Light emitted from the first light-emitting element has a first emission spectrum 230 shown in FIG. 2B. The first emission spectrum 230 has at least two peaks. Further, holes are injected from the second anode 221 to the third light-emitting layer and the fourth light-emitting layer, and electrons are injected from the second cathode 223 to the third light-emitting layer and the fourth light-emitting layer, and when the electrons and the holes recombine, light can be emitted from the second light-emitting element 220. Light emitted from the second light-emitting element has a second emission spectrum 240 shown in FIG. 2B. The second emission spectrum 240 has at least two peaks. That is, light can be emitted from both the first light-emitting element and the second light-emitting element.

It is to be noted that in an equivalent circuit, the common current with the current density J flows through the first light-emitting element 210 and the second light-emitting element 220, and each element emits light with a luminance which corresponds to the current density J. Here, when the first anode 211, the first cathode 213, and the second anode 221 are light-transmitting electrodes, both light emitted from the first light-emitting element and light emitted from the second light-emitting element can be extracted. Further, when the second cathode 223 is an electrode having a light-reflecting property, emitted light can be reflected and extracted efficiently on the side through which light is extracted.

In this embodiment mode, the two peaks of the first emission spectrum 230 and the two peaks of the second emission spectrum 240 are preferably located at different positions. That is, the peaks of the first emission spectrum and the peaks of the second emission spectrum do not overlap with each other. With such a structure, light having a broad spectrum can be obtained.

In particular, the peaks preferably located in the wavelength region of more than or equal to 400 nm and less than 470 nm, the wavelength region of more than or equal to 470 nm and less than 540 nm, the wavelength region of more than or equal to 540 nm and less than 600 nm, and the wavelength region of more than or equal to 600 nm and less than 700 nm.

With such a structure, white light having a broad spectrum over the whole visible light region can be emitted. A light-emitting element having such a structure has an excellent color rendering property and therefore suitable for use in a lighting apparatus.

Furthermore, an emission color of any of the anthracene derivatives described in Embodiment Mode 1 which is contained in the first light-emitting layer 212A and an emission color of the second light-emitting substance contained in the second light-emitting layer 212B are preferably complementary colors. Also, an emission color of the third light-emitting substance contained in the third light-emitting layer 222A and an emission color of the fourth light-emitting substance contained in the fourth light-emitting layer 222B are preferably complementary colors. With such a structure, an emission color of light from the first light-emitting element is white and an emission color of light from the second light-emitting element is white. Then, light emitted from the first light-emitting element and light emitted from the second light-emitting element are combined with each other so that white light can be emitted from the stacked type light-emitting element.

The anthracene derivatives described in Embodiment Mode 1 emit blue to yellow green light. Therefore, when an anthracene derivative that emits blue light among the anthracene derivatives described in Embodiment Mode 1 and a light-emitting substance that emits yellow to orange light are combined with each other, a white light-emitting element can be obtained. Alternatively, when an anthracene derivative that emits blue green to green light and a light-emitting substance that emits red light are combined with each other, a white light-emitting element can be obtained. In addition, as the light-emitting element (the stacked type light-emitting element) in which the first light-emitting element and the second light-emitting element are stacked, a white light-emitting element can be obtained.

Any of the anthracene derivatives described in Embodiment Mode 1 which have high emission efficiency and also a long life is preferably used for the first light-emitting element and the second light-emitting element. However, the light-emitting elements described in this embodiment mode are not limited to such a structure. Any of the anthracene derivatives described in Embodiment Mode 1 may be contained in at least one of the first light-emitting element and the second light-emitting element.

Further, when a light-emitting substance other than the anthracene derivatives described in Embodiment Mode 1 is used for the light-emitting layer, any of a variety of light-emitting substances can be used. For example, a fluorescent material or a phosphorescent material can be used.

For example, as a material having an emission peak in the yellow to orange wavelength region (greater than or equal to 540 nm and less than 600 nm), any of the materials described in Embodiment Mode 2 can be used. Furthermore, as a material having an emission peak in the red wavelength region (greater than or equal to 600 nm and less than 700 nm), any of the materials described in Embodiment Mode 2 can be used.

Further, as a material that exhibits an emission spectrum having a peak in the blue wavelength range (more than or equal to 400 nm and less than 470 nm), perylene, 2,5,8,11-tetra(tert-butyl)perylene (abbreviation: TBP), or the like can be used. In addition, a styrylarylene derivative such as 4,4'-bis(2,2-diphenylvinyl)biphenyl (abbreviation: DPVBi), or an anthracene derivative such as 9,10-diphenylanthracene, 9,10-di(2-naphthyl)anthracene (abbreviation: DNA), or 9,10-bis(2-naphthyl)-2-t-butylanthracene (abbreviation: t-BuDNA) can be used. Alternatively, a polymer such as poly(9,9-dioctylfluorene) may be used. Further, for the material that exhibits an emission spectrum having a peak in the blue wavelength range (more than or equal to 400 nm and less than 470 nm), a styrylamine derivative is preferably used, and examples thereof include N,N-bis[4-(9H-carbazol-9-yl)phenyl]-N,N'-diphenylstilbene-4,4'-diamine (abbreviation: YGA2S), N,N'-diphenyl-N,N'-bis(9-phenyl-9H-carbazol-3-yl)stilbene-4,4'-diamine (abbreviation: PCA2S), and the like. In particular, YGA2S exhibits an emission spectrum having a peak at about 450 nm and thus is preferable. In addition, any of these light-emitting substances (a guest material) may be dispersed into another substance (a host material) to form the light-emitting layer. For the host material in this case, an anthracene derivative is preferably used, and 9,10-bis(2-naphthyl)-2-t-butylanthracene (abbreviation: t-BuDNA) or 9-[4-(N-carbazolyl)phenyl]-10-phenylanthracene (abbreviation: CzPA) is preferably used. In particular, CzPA is electrochemically stable and thus preferably used.

Examples of a material that exhibits an emission spectrum having a peak in the blue green to green wavelength range (more than or equal to 470 nm and less than 540 nm) include coumarin derivatives such as coumarin 30 and coumarin 6, metal complexes such as BAlq, $Zn(BTZ)_2$, and bis(2-methyl-8-quinolinolato)gallium chloride (abbreviation: $Ga(mq)_2Cl$). Alternatively, bis[2-(4',6'-difluorophenyl)pyridinato-N,$C^{2'}$] iridium picolinate (abbreviation: FIrpic), bis[2-phenylpyridinato-N,$C^{2'}$]iridium acetylacetonate (abbreviation: $Ir(ppy)_2$(acac)), or the like may be used as a guest material and dispersed into an appropriate host material. Further alternatively, perylene or TBP, which is described above, may be dispersed into an appropriate host material at a high concentration of 5 wt % or more. Alternatively, a polymer such as poly(p-phenylenevinylene) may be used. For the material that exhibits an emission spectrum having a peak in the blue green to green wavelength range (more than or equal to 470 nm and less than 540 nm), an anthracene derivative, which can emit light with high efficiency, is preferably used. For example, an anthracene derivative in which the 2-position is substituted with an amino group can emit green light with high efficiency and thus is preferably used. For example, N-(9,10-diphenyl-2-anthryl)-N,9-diphenyl-9H-carbazol-3-amine (abbreviation: 2PCAPA) has a long life and thus is preferably used. In addition, any of these light-emitting substances (a guest material) may be dispersed into another substance (a host material) to form the light-emitting layer. For the host material in this case, an anthracene derivative is preferably used, and CzPA described above is electrochemically stable and thus preferably used. In the case where blue light emission and green light emission are combined with each other to fabricate a light-emitting element that exhibits an emission spectrum with two peaks in the blue to green wavelength ranges, it is preferable to employ a structure in which an anthracene derivative having an electron-transporting property, such as CzPA, is used for the host of the blue light-emitting layer and an aromatic amine compound having a hole-transporting property, such as NPB, is used for the green light-emitting layer so that light emission at an interface between a blue light-emitting layer and a green light-emitting layer can be obtained. That is, in this case, for a host material for a green light-emitting material such as 2PCAPA, an aromatic amine compound such as NPB is preferably used.

It is to be noted that the emission colors of the light-emitting substances given above may change to some extent depending on the host material or the element structure.

In a white light-emitting element having the above structure, compared with the light-emitting element described in Embodiment Mode 2, the emission color is not easily changed by a change in the voltage or current density. For example, even a change in luminance of the fourth light-emitting layer 222B which is caused by deterioration over time results in a relatively small change in the chromaticity because the contribution of the fourth light-emitting layer 222B with respect to the luminance of the whole stacked type light-emitting element is approximately one quarter.

Further, in the case of the stacked type light-emitting element described in this embodiment mode, the number of the stacked light-emitting elements can be made smaller than in the case where light-emitting elements each having only one peak are stacked in series. Thus, the stacked type light-emitting element described in this embodiment mode is advantageous in that an increase in driving voltage caused by stacking the light-emitting elements can be suppressed. Further, in the stacked type light-emitting element described in this embodiment mode, since a luminance obtained is the sum of both the luminance of the first light-emitting element and the luminance of the second light-emitting element, which are obtained with respect to a given current density J, a high luminance with respect to a current (i.e., current efficiency) can also be obtained.

Further, in the light-emitting elements described in FIGS. 2A and 2B, the first light-emitting layer 212A that exhibits a longer wavelength emission spectrum than the second light-emitting layer 212B is preferably placed away from the light-reflecting electrode so that interference of light can be suppressed. In addition, the third light-emitting layer 222A that exhibits a longer wavelength emission spectrum than the fourth light-emitting layer 222B is preferably placed away from the light-reflecting electrode so that interference of light can be suppressed.

It is to be noted that in FIGS. 2A and 2B, the second cathode 223 is a light-reflecting electrode, and emitted light is extracted through the first anode and the substrate 200. Thus, preferably, the thickness of each of the fourth light-emitting layer 222B, the third light-emitting layer 222A, the second anode 221, the second light-emitting layer 212B, the first light-emitting layer 212A, and the like is adjusted in consideration of, for example, interference of light.

In addition, in the description of FIG. 2A, the second cathode 223 is a light-reflecting electrode. However, a structure in which the second cathode 223 is a light-transmitting electrode and further a light-reflecting film is formed above the second cathode may also be employed. In this case, the thickness of each of the second cathode 223, the fourth light-emitting layer 222B, the third light-emitting layer 222A, the second anode 221, the second light-emitting layer 212B, the first light-emitting layer 212A, and the like is preferably adjusted in consideration of interference of light. Preferably a material with low electrical resistance, for example, a conductive material containing aluminum (Al), silver (Ag), or the like is used for the light-reflecting electrode, and accordingly the power consumption of the light-emitting element can be reduced.

Further, in the above description, a structure in which the second cathode 223 is a light-reflecting electrode and emitted light is extracted through the first anode 211 and the substrate 200 is described; however, the present invention is not limited to this structure. For example, a structure may be employed in which the second light-emitting element 220 is formed over a substrate; over that, the first light-emitting element 210 is formed; the second anode 221 is a light-reflecting electrode; the second cathode 223, the first anode 221, and, the first cathode 213 are light-transmitting electrodes; and emitted light is extracted in the direction opposite to that shown in FIG. 2A. Further, a structure in which the second anode 221 is not a light-reflecting electrode but a light-transmitting electrode and a light-reflecting film is provided below the second anode may be employed.

In addition, in FIGS. 2A and 2B, the anode is formed on the substrate side; however, the cathode may be provided on the substrate side.

Furthermore, light may be made more like natural light having a continuous spectrum by adjusting the thickness of each stacked layer to deliberately create slight interference of light so that the production of a sharp peak which juts out is suppressed and a trapezoidal emission spectrum is obtained. Further, by adjusting the thickness of each stacked layer to deliberately create slight interference of light, the position of a peak of an emission spectrum can be changed. By adjusting the thickness of each stacked layer so that a plurality of peak intensities that appears in an emission spectrum is made roughly the same, and further by decreasing the intervals between peaks, white light emission having an emission spectrum that is closer to a trapezoidal shape can be obtained.

By applying the present invention, a white color that is close to natural light having a continuous spectrum can be obtained by adjusting the thickness or material of each layer and utilizing interference of light. Therefore, the light-emitting element of the present invention is suitable for use in a lighting apparatus.

It is to be noted that this embodiment mode can be combined with any other embodiment mode described in this specification as appropriate.

Embodiment Mode 4

Figure 3A:
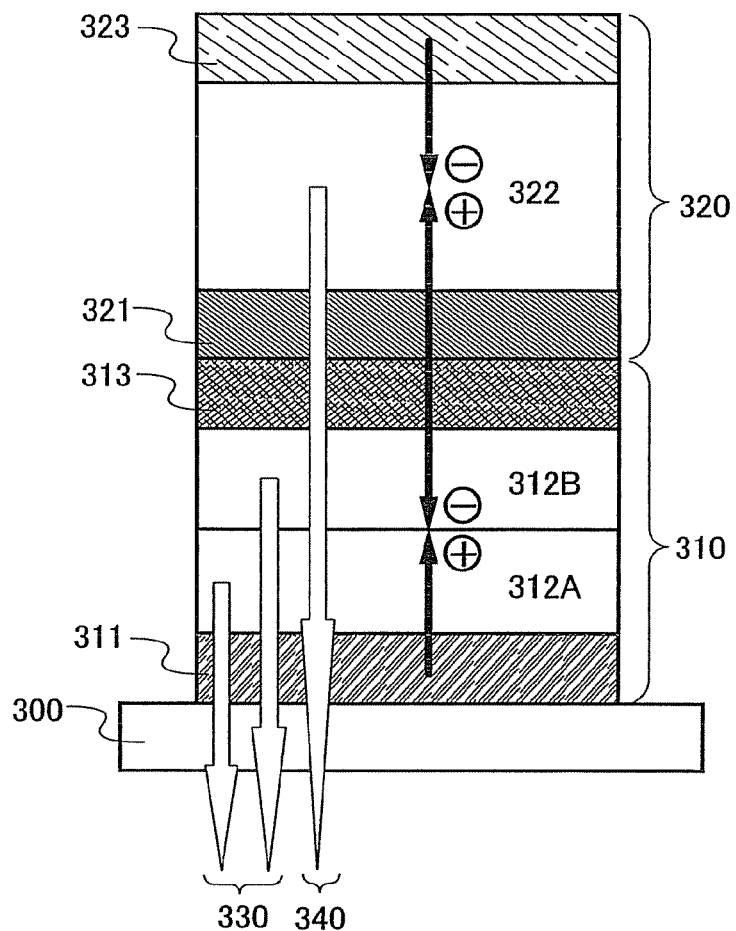
FIGS. 3A and 3B illustrate a light-emitting element according to, an aspect of the present invention.
Figure 3B:
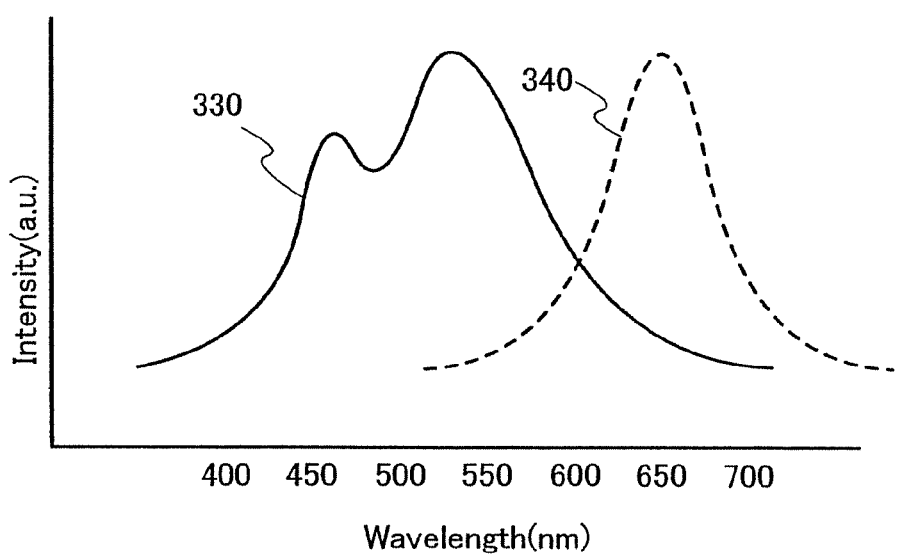

In this embodiment mode, an example of a structure of a light-emitting element of the present invention is described using FIGS. 3A and 3B.

In FIGS. 3A and 3B, a first light-emitting element 310 and a second light-emitting element 320 are stacked over a substrate 300. The first light-emitting element 310 and the second light-emitting element 320 are connected in series to each other. The first light-emitting element 310 is a light-emitting element as described in Embodiment Mode 2, and includes a first light-emitting layer 312A and a second light-emitting layer 312B between a first anode 311 and a first cathode 313. Further, the second light-emitting element 320 includes a third light-emitting layer 322 between a second anode 321 and a second cathode 323. In addition, in FIGS. 3A and 3B, the first anode 311 is an electrode having a light-transmitting property and the second cathode 323 is an electrode having a light-reflecting property.

The substrate 300 can be similar to those described in Embodiment Mode 2 and Embodiment Mode 3.

The first anode 311, the first cathode 313, the second anode 321, and the second cathode 323 can also be similar to those described in Embodiment Mode 2 and Embodiment Mode 3.

Further, the first light-emitting element 310 includes the second light-emitting layer 312B containing any of the anthracene derivatives described in Embodiment Mode 1 and the first light-emitting layer 312A containing a light-emitting substance having an emission color that is different from that of the second light-emitting layer 312B. It is to be noted that the first light-emitting layer 312A and the second light-emitting layer 312B may be stacked in the inverse order.

Further, the second light-emitting element 320 includes the third light-emitting layer 322. The third light-emitting layer 322 exhibits an emission color different from those of the light-emitting layer 312A and the second light-emitting layer 312B.

When the first anode 311 side is positively biased and the second cathode 323 side is negatively biased in the light-emitting elements as described above, both light from the first light-emitting element and light from the second light-emitting element can be emitted. Light emitted from the first light-emitting element has a first emission spectrum 330. The first emission spectrum 330 has at least two peaks. Further, light emitted from the second light-emitting element has a second emission spectrum 340. The second emission spectrum 340 has at least one peak.

In this embodiment mode, the two peaks of the first emission spectrum 330 and the one peak of the second emission spectrum 340 are preferably located at different positions. That is, the peaks of the first emission spectrum and the peak of the second emission spectrum do not overlap with each other. With such a structure, light having a broad spectrum can be emitted.

In particular, the peaks preferably located in the wavelength region of more than or equal to 400 nm and less than 500 nm, the wavelength region of more than or equal to 500 nm and less than 600 nm, and the wavelength region of 600 nm and less than 700 nm. With such a structure, white light having a broad spectrum over the whole visible light region can be emitted. A light-emitting element having such a structure has an excellent color rendering property and therefore suitable for use in a lighting apparatus.

Furthermore, the first light-emitting layer 312A, the second light-emitting layer 312B, and the third light-emitting layer 322 preferably emit green light, blue light, and red light, respectively. With such a structure, white light can be emitted from the stacked type light-emitting element.

The anthracene derivatives described in Embodiment Mode 1 emit blue to yellow green light. Therefore, when an anthracene derivative that emits blue light among the anthracene derivatives described in Embodiment Mode 1, a light-emitting substance that emits green light, and a light-emitting substance that emits red light are combined with each other, a white light-emitting element can be obtained. Alternatively, when a light-emitting substance that emits blue light, an anthracene derivative that emits green light, and a light-emitting substance that emits red light are combined with each other, a white light-emitting element can be obtained.

Any of the anthracene derivatives described in Embodiment Mode 1 which have high emission efficiency and also a long life is preferably used for two of the three light-emitting layers. However, the light-emitting elements described in this embodiment mode are not limited to such a structure. Any of the anthracene derivatives described in Embodiment Mode 1 may be contained in at least one of the three light-emitting layers In addition, when a light-emitting substance other than the anthracene derivatives described in Embodiment Mode 1 is used for the light-emitting layer, a variety of light-emitting substances can be used. For example, a fluorescent material or a phosphorescent, material can be used.

For example, as a material having an emission peak in the wavelength region of greater than or equal to 600 nm and less than 700 nm, any of the materials described in Embodiment Mode 2 can be used.

Further, examples of the material that exhibits an emission spectrum having a peak in the wavelength range of more than or equal to 500 nm and less than 600 nm include rubrene, (2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), bis[2-(2-thienyl)pyridinato]iridium acetylacetonato (abbreviation: Ir(thp)$_2$(acac)), bis(2-phenylquinolinato)iridium acetylacetonato (abbreviation: Ir(pq)$_2$(acac)), and the like. Alternatively, bis[2-phenylpyridinato-N,C$^{2'}$]iridium acetylacetonate (abbreviation: Ir(ppy)$_2$(acac)), tris(2-phenylpyridinato-N,C$^{2'}$)iridium (abbreviation: Ir(ppy)$_3$), or the like can be used. In particular, a tetracene derivative such as rubrene has high efficiency and chemical stability and thus is preferable. Alternatively, in particular, N-(9,10-diphenyl-2-anthryl)-N,9-diphenyl-9H-carbazol-3-amine (abbreviation: 2PCAPA) has a long life and thus is preferable. In addition, any of the above light-emitting substances (a guest material) may be dispersed into another substance (a host material) to form in the light-emitting layer. For the host material in this case, an aromatic amine compound such as 4,4'-bis[N-(1-naphthyl)-N-phenylamino]biphenyl (abbreviation: NPB) or 4-(9H-carbazol-9-yl)-4'-(10-phenyl-9-anthryl)triphenylamine (abbreviation: YGAPA) is preferably used. Alternatively, an anthracene derivative is preferably used, and CzPA described above is electrochemically stable and thus preferably used. Alternatively, a polymer such as poly(2,5-dialkoxy-1,4-phenylenevinylene) may be used.

Further, for the material that exhibits an emission spectrum having a peak in the wavelength range of more than or equal to 400 nm and less than 500 nm, any of the anthracene derivatives described in Embodiment Mode 1 can be used.

In a white light-emitting element having the above structure, compared with the light-emitting element described in Embodiment Mode 2, the emission color is not easily changed by a change in the voltage or current density. For example, even a change in luminance of the first light-emitting layer 312A which is caused by deterioration over time results in a relatively small change in the chromaticity because the contribution of the first light-emitting layer 312A with respect to the luminance of the whole stacked type light-emitting element is approximately one third.

Further, the white light-emitting element having the above structure has peaks in each of the red wavelength region, the green wavelength region, and the blue wavelength region, and therefore can preferably be used for a full color display in which a color filter is used.

Further, the light-emitting elements described in this embodiment mode contains any of the anthracene derivatives described in Embodiment Mode 1. The anthracene derivatives described in Embodiment Mode 1 have an emission spectrum having a peak in the blue green to yellow green wavelength range, and thus light emission with high efficiency can be achieved. Therefore, by use of any of the anthracene derivatives described in Embodiment Mode 1, a light-emitting element with high emission efficiency can be obtained. Further, the anthracene derivatives described in Embodiment Mode 1 are stable with respect to repeated redox reactions and electrochemically stable. Therefore, by use of any of the anthracene derivatives described in Embodiment Mode 1, a light-emitting element that does not easily deteriorate and has a long life can be obtained.

Further, in the case of the stacked type light-emitting element described in this embodiment mode, the number of the stacked light-emitting elements can be made smaller than in the case where light-emitting elements each having only one peak are stacked in series. Thus, the stacked type light-emitting elements described in this embodiment mode are advantageous in that an increase in driving voltage caused by stacking the light-emitting elements can be suppressed. Further, in the stacked type light-emitting elements described in this embodiment mode, since a luminance obtained is the sum of both the luminance of the first light-emitting element and the luminance of the second light-emitting element, which are obtained with respect to a given current density J, a high luminance with respect to current (i.e., current efficiency) can also be obtained.

In addition, in FIGS. 3A and 3B, the first light-emitting layer 312A that exhibits a longer wavelength emission spectrum than the second light-emitting layer 312B is preferably placed away from the light-reflecting electrode so that interference of light can be suppressed.

It is to be noted that in FIGS. 3A and 3B, the second cathode 323 is a light-reflecting electrode, and emitted light is extracted through the first anode and the substrate 300. Thus, preferably, the thickness of each of the third light-emitting layer 322, the second anode 321, the second light-emitting layer 312B, the first light-emitting layer 312A, and the like is adjusted in consideration of interference of light.

Further, it is to be noted that in the description of FIG. 3A, the second cathode 323 is a light-reflecting electrode. However, a structure in which the second cathode 323 is a light-transmitting electrode and further a light-reflecting film is formed above the second cathode may be employed. In this case, the thickness of each of the second cathode 323, the third light-emitting layer 322, the second anode 321, the second light-emitting layer 312B, the first light-emitting layer 312A, and the like is preferably adjusted in consideration of interference of light. Preferably, a material with low resistance, for example, a conductive material containing aluminum (Al), silver (Ag), or the like is used for the light-reflecting electrode, and accordingly the power consumption of the light-emitting element can be reduced.

Further, in FIGS. 3A and 3B, a structure in which the second cathode 323 is a light-reflecting electrode and emitted light is extracted through the first anode 311 and the substrate 300 is described; however, the present invention is not limited to this structure. For example, a structure may be employed in which the second light-emitting element 320 is formed over a substrate; over that, the first light-emitting element 310 is formed; the second anode 321 is a light-reflecting electrode; the second cathode 323, the first anode 311, and the first cathode 313 are light-transmitting electrodes; and emitted light is extracted in the direction opposite to that shown in FIG. 3A. Further, a structure in which the second anode 321 is not a light-reflecting electrode but a light-transmitting electrode and a light-reflecting film is provided below the second anode may be employed.

Further, in FIGS. 3A and 3B, the anode is formed on the substrate side; however, the cathode may be provided on the substrate side.

Furthermore, light may be made more like natural light having a continuous spectrum by adjusting the thickness of each stacked layer to deliberately create slight interference of light so that the production of a sharp peak which juts out is suppressed and a trapezoidal emission spectrum is obtained. Further, by adjusting the thickness of each stacked layer to deliberately create slight interference of light, the position of a peak of an emission spectrum can be changed. By adjusting the thickness of each stacked layer so that a plurality of peak intensities that appears in an emission spectrum is made roughly the same, and further by decreasing the intervals between peaks, white light emission having an emission spectrum that is closer to a trapezoidal shape can be obtained.

It is to be noted that this embodiment mode can be combined with any other embodiment mode described in this specification as appropriate.

Embodiment Mode 5

In this embodiment mode, a material and an element structure which can be applied to the first light-emitting element and the second light-emitting element shown in FIG. 1A, FIG. 2A, and FIG. 3A are described.

Figure 4A:
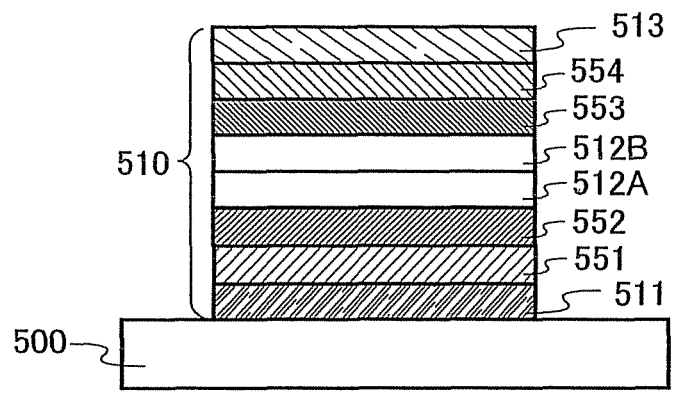
FIGS. 4A and 4B each illustrate a light-emitting element according to an aspect of the present invention.
Figure 4B:
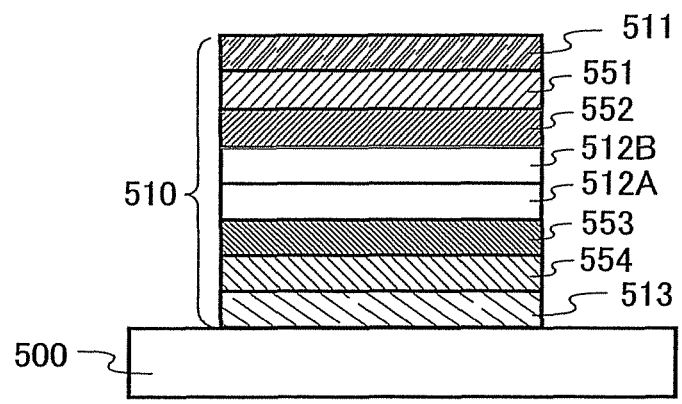

In FIG. 1A, FIG. 2A, and FIG. 3A, a hole-injecting layer and/or a hole-transporting layer may be interposed between the first anode and the first light-emitting layer. Further, in FIG. 1A, FIG. 2A, and FIG. 3A, an electron-injecting layer and/or an electron-transporting layer may be interposed between the first cathode and the second light-emitting layer. FIGS. 4A and 4B each illustrate a light-emitting element having a structure in which a hole-injecting layer 551 and a hole-transporting layer 552 are interposed between a first anode 511 and a first light-emitting layer 512A, and an electron-transporting layer 553 and an electron-injecting layer 554 are interposed between a first cathode 513 and a second light-emitting layer 512B.

Further, in FIG. 4A, the first anode 511 is provided on a substrate 500 side, but the first cathode 513 may be provided on the substrate 500 side as shown in FIG. 4B. In this case, the hole-injecting layer 551, the hole-transporting layer 552, the electron-transporting layer 553, and the electron-injecting layer 554 are stacked in the inverse order of that shown in FIG. 4A.

In addition, similarly to the first light-emitting element, in FIG. 2A, a hole-injecting layer and/or a hole-transporting layer may be interposed between the second anode and the third light-emitting layer. Further, in FIG. 2A, an electron-injecting layer and/or an electron-transporting layer may be interposed between the second cathode and the fourth light-emitting layer.

In addition, similarly to the first light-emitting element, in FIG. 3A, a hole-injecting layer and/or a hole-transporting layer may be interposed between the second anode and the third light-emitting layer. Further, in FIG. 3A, an electron-injecting layer and/or an electron-transporting layer may be interposed between the second cathode and the third light-emitting layer.

It is to be noted that a hole-injecting layer is a layer which exhibits a function of accepting holes from an anode, and a hole-transporting layer is a layer which exhibits a function of donating holes to a light-emitting layer. Further, an electron-injecting layer is a layer which exhibits a function of accepting electrons from a cathode, and an electron-transporting layer is a layer which exhibits a function of donating electrons to a light-emitting layer.

Materials that can be used for each layer are specifically shown as examples. However, materials that can be applied to the present invention are not limited to these examples.

The hole-injecting layer is a layer that contains a substance having a high hole-injecting property. As the substance having a high hole-injecting property, molybdenum oxide, vanadium oxide, ruthenium oxide, tungsten oxide, manganese oxide, or the like can be used. In addition, a phthalocyanine-based compound such as phthalocyanine (abbreviation: $H_2Pc$) or copper phthalocyanine (abbreviation: CuPc); a high molecule such as poly(3,4-ethylenedioxythiophene)/poly(styrenesulfonic acid) (PEDOT/PSS), or the like can be used to form the hole-injecting layer.

Alternatively, for the hole-injecting layer, a composite material in which an acceptor substance is mixed into a substance having a high hole-transporting property can be used. It is to be noted that by using such a composite material in which an acceptor substance is mixed into a substance having a high hole-transporting property, a material for forming an electrode can be selected regardless of the work function. In other words, besides a material with a high work function, a material with a low work function may also be used for the anode. As examples of the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable since their electron-accepting properties are high. Among them, molybdenum oxide is especially preferable since it is stable in air, has a low hygroscopic property, and is easily treated.

As a substance having a high hole-transporting property used for the composite material, any of a variety of compounds such as aromatic amine compounds, carbazole derivatives, aromatic hydrocarbons, and high molecular compounds (such as oligomers, dendrimers or polymers) can be used. It is to be noted that the substance having a high hole-transporting property used for the composite material is preferably a substance having a hole mobility of $10^{-6}$ cm$^2$/(V·s) or higher is preferably used. However, any substance other than these substances may be used as long as it is a substance in which the hole-transporting property is higher than the electron-transporting property. The substance having a high hole-transporting property which can be used for the composite material is specifically given below.

As an aromatic amine compound which can be used for the composite material, for example, 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]-1,1'-biphenyl (abbreviation: BSPB), or the like can be used. Alternatively, N,N'-bis(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), or the like can be used.

As carbazole derivatives which can be used for the composite material, the following can be given specifically: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Moreover, as a carbazole derivative which can be used for the composite material, 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), 1,4-bis[4-(N-carbazolyl)phenyl]-2,3,5,6-tetraphenylbenzene, or the like can be used.

Further, as an aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, the aromatic hydrocarbon which, has a hole mobility of $1\times10^{-6}$ cm$^2$/(V·s) or higher and which has 14 to 42 carbon atoms is preferably used.

It is to be noted that the aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Further, a high molecular compound (an oligomer, a dendrimer, a polymer, or the like) can be used for the hole-injecting layer. For example, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine (abbreviation: poly-TPD) can be used. In addition, a high molecular compound doped with acid, such as poly(3,4-ethylenedioxythiophene)/poly(styrenesulfonic acid) (PEDOT/PSS) or polyaniline/poly(styrenesulfonic acid) (PAni/PSS), can be used.

Further, the hole-injecting layer may be formed using a composite material that is formed using the above high molecular compound, such as PVK, PVTPA, PTPDMA, or Poly-TPD, and the above acceptor substance.

The hole-transporting layer is a layer containing a substance having a high hole-transporting property. As a substance having a high hole-transporting property, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis[N-(spiro-9,9'-bifluoren-2-yl)-N-phenylamino]-1,1'-biphenyl (abbreviation: BSPB) or the like can be used. The substances mentioned here mainly are substances having a hole mobility of $10^{-6}$ cm$^2$/(V·s) or higher. However, any substance other than the above substances may be used as long as it is a substance in which the hole-transporting property is higher than the electron-transporting property. It is to be noted that the layer containing a substance having a high hole-transporting property may be not only a single layer but also a stack of two or more layers containing the aforementioned substances.

Further, for the hole-transporting layer, a high molecular compound such as PVK, PVTPA, PTPDMA, or Poly-TPD can be used.

The electron-transporting layer is a layer containing a material with a high electron-transporting property. For example, a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryilium (abbreviation: BeBq$_2$), or bis(2-methyl-8-quinolinolato)(4-phenylphenolato)aluminum (abbreviation: BAlq), or the like can be used: Alternatively, a metal complex having an oxazole-based or thiazole-based ligand, such as bis[2-(2-hydroxyphenyl)benzoxazolato]zinc (abbreviation: Zn(BOX)$_2$), or bis[2-(2-hydroxyphenyl)-benzothiazolato]zinc (abbreviation: Zn(BTZ)$_2$), or the like can be used. Furthermore, besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are materials having an electron mobility of $10^{-6}$ cm$^2$/(V·s) or higher. However, any substance other than the above substances may be used as long as it is a substance in which the electron-transporting property is higher than the hole-transporting property. Further, the electron-transporting layer may be not only a single layer but also a stack of two or more layers containing the aforementioned substances.

For the electron-transporting layer, a high molecular compound may be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

Further, an electron-injecting layer may be provided. For the electron-injecting layer, a compound of an alkali metal or an alkaline earth metal, such as lithium fluoride (LiF), cesium fluoride (CsF), or calcium fluoride (CaF$_2$) can be used. Furthermore, a layer formed in which a substance having an electron-transporting property is combined with an alkali metal or an alkaline earth metal can be used. For example, a layer in which magnesium (Mg) is contained in Alq can be used. It is to be noted that by using a layer formed in which a substance having an electron-transporting property is combined with an alkali metal or an alkaline earth metal as the electron-injecting layer, electrons can be injected efficiently from the cathode, which is preferable.

It is to be noted that there is no limitation on a method of stacking layers of a light-emitting element, in the fabrication of the light-emitting element of the present invention described above. Any of a variety of methods can be applied regardless of a dry method or a wet method, as long as layers can be stacked. In addition, a different film formation method may be used to form each electrode or each layer. A vacuum evaporation method, a sputtering method, or the like can be employed as a dry method. In addition, an inkjet method, a spin coating method, or the like can be employed as a wet method.

For example, among the above-described materials, a high molecular compound may be used to form the EL layer by a wet method. Alternatively, a low molecular organic compound can be used to form the EL layer by a wet method. Further alternatively, a low molecular organic compound may be used to form in the EL layer by a dry method such as a vacuum evaporation method.

In addition, the electrodes may each be formed by a wet method using a sol-gel method, or by a wet method using a paste of a metal material, for example. Alternatively, the electrodes can be formed by a dry method such as a sputtering method or a vacuum evaporation method.

It is to be noted that this embodiment mode can be combined with any other embodiment mode described in this specification as appropriate.

Embodiment Mode 6

Figure 5:
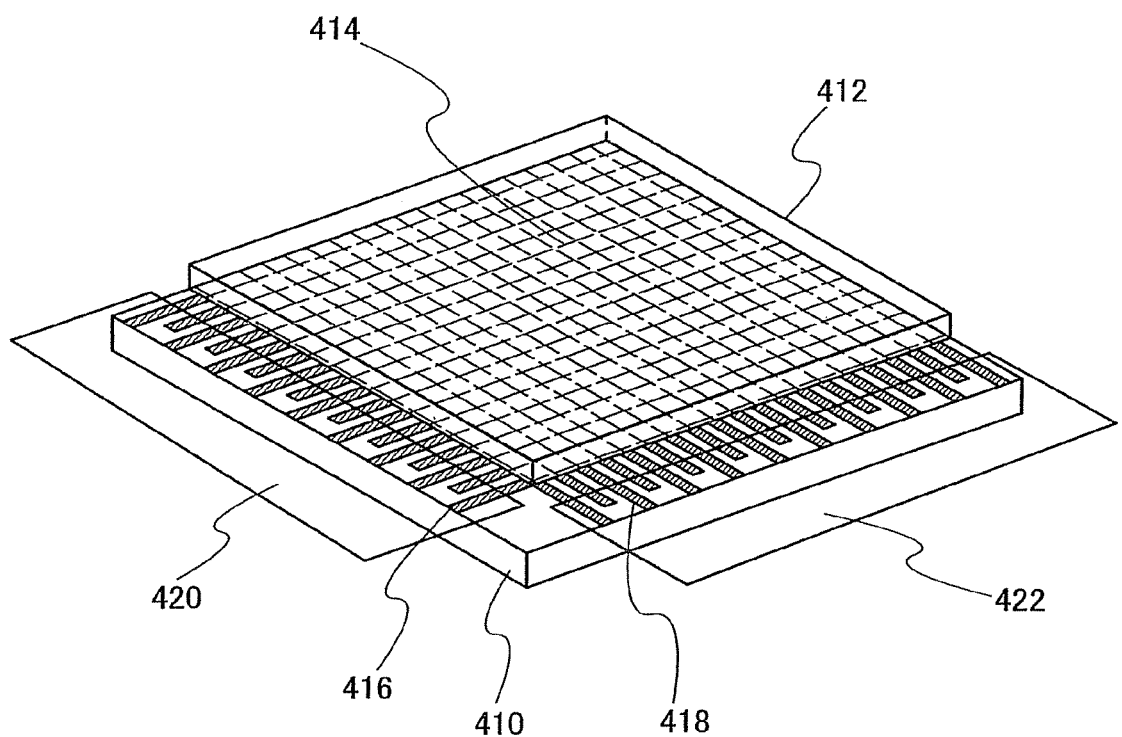
FIG. 5 illustrates a light-emitting device according to an aspect of the present invention.

In this embodiment mode, a light-emitting device manufactured to which the present invention is applied is described. In this embodiment mode, the case where a passive matrix light-emitting device is used as a display device is described using FIG. 5 to FIG. 7, FIGS. 8A and 8B, and FIGS. 9A and 9B. FIG. 5 is a schematic configuration diagram showing a main part of the display device.

Over a substrate 410, a first electrode 416 and a second electrode 418 that extends in a direction intersecting with the first electrode 416 are provided. Light-emitting element similar to those described in Embodiment Modes 2 to 5 are provided at least at the intersection portions of the first electrode 416 and the second electrode 418. In the display device of FIG. 5, a plurality of first electrodes 416 and a plurality of second electrodes 418 are disposed and the light-emitting elements of pixels are arranged in matrix; thus, a display portion 414 is formed. In this display portion 414, emission and non-emission of each light-emitting element are controlled by controlling potentials of the first electrode 416 and the second electrode 418; thus, the display portion 414 can display moving images and still images.

In this display device, a signal for displaying an image (also referred to as a video signal) is applied to each of the first electrode 416 extending in one direction over the substrate 410 and the second electrode 418 that intersects with the first electrode 416; thus, emission or non-emission of each light-emitting element is selected. That is, this is a passive matrix display device of which pixels are driven solely by a signal given from an external circuit. Such a display device has a simple structure and can be manufactured easily even when the area of the device is enlarged.

It is to be noted that an opposite substrate 412 may be provided as necessary, and it can serve as a protective member when provided corresponding to the position of the display portion 414. For this opposite substrate 412, even if a hard plate member is not used, a resin film or a resin material can be applied instead. The first electrode 416 and the second electrode 418 are led to end portions of the substrate 410 and serve as terminals to be connected to external circuits. In other words, the first electrode 416 and the second electrode 418 are in contract with flexible wiring boards 420 and 422 at the end portions of the substrate 410. In the external circuits, there are a power source circuit, a tuner circuit, and/or the like, in addition to a controller circuit that controls the video signal.

Figure 6:
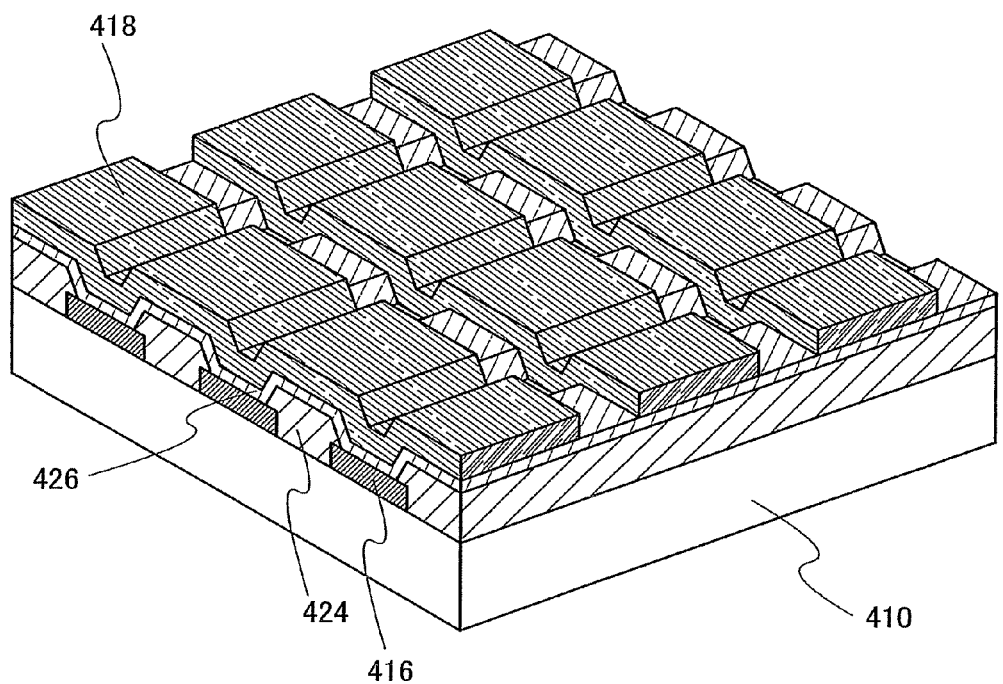
FIG. 6 illustrates a light-emitting device according to an aspect of the present invention.

FIG. 6 is a partial enlarged view showing a structure of the display portion 414. A partition layer 424 is formed on a side end portion of the first electrode 416 formed over the substrate 410. Further, an EL layer 426 is formed at least over an exposed surface of the first electrode 416.

The EL layer is formed between a pair of electrodes. As described in Embodiment Mode 2, two light-emitting layers may be provided in the EL layer, or as in Embodiment Mode 3, four light-emitting layers may be provided in the EL layer. Alternatively, three light-emitting layers may be provided as in Embodiment Mode 4. One of the plural light-emitting layers contains any of the anthracene derivatives described in Embodiment Mode 1. Further, as described in Embodiment Mode 5, functional layers may be provided in addition to the light-emitting layer. It is to be noted that any of a variety of compounds such as low molecular compounds, oligomers, dendrimers, and high molecular compounds can be employed as other materials for the EL layer.

The second electrode 418 is formed over the EL layer 426. The second electrode 418 intersects with the first electrode 416, and thus it extends over the partition layer 424 as well. The partition layer 424 is formed using an insulating material so that short circuit between the first electrode 416 and the second electrode 418 does not occur. In a portion where the partition layer 424 covers the end portion of the first electrode 416, a side end portion of the partition layer 424 is sloped so as not to form a steep step, such that it has a so-called tapered shape. When the partition layer 424 has such a shape, coverage with the EL layer 426 and the second electrode 418 improves, and defects such as cracks or tear can be prevented.

Figure 7:
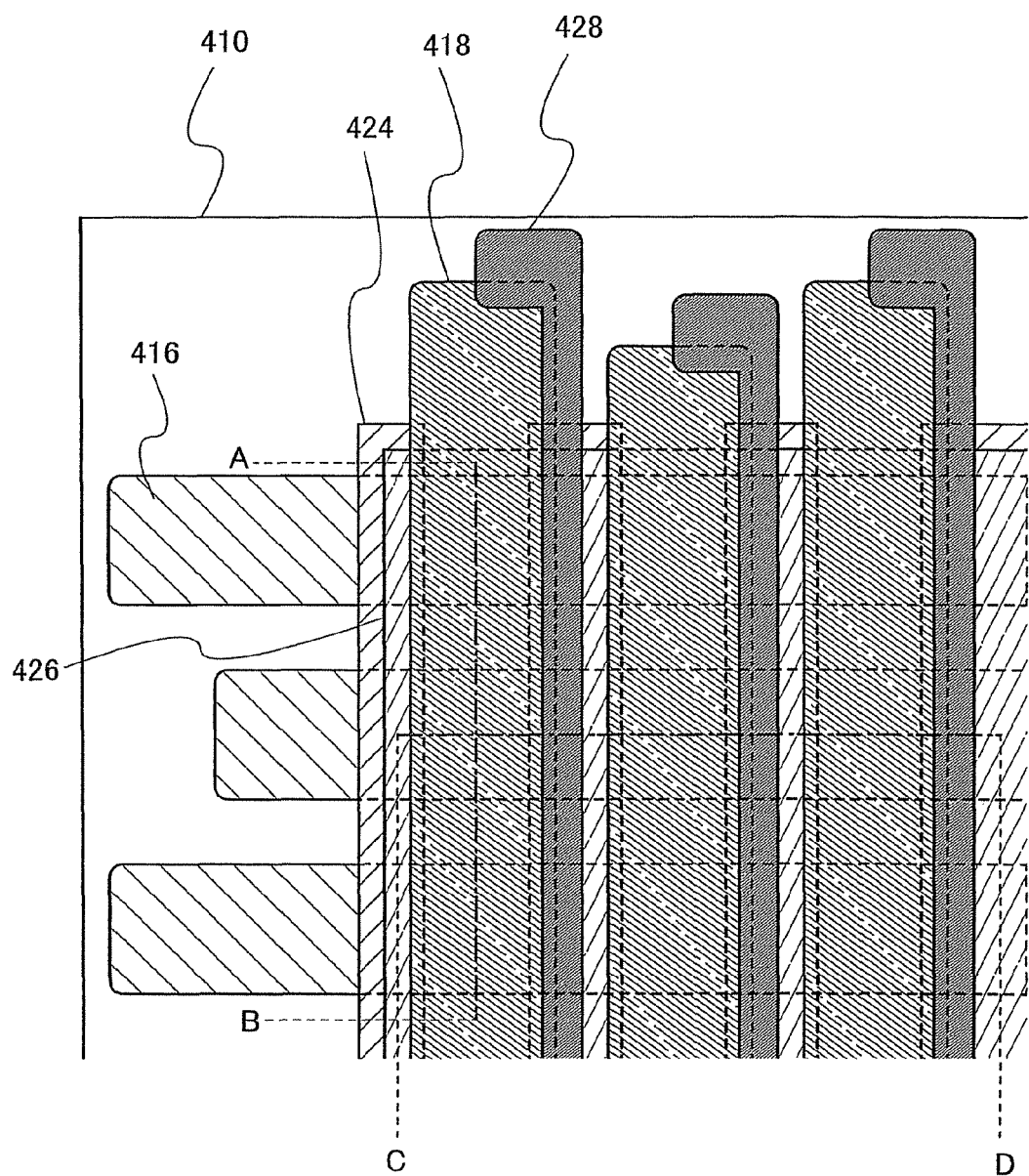
FIG. 7 illustrates a light-emitting device according to an aspect of the present invention.

FIG. 7 is a plane view of the display portion 414, which shows the arrangement of the first electrode 416, the second electrode 418, the partition layer 424, and the EL layer 426. In the case where the second electrode 418 is formed of a transparent conductive film of an oxide such as indium tin oxide or zinc oxide, an auxiliary electrode 428 is preferably provided so as to reduce the resistance loss. In this case, the auxiliary electrode 428 may be formed using a refractory metal such as titanium, tungsten, chromium, or tantalum, or a combination of the refractory metal and a low resistance metal such as aluminum or silver.

Figure 8A:
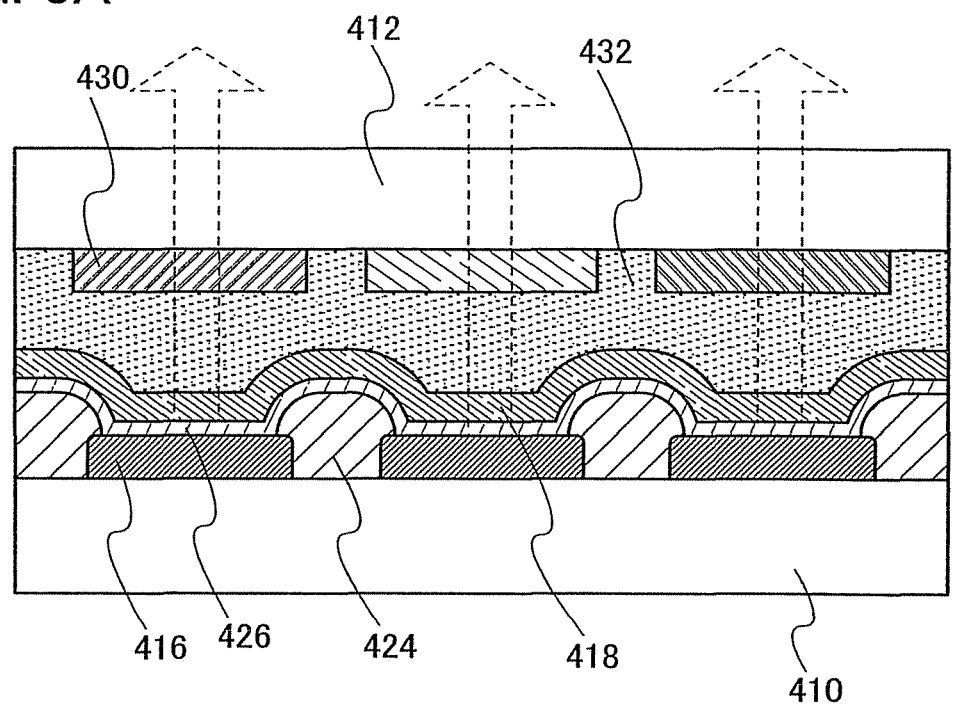
FIGS. 8A and 8B each illustrate a light-emitting device according to an aspect of the present invention.
Figure 8B:
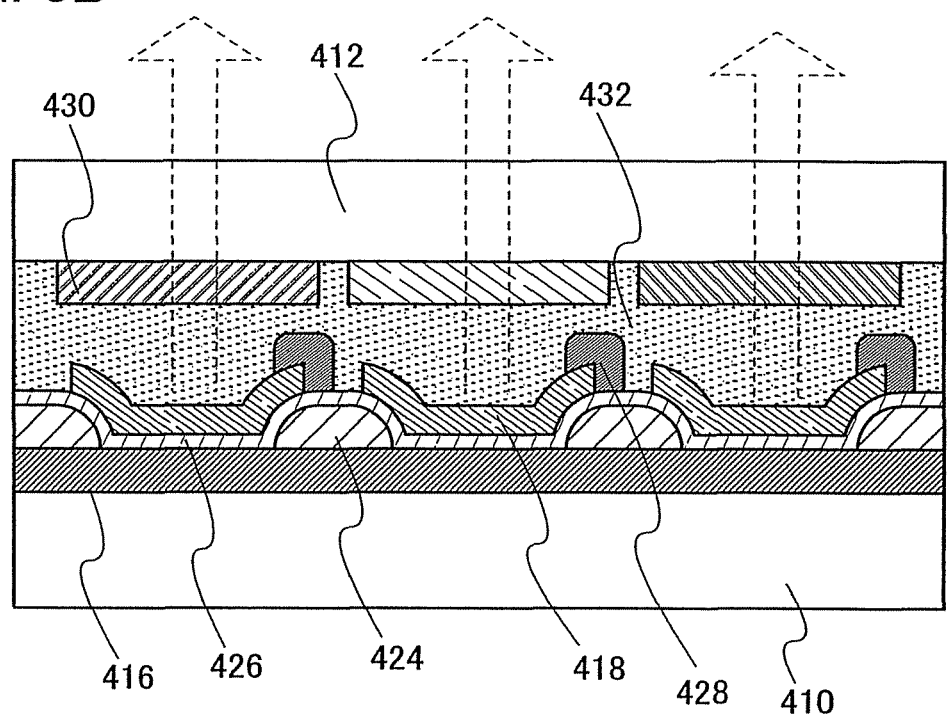

FIGS. 8A and 8B are cross-sectional views taken along the line A-B and the line C-D in FIG. 7, respectively. FIG. 8A is a cross-sectional view in which the first electrodes 416 are lined up, and FIG. 8B is a cross-sectional view in which the second electrodes 418 are lined up. The EL layer 426 is formed at the intersection portions of the first electrode 416 and the second electrode 418, and the light-emitting elements are formed in these portions. The auxiliary electrode 428 shown in FIG. 8B is provided over the partition layer 424 and in contact with the second electrode 418. The auxiliary electrode 428 formed over the partition layer 424 does not block light from the light-emitting element formed at the intersection portion of the first electrode 416 and the second electrode 418; therefore, the emitted light can be efficiently utilized. In addition, short circuit between the auxiliary electrode 428 and the first electrode 416 can be prevented.

In each of FIGS. 8A and 8B, an example in which color conversion layers 430 are provided for the opposite substrate 412 are shown. The color conversion layer 430 converts the wavelength of light emitted from the EL layer 426 so as to change the color of the emitted light. In this case, light emitted from the EL layer 426 is preferably blue light or ultraviolet light with high energy. When the color conversion layers 430 for converting light to red, green, and blue light are arranged, a display device including a light-emitting device that performs full-color display can be obtained. Alternatively, the color conversion layer 430 may be replaced by a colored layer (a color filter) to form a light-emitting device that can perform full-color display. In this case, the EL layer 426 may be made to emit white light. Further, a color conversion layer or a color filter may be provided on a light-extraction side. When light is extracted through the substrate 410, a color conversion layer or a color filter may be provided on the substrate 410 side. Alternatively, a monochrome display device can be provided, without use of a color conversion layer or a color filter.

Alternatively, an EL layer including light-emitting layers that emit light of the same emission color may be formed over the entire surface to provide monochrome light-emitting elements, and a light-emitting device that is capable of performing monochrome display or a light-emitting device that is capable of performing area color display may be provided.

A filler 432 may be provided as appropriate to fix the substrate 410 and the opposite substrate 412 to each other.

In the above description, when aluminum, titanium, tantalum, or the like is used for the first electrode 416 and indium oxide, indium tin oxide (ITO), indium zinc oxide, or zinc oxide is used for the second electrode 418, a display device in which the display portion 414 is formed on the opposite substrate 412 side can be obtained. When indium oxide, indium tin oxide (ITO), indium zinc oxide, or zinc oxide is used for the first electrode 416 and aluminum, titanium, tantalum, or the like is used for the second electrode 418, a display device in which the display portion 414 is formed on the substrate 410 side can be obtained. Further, when both the first electrode 416 and the second electrode 418 are formed of electrodes having a light-transmitting property, a display device capable of display on both sides can be obtained.

Figure 9A:
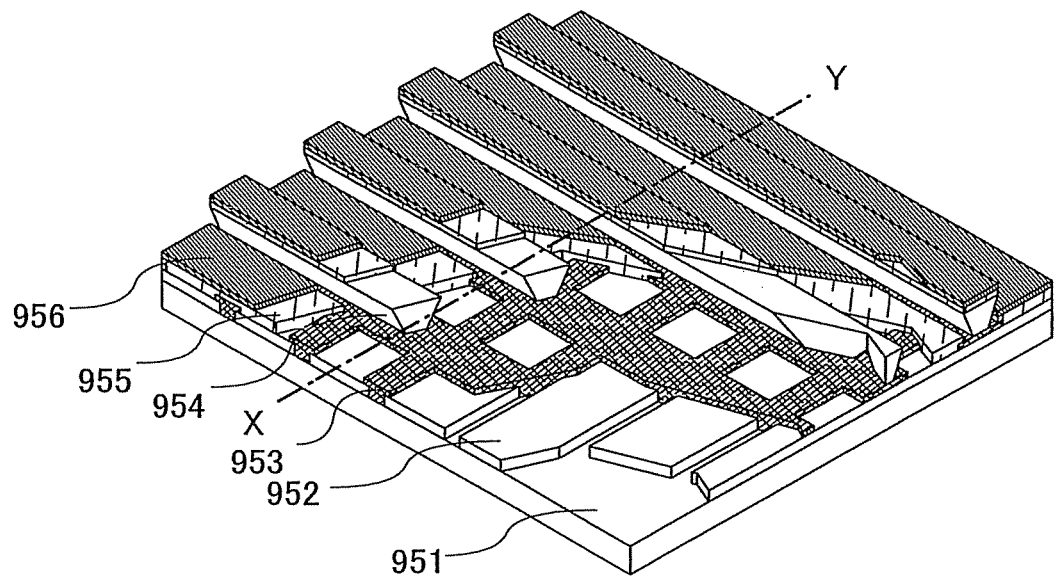
FIGS. 9A and 9B illustrate a light-emitting device according to an aspect of the present invention.
Figure 9B:
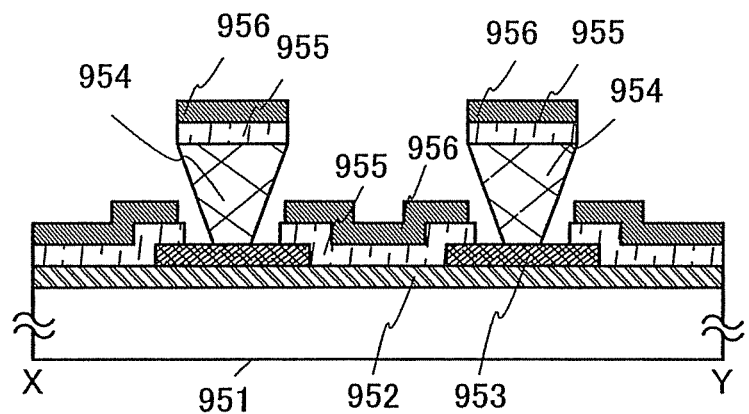

Further, another structure of the display portion 414 is shown in FIGS. 9A and 9B. FIG. 9A is a perspective view of a light-emitting device, and FIG. 9B is a cross-sectional view taken along the line X-Y of FIG. 9A. In the structure shown in FIGS. 9A and 9B, an end portion of a first electrode 952 is covered by an insulating layer 953. In addition, a partition layer 954 is provided over the insulating layer 953. Sidewalls of the partition layer 954 have a slant such that a distance between one sidewall and the other sidewall becomes narrower as the sidewalls gets closer to a surface of the substrate 951. In other words, a cross-section taken in the direction of a shorter side of the partition layer 954 has a trapezoidal shape, and the base of the trapezoid (a side of the trapezoid which is parallel to the surface of the insulating layer 953 and is in contact with the insulating layer 953) is shorter than the upper side of the trapezoid (a side of the trapezoid which is parallel to the surface of the insulating layer 953 and is not in contact with the insulating layer 953). By providing the partition layer 954 in this manner, an EL layer 955 and a second electrode 956 can be formed in a self-aligning manner utilizing the partition layer 954.

In addition, an optical film such as a polarizing plate, a circularly polarizing light plate (including an elliptically polarizing plate), a retardation plate (a $\lambda/4$ plate or a $\lambda/2$ plate), or a color filter may be provided as appropriate on the light-emission surface. In addition, the polarizing plate or the circularly polarizing plate may be provided with an anti-reflection film. For example, anti-glare treatment may be applied by forming irregularities on the surface in order to diffuse reflected light and reduce glare.

Further, although the example in which a driver circuit is not provided over the substrate is shown in FIG. 5, the present invention is not limited to the example, and an IC chip including a driver circuit may be mounted on the substrate.

In the case where the IC chip is mounted, a data line side IC and a scanning line side IC, in each of which the driver circuit for transmitting a signal to a pixel portion is formed, are mounted on the periphery of (outside) the pixel portion by a COG method. As an alternative mounting technique to the COG bonding, TCP or wire bonding may be used. The TCP is a TAB tape mounted with an IC, and the TAB tape is connected to a wiring over an element formation substrate so that the IC is mounted. Each of the data line side IC and the scanning line side IC may be formed using a silicon substrate, or may be formed using a driver circuit including a TFT over a glass substrate, a quartz substrate, or a plastic substrate. Further, one IC may be provided on one side, or a plurality of ICs may be provided on one side.

As described above, the passive-matrix light-emitting device to which the present invention is applied can be manufactured.

Since any of the anthracene derivatives described in Embodiment Mode 1 is used for the light-emitting device of the present invention, the light-emitting device can have favorable characteristics. Specifically, a light-emitting device with high emission efficiency and low power consumption can be provided.

Further, the anthracene derivatives described in Embodiment Mode 1 are chemically stable and thus a light-emitting device having a long life can be provided.

The light-emitting device described in this embodiment mode can conduct full-color display with the use of a color filter.

It is to be noted that this embodiment mode can be combined with any other embodiment mode described in this specification as appropriate.

Embodiment Mode 7

In this embodiment mode, a light-emitting device manufactured to which the present invention is applied is described. In this embodiment mode, an active-matrix light-emitting device is described using FIGS. 10A and 10B.

FIG. 10A is a top view of a light-emitting device, and FIG. 10B is a cross-sectional view taken along the lines A-A' and B-B' of FIG. 4A. This light-emitting device includes a driver circuit portion (a source side driver circuit) 601, a pixel portion 602, and a driver circuit portion (a gate side driver circuit) 603 to control the light emission of the light-emitting element. In addition, reference numerals 604 and 605 denote a sealing substrate and a sealant, respectively, and the inner side of the sealant 605 is a space 607.

It is to be noted that a leading wiring 608 is a wiring for transmitting signals to be input to the source side driver circuit 601 and the gate side driver circuit 603, and receives signals such as a video signal, a clock signal, a start signal, and a reset signal from a flexible printed circuit (FPC) 609 as an external input terminal. It is to be noted that only the FPC is shown here; however, this FPC may be provided with a printed wiring board (PWB). The light-emitting device in this specification includes not only the main body of the light-emitting device but also the light-emitting device with an FPC or a PWB attached thereto.

Next, the cross-sectional structure is described using FIG. 10B. The driving circuit portions and the pixel portion are formed over an element substrate 610; however, the source side driving circuit 601 that is a driving circuit portion and a single pixel in the pixel portion 602 are shown here.

It is to be noted that the source side driver circuit portion 601 is formed of a CMOS circuit in which an n-channel TFT 623 and a p-channel TFT 624 are combined with each other. Further, the driver circuit may be formed of various circuits such as a CMOS circuit, a PMOS circuit, or an NMOS circuit. Further, a driver integration type in which the driver circuit is formed over the substrate is described in this embodiment, but it is not necessarily required and the driver circuit can be formed outside the substrate.

It is to be noted that the structure of the TFT is not particularly limited. A staggered TFT or an inversely-staggered TFT may be used. Further, there is no particular limitation on the crystallinity of a semiconductor film used for the TFT. An amorphous semiconductor film may be used, or a crystalline semiconductor film may be used. Alternatively, a single-crystal semiconductor film may be used. A single-crystal semiconductor film can be formed by Smart Cut (registered trademark) or the like.

Further, the pixel portion 602 includes a plurality of pixels each of which includes a switching TFT 611, a current-controlling TFT 612, and a first electrode 613 that is electrically connected to a wiring (a source electrode or a drain electrode) of the current-controlling TFT 612. It is to be noted that an insulator 614 is formed to cover an end portion of the first electrode 613. Here, the insulator 614 is formed using a positive photosensitive acrylic resin film.

Further, the insulator 614 is preferably formed to have a curved surface with curvature at an upper end portion or a lower end portion thereof so as to have favorable coverage. For example, in the case of using positive photosensitive acrylic as a material of the insulator 614, it is preferable that only the upper end portion of the insulator 614 be made to have a curved surface with a curvature radius (0.2 μm to 3 μm). Besides, as the insulator 614, it is possible to use a negative photosensitive material which is insoluble in an etchant by light irradiation and a positive photosensitive material which is soluble in an etchant by light irradiation. In addition, as the insulator 614, without limitation to an organic compound, for example, an inorganic compound such as silicon oxide or silicon oxynitride can also be used.

An EL layer 616 and a second electrode 617 are formed over the first electrode 613.

The first electrode 613 serves as an anode. It is preferably to use a material having a high work function as a material used for the first electrode 613. For example, a single film such as an ITO film, an indium tin oxide film containing silicon, an indium oxide film containing 2 wt % to 20 wt % zinc oxide, a titanium nitride film, a chromium film, a tungsten film, a zinc film, or a platinum film can be used. In addition, a stacked structure of a titanium nitride film and a film mainly containing aluminum; a three-layered structure including a titanium nitride film, a film mainly containing aluminum, and a titanium nitride film; or the like can be employed. It is to be noted that when employing a stacked structure, resistance of a wiring becomes low, a favorable ohmic contact can be obtained, and further the stacked structure can function as an anode.

The EL layer 616 is formed between a pair of electrodes. As described in Embodiment Mode 2, two light-emitting layers may be provided in the EL layer, or as in Embodiment Mode 3, four light-emitting layers may be provided in the EL layer. Alternatively, three light-emitting layers may be provided as in Embodiment Mode 4. One of the plural light-emitting layers contains any of the anthracene derivatives described in Embodiment Mode 1. Further, as described in Embodiment Mode 5, functional layers may be provided in addition to the light-emitting layer. It is to be noted that any of a variety of compounds such as low molecular compounds, oligomers, dendrimers and high molecular compounds can be employed as other materials for the EL layer.

The second electrode 617 serves as a cathode. As a material used for the second electrode 617, a material having a low work function (Al, Mg, Li, Ca, or an alloy or a compound thereof such as MgAg, MgIn, AlLi, LiF, or $CaF_2$) is preferably used. It is to be noted that in the case where light generated in the EL layer 616 is transmitted through the second electrode 617, a stacked structure of a metal thin film having a reduced thickness and a transparent conductive film (ITO, indium oxide containing 2 wt % to 20 wt % zinc oxide, indium tin oxide containing silicon or silicon oxide, zinc oxide (ZnO), or the like) are preferably used as the second electrode 617.

Further, although only one light-emitting element 618 is shown in the cross-sectional view of FIG. 10B, a plurality of light-emitting elements is arranged in matrix in the pixel portion 602. Light-emitting elements for three kinds of light emissions (R, G, and B) are selectively formed in the pixel portion 602, so that a light-emitting device which is capable of full color display can be manufactured. Alternatively, light-emitting elements for the same color may be formed over the entire surface, and thus a light-emitting device which is capable of performing monochrome display or a light-emitting device which is capable of performing area color display may be provided. Still alternatively, a light-emitting device capable of performing full color display may be provided by combining light-emitting elements for white light emission with color filters.

Furthermore, by attaching the sealing substrate 604 to the element substrate 610 using the sealant 605, the light-emitting element 618 is provided in the space 607 that is surrounded by the element substrate 610, the sealing substrate 604, and the sealant 605. It is to be noted that the space 607 is filled with a filler. There are cases where the space 607 may be filled with an inert gas (nitrogen, argon, or the like), or where the space 607 may be filled with the sealant 605.

It is to be noted that the sealant 605 is preferably formed of an epoxy-based resin. Further, a material which hardly transmits water and oxygen is preferable. Further, as the sealing substrate 604, a plastic substrate formed of fiberglass-reinforced plastics (FRP), polyvinyl fluoride (PVF), polyester, or acrylic, or the like can be used instead of a glass substrate or a quartz substrate.

As described above, the active-matrix light-emitting device to which the present invention is applied can be manufactured.

Since any of the anthracene derivatives described in Embodiment Mode 1 is used for the light-emitting device of the present invention, a light-emitting device having favorable characteristics can be obtained. Specifically, a light-emitting device with high emission efficiency and low power consumption can be provided.

Further, the anthracene derivatives described in Embodiment Mode 1 are chemically stable and thus a light-emitting device having a long life can be provided.

The light-emitting device described in this embodiment mode can conduct full-color display with the use of a color filter.

Embodiment Mode 8

In this embodiment mode, electronic appliances of the present invention including any of the light-emitting devices described in Embodiment Modes 6 and 7 are described. The electronic appliance of the present invention includes any of the anthracene derivatives described in Embodiment Mode 1 and a display portion with high emission efficiency. Also, the electronic appliance of the present invention has a display portion having reduced power consumption. The electronic appliance of the present invention has a display portion having a long life.

As examples of the electronic appliances including a light-emitting element of the present invention, cameras such as video cameras or digital cameras, goggle type displays, navigation systems, audio playback devices (e.g., car audio systems and audio systems), computers, game machines, portable information terminals (e.g., mobile computers, cellular phones, portable game machines, and electronic books), image playback devices in which a recording medium is provided (devices that are capable of playing back recording media such as digital versatile discs (DVDs) and equipped with a display device that can display the image), and the like are given. Specific examples of these electronic appliances are shown in FIGS. 11A to 11D.

Figure 11A:
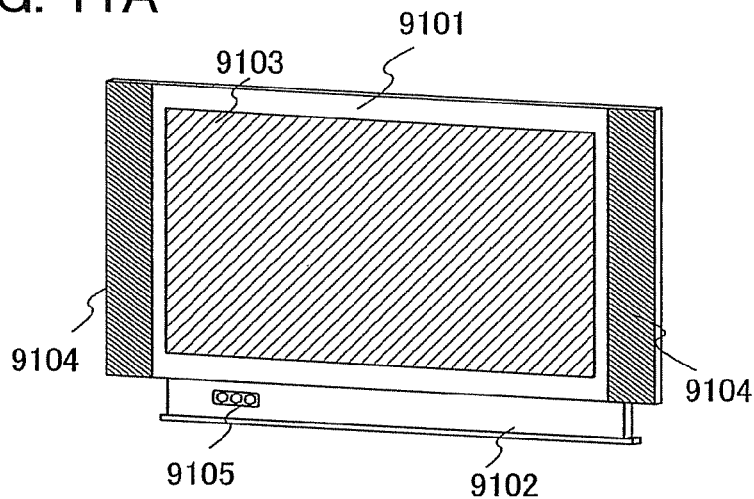
FIGS. 11A to 11D each illustrate an electronic appliance according to an aspect of the present invention.

FIG. 11A shows a television set according to the present invention, which includes a housing 9101, a supporting base 9102, a display portion 9103, a speaker portion 9104, a video input terminal 9105, and the like. In this television set, the display portion 9103 has light-emitting elements similar to those described in Embodiment Modes 1 to 5, and the light-emitting elements are arranged in matrix. The features of the light-emitting element are represented by high emission efficiency and a long life. The display portion 9103 which includes such light-emitting elements has similar features. Therefore, in this television set, image quality is scarcely deteriorated and low power consumption is achieved. Such features contribute to significant reduction and downsizing of the deterioration compensation function circuits and power source circuits in the television set; therefore, small sized and lightweight housing 9101 and supporting base 9102 can be achieved. In the television set according to the present invention, low power consumption, high image quality, and small size and lightweight are achieved; therefore, products suitable for living environment can be provided.

Figure 11B:
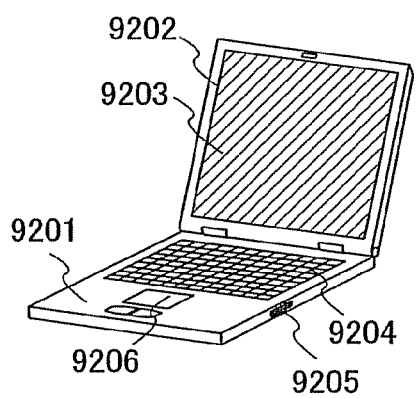

FIG. 11B shows a computer according to the present invention, which includes a main body 9201, a housing 9202, a display portion 9203, a keyboard 9204, an external connection port 9205, a pointing device 9206, and the like. In this computer, the display portion 9203 has light-emitting elements similar to those described in Embodiment Modes 1 to 5, and the light-emitting elements are arranged in matrix. The features of the light-emitting element are represented by high emission efficiency and a long life. The display portion 9203 which includes such light-emitting elements has similar features. Therefore, in this computer, image quality is scarcely deteriorated and lower power consumption is achieved. Such features contribute to significant reduction and downsizing of the deterioration compensation function circuits and power source circuits in the computer; therefore, small sized and lightweight main body 9201 and housing 9202 can be achieved. In the computer according to the present invention, low power consumption, high image quality, and small size and lightweight are achieved; therefore, products suitable for the environment can be supplied.

Figure 11C:
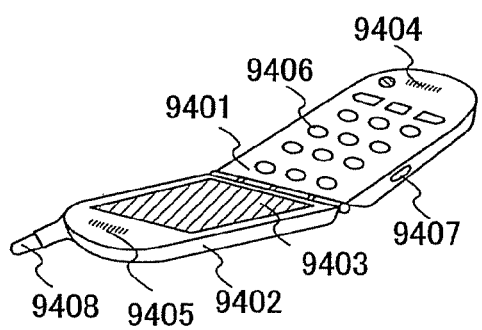

FIG. 11C shows a cellular phone according to the present invention, which includes a main body 9401, a housing 9402, a display portion 9403, an audio input portion 9404, an audio output portion 9405, an operation key 9406, an external connection port 9407, an antenna 9408, and the like. In this cellular phone, the display portion 9403 has light-emitting elements similar to those described in Embodiment Modes 1 to 5, and the light-emitting elements are arranged in matrix. The features of the light-emitting element are represented by high emission efficiency and a long life. The display portion 9403 which includes such light-emitting elements has similar features. Therefore, in this cellular phone, image quality is scarcely deteriorated and lower power consumption is achieved. Such features contribute to significant reduction and downsizing of the deterioration compensation function circuits and power source circuits in the cellular phone; therefore, small sized and lightweight main body 9401 and housing 9402 can be supplied. In the cellular phone according to the present invention, low power consumption, high image quality, and a small size and lightweight are achieved; therefore, products suitable for portability can be provided.

Figure 11D:
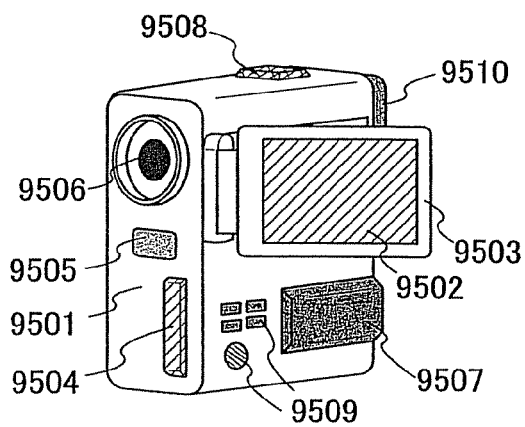

FIG. 11D shows a camera according to the present invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In this camera, the display portion 9502 has light-emitting elements similar to those described in Embodiment Modes 1 to 5, and the light-emitting elements are arranged in matrix. The features of the light-emitting element are represented by high emission efficiency and a long life. The display portion 9502 which includes such light-emitting elements has similar features. Therefore, in this camera, image quality is hardly deteriorated and lower power consumption can be achieved. Such features contribute to significant reduction and downsizing of the deterioration compensation function circuits and power source circuits in the camera; therefore, a small sized and lightweight main body 9501 can be supplied. In the camera according to the present invention, low power consumption, high image quality, and small size and lightweight are achieved; therefore, products suitable for portability can be provided.

As described above, the applicable range of the light-emitting devices of the present invention is wide so that the light-emitting devices can be applied to electronic appliances of all kinds of fields. By applying a light-emitting element of the present invention, an electronic appliance having a display portion having reduced power consumption can be provided. Further, an electronic appliance having a display portion having a long life can be provided.

Further, such light-emitting devices of the present invention can also be used for a lighting apparatus. One mode using a light-emitting element of the present invention for the lighting apparatus is described using FIG. 12.

Figure 12:
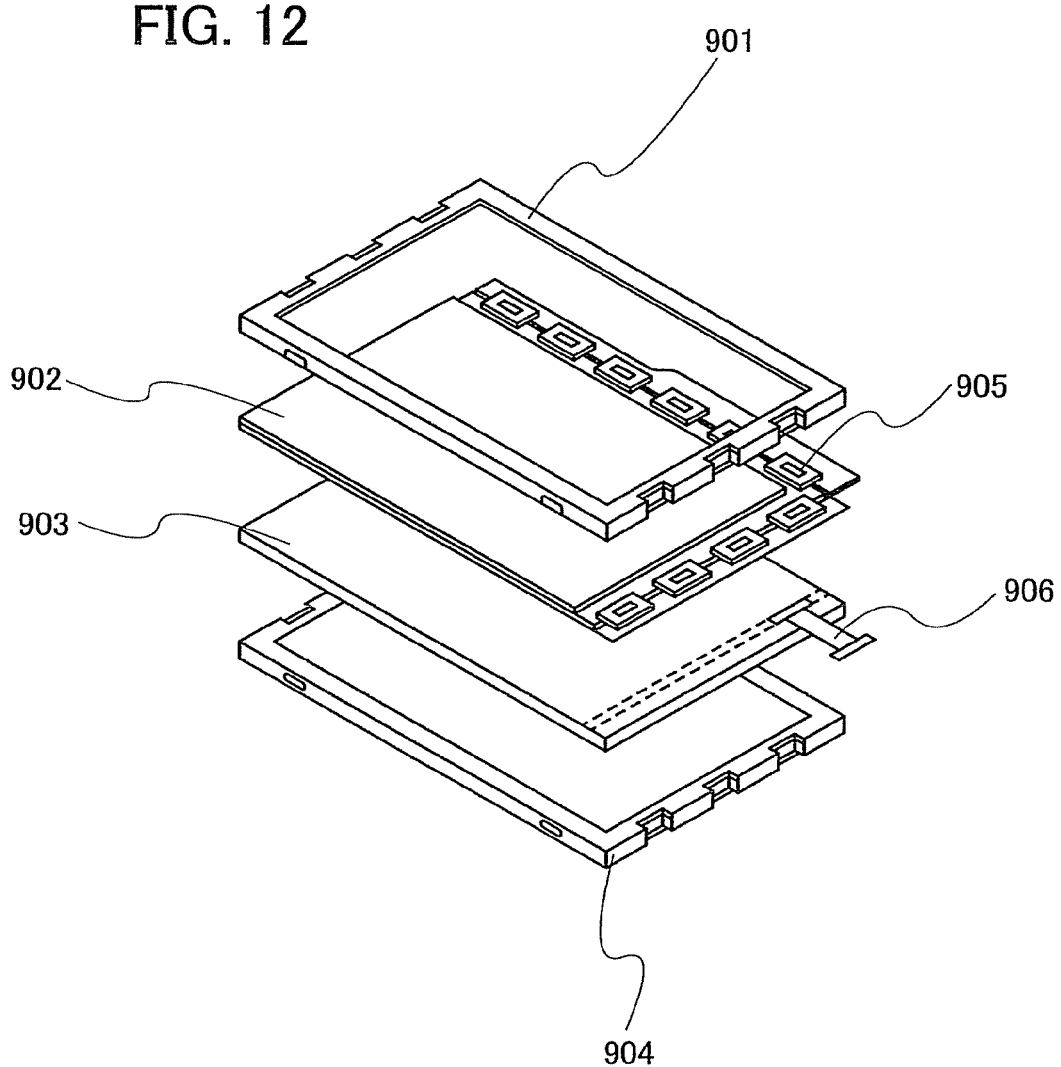
FIG. 12 illustrates an electronic appliance according to an aspect of the present invention.

FIG. 12 shows an example of a liquid crystal display device using the light-emitting device of the present invention as a backlight. The liquid crystal display device shown in FIG. 12 includes a housing 901, a liquid crystal layer 902, a backlight 903, and a housing 904, and the liquid crystal layer 902 is connected to a driver IC 905. Further, the light-emitting device of the present invention is used for the backlight 903, and a current is supplied through a terminal 906.

By using the light-emitting device of the present invention as the backlight of the liquid crystal display device, a backlight with reduced power consumption and high emission efficiency can be provided. Further, the light-emitting device of the present invention is a lighting apparatus with plane light emission and can be made to have a large area. Therefore, the backlight can be made to have a large area, and thus a liquid crystal display device having a large area can be provided. Furthermore, the light-emitting device of the present invention has a thin shape and has low power consumption; therefore, a thin shape and low power consumption of a display device can also be achieved. Further, since the light-emitting device of the present invention has a long life; a liquid crystal display device using the light-emitting device of the present invention also has a long life.

Figure 13:
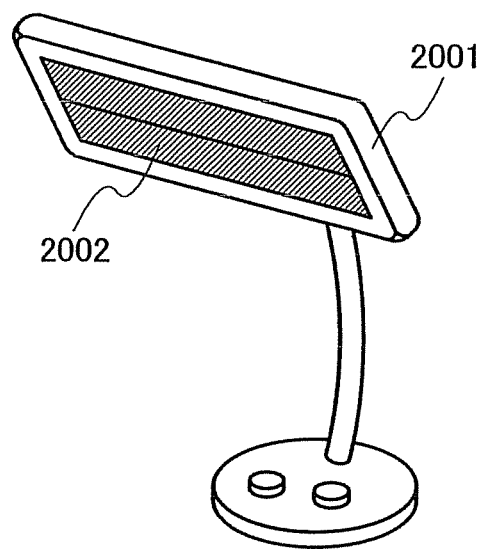
FIG. 13 illustrates a lighting apparatus according to an aspect of the present invention.

FIG. 13 shows an example of using the light-emitting device to which the present invention is applied, as a table lamp which is an example of a lighting apparatus. The table lamp shown in FIG. 13 has a housing 2001 and a light source 2002, and the light-emitting device of the present invention is used as the light source 2002. The light-emitting device of the present invention has high emission efficiency and has a long life; therefore, the table lamp also has high emission efficiency and a long life.

Figure 14:
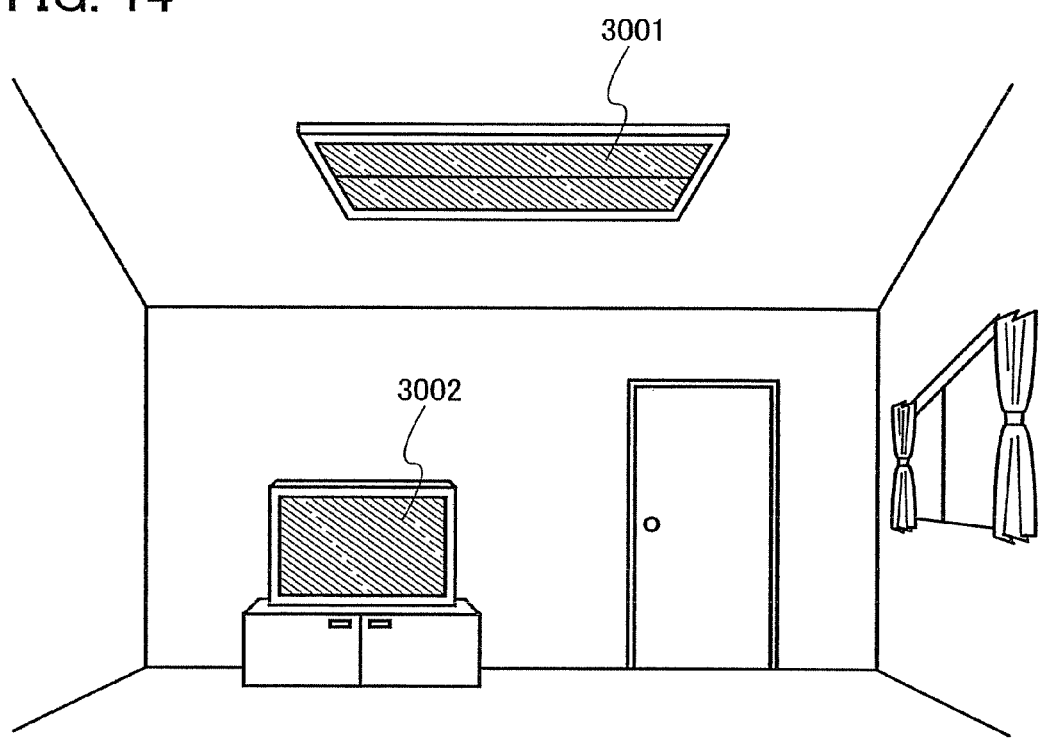
FIG. 14 illustrates a lighting apparatus according to an aspect of the present invention.

FIG. 14 shows an example of using a light-emitting device to which the present invention is applied, as an indoor lighting apparatus 3001. Since the light-emitting device of the present invention can also have a large area, the light-emitting device of the present invention can be used as a lighting apparatus having a large emission area. Further, the light-emitting device of the present invention has a thin shape and consumes low power; therefore, the light-emitting device of the present invention can be used as a lighting apparatus having a thinner shape and lower power consumption. Thus, a television set 3002 according to the present invention as shown in FIG. 11A is placed in a room where the light-emitting device to which the present invention is applied is used as the indoor lighting apparatus 3001, and public broadcasting and movies can be watched. In such a case, since both of the devices consume low power, a powerful image can be watched in a bright room without concern about electricity charges.

Example 1

In this example, a synthesis method of 2-{4-[N-(4-diphenylaminophenyl)-N-phenylamino]phenyl}-9,10-diphenylanthracene (abbreviation: 2DPAPPA), which can be used in the present invention and is represented by the structural formula (101), is described in specific terms.

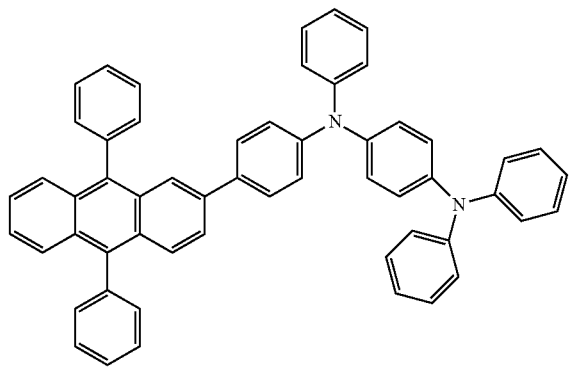

(101)

[Step 1] Synthesis of 2-bromo-9,10-diphenylanthracene (i) Synthesis of 2-bromo-9,10-anthraquinone A synthesis scheme of 2-bromo-9,10-anthraquinone is represented by (C-1).

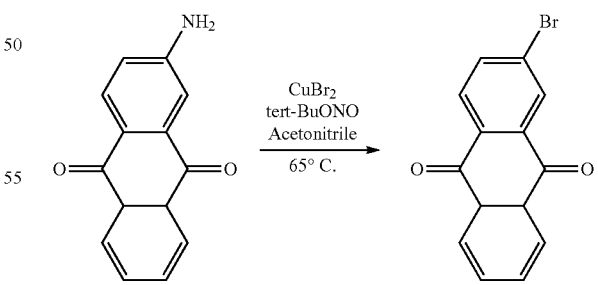

(C-1)

Into a 1 L three-neck flask were put 46 g (0.20 mol) of copper(II) bromide and 500 mL of acetonitrile. Furthermore, 17 g (0.17 mol) of tert-butyl nitrite was added thereto, and the mixture was heated to 65° C. To the mixture was added 25 g (0.11 mol) of 2-amino-9,10-anthraquinone, followed by stirring for six hours at the same temperature. After the reaction, the reaction solution was poured into 500 mL of hydrochloric acid (3 mol/L), and this suspension was stirred for three hours, whereby a solid substance was precipitated. This precipitate was collected by suction filtration and washed with water and ethanol while being suction filtered. The residue was dissolved in toluene and suction filtered through Florisil (produced by Wako Pure Chemical Industries, Ltd., Catalog No. 540-00135), Celite (produced by Wako Pure Chemical Industries, Ltd., Catalog No. 531-16855), and alumina, and the filtrate was obtained. The obtained filtrate was concentrated, so that a solid substance was obtained. This solid substance was recrystallized with a mixed solvent of chloroform and hexane to give 18.6 g of a milky white powdered solid substance, 2-bromo-9,10-anthraquinone, which was the object of the synthesis, in 58% yield.

(ii) Synthesis of 2-bromo-9,10-diphenyl-9,10-dihydroanthracene-9,10-diol

A synthesis scheme of 2-bromo-9,10-diphenyl-9,10-dihydroanthracene-9,10-diol is shown in (C-2).

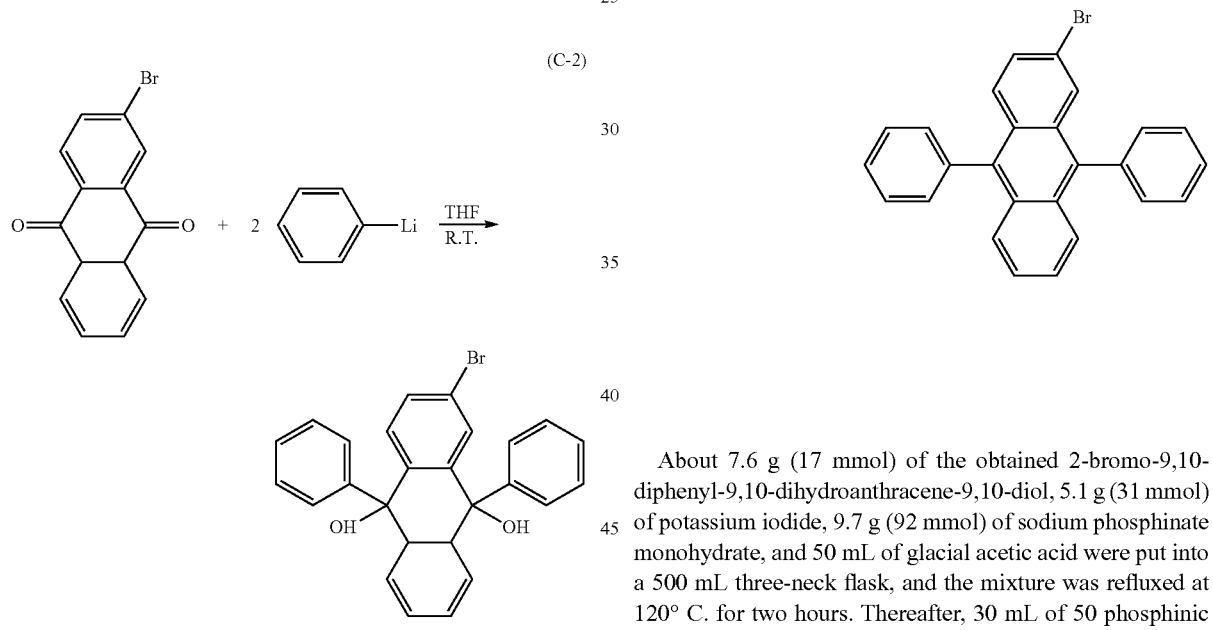

Into a 300 mL three-neck flask was put 4.9 g (17 mmol) of 2-bromo-9,10-anthraquinone, the atmosphere in the flask was substituted with nitrogen, and 100 mL of tetrahydrofuran (THF) was added thereto and dissolved well. Then, 18 mL (37 mmol) of phenyllithium was dropped into this solution, followed by stirring at room temperature for about 12 hours. After the reaction, the solution was washed with water, and an aqueous layer was extracted with ethyl acetate. The extract was combined with an organic layer to be dried with magnesium sulfate. After the drying, the mixture was suction filtered, and the filtrate was concentrated to give 2-bromo-9,10-diphenyl-9,10-dihydroanthracene-9,10-diol, which was the object of the synthesis (about 7.6 g).

(iii) Synthesis of 2-bromo-9,10-diphenylanthracene

A synthesis scheme of 2-bromo-9,10-diphenylanthracene is shown in (C-3).

About 7.6 g (17 mmol) of the obtained 2-bromo-9,10-diphenyl-9,10-dihydroanthracene-9,10-diol, 5.1 g (31 mmol) of potassium iodide, 9.7 g (92 mmol) of sodium phosphinate monohydrate, and 50 mL of glacial acetic acid were put into a 500 mL three-neck flask, and the mixture was refluxed at 120° C. for two hours. Thereafter, 30 mL of 50 phosphinic acid was added to the reaction mixture, and the mixture was stirred at 120° C. for one hour. After the reaction, the solution was washed with water, and the aqueous layer was extracted with ethyl acetate. The extract was combined with an organic layer to be dried with magnesium sulfate. After the drying, this mixture was suction filtered, and the obtained filtrate was concentrated to give a solid substance. This solid substance was dissolved in toluene, and the solution was filtered through Celite (produced by Wako Pure Chemical Industries, Ltd., Catalog No. 531-16855), Florisil (produced by Wako Pure Chemical Industries, Ltd., Catalog No. 540-00135), and alumina. The obtained filtrate was concentrated to give a solid substance, and the solid substance was recrystallized with a mixed solvent of chloroform and hexane, giving 5.1 g of 2-bromo-9,10-diphenylanthracene, which was the object of the synthesis, as a light yellow powdered solid substance. The yield of the two stages (ii) and (iii) was 74%.

[Step 2] Synthesis of 2-(4-bromophenyl)-9,10-diphenylanthracene (i) Synthesis of 2-iodo-9,10-diphenylanthracene A synthesis scheme of 2-iodo-9,10-diphenylanthracene is shown in (C-4).

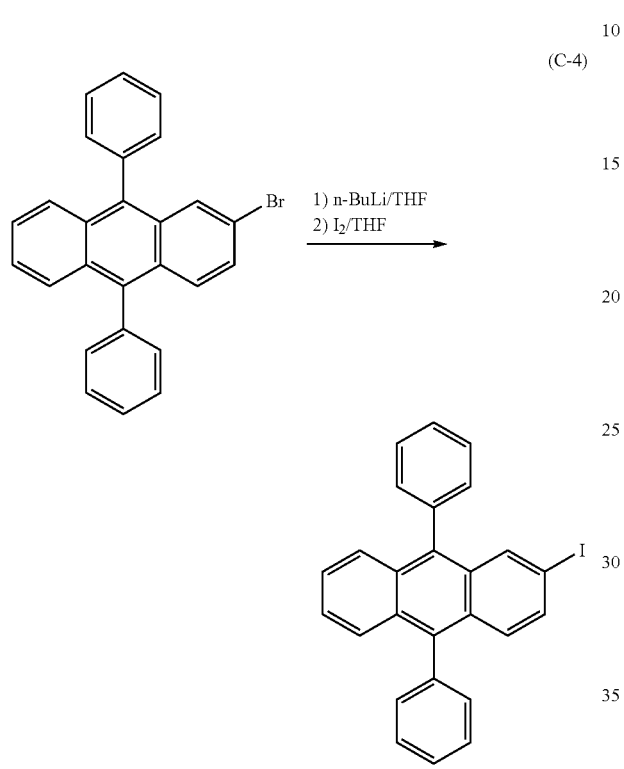

(C-4)

Into a 500 mL three neck flask was put 10 g (24 mmol) of 2-bromo-9,10-diphenylanthracene, and the atmosphere in the flask was substituted with nitrogen. Then, 150 mL of tetrahydrofuran was added thereto and dissolved well. This solution was stirred at −78° C. Then, 19 mL of n-butyllithium solution (1.6 mmol/L) was dropped into this solution using a syringe, stirred at −78° C. for one hour, and reacted to precipitate a white solid substance. After the reaction, a solution in which 12 g (49 mmol) of iodine was dissolved into 80 mL of tetrahydrofuran was dropped into the reaction mixture using a funnel for dropping. After the dropping, this mixture was stirred at −78° C. for one hour and then at room temperature for 12 hours. After the reaction, a sodium thiosulfate solution was added to the reaction solution, followed by stirring at room temperature for one hour. Ethyl acetate was added to this mixture, followed by extraction. An organic layer was separated from an aqueous layer and washed with an aqueous solution of sodium thiosulfate and then a saturated saline solution in this order. An organic layer was separated from an aqueous layer and dried with magnesium sulfate. This mixture was suction filtered so that the magnesium sulfate was removed. The obtained filtrate was concentrated to give a solid substance. Methanol was added to this solid substance, followed by washing with ultrasonic wave irradiation, whereby a solid substance was precipitated. This solid substance was collected by suction filtration to give 9.9 g of a light yellow powdered solid substance in 90% yield.

(ii) Synthesis of 2-(4-bromophenyl)-9,10-diphenylanthracene

A synthesis scheme of 2-(4-bromophenyl)-9,10-diphenylanthracene is shown in (C-5).

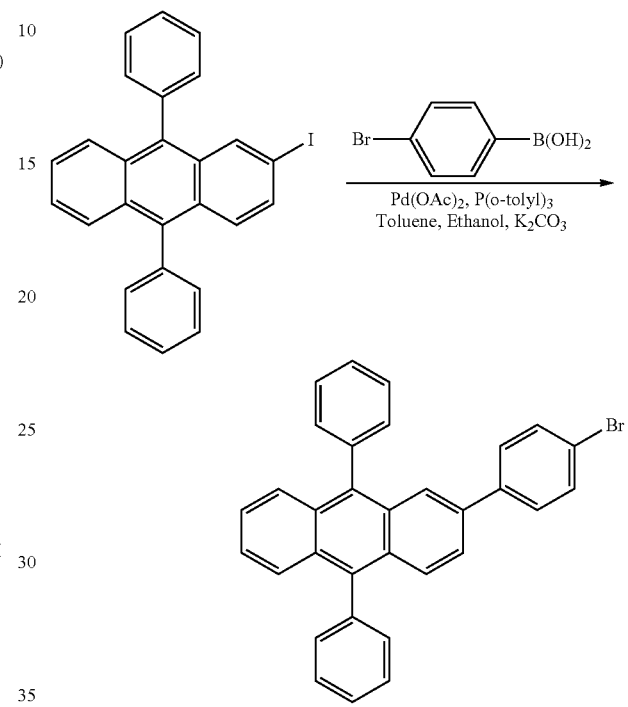

(C-5)

Into a 200 mL three neck flask were put 2.0 g (9.9 mmol) of 4-bromophenyl boronic acid, 0.02 g (0.089 mmol) of palladium(0) acetate, 5.0 g (11 mmol) of 2-iodo-9,10-diphenylanthracene, and 0.30 g (0.99 mmol) of tris(o-tolyl)phosphine, and the atmosphere in the flask was substituted with nitrogen. To this mixture were added 50 mL of toluene, 20 mL (2 mol/L) of an aqueous solution of potassium carbonate, and 10 mL of ethanol. This mixture was stirred at 100° C. for eight hours to be reacted. After the reaction, toluene was added to the reaction mixture, and this suspension was washed with a saturated aqueous solution of sodium hydrogen carbonate and a saturated saline solution in this order. An organic layer was separated from an aqueous layer and suction filtered through Celite (produced by Wako Pure Chemical Industries, Ltd., Catalog No. 531-16855), alumina, and Florisil (produced by Wako Pure Chemical Industries, Ltd., Catalog No. 540-00135) to give a filtrate. The obtained filtrate was concentrated to give a solid substance. Methanol was added to this solid substance, followed by washing with ultrasonic wave irradiation to precipitate a solid substance. This solid substance was collected by suction filtration to give 4.6 g of a light yellow powdered solid substance in 87% yield. By a nuclear magnetic resonance method (NMR), this compound was proved to be 2-(4-bromophenyl)-9,10-diphenylanthracene.

Figure 15A:
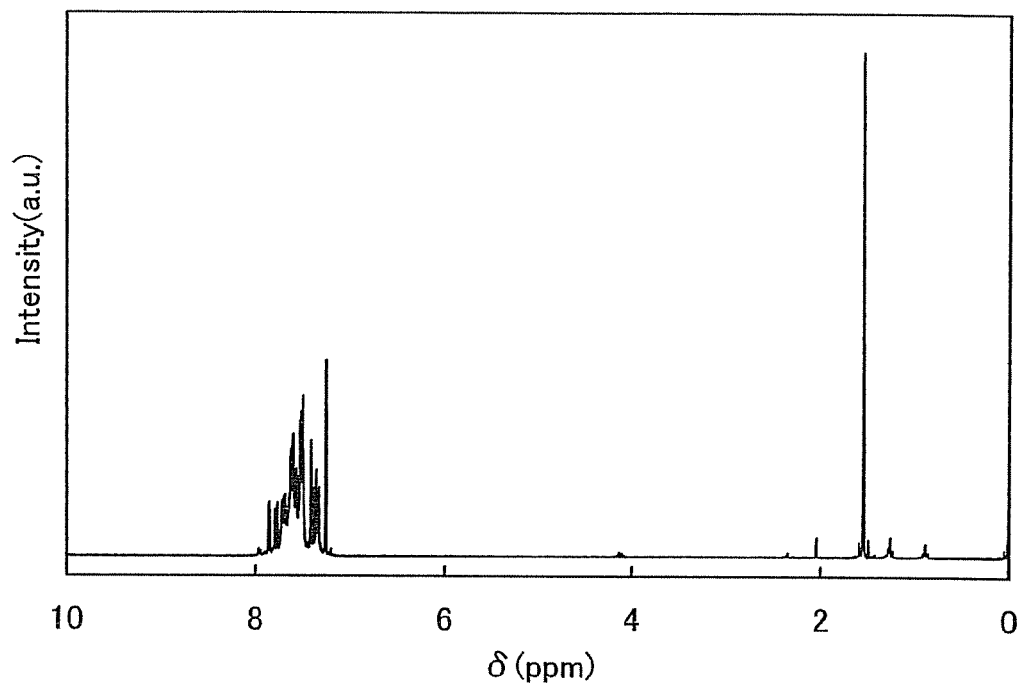
FIGS. 15A and 15B are each a $^1$H NMR chart of 2-(4-bromophenyl)-9,10-diphenylanthracene.
Figure 15B:
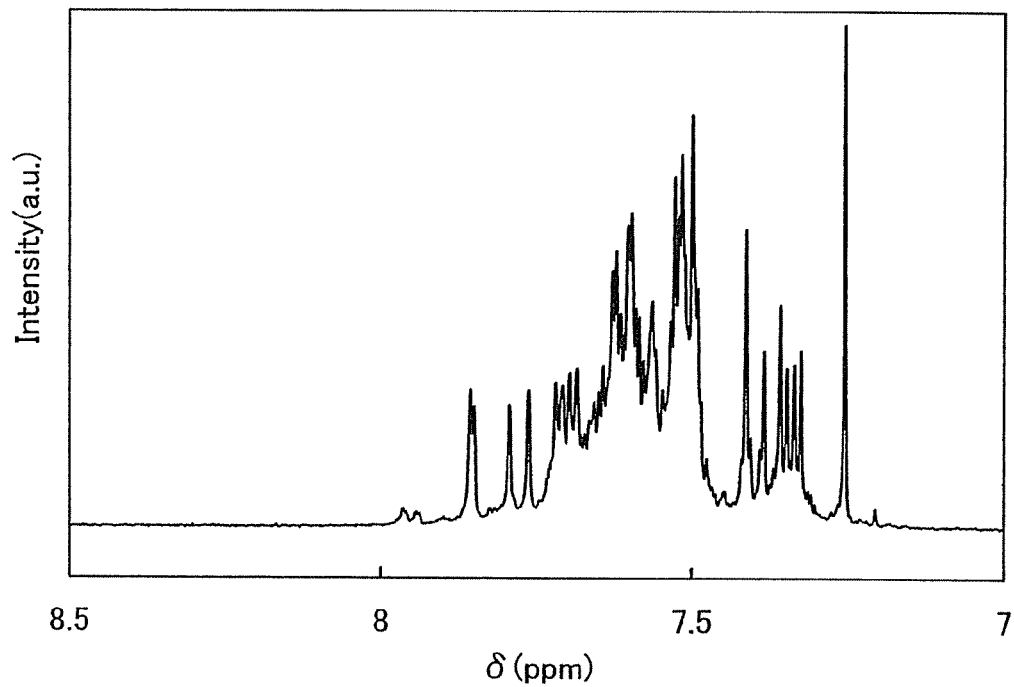

$^1$H NMR data of 2-(4-bromophenyl)-9,10-diphenylanthracene is shown below. $^1$H NMR (CDCl$_3$, 300 MHz): δ=7.33-7.36 (m, 2H), 7.40 (d, J=8.4 Hz, 2H), 7.49-7.72 (m, 15H), 7.78 (d, J=9.3 Hz, 1H), 7.85 (d, J=1.5 Hz, 1H). In addition, FIGS. 15A and 15B show $^1$H NMR charts. It is to be noted that FIG. 15B is a chart in which the range of 7.0 ppm to 8.5 ppm in FIG. 15A is enlarged.

[Step 3] Synthesis Method of 2DPAPPA

A synthesis scheme of 2DPAPPA is shown in (C-6).

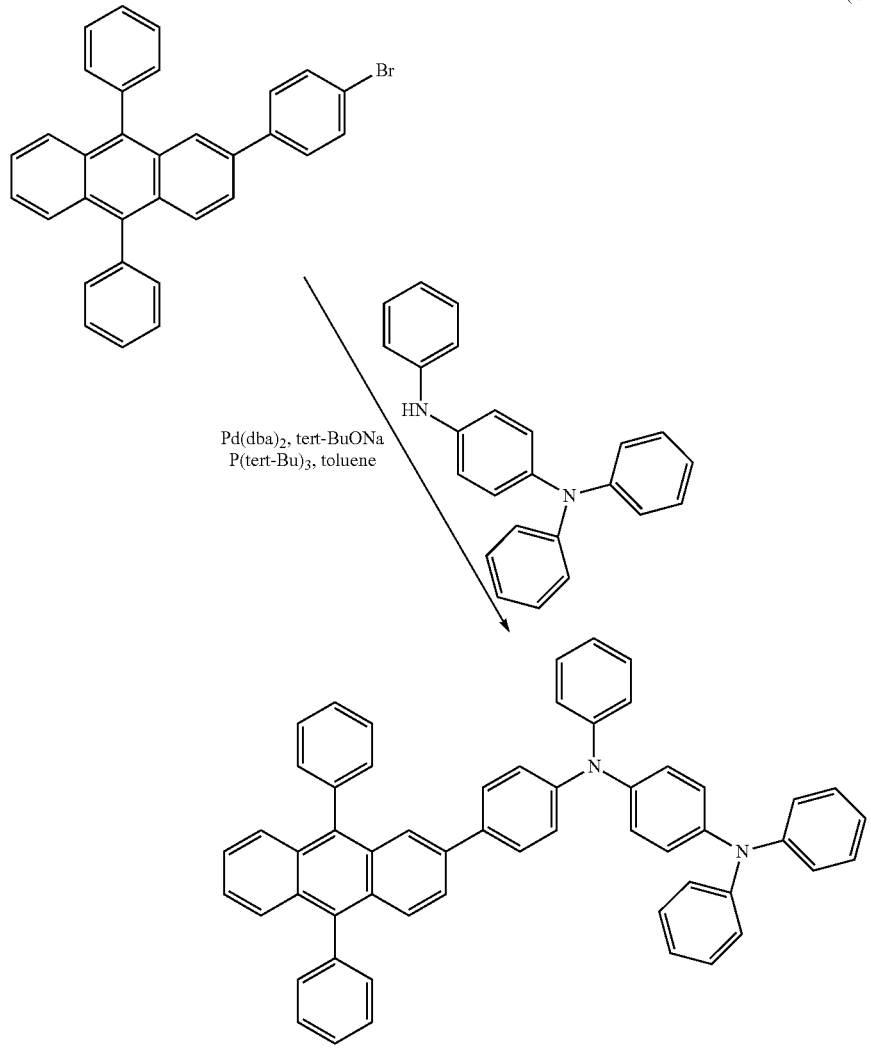

(C-6)

Into a 50 mL three-neck flask were put 0.84 g (1.7 mmol) of 2-(4-bromophenyl)-9,10-diphenylanthracene synthesized in Step 2 of Example 1, 0.30 g (3.1 mmol) of sodium tert-butoxide, 0.53 g (1.60 mmol) of N,N',N'-triphenyl-1,4-phenylenediamine, and 0.03 g (0.06 mmol) of bis(dibenzylideneacetone)palladium(0), and the atmosphere in the flask was substituted with nitrogen. To this mixture were added 10 mL of toluene and 0.02 mL of a 10 wt % hexane solution of tri(tert-butyl)phosphine. This mixture was heated and stirred at 80° C. for five hours to be reacted. After the reaction, toluene was added to the reaction mixture, and this suspension was suction filtered through Celite (produced by Wako Pure Chemical Industries, Ltd., Catalog No. 531-16855), Florisil (produced by Wako Pure Chemical Industries, Ltd., Catalog No. 540-00135), and alumina to give a filtrate. The obtained filtrate was washed with water and a saturated saline solution. Then, magnesium sulfate was added to an organic layer so that the organic layer was dried. This mixture was suction filtered, magnesium sulfate was removed, and a filtrate was obtained. This filtrate was concentrated to give a solid substance, and the solid substance was purified by silica gel column chromatography (a developing solvent was a mixed solvent of toluene:hexane=1:10 and then a developing solvent was a mixed solvent of toluene:hexane=1:3). The obtained fraction was concentrated to give a solid substance. This solid substance was recrystallized with a mixed solvent of dichloromethane and methanol to give 0.84 g of a light yellow powdered solid substance in 66% yield. By a nuclear magnetic resonance method (NMR), this compound was proved to be 2-{4-[N-(4-diphenylaminophenyl)-N-phenylamino]phenyl}-9,10-diphenylanthracene (abbreviation: 2DPAPPA).

Figure 16A:
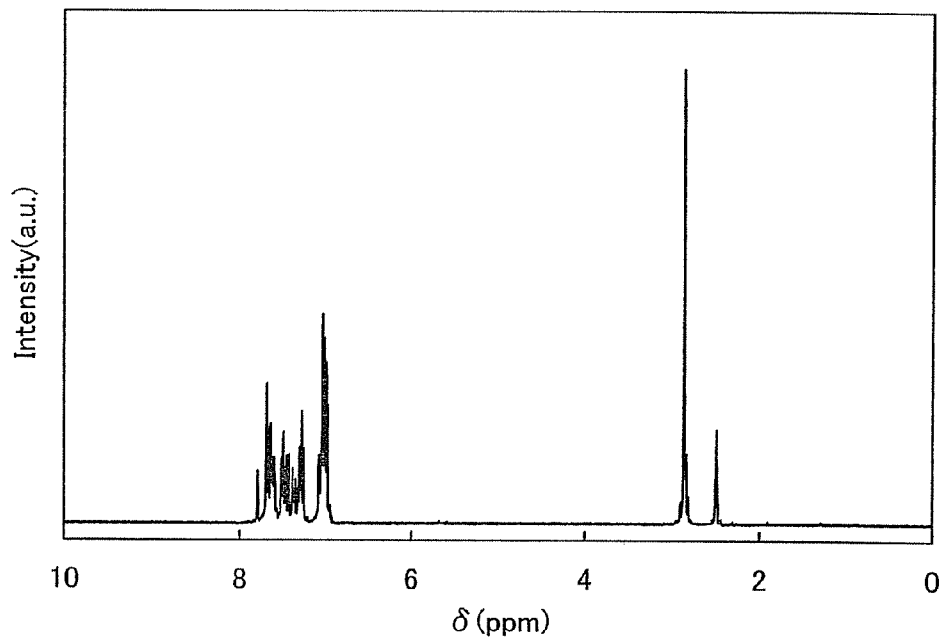
FIGS. 16A and 16B are each a $^1$H NMR chart of 2-{-4-[N-(4-diphenylaminophenyl)-N-phenylamino]phenyl}-9,10-diphenylanthracene (abbreviation: 2DPAPPA).
Figure 16B:
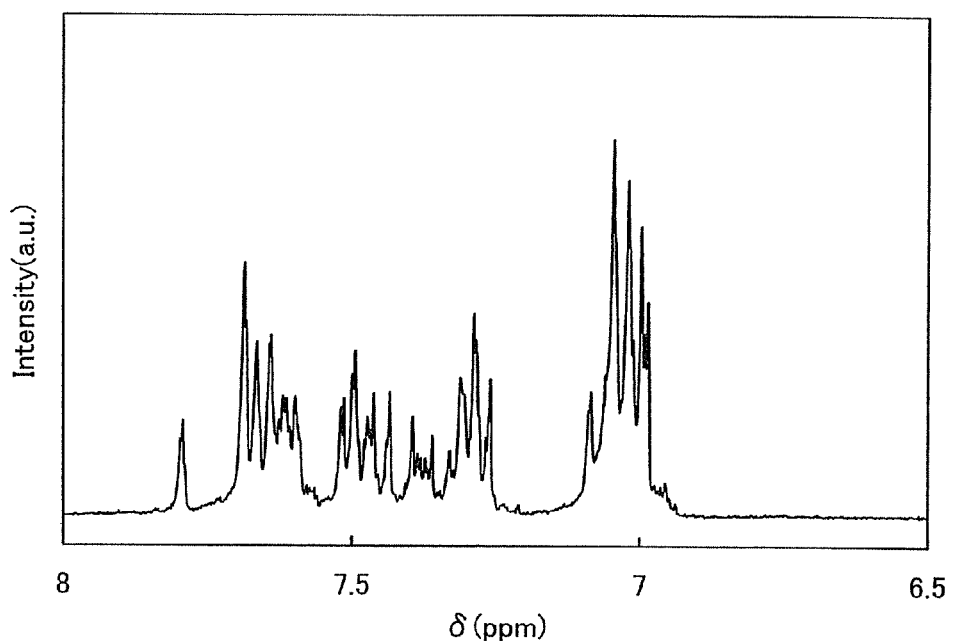

$^1$H NMR data of 2DPAPPA is shown below. $^1$H NMR (DMSO-d$_6$, 300 MHz, 120° C.): δ=6.93-7.12 (m, 15H), 7.24-7.54 (m, 14H), 7.72-7.56 (m, 10H), 7.79 (s, 1H). In addition, FIGS. 16A and 16B show $^1$H NMR charts. It is to be noted that FIG. 16B is a chart in which the range of 6.5 ppm to 8.0 ppm in FIG. 16A is enlarged.

Figure 17:
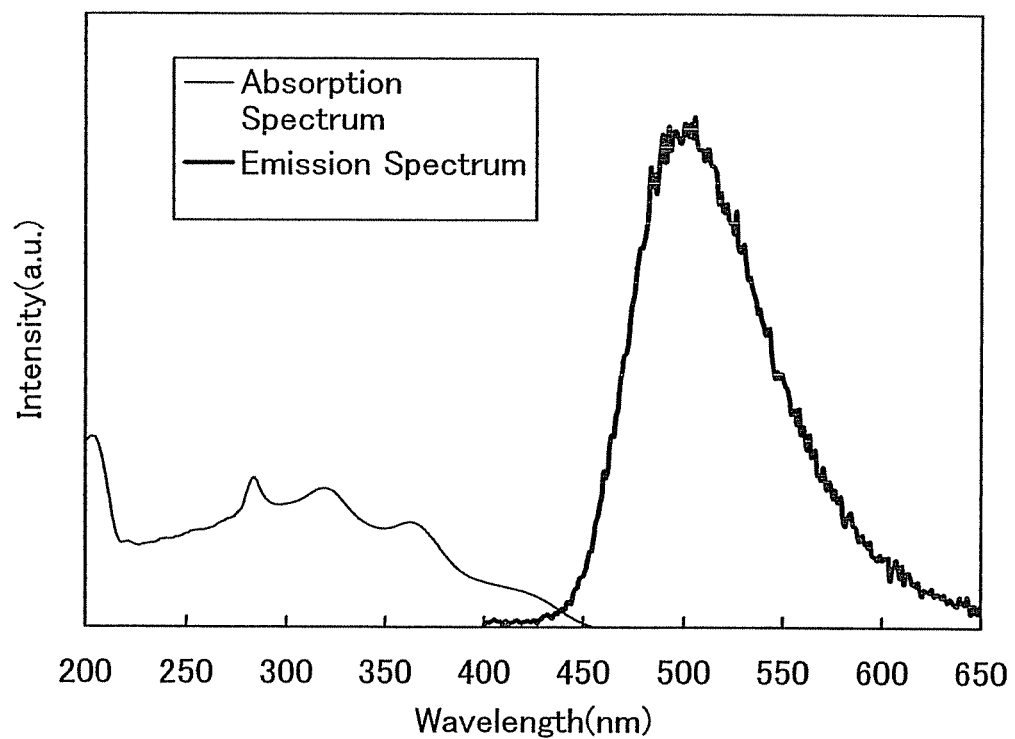
FIG. 17 illustrates an absorption spectrum and an emission spectrum of 2-{4-[N-(4-diphenylaminophenyl)-N-phenylamino]phenyl}-9,10-diphenylanthracene (abbreviation: 2DPAPPA).

Further, FIG. 17 shows an absorption spectrum and an emission spectrum of a toluene solution of 2DPAPPA. An ultraviolet-visible spectrophotometer (V550, manufactured by Japan Spectroscopy Corporation) was used for the measurements. The solution was put into a quartz cell. The absorption spectrum obtained by subtracting the absorption spectrum of the quartz cell from the absorption spectra of the solution and the quartz cell is shown in FIG. 17. In FIG. 17, the horizontal axis indicates the wavelength (nm) and the vertical axis indicates the intensity (an arbitrary unit). In the case of the toluene solution, absorptions were observed at around 284 nm, 319 nm, and 362 nm. In addition, in the case of the toluene solution, the maximum emission wavelength was 505 nm (an excitation wavelength of 361 nm).

Further, when the ionizing potential of a thin film of 2DPA-PPA was measured with a photoelectron spectrometer (AC-2, manufactured by RIKEN KEIKI CO., LTD) in the atmosphere, the ionizing potential was 5.26 eV. As a result, the HOMO level was proved to be −5.26 eV. Furthermore, an absorption edge was obtained from a Tauc plot assuming direct transition by using the data of the absorption spectrum of the thin film of 2DPAPPA, and the absorption edge was regarded as an optical energy gap. The energy gap was 2.65 eV. Therefore, a LUMO level of −2.61 eV was obtained from the obtained values of the energy gap value and HOMO level.

Example 2

In this example, a synthesis method of 2-{4-[N-phenyl-N-(9-phenylcarbazol-3-yl)amino]phenyl}-9,10-diphenylanthracene (abbreviation: 2PCAPPA), which can be used in the present invention and is represented by the structural formula (132), is described in specific terms.

(132)

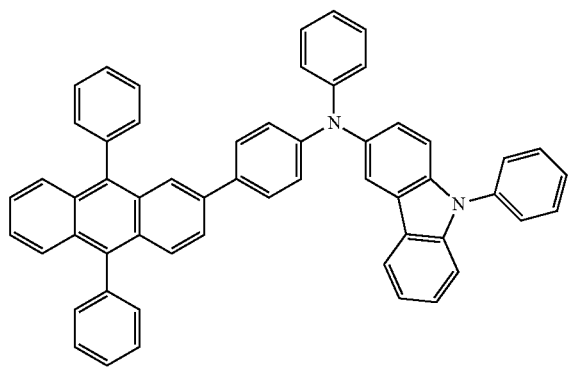

[Step 1] Synthesis of N-phenyl-(9-phenyl-9H-carbazol-3-yl)amine (abbreviation: PCA)

(i) Synthesis of 3-bromo-9-phenylcarbazole

A synthesis scheme of 3-bromo-9-phenylcarbazole is shown in (D-1).

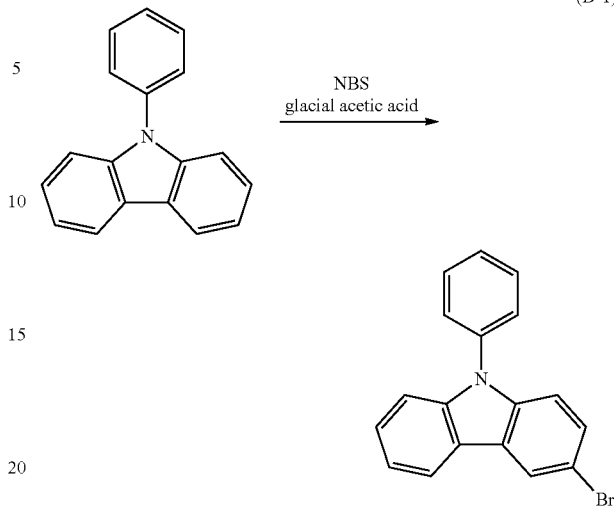

(D-1)

Into a 2 L Meyer flask was put 24.3 g (100 mmol) of 9-phenylcarbazole, and dissolved in 600 mL of glacial acetic acid. Then, 17.8 g (100 mmol) of N-bromosuccinimide was slowly added thereto, followed by stirring at room temperature for about 12 hours. This glacial acetic acid solution was dropped into 1 L of ice water while being stirred. A white solid substance was precipitated and collected by suction filtration, and then the white solid substance was washed with water three times while being suction filtered. This solid substance was dissolved in 150 mL of diethyl ether, and this solution was washed with a saturated aqueous solution of sodium hydrogen carbonate and water. The resulting organic layer was dried with magnesium sulfate. This mixture was suction filtered, and the obtained filtrate was concentrated to give an oily substance. This oily substance was dissolved in about 50 mL of methanol. The resulting solution was left still to precipitate a white solid. This solid substance was collected by suction filtration and dried. Then, 28.4 g (88% yield) of 3-bromo-9-phenylcarbazole was obtained as a white powder.

(ii) Synthesis of N-phenyl-(9-phenyl-9H-carbazol-3-yl)amine (abbreviation: PCA)

A synthesis scheme of N-phenyl-(9-phenyl-9H-carbazol-3-yl)amine (abbreviation: PCA) is shown in (D-2).

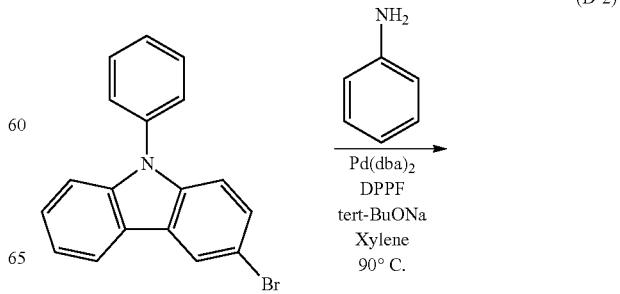

(D-2)

-continued

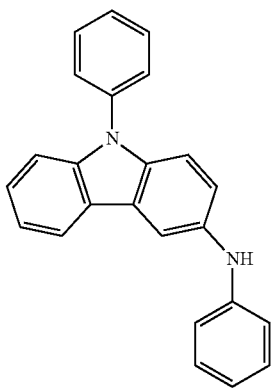

Into a 500 mL three-neck flask were added 19 g (60 mmol) of 3-bromo-9-phenylcarbazole, 0.34 g (0.60 mmol) of bis(dibenzylideneacetone)palladium(0), 1.6 g (3.0 mmol) of 1,1-bis(diphenylphosphino)ferrocene, and 13 g (0.18 mol) of sodium tert-butoxide, and the atmosphere in the flask was substituted with nitrogen. Then, 110 mL of dehydrated xylene and 7.0 g (75 mmol) of aniline were added thereto. This was heated and stirred at 90° C. for 7.5 hours under a stream of nitrogen. After the reaction was completed, about 500 mL of hot toluene was added to the reaction solution, followed by filtration through Florisil (produced by Wako Pure Chemical Industries, Ltd., Catalog No. 540-00135), alumina, and Celite (produced by Wako Pure Chemical Industries, Ltd., Catalog No. 531-16855). The obtained filtrate was concentrated, and hexane and ethyl acetate were added thereto, followed by irradiation with ultrasonic waves, whereby a solid substance was precipitated. This solid substance was collected by suction filtration and dried to produce 15 g (75% yield) of N-phenyl-(9-phenyl-9H-carbazol-3-yl)amine (abbreviation: PCA) as a milky white powder. By a nuclear magnetic resonance method (NMR), this compound was proved to be N-phenyl-(9-phenyl-9H-carbazol-3-yl)amine (abbreviation: PCA).

Figure 18A:
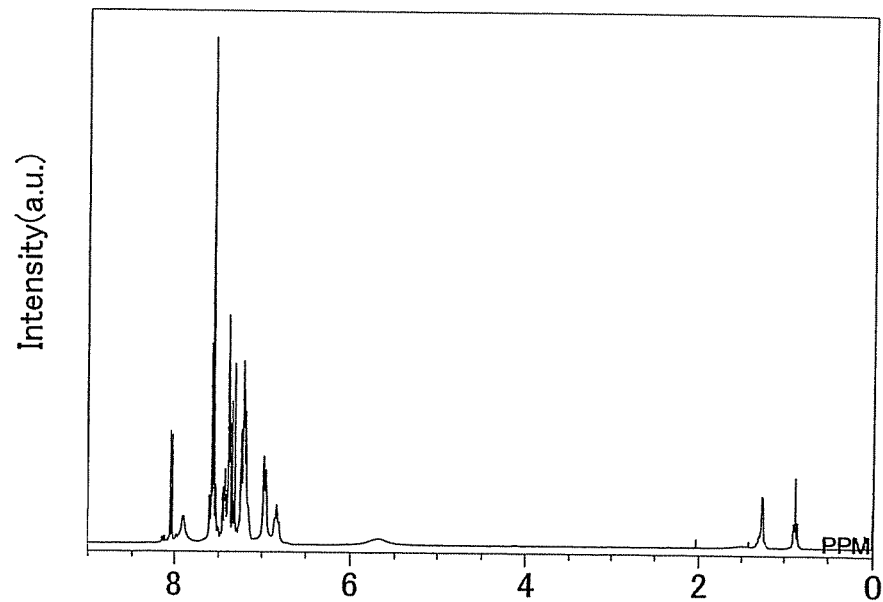
FIGS. 18A and 18B are each a $^1$H NMR chart of N-phenyl-(9-phenyl-9H-carbazol-3-yl)amine (abbreviation: PCA).
Figure 18B:
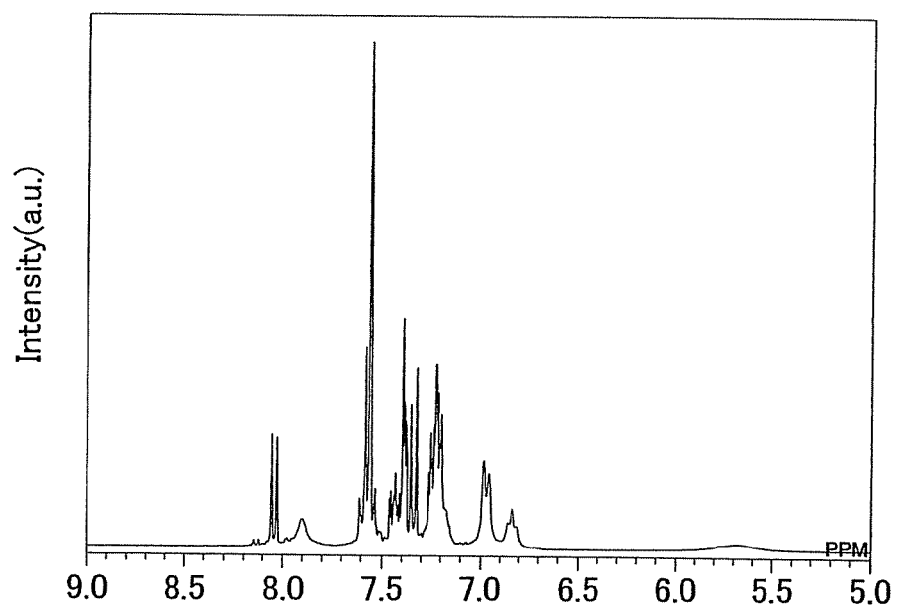

$^1$H NMR data of this compound is given below. $^1$H NMR (300 MHz, CDCl$_3$); 6.84 (t, J=6.9 Hz, 1H), 6.97 (d, J=7.8 Hz, 2H), 7.20-7.61 (m, 13H), 7.90 (s, 1H), 8.04 (d, J=7.8 Hz, 1H). In addition, FIGS. 18A and 18B show $^1$H NMR charts. It is to be noted that FIG. 18B is a chart in which the range of 5.0 ppm to 9.0 ppm in FIG. 18A is enlarged. In addition, data obtained when a DMSO-d$_6$ solvent was used is given. $^1$H NMR (300 MHz, DMSO-d$_6$): δ=6.73 (t, j=7.5, 1H), 7.02 (d, j=8.1, 2H), 7.16-7.70 (m, 12H), 7.95 (s, 1H), 8.06 (s, 1H), 8.17 (d, j=7.8, 1H). $^{13}$C NMR (75.5 MHz, DMSO-d$_6$): δ=109.55, 110.30, 110.49, 114.71, 118.22, 119.70, 120.14, 120.61, 122.58, 123.35, 126.18, 126.48, 127.37, 129.15, 130.14, 135.71, 136.27, 137.11, 140.41, 145.61.

[Step 2] Synthesis Method of 2PCAPPA

A synthesis scheme of 2PCAPPA is shown in (D-3).

(D-3)

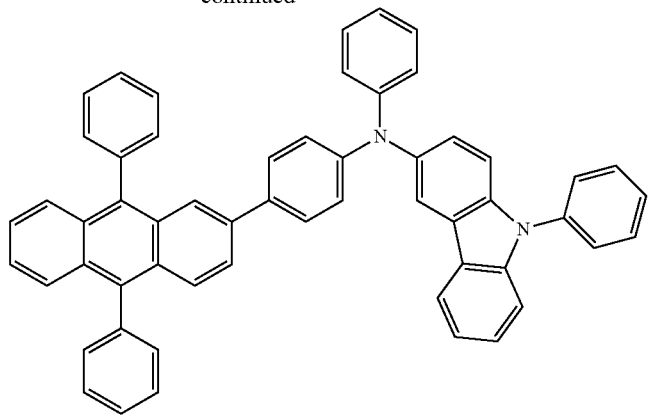

Into a 50 mL three-neck flask were put 0.52 g of (1.1 mmol) of 2-(4-bromophenyl)-9,10-diphenylanthracene synthesized in Step 2 of Example 1, 0.30 g (3.1 mmol) of sodium tert-butoxide, 0.32 g (0.96 mmol) of N-phenyl-9-phenylacarbazol-3-amine, and 0.030 g (0.060 mmol) of bis(dibenzylideneacetone)palladium(0), and the atmosphere in the flask was substituted with nitrogen. To this mixture were added 10 mL of toluene and 0.02 mL of a 10 wt % hexane solution of tri(tert-butyl)phosphine. This mixture was heated at 80° C. for five hours while being stirred so that the mixture was reacted. After the reaction, toluene was added to the reaction mixture, and this suspension was suction filtered through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was washed with water and a saturated saline solution, and then magnesium sulfate was added to an organic layer so that the organic layer was dried. This mixture was suction filtered, magnesium sulfate was removed, and the obtained filtrate was concentrated to give a solid substance. The obtained solid substance was purified with a silica gel column chromatography (a developing solvent was a mixed solvent of toluene:hexane=1:10 and then a developing solvent was a mixed solvent of toluene:hexane=1:3). The obtained fraction was concentrated to give a solid substance. This solid substance was recrystallized with a mixture solution of dichloromethane and methanol to give 0.50 g of a light yellow powdered solid substance was obtained in 61% yield. By a nuclear magnetic resonance method (NMR), this compound was found to be 2-{4-[N-phenyl-N-(9-phenylcarbazol-3-yl)amino]phenyl}-9,10-diphenylanthracene (abbreviation: 2PCAPPA).

By train sublimation, 1.4 g of the obtained yellow solid substance was purified. The sublimation was conducted under a reduced pressure of 7.0 Pa, an argon flow rate of 3 mL/min, at 335° C. for 15 hours to give 1.1 g of 2PCAPPA in 79% yield.

Figure 19A:
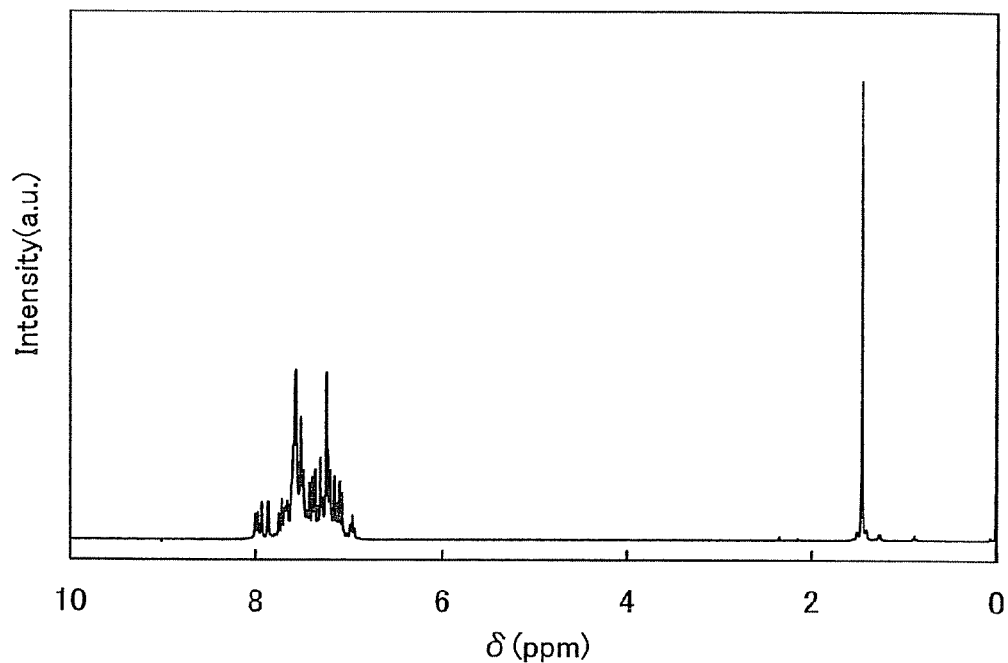
FIGS. 19A and 19B are each a $^1$H NMR chart of 2-{4-[N-phenyl-N-(9-phenylcarbazol-3-yl)amino]phenyl}-9,10-diphenylanthracene (abbreviation: 2PCAPPA).
Figure 19B:
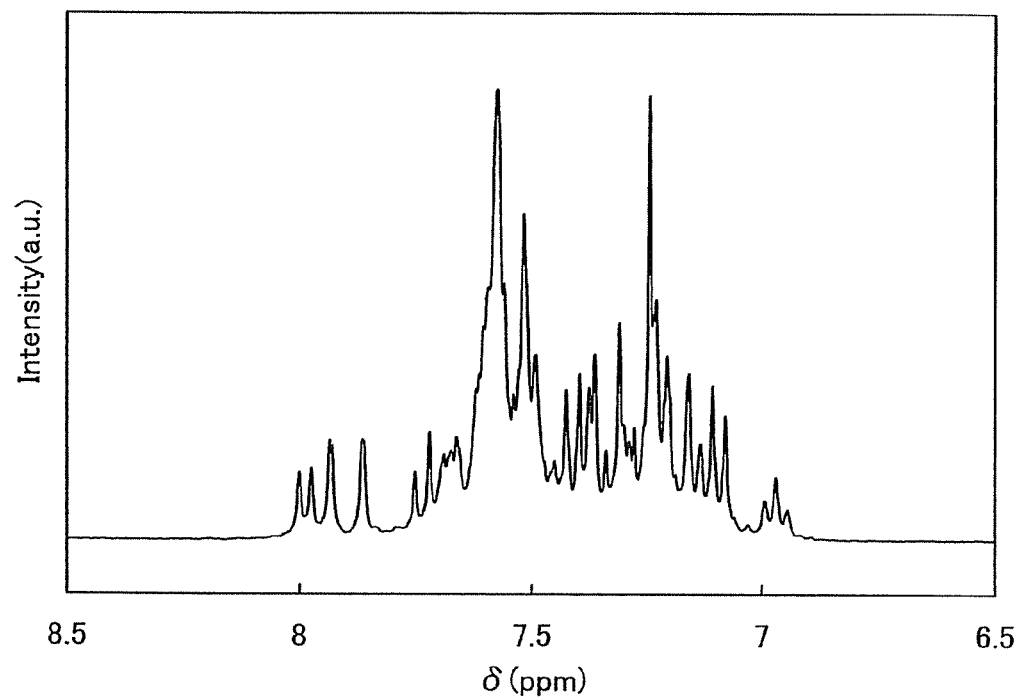

Further, $^1$H NMR data of the obtained compound is given below. $^1$H NMR (CDCl$_3$, 300 MHz, 50° C.): δ=6.03-7.02 (m, 1H), 7.04-7.78 (m, 34H), 7.86 (s, 1H), 7.93 (s, 1H), 7.99 (d, J=7.8 Hz, 1H). In addition, FIGS. 19A and 19B show $^1$H NMR charts. It is to be noted that FIG. 19B is a chart in which the range of 6.5 ppm to 8.5 ppm in FIG. 19A is enlarged.

Figure 20:
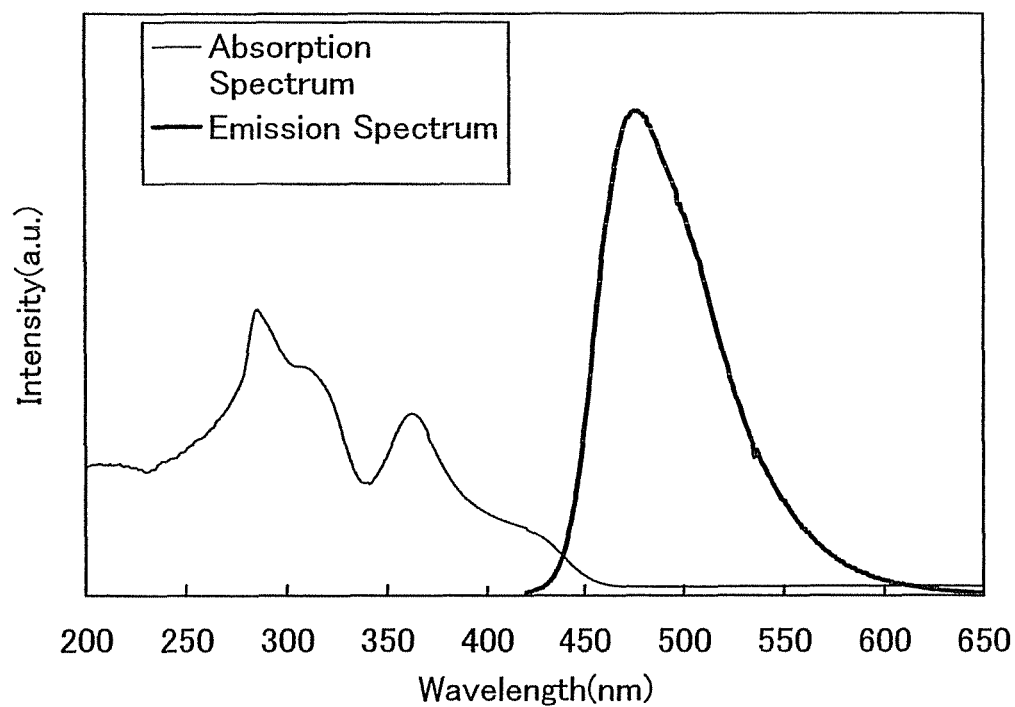
FIG. 20 illustrates an absorption spectrum and an emission spectrum of 2-{4-[N-phenyl-N-(9-phenylcarbazol-3-yl)amino]phenyl}-9,10-diphenylanthracene (abbreviation: 2PCAPPA).

Further, FIG. 20 shows an absorption spectrum and an emission spectrum of a toluene solution of 2PCAPPA. An ultraviolet-visible spectrophotometer (V550, manufactured by Japan Spectroscopy Corporation) was used for the measurements. The solution was put into a quartz cell. The absorption spectrum obtained by subtracting the absorption spectrum of the quartz cell from the absorption spectra of the solution and the quartz cell is shown in FIG. 20. In FIG. 20, the horizontal axis indicates the wavelength (nm) and the vertical axis indicates the absorption intensity (an arbitrary unit). In the case of the toluene solution, absorptions were observed at around 285 nm and 362 nm. In addition, in the case of the toluene solution, the maximum emission wavelength was 477 nm (an excitation wavelength of 363 nm).

Further, when the ionizing potential of a thin film of 2PCAPPA was measured with a photoelectron spectrometer (AC-2, by RIKEN KEIKI CO., LTD.) in the atmosphere, the ionizing potential was 5.32 eV. As a result, the HOMO level was proved to be −5.32 eV. Furthermore, an absorption edge was obtained from a Tauc plot assuming direct transition by using the data of the absorption spectrum of the thin film of 2PCAPPA, and the absorption edge was regarded as an optical energy gap. The energy gap was 2.63 eV. Therefore, a LUMO level of −2.69 eV was obtained from the obtained values of the energy gap value and HOMO level.

Example 3

In this example, a synthesis method of 2-(4-{N-[4-carbazol-9-yl]phenyl]-N-phenylamino}phenyl)-9,10-diphenylanthracene (abbreviation: 2YGAPPA), which can be used in the present invention and is represented by the structural formula (182), is described in specific terms.

(182)

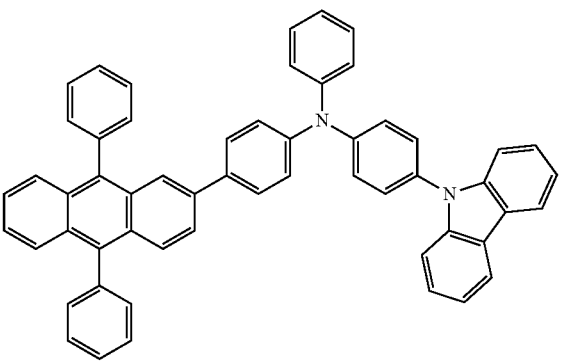

[Step 1] Synthesis of 4-(carbazol-9-yl)diphenylamine (abbreviation: YGA)

(i) Synthesis of N-(4-bromophenyl)carbazole

A synthesis scheme of N-(4-bromophenyl)carbazole is shown in (E-1).

(ii) Synthesis of 4-(carbazol-9-yl)diphenylamine (abbreviation: YGA)

A synthesis scheme of 4-(carbazol-9-yl)diphenylamine (abbreviation: YGA) is shown in (E-2).

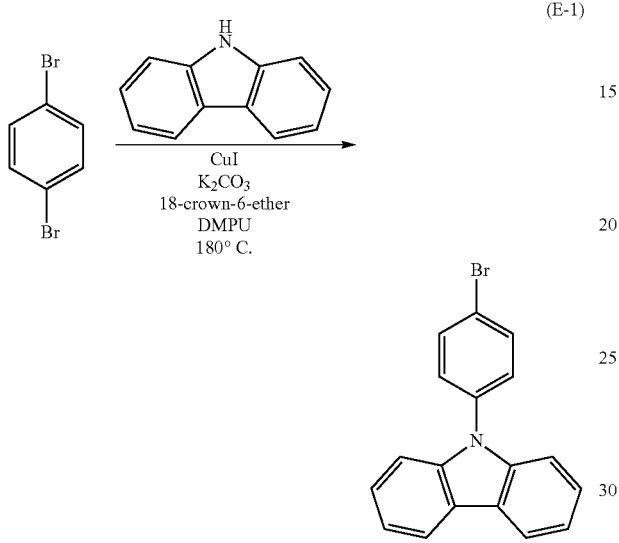

(E-1)

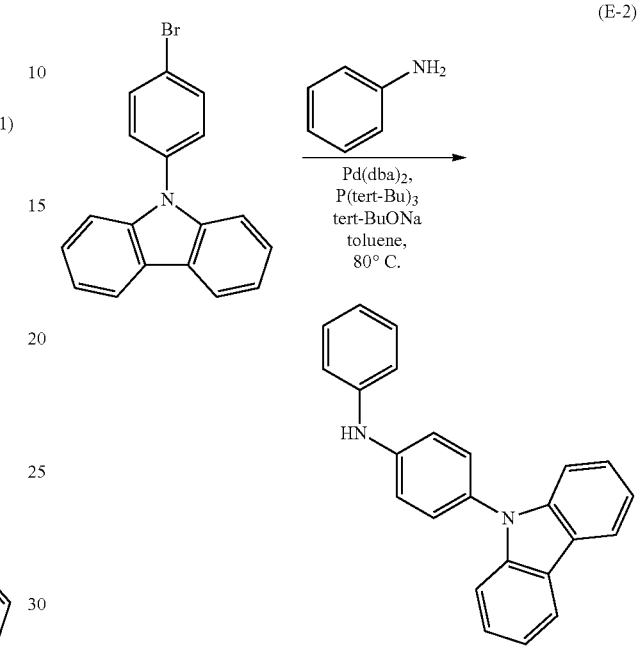

(E-2)

First, a synthesis method of N-(4-bromophenyl)carbazole is described. Into a 300 mL three-neck flask were put 56 g (0.24 mol) of 1,4-dibromobenzene, 31 g (0.18 mol) of carbazole, 4.6 g (0.024 mol) of copper(I) iodide, 66 g (0.48 mol) of potassium carbonate, and 2.1 g (0.008 mol) of 18-crown-6-ether, and the atmosphere in the flask was substituted with nitrogen. Then, 8 mL of 1,3-dimethyl-3,4,5,6-tetrahydro-2 (1H)-pyrimidinone (abbreviation: DMPU) was added, and the mixture was stirred at 180° C. for six hours. After the reaction mixture was cooled to room temperature, the sediment was removed by suction filtration. The filtrate was washed with a diluted hydrochloric acid, a saturated aqueous solution of sodium hydrogen carbonate, and a saturated saline solution in this order, and an organic layer was dried with magnesium sulfate. After the drying, the mixture was filtered by gravity, and the obtained filtrate was concentrated to produce an oily substance. This oily substance was purified by silica gel column chromatography (hexane:ethyl acetate=9:1). The obtained solid substance was recrystallized with a mixed solvent of chloroform and hexane to give 21 g of N-(4-bromophenyl)carbazole, which was the object of the synthesis, as a light brown plate-like crystal in 35% yield. By a nuclear magnetic resonance method (NMR), this compound was proved to be N-(4-bromophenyl)carbazole.

$^1$H NMR data of this compound is given below. $^1$H NMR (300 MHz, CDCl$_3$): δ=8.14 (d, J=7.8 Hz, 2H), 7.73 (d, J=8.7 Hz, 2H), 7.46 (d, J=8.4 Hz, 2H), 7.42-7.26 (m, 6H).

Into a 200 mL three-neck flask were put 5.4 g (17.0 mmol) of N-(4-bromophenyl)carbazole obtained in the abovementioned step (i), 1.8 mL (20.0 mmol) of aniline, 100 mg (0.17 mmol) of bis(dibenzylideneacetone)palladium(0), and 3.9 g (40 mmol) of sodium tert-butoxide, and the atmosphere in the flask was substituted with nitrogen. Then, 0.1 mL of a 10 wt % hexane solution of tri(tert-butyl)phosphine and 50 mL of toluene were added to this mixture, and the mixture was stirred at 80° C. for six hours. After the reaction, the reaction mixture was filtered through Florisil (produced by Wako Pure Chemical Industries, Ltd.; Catalog No. 540-00135), Celite (produced by Wako Pure Chemical Industries, Ltd., Catalog No. 531-16855), and alumina. The filtrate was washed with water, and a saturated saline solution. An organic layer was dried with magnesium sulfate, and this mixture was filtered by gravity. An oily substance obtained by concentration of the filtrate was purified by silica gel column chromatography (hexane:ethyl acetate=9:1) to give 4.1 g of 4-(carbazol-9-yl) diphenylamine (abbreviation: YGA), which was the object of the synthesis, in 73% yield. By a nuclear magnetic resonance method (NMR), this compound was proved to be 4-(carbazol-9-yl)diphenylamine (abbreviation: YGA).

Figure 21A:
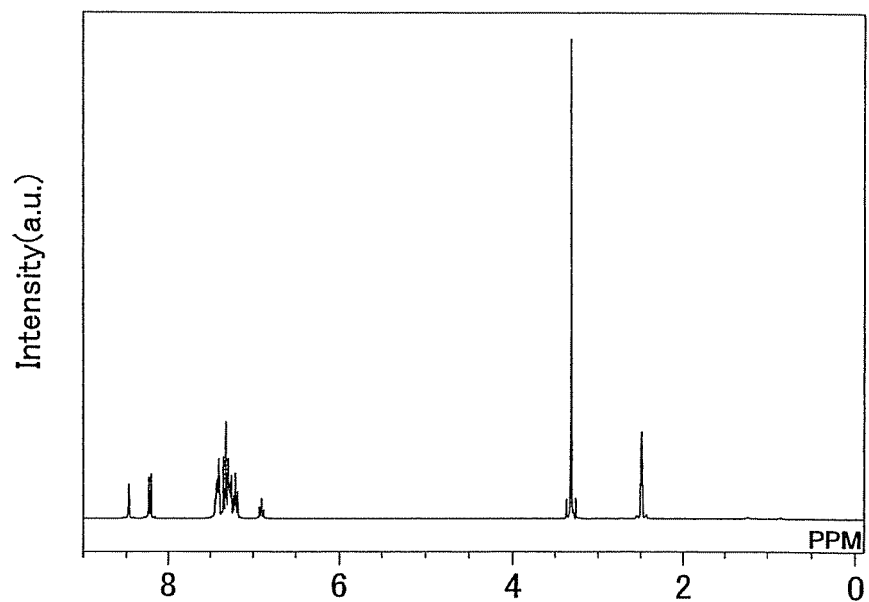
FIGS. 21A and 21B are each a $^1$H NMR chart of 4-(carbazol-9-yl)diphenylamine (abbreviation: YGA).
Figure 21B:
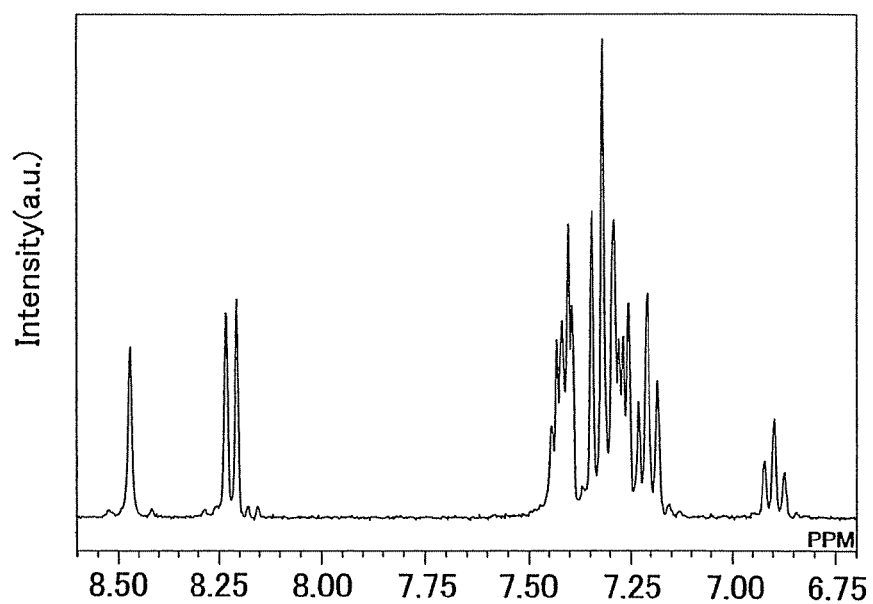

$^1$H NMR data of this compound is given below. $^1$H NMR (300 MHz, DMSO-d$_6$): δ=8.47 (s, 1H), 8.22 (d, J=7.8 Hz, 2H), 7.44-7.16 (m, 14H), 6.92-6.87 (m, 1H). In addition, FIGS. 21A and 21B show $^1$H NMR charts. It is to be noted that FIG. 21B is a chart in which the range of 6.5 ppm to 8.5 ppm in FIG. 21A is enlarged.

[Step 2] Synthesis Method of 2YGAPPA

A synthesis scheme of 2YGAPPA is shown in (E-3).

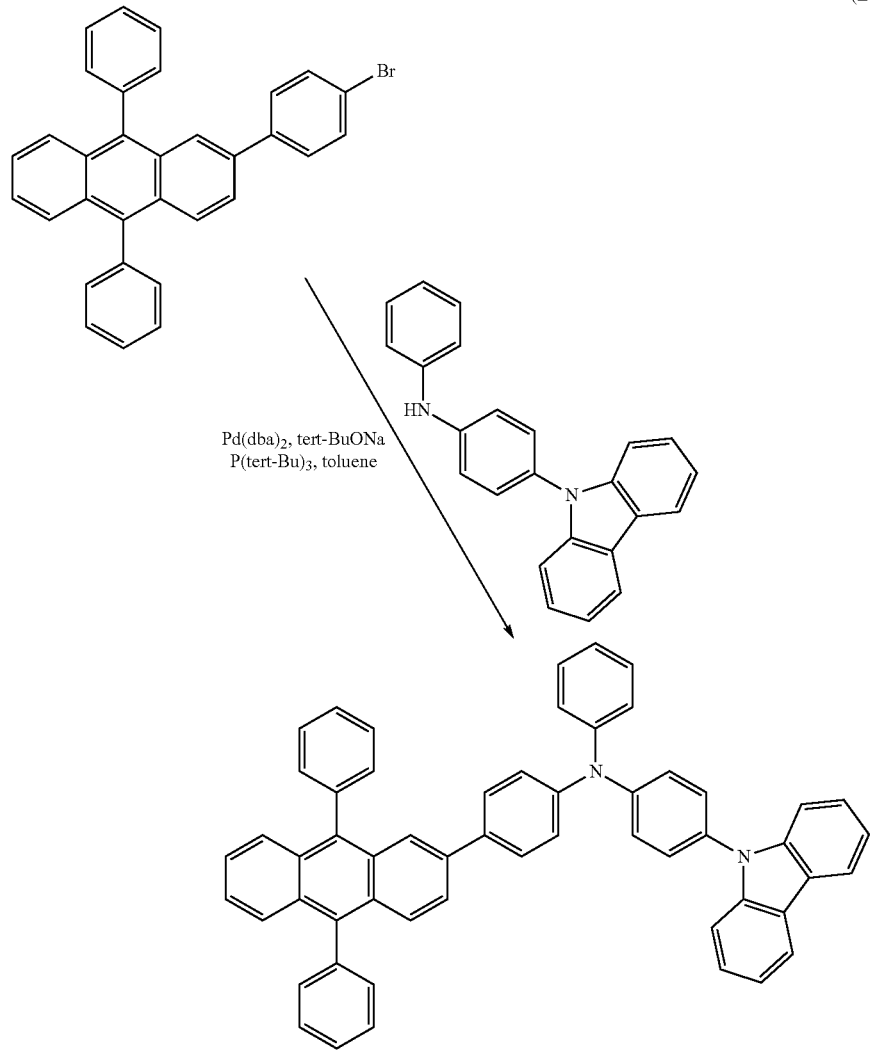

(E-3)

Into a 50 mL three-neck flask were put 0.51 g of (1.1 mmol) of 2-(4-bromophenyl)-9,10-diphenylanthracene synthesized in Step 2 of Example 1, 0.20 g (2.1 mmol) of sodium tert-butoxide, 0.35 g (1.1 mmol) of 4-(carbazol-9-yl)diphenylamine, and 0.02 g (0.04 mmol) of bis(dibenzylideneacetone)palladium(0), and the atmosphere in the flask was substituted with nitrogen. To this mixture were added 10 mL of toluene and 0.02 mL of a 10 wt % hexane solution of tri(tert-butyl)phosphine. This mixture was heated at 80° C. for three hours while being stirred so that the mixture was reacted. After the reaction, toluene was added to the reaction mixture, and this suspension was suction filtered through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was washed with water and a saturated saline solution, and then magnesium sulfate was added to an organic layer so that the organic layer was dried. This mixture was suction filtered, magnesium sulfate was removed, and the obtained filtrate was concentrated to give a solid substance. The obtained solid substance was purified using a silica gel column chromatography. For the column chromatography, a mixed solvent of toluene:hexane=1:10 was used first as a developing solvent, and then a mixed solvent of toluene:hexane=1:5 was used as a developing solvent. The obtained fraction was concentrated to give a solid substance. This solid substance was recrystallized with a mixed solvent of dichloromethane and methanol to give 0.51 g of a light yellow powdered solid substance in 65% yield. By a nuclear magnetic resonance measurement (NMR), this compound was proved to be 2-(4-{N-[4-(carbazol-9-yl)phenyl]-N-phenylamino}phenyl)-9,10-diphenylanthracene (abbreviation: 2YGAPPA).

By train sublimation, 1.4 g of the obtained yellow solid substance was purified. The sublimation was conducted under a reduced pressure of 7.0 Pa, an argon flow rate of 3 mL/min, at 333° C. for nine hours to give 1.2 g of the solid substance in 86% yield.

Further, $^1$H NMR data of the obtained compound is given below. $^1$H NMR (CDCl$_3$, 300 MHz): δ=7.06-7.15 (m, 1H), 7.17-7.74 (m, 33H), 7.78 (d, J=9.8 Hz, 1H), 7.90 (s, 1H), 8.14

Figure 22A:
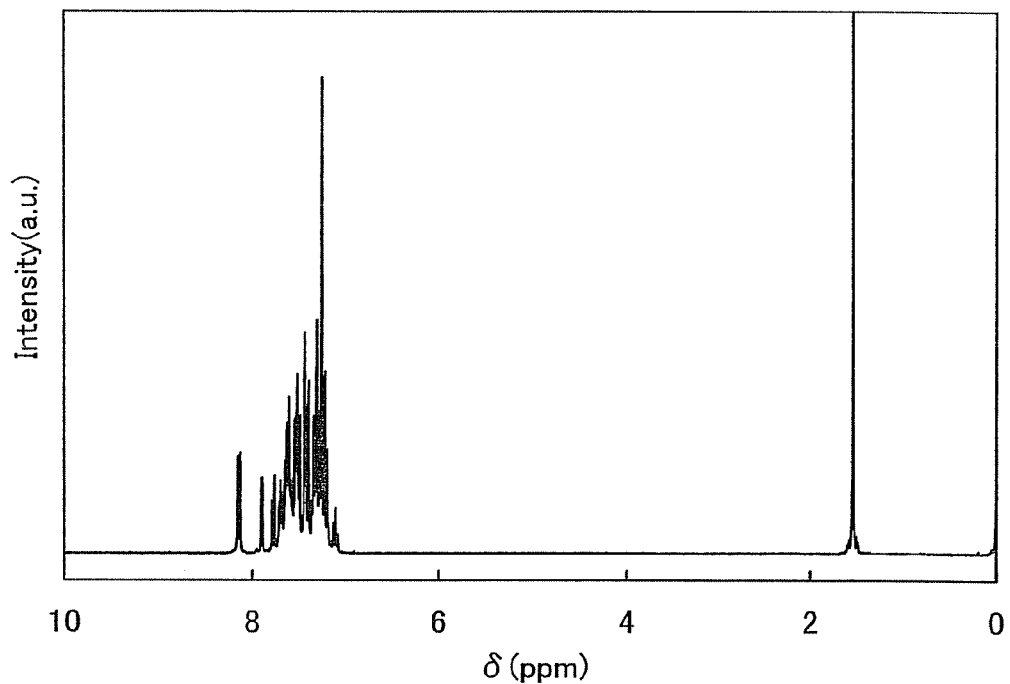
FIGS. 22A and 22B are each a $^1$H NMR chart of 2-(4-{N-[4-(carbazol-9-yl)phenyl]-N-phenylamino}phenyl)-9,10-diphenylanthracene (abbreviation: 2YGAPPA).
Figure 22B:
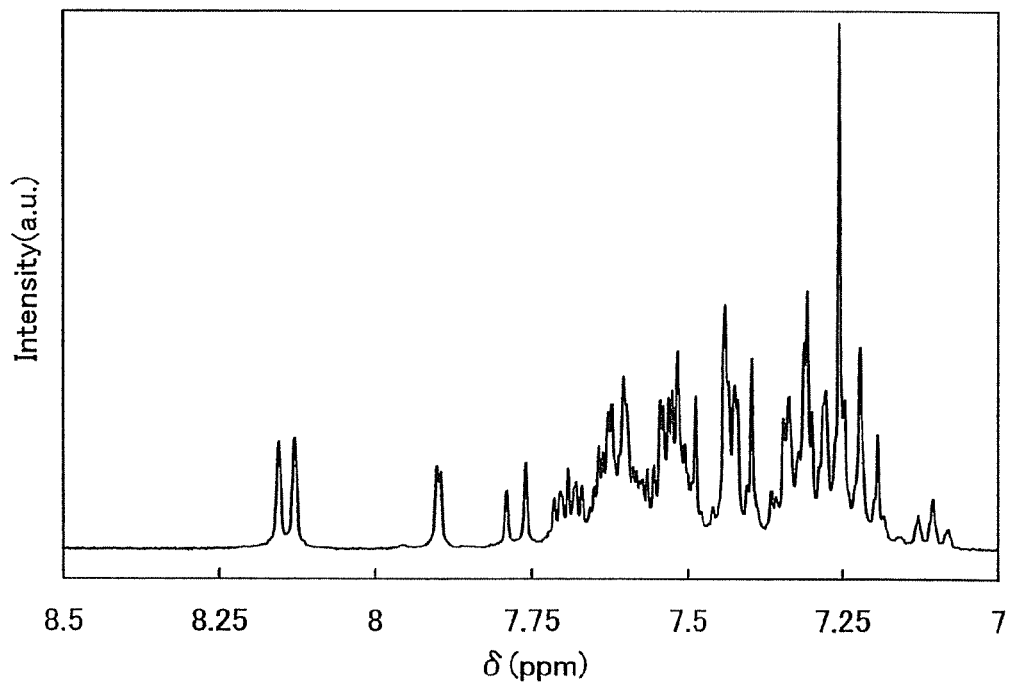

(d, J=7.8 Hz, 2H). In addition, FIGS. 22A and 22B show $^1$H NMR charts. It is to be noted that FIG. 22B is a chart in which the range of 7.0 ppm to 8.5 ppm in FIG. 22A is enlarged.

Figure 23:
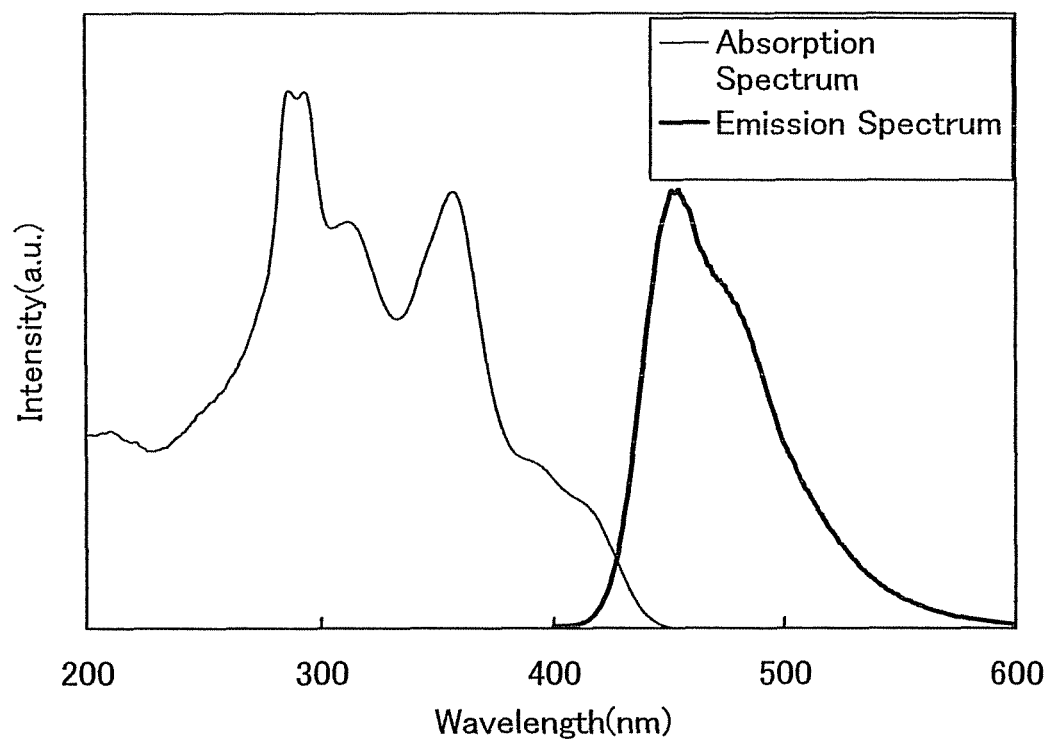
FIG. 23 illustrates an absorption spectrum and an emission spectrum of 2-(4-{N-[4-(carbazol-9-yl)phenyl]-N-phenylamino}phenyl)-9,10-diphenylanthracene (abbreviation: 2YGAPPA).

Further, FIG. 23 shows an absorption spectrum and an emission spectrum of a toluene solution of 2YGAPPA. An ultraviolet-visible spectrophotometer (V550, manufactured by Japan Spectroscopy Corporation) was used for the measurements. The solution was put into a quartz cell. The absorption spectrum obtained by subtracting the absorption spectrum of the quartz cell from the absorption spectra of the solution and the quartz cell is shown in FIG. 23. In FIG. 23, the horizontal axis indicates the wavelength (nm) and the vertical axis indicates the absorption intensity (an arbitrary unit). In the case of the toluene solution, absorptions were observed at around 286 nm, 293 nm, 312 nm, and 357 nm. In addition, in the case of the toluene solution, the maximum emission wavelength was 454 nm (an excitation wavelength of 356 nm).

Further, when the ionizing potential of a thin film of 2YGAPPA was measured with a photoelectron spectrometer (AC-2, by RIKEN KEIKI CO., LTD) in the atmosphere, the ionizing potential was 5.48 eV. As a result, the HOMO level was proved to be −5.48 eV. Furthermore, an absorption edge was obtained from a Tauc plot assuming direct transition by using the data of the absorption spectrum of the thin film of 2YGAPPA, and the absorption edge was regarded as an optical energy gap. The energy gap was 2.75 eV. Therefore, a LUMO level of −2.73 eV was obtained from the obtained values of the energy gap value and HOMO level.

Further, the redox reaction characteristics of 2YGAPPA were measured by cyclic voltammetry (CV) measurements. It is to be noted that an electrochemical analyzer (ALS model 600A, manufactured by BAS Inc.) was used for the measurements.

As for a solution used in the CV measurements, dehydrated N,N-dimethylformamide (DMF) (produced by Aldrich, 99.8%, Catalog No. 22705-6) was used as a solvent. Tetra-n-butylammonium perchlorate (n-Bu$_4$NClO$_4$) (produced by Tokyo Chemical Industry Co., Ltd., Catalog No. T0836) used as a supporting electrolyte was dissolved in DMF at a concentration of 100 mmol/L, and an electrolysis solution was prepared. Furthermore, the measurement object, 2YGAPPA was tried to be dissolved in the electrolysis solution at a concentration of 10 mmol/L; however, 2YGAPPA has low solubility and an undissolved portion thereof is left. Accordingly, supernatant fluid was skimmed with the undissolved portion deposited, and was used in the measurements. Further, a platinum electrode (a PTE platinum electrode, manufactured by BAS Inc.) was used as a working electrode. A platinum electrode (a VC-3 Pt counter electrode (5 cm), manufactured by BAS Inc.) was used as a counter electrode. An Ag/Ag$^+$ electrode (an RE5 non-aqueous solvent type reference electrode, manufactured by BAS Inc.) was used as a reference electrode. It is to be noted that the measurements were conducted at room temperature.

Oxidation characteristics of 2YGAPPA were evaluated in the following manner. The potential of the working electrode with respect to the reference electrode was shifted from −0.27 V to 0.70 V, which was followed by shifting the potential from 0.70 V to −0.27 V. This cycle was set as one cycle, and 100 cycles were performed. Also, reduction characteristics of 2YGAPPA were evaluated in the following manner. The potential of the working electrode with respect to the reference electrode was shifted from −0.35 V to −2.60 V, which was followed by shifting the potential from −2.60 V to −0.35 V. This cycle was set as one cycle, and 100 cycles were performed. It is to be noted that the scanning speed in the CV measurements was set to be 0.1 V/s.

Figure 24:
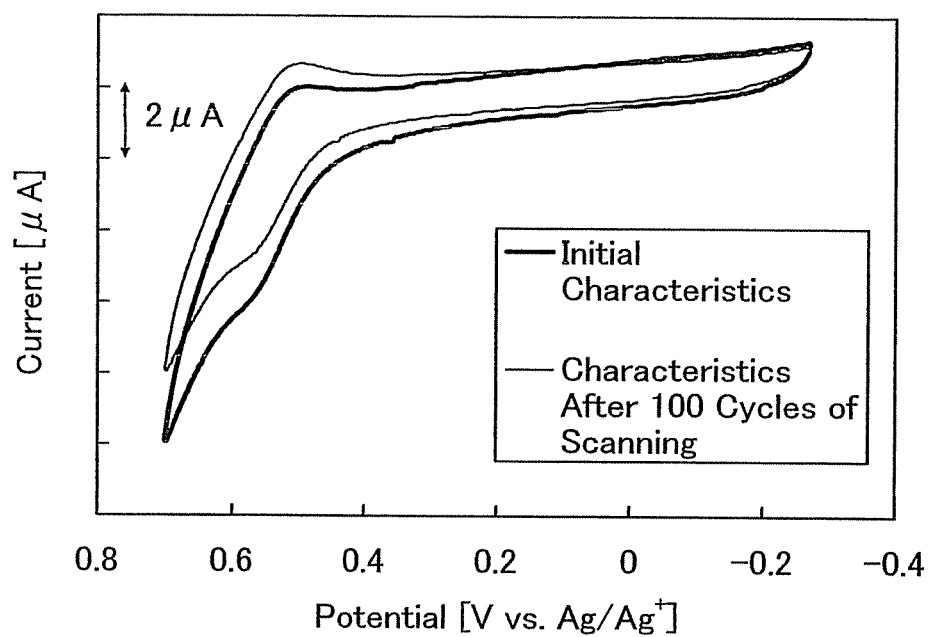
FIG. 24 illustrates oxidation characteristics of 2-(4-{N-[4-(carbazol-9-yl)phenyl]-N-phenylamino}phenyl)-9,10-diphenylanthracene (abbreviation: 2YGAPPA).
Figure 25:
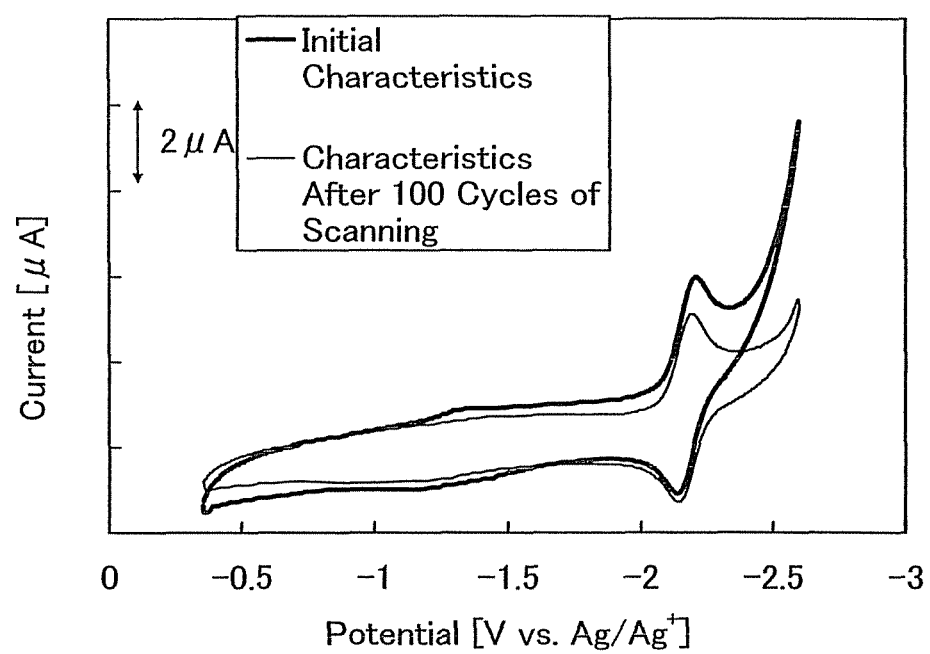
FIG. 25 illustrates reduction characteristics of 2-(4-{N-[4-(carbazol-9-yl)phenyl]-N-phenylamino}phenyl)-9,10-diphenylanthracene (abbreviation: 2YGAPPA).

The CV measurement results on an oxidation side of 2YGAPPA and the CV measurement results on a reduction side of 2YGAPPA are shown in FIG. 24 and FIG. 25, respectively. In FIG. 24 and FIG. 25, the horizontal axis indicates the potential (V) of the working electrode with respect to the reference electrode, and the vertical axis indicates the current value (μA) which flowed between the working electrode and the counter electrode. From FIG. 24, a current exhibiting oxidation was observed around 0.57 to 0.59 V (vs. Ag/Ag$^+$). In addition, From FIG. 25, a current exhibiting reduction was observed around −2.21 V (vs. Ag/Ag$^+$).

In spite of the fact that 100 cycles of scanning were conducted repeatedly, a peak position and the peak intensity at the CV curve scarcely changed in the oxidation and the reduction reactions, which reveals that the anthracene derivative of the present invention is extremely stable with respect to repeated redox reactions.

Example 4

In this example, a synthesis method of 2-{3-[N-phenyl-N-(9-phenylcarbazol-3-yl)amino]phenyl}-9,10-diphenylanthracene (abbreviation: 2 mPCAPPA), which can be used in the present invention and is represented by the structural formula (174), is described in specific terms.

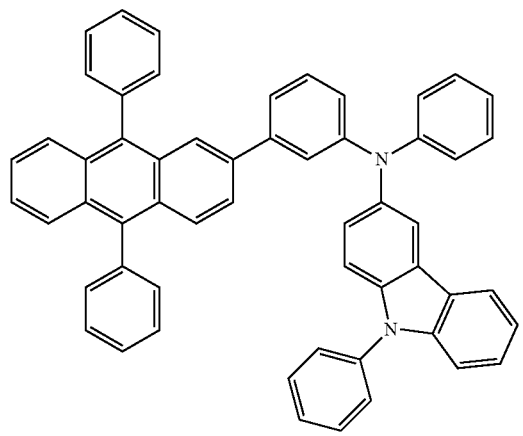

(174)

[Step 1] Synthesis of 2-(3-bromophenyl)-9,10-diphenylanthracene

A synthesis scheme of 2-(3-bromophenyl)-9,10-diphenylanthracene is shown in (F-1).

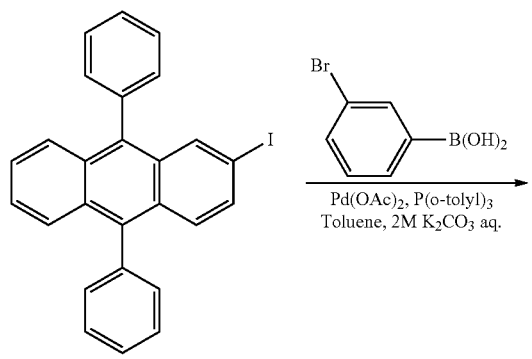

(F-1)

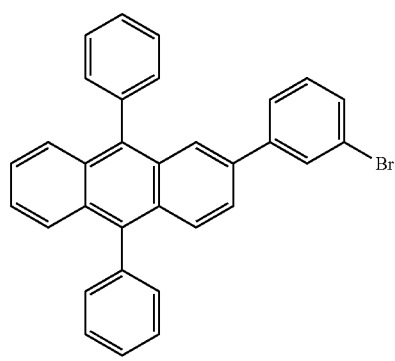

In a 200 mL three-neck flask were put 2.0 g (10 mmol) of 3-bromophenylboronic acid, 4.6 g (10 mmol) of 9,10-diphenyl-2-iodoanthracene, and 0.15 mg (0.50 mmol) of tris(o-tolyl)phosphine, and the atmosphere in the flask was substituted with nitrogen. To this mixture were added 50 mL of toluene and 14 mL (2 mol/L) of an aqueous solution of potassium carbonate. The mixture was stirred to be degassed while the pressure in the flask was reduced, and then 23 mg (0.10 mmol) of palladium(II) acetate was added to the mixture. This mixture was refluxed at 110° C. for eight hours. After the reaction, toluene was added to the reaction mixture, and this suspension was washed with water. An aqueous layer was separated from an organic layer and extracted with toluene. The extract was combined with the organic layer to be dried with magnesium sulfate. This mixture was filtered to remove magnesium sulfate, and the filtrate was concentrated to give an oily substance. This oily substance was purified by silica gel column chromatography (a developing solvent was hexane) to give 0.4 g of a milky-white solid substance in 18% yield. By a nuclear magnetic resonance method (NMR), this compound was found to be 2-(3-bromophenyl)-9,10-diphenylanthracene.

Figure 26A:
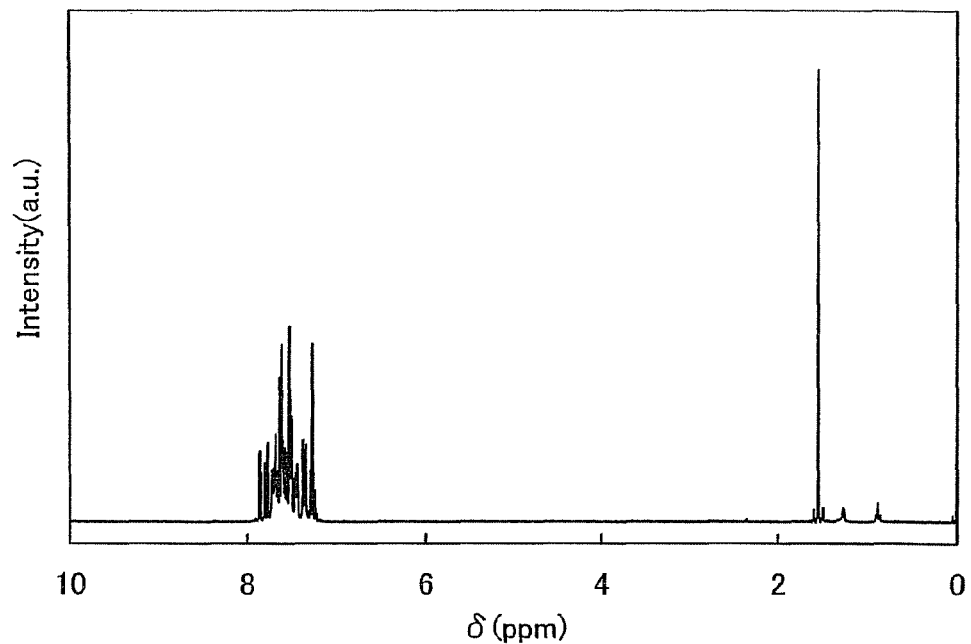
FIGS. 26A and 26B are each a $^1$H NMR chart of 2-(3-bromophenyl)-9,10-diphenylanthracene.
Figure 26B:
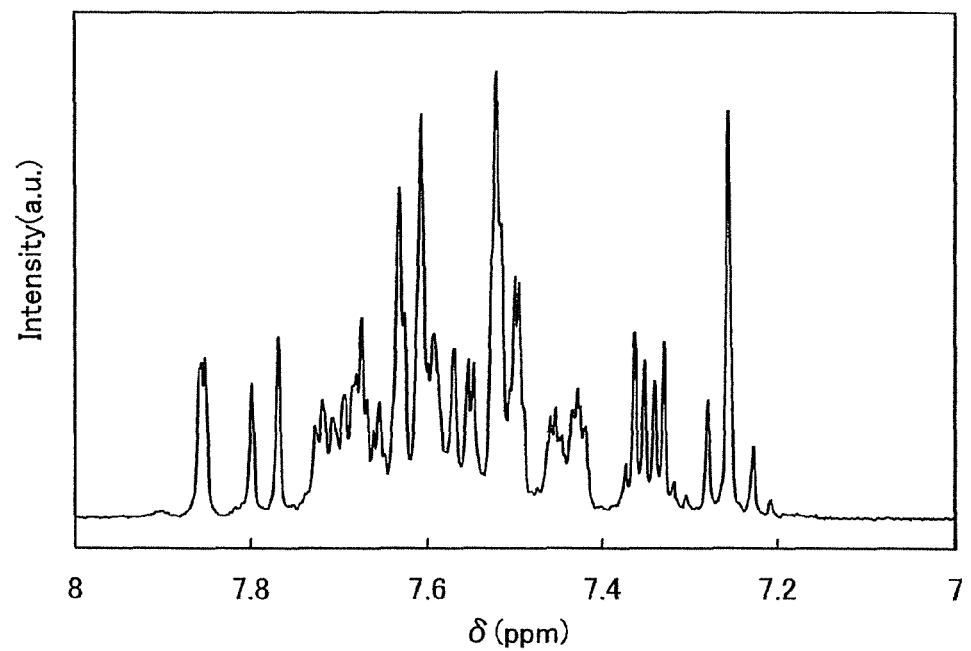

$^1$H NMR data of 2-(3-bromophenyl)-9,10-diphenylanthracene is shown below. $^1$H NMR (CDCl$_3$, 300 MHz): δ=7.33-7.36 (m, 2H), 7.43-7.46 (m, 2H), 7.50-7.73 (m, 15H), 7.78 (d, J=9.3 Hz, 1H), 7.85 (d, J=1.2 Hz, 1H). In addition, FIGS. 26A and 26B show $^1$H NMR charts. It is to be noted that FIG. 26B is a chart in which the range of 7.0 ppm to 8.0 ppm in FIG. 26A is enlarged.

[Step 2] A synthesis method of 2 mPCAPPA

A synthesis scheme of 2 mPCAPPA is shown in (F-2).

(F-2)

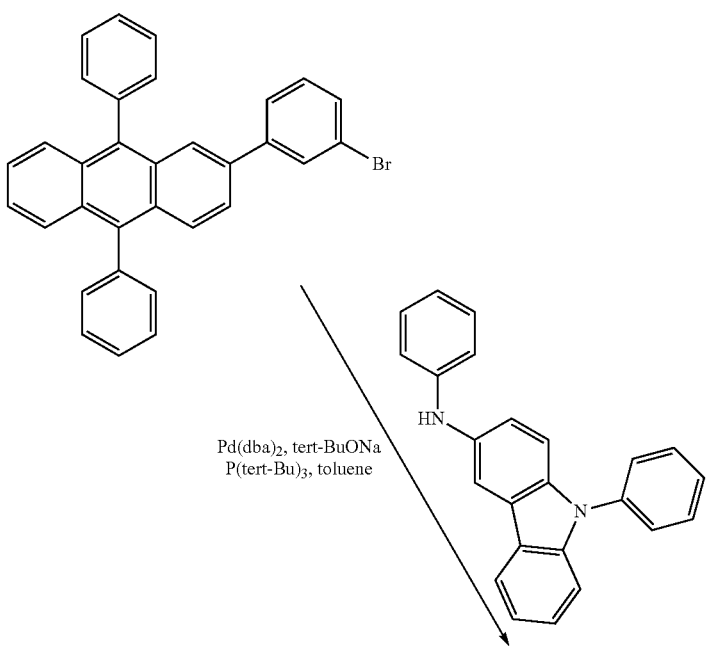

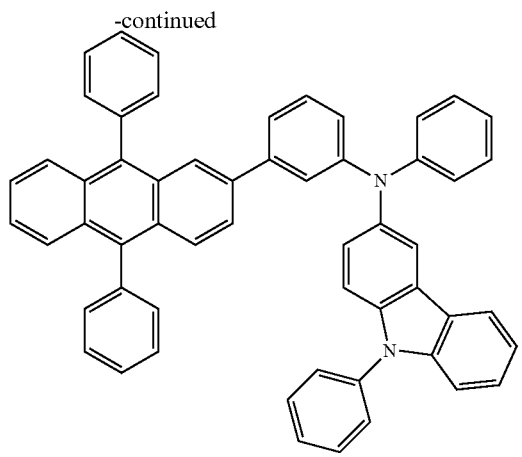

Into a 50 mL three-neck flask were put 0.45 g of (0.93 mmol) of 2-(3-bromophenyl)-9,10-diphenylanthracene, 0.2 g (2.1 mmol) of sodium tert-butoxide, 0.31 g (0.93 mmol) of N-phenyl-9-phenylcarbazol-3-amine, and 0.02 g (0.04 mmol) of bis(dibenzylideneacetone)palladium(0), and the atmosphere in the flask was substituted with nitrogen. To this mixture were added 10 mL of toluene and 0.02 mL of a 10 wt % hexane solution of tri(tert-butyl)phosphine. This mixture was heated at 80° C. for five hours while being stirred to be reacted. After the reaction, toluene was added to the reaction mixture, and this suspension was suction filtered through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was washed with water and a saturated saline solution, and then an organic layer and an aqueous layer were separated from each other. Then, magnesium sulfate was added to the organic layer so that the organic layer was dried. This mixture was suction filtered, magnesium sulfate was removed, and the obtained filtrate was concentrated to give a solid substance. This solid substance was dissolved in toluene and a slight amount of hexane, followed by purification using a silica gel column chromatography. For a developing solvent of the column chromatography, a mixed solvent of toluene:hexane=1:9 was used, and then a mixed solvent of toluene:hexane=1:3 was used. The obtained fraction was concentrated to give a solid substance. The solid substance was recrystallized with a mixed solvent of chloroform and methanol to give 0.46 g of a yellow powdered solid substance in 67% yield. By a nuclear magnetic resonance method (NMR), this compound was found to be 2-{3-[N-phenyl-N-(9-phenylcarbazol-3-yl)amino]phenyl}-9,10-diphenylanthracene (abbreviation: 2 mPCAPPA).

Figure 27A:
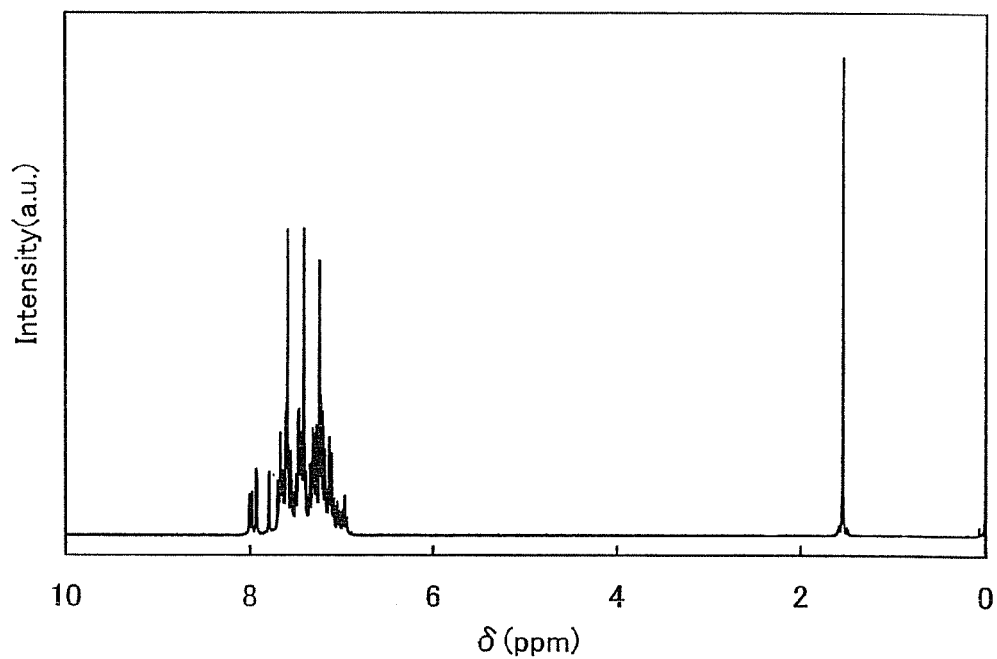
FIGS. 27A and 27B are each a $^1$H NMR chart of 2-{3-[N-phenyl-N-(9-phenylcarbazol-3-yl)amino]phenyl}-9,10-diphenylanthracene (abbreviation: 2 mPCAPPA).
Figure 27B:
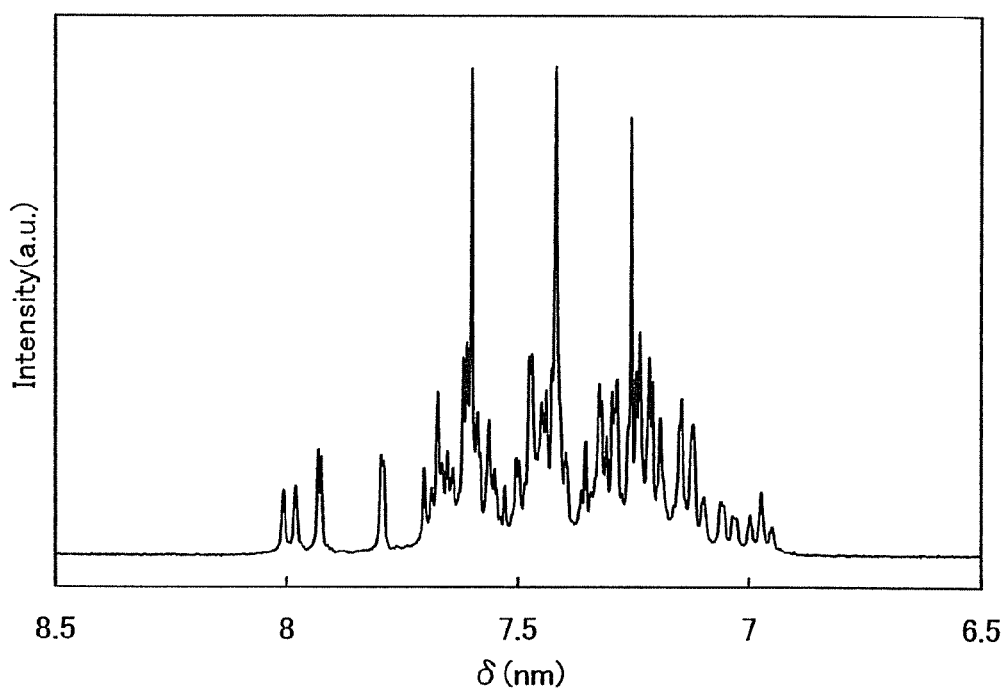

Further, $^1$H NMR data of the obtained compound is given below. $^1$H NMR (CDCl$_3$, 300 MHz): δ=6.91-7.75 (m, 35H), 7.79 (s, 1H), 7.93 (s, 1H), 7.99 (d, J=7.8 Hz, 1H). In addition, FIGS. 27A and 27B show $^1$H NMR charts. It is to be noted that FIG. 27B is a chart in which the range of 6.5 ppm to 8.5 ppm in FIG. 27A is enlarged.

Figure 28:
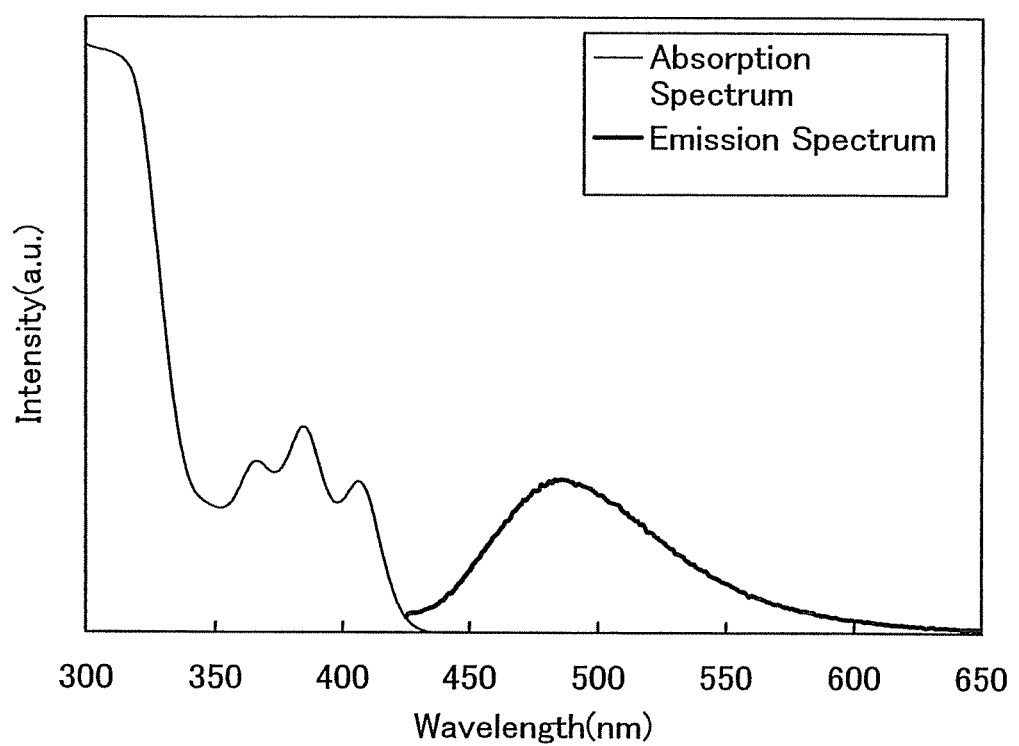
FIG. 28 illustrates an absorption spectrum and an emission spectrum of 2-{3-[N-phenyl-N-(9-phenylcarbazol-3-yl)amino]phenyl}-9,10-diphenylanthracene (abbreviation: 2 mPCAPPA).

Further, FIG. 28 shows an absorption spectrum and an emission spectrum of a toluene solution of 2 mPCAPPA. An ultraviolet-visible spectrophotometer (V550, manufactured by Japan Spectroscopy Corporation) was used for the measurements. The solution was put into a quartz cell. The absorption spectrum obtained by subtracting the absorption spectrum of the quartz cell from the absorption spectra of the solution and the quartz cell is shown in FIG. 28. In FIG. 28, the horizontal axis indicates the wavelength (nm) and the vertical axis indicates the intensity (an arbitrary unit). In the case of the toluene solution, absorptions were observed at around 366 nm, 384 nm, and 406 nm. In addition, in the case of the toluene solution, the maximum emission wavelength was 485 nm (an excitation wavelength of 369 nm).

In addition, when the ionizing potential of a thin film of 2 mPCAPPA was measured with a photoelectron spectrometer (AC-2, manufactured by RIKEN KEIKI CO., LTD.) in the atmosphere, the ionizing potential was 5.34 eV. As a result, the HOMO level was proved to be −5.34 eV. Furthermore, an absorption edge was obtained from a Tauc plot assuming direct transition by using the data of the absorption spectrum of the thin film of 2 mPCAPPA, and the absorption edge was regarded as an optical energy gap. The energy gap was 2.83 eV. Therefore, a LUMO level of −2.51 eV was obtained from the obtained values of the energy gap value and HOMO level.

Example 5

In this example, a synthesis method of 2-(3-{N-[4-(carbazol-9-yl)phenyl]-N-phenylamino}phenyl)-9,10-diphenylanthracene (abbreviation: 2mYGAPPA), which can be used in the present invention and is represented by the structural formula (216), is described in specific terms.

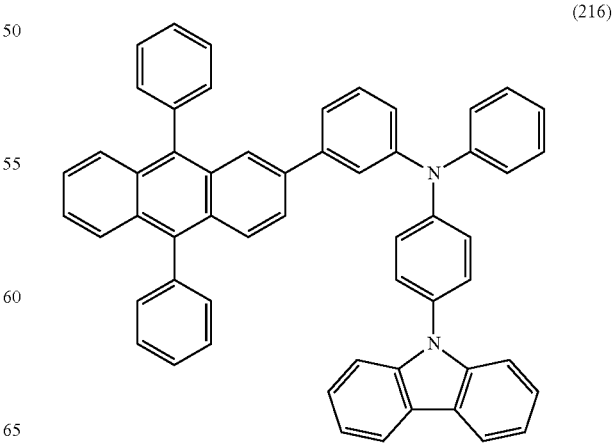

(216)

[Step 1] Synthesis Method of 2mYGAPPA

A synthesis scheme of 2mYGAPPA is shown in (G-1).

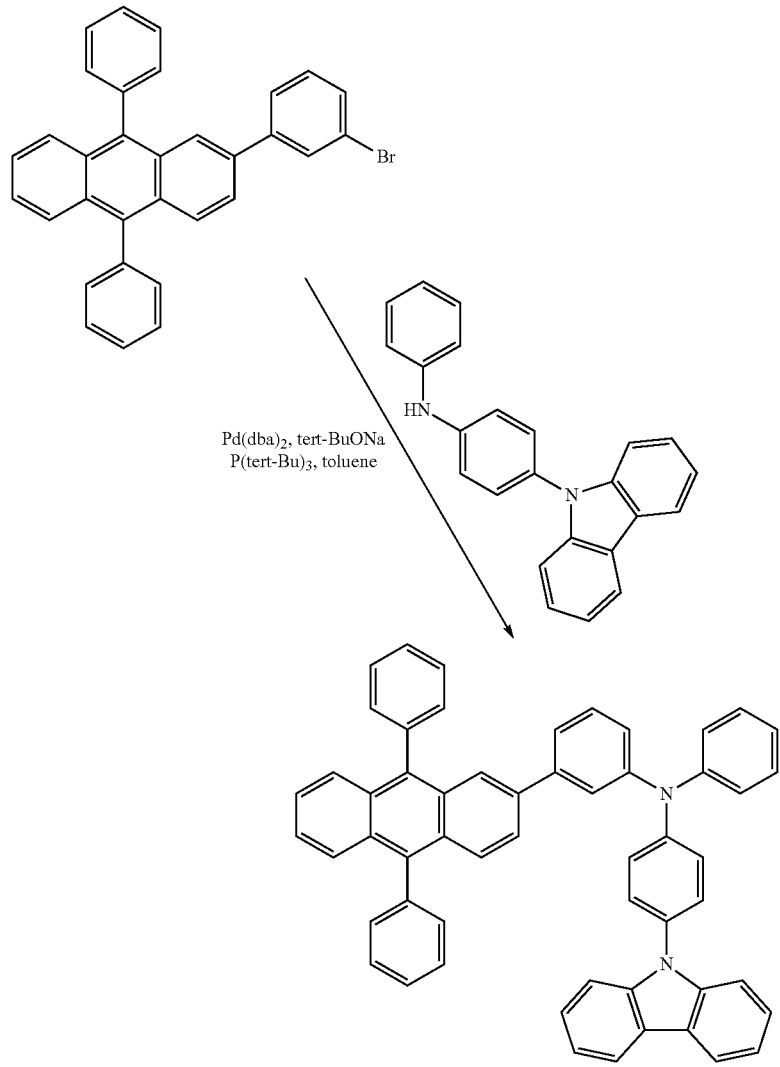

(G-1)

Into a 50 mL three-neck flask were put 0.45 g of (0.93 mmol) of 2-(3-bromophenyl)-9,10-diphenylanthracene, 0.2 g (2.1 mmol) of sodium tert-butoxide, 0.31 g (0.93 mmol) of 4-(9-carbazolyl)diphenylamine, and 0.010 g (0.02 mmol) of bis(dibenzylideneacetone)palladium(0), and the atmosphere in the flask was substituted with nitrogen. To this mixture were added 10 mL of toluene and 0.01 mL of tri(tert-butyl)phosphine 10 wt % hexane solution. This mixture was heated at 80° C. for five hours while being stirred to be reacted. After the reaction, toluene was added to the reaction mixture, and this suspension was suction filtered through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was washed with water and a saturated saline solution, and then an aqueous layer and an organic layer were separated from each other. Then, magnesium sulfate was added to the organic layer so that the organic layer was dried. This mixture was suction filtered, magnesium sulfate was removed, and the obtained filtrate was concentrated to give a solid substance. This solid substance was dissolved in toluene and a slight amount of hexane, followed by purification using a silica gel column chromatography. For a developing solvent of the column chromatography, a mixed solvent of toluene:hexane=1:9 was used, and then a mixed solvent of toluene:hexane=1:2 was used. The fraction was concentrated to give a solid substance. The solid substance was recrystallized with a mixed solvent of chloroform and methanol to give 0.45 g of a yellow powdered solid substance in 65% yield. By a nuclear magnetic resonance method (NMR), this compound was found to be 2-(3-{N-[4-(carbazol-9-yl)phenyl]-N-phenylamino}phenyl)-9,10-diphenylanthracene (abbreviation: 2mYGAPPA).

Figure 29A:
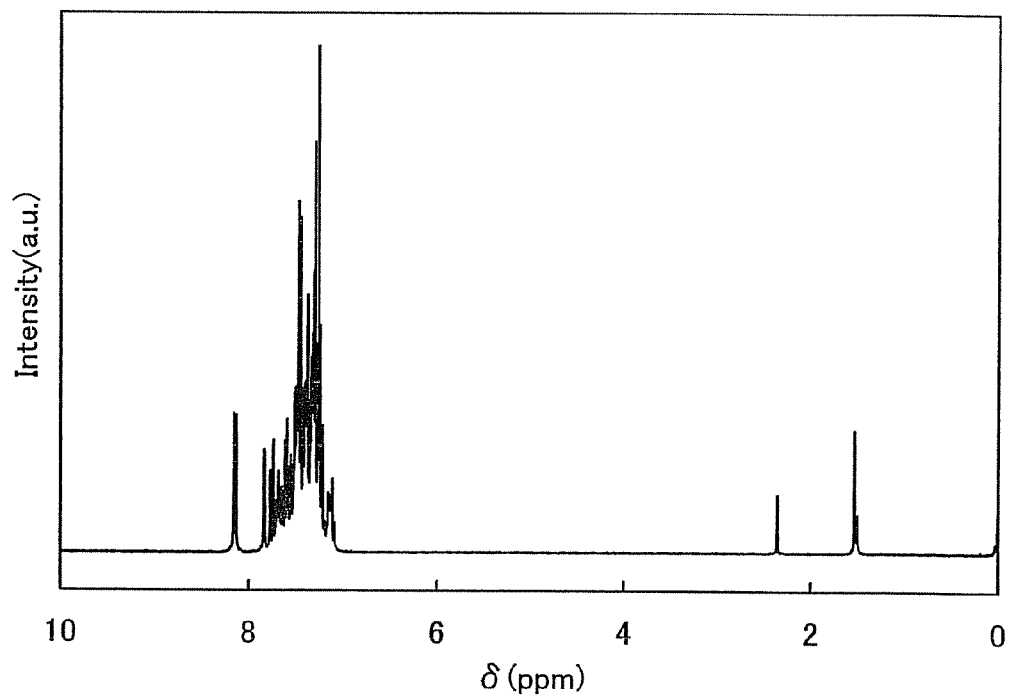
FIGS. 29A and 29B are each a $^1$H NMR chart of 2-(3-{N-[4-(carbazol-9-yl)phenyl]-N-phenylamino}phenyl)-9,10-diphenylanthracene (abbreviation: 2mYGAPPA).
Figure 29B:
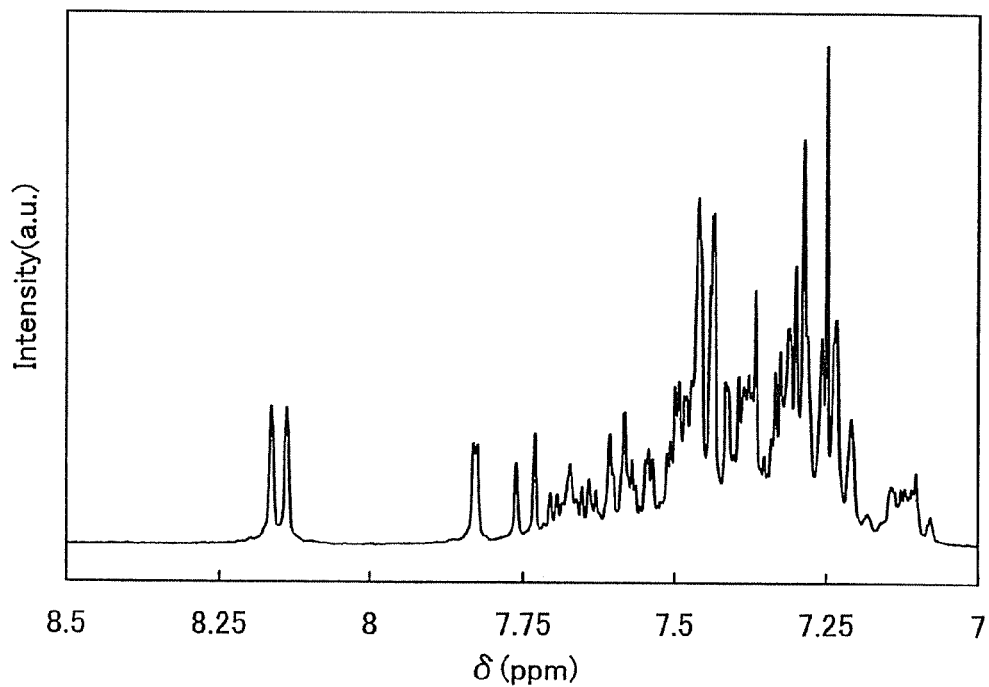

Further, $^1$H NMR data of the obtained compound is given below. $^1$H NMR (CDCl$_3$, 300 MHz): δ=7.06-7.72 (m, 34H), 7.75 (d, J=9.3 Hz, 1H), 7.83 (s, 1H), 8.15 (d, J=7.8 Hz, 2H). In addition, FIGS. 29A and 29B show $^1$H NMR charts. It is to be noted that FIG. 29B is a chart in which the range of 7.0 ppm to 8.5 ppm in FIG. 29A is enlarged.

Example 6

Figure 30:
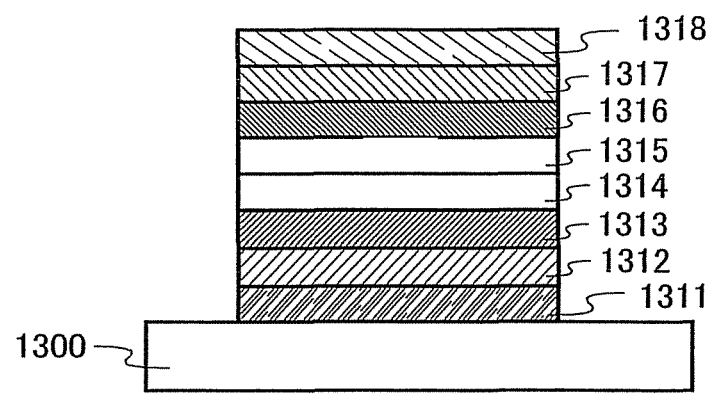
FIG. 30 illustrates a light-emitting element of Examples.

In this example, a light-emitting element to which the present invention is applied is described using FIG. 30.

Chemical formulae of materials used in this example are shown below. It is to be noted that chemical formulae of the materials of which the structural formulae have already been shown in this specification are omitted.

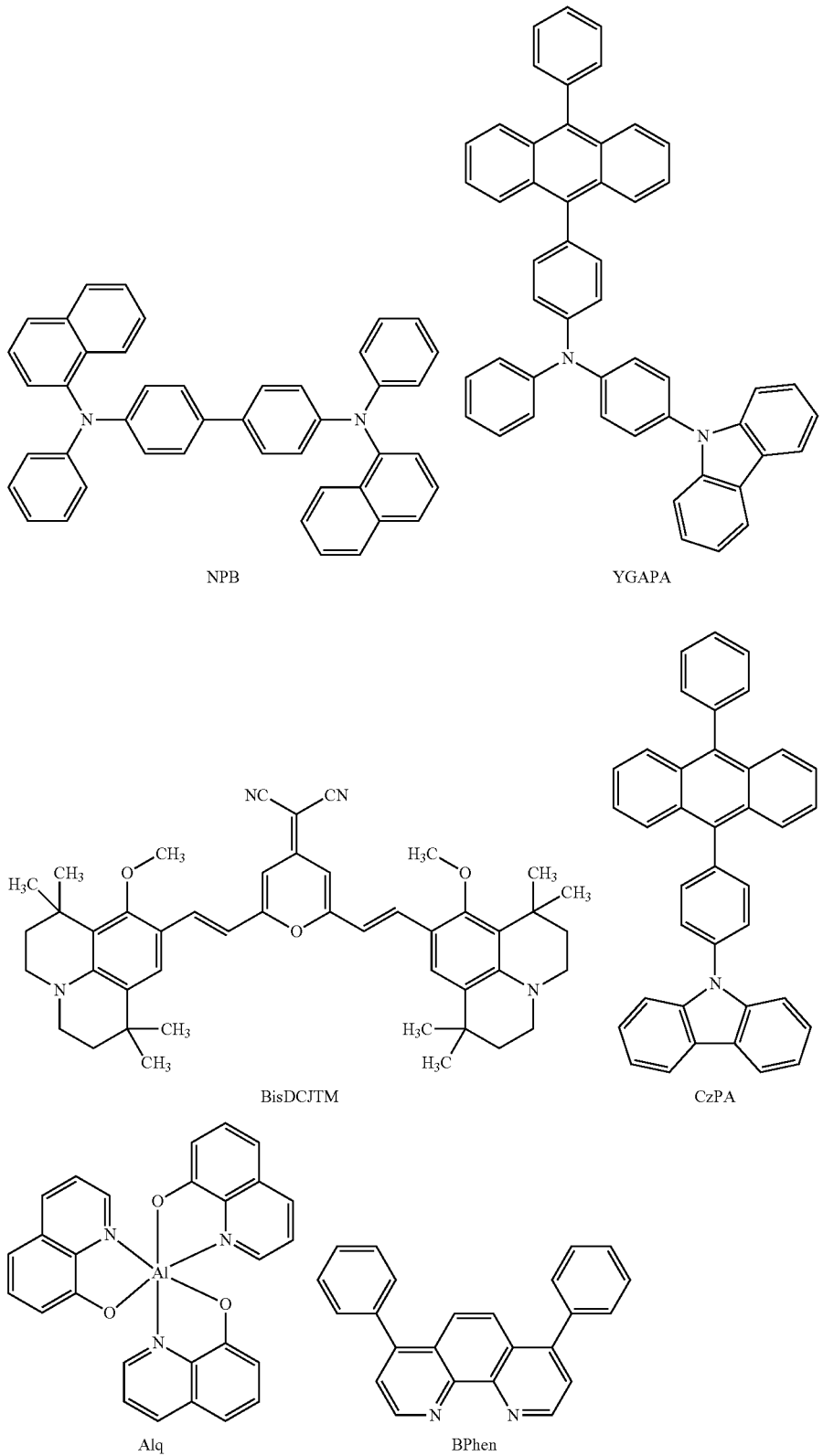

NPB

YGAPA

BisDCJTM

CzPA

Alq

BPhen

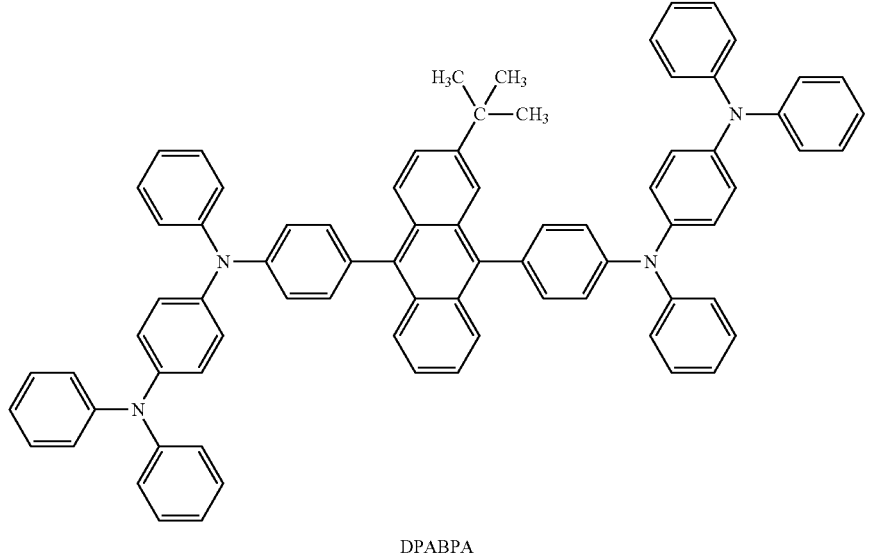 [SMILES: CC(C)(C)c1ccc2c(-c3ccc(N(c4ccccc4)c4ccc(N(c5ccccc5)c5ccccc5)cc4)cc3)c3ccccc3c(-c3ccc(N(c4ccccc4)c4ccc(N(c5ccccc5)c5ccccc5)cc4)cc3)c2c1]

DPABPA (Light-Emitting Element 1)

First, indium tin oxide containing silicon oxide was deposited over a glass substrate 1300 by a sputtering method to form a first anode 1311. It is to be noted that the thickness of the first anode was set to be 110 nm and the area thereof was set to be 2 mm×2 mm.

Next, the substrate provided with the first anode was fixed on a substrate holder that was provided in a vacuum evaporation apparatus so that a surface provided with the first anode faced downward. The pressure in the vacuum evaporation apparatus was reduced to approximately $10^{-4}$ Pa. Then, over the first anode 1311, NPB and molybdenum(VI) oxide were co-evaporated to form a layer containing a composite material of an organic compound and an inorganic compound, as a hole-injecting layer 1312. The thickness of the hole-injecting layer 1312 was set to be 50 nm and the weight ratio of NPB to molybdenum oxide was adjusted so as to be 4:1 (=NPB:molybdenum oxide). It is to be noted that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited over the hole-injecting layer 1312 to a thickness of 10 nm by an evaporation method using resistive heating to form a hole-transporting layer 1313.

Further more, 4-(9H-carbazol-9-yl)-4'-(10-phenyl-9-anthryl)triphenylamine (abbreviation: YGAPA) and {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) were co-evaporated to form a first light-emitting layer 1314 with a thickness of 10 nm over the hole-transporting layer 1313. Here, the weight ratio of YGAPA to BisDCJTM was adjusted so as to be 1:0.0025 (=YGAPA:BisDCJTM). It is to be noted that BisDCJTM, which is a guest material, emitted red light.

Furthermore, 9-[4-(N-carbazolyl)phenyl]-10-phenylanthracene (abbreviation: CzPA) and 2-{4-[N-phenyl-N-(9-phenylcarbazol-3-yl)amino]phenyl}-9,10-diphenylanthracene (abbreviation: 2PCAPPA) represented by the structural formula (132) were co-evaporated to form a second light-emitting layer 1315 with a thickness of 20 nm over the first light-emitting layer 1314. Here, the weight ratio of CzPA to 2PCAPPA was adjusted so as to be 1:0.1 (=CzPA:2PCAPPA). It is to be noted that 2PCAPPA, which is a guest material, emitted blue green light.

Then, tris(8-quinolinolato)aluminum (abbreviation: Alq) was deposited over the second light-emitting layer 1315 to a thickness of 10 nm by an evaporation method using resistive heating to form an electron-transporting layer 1316.

Furthermore, bathophenanthroline (abbreviation: BPhen) and lithium (Li) were co-evaporated to form an electron-injecting layer 1317 with a thickness of 20 nm over the electron-transporting layer 1316. Here, the weight ratio of BPhen to Li was adjusted so as to be 1:0.01 (=BPhen:Li).

Lastly, aluminum was deposited over the electron-injecting layer 1317 to a thickness of 200 nm by an evaporation method using resistive heating to form a first cathode 1318. Accordingly, a light-emitting element 1 was fabricated.

(Comparative Light-Emitting Element 2)

A comparative light-emitting element 2 was fabricated using 9,10-bis{4-[N-(4-diphenylaminophenyl)-N-phenylamino]phenyl}-2-tert-butylanthracene (abbreviation: DPABPA) for the second light-emitting layer instead of using 2PCAPPA. That is, CzPA and 9,10-bis{4-[N-(4-diphenylaminophenyl)-N-phenylamino]phenyl}-2-tert-butylanthracene (abbreviation: DPABPA) were co-evaporated to form the second light-emitting layer with a thickness of 20 nm. Here, the weight ratio of CzPA to DPABPA was adjusted, so as to be 1:0.1 (=CzPA:DPABPA). The comparative light-emitting element 2 was fabricated in a similar manner to the light-emitting element 1 other than the second light-emitting layer. It is to be noted that DPABPA, which is a guest material, emitted blue green light.

After sealing was performed in a glove box under a nitrogen atmosphere so that the light-emitting element 1 and the comparative light-emitting element 2 obtained as described above were not exposed to the atmosphere, operation characteristics of these light-emitting elements were measured. It is to be noted that the measurements were performed at room temperature (in an atmosphere kept at 25° C.).

Figure 31:
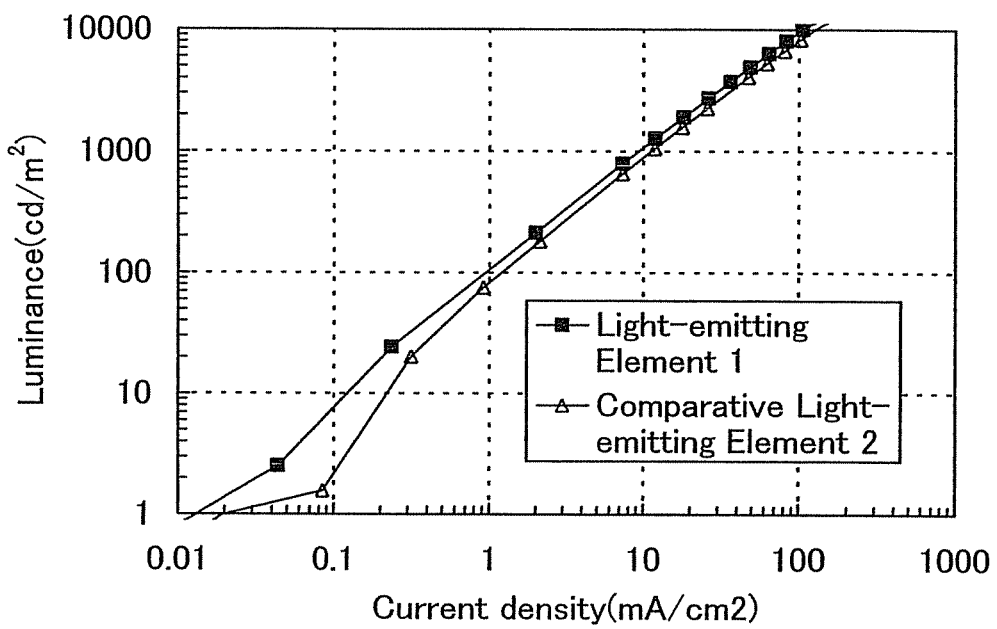
FIG. 31 illustrates current density vs. luminance characteristics of light-emitting elements fabricated in Example 6.
Figure 32:
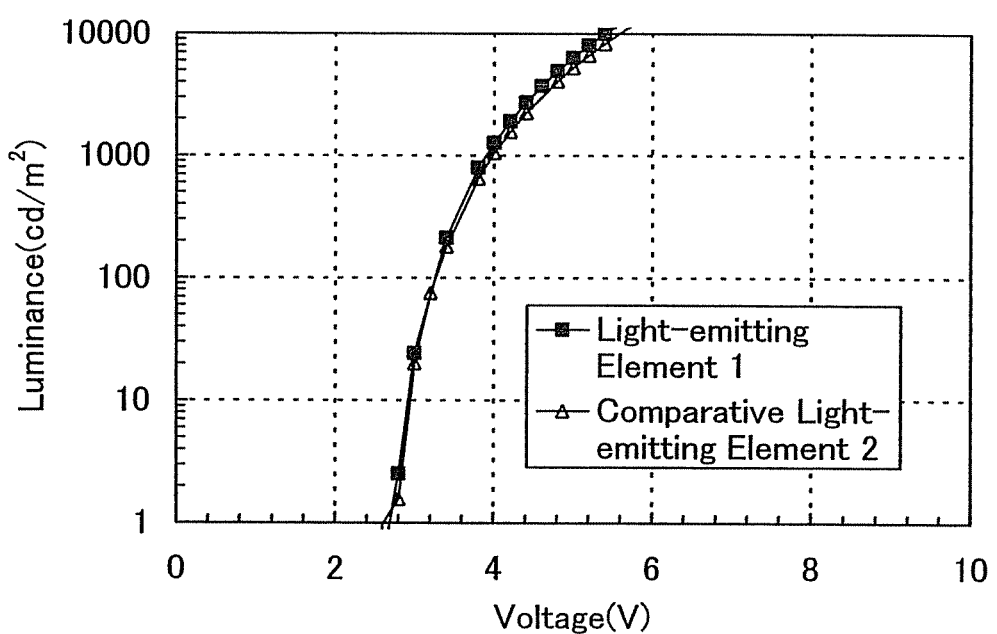
FIG. 32 illustrates voltage vs. luminance characteristics of light-emitting elements fabricated in Example 6.
Figure 33:
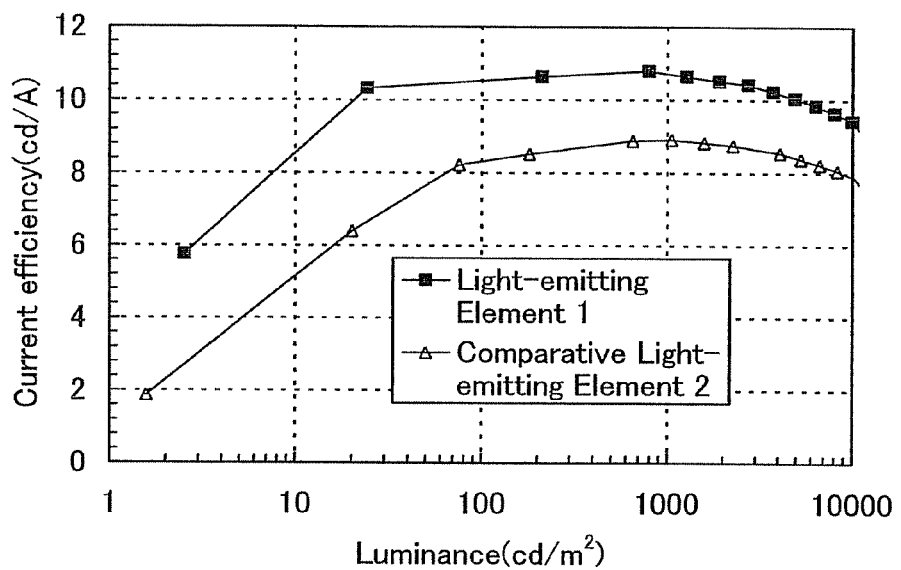
FIG. 33 illustrates luminance vs. current efficiency characteristics of light-emitting elements fabricated in Example 6.

The current density vs. luminance characteristics of the light-emitting element 1 and the comparative light-emitting element 2 are shown in FIG. 31. In addition, the voltage vs. luminance characteristics are shown in FIG. 32. In addition, the luminance vs. current efficiency characteristics are shown in FIG. 33. In addition, the emission spectra at a current of 1 mA are shown in FIG. 34.

Figure 34:
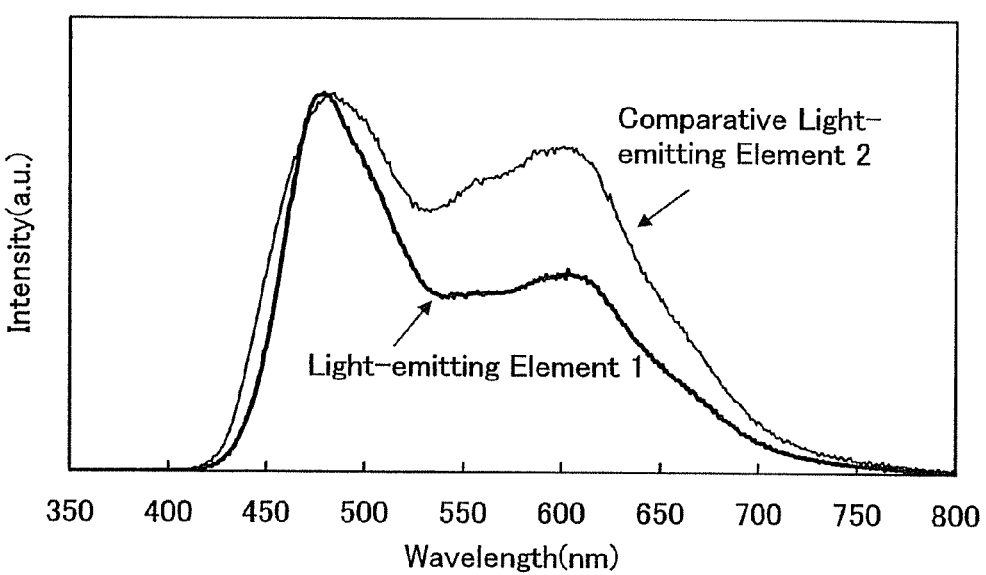
FIG. 34 illustrates emission spectra of light-emitting elements fabricated in Example 6.

As can be seen from FIG. 34, the emission spectrum of the comparative light-emitting element 2 has two peaks. In addition, the CIE chromaticity coordinate of the comparative light-emitting element 2 at a luminance of 1060 cd/m² was (x=0.33, y=0.38), and light emission was white. In addition, at a luminance of 1060 cd/m², the current efficiency was 8.9 cd/A and the external quantum efficiency was 4.1%. In addition, at a luminance of 1060 cd/m², the voltage was 4.0 V, the current density was 11.8 A/cm², and the power efficiency was 7.0 lm/W.

Further, as can be seen from FIG. 34, the emission spectrum of the light-emitting element 1 has two peaks. In addition, the CIE chromaticity coordinates of the light-emitting element 1 at a luminance of 790 cd/m² was (x=0.29, y=0.37), and light emission was white. In addition, at a luminance of 790 cd/m², the current efficiency was 10.8 cd/A and the external quantum efficiency was 5.2%, meaning that the emission efficiency was high. In addition, at a luminance of 790 cd/m², the voltage was 3.8 V, the current density was 7.4 mA/cm², and the power efficiency was 8.9 lm/W, meaning that the power efficiency was high.

Thus, it can be understood that although both the light-emitting element 1 and the comparative light-emitting element 2 emitted white light, the light-emitting element 1 has higher emission efficiency than the comparative light-emitting element 2. In addition, it can be understood that the power consumption of the light-emitting element 1 is more reduced than the comparative light-emitting element 2.

Therefore, by applying the present invention, a white light-emitting element having high emission efficiency can be obtained. Further, a white light-emitting element with low power consumption can be obtained.

Example 7

Figure 35:
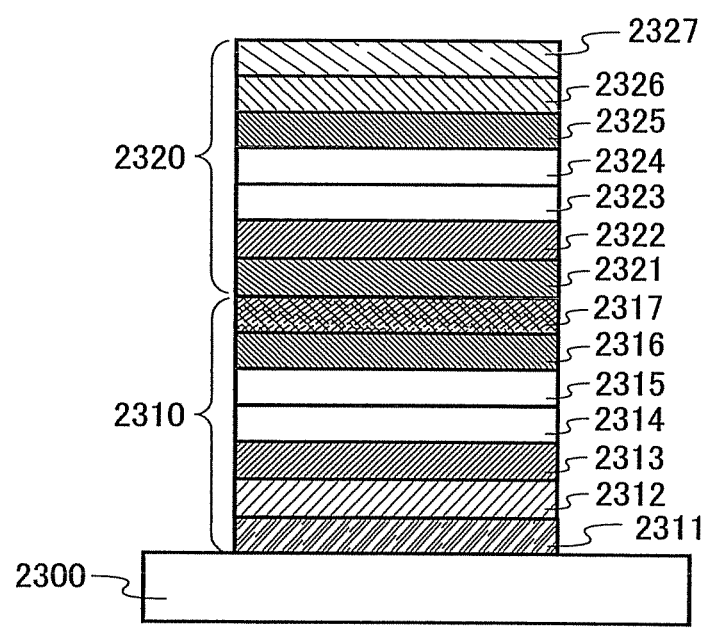
FIG. 35 illustrates a light-emitting element of Examples.

In this example, a light-emitting element to which the present invention is applied is described using FIG. 35. Chemical formulae of materials used in this example are shown below. It is to be noted that chemical formulae of the materials of which the structural formulae have already been shown in this specification are omitted.

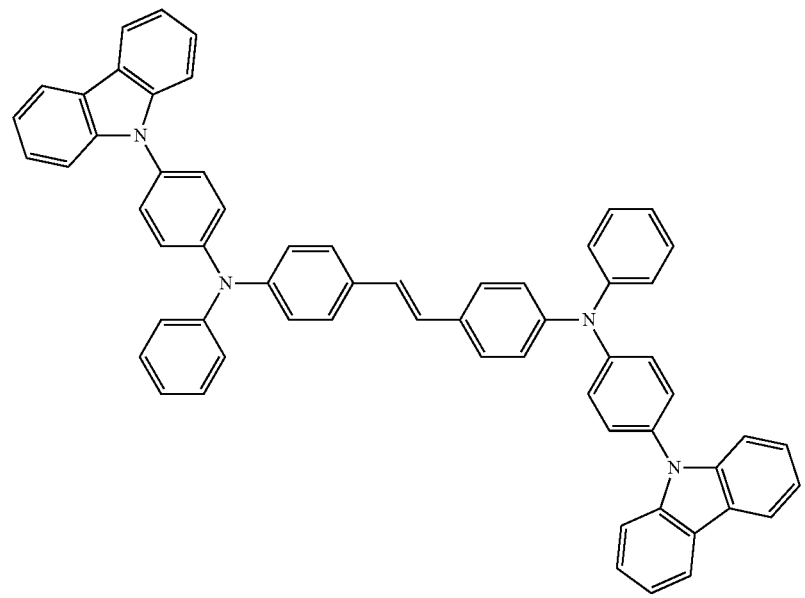

YGA2S

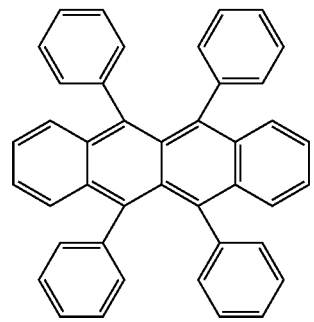

rubrene (Light-emitting Element 3)

First, indium tin oxide containing silicon oxide was deposited over a glass substrate 2300 by a sputtering method to form a first anode 2311. It is to be noted that the thickness of the first anode was set to be 110 nm and the area thereof was set to be 2 mm×2 mm.

Next, the substrate provided with the first anode was fixed on a substrate holder that was provided in a vacuum evaporation apparatus so that a surface provided with the first anode faced downward. The pressure in the vacuum evaporation apparatus was reduced to approximately $10^{-4}$ Pa. Then, over the first anode 2311, NPB and molybdenum(VI) oxide were co-evaporated to form a layer containing a composite material of an organic compound and an inorganic compound, as a hole-injecting layer 2312. The thickness of the hole-injecting layer 2312 was set to be 50 nm and the weight ratio of NPB to molybdenum oxide was adjusted so as to be 4:1 (=NPB:molybdenum oxide). It is to be noted that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited over the hole-injecting layer 2312 to a thickness of 10 nm by an evaporation method using resistive heating to form a hole-transporting layer 2313.

Furthermore, 4-(9H-carbazol-9-yl)-4'-(10-phenyl-9-anthryl)triphenylamine (abbreviation: YGAPA) and {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) were co-evaporated to form a first light-emitting layer 2314 with a thickness of 10 nm over the hole-transporting layer 2313. Here, the weight ratio of YGAPA to BisDCJTM was adjusted so as to be 1:0.0025 (=YGAPA:BisDCJTM). It is to be noted that BisDCJTM, which is a guest material, emitted red light.

Furthermore, 9-[4-(N-carbazolyl)phenyl]-10-phenylanthracene (abbreviation: CzPA) and 2-{4-[N-phenyl-N-(9-phenylcarbazol-3-yl)amino]phenyl}-9,10-diphenylanthracene (abbreviation: 2PCAPPA) represented by the structural formula (132) were co-evaporated to form a second light-emitting layer 2315 with a thickness of 20 nm over the first light-emitting layer 2314. Here, the weight ratio of CzPA to 2PCAPPA was adjusted so as to be 1:0.1 (=CzPA: 2PCAPPA). It is to be noted that 2PCAPPA, which is a guest material, emitted blue green light.

Then, tris(8-quinolinolato)aluminum (abbreviation: Alq) was deposited over the second light-emitting layer 2315 to a thickness of 10 nm by an evaporation method using resistive heating to form an electron-transporting layer 2316.

Furthermore, bathophenanthroline (abbreviation: BPhen) and lithium (Li) were co-evaporated to form a first cathode 2317 with a thickness of 20 nm over the electron-transporting layer 2316. Here, the weight ratio of BPhen to Li was adjusted so as to be 1:0.01 (=BPhen:Li).

Next, over the first cathode 2317, NPB and molybdenum (VI) oxide were co-evaporated to faun a layer containing a composite material of an organic compound and an inorganic compound, as a second anode 2321. The thickness of the layer was set to be 100 nm, and the weight ratio of NPB and molybdenum oxide was adjusted so as to be 4:1 (=NPB: molybdenum oxide).

Next, 4,4'-bis[N-(1-naphthyl)-N-phenylamino]biphenyl (abbreviation: NPB) was deposited over the second anode 2321 to a thickness of 10 nm by an evaporation method using resistive heating to form a hole-transporting layer 2322.

Furthermore, 4-(9H-carbazol-9-yl)-4'-(10-phenyl-9-anthryl)triphenylamine (abbreviation: YGAPA) and rubrene were co-evaporated to form a third light-emitting layer 2323 with a thickness of 10 nm over the hole-transporting layer 2322. Here, the weight ratio of YGAPA to rubrene was set to be 1:0.005 (=YGAPA:rubrene). It is to be noted that rubrene, which is a guest material, emitted yellow to orange light.

Furthermore, 9-[4-(N-carbazolyl)phenyl]-10-phenylanthracene (abbreviation: CzPA) and 4,4'-bis {N-[4-(carbazol-9-yl)phenyl]-N-phenylamino}stilbene (abbreviation: YGA2S) were co-evaporated to form a fourth light-emitting layer 2324 with a thickness of 20 nm over the third light-emitting layer 2323. Here, the weight ratio of CzPA to YGA2S was adjusted so as to be 1:0.04 (=CzPA:YGA2S). It is to be noted that YGA2S, which is a guest material, emitted blue light.

Then, tris(8-quinolinolato)aluminum (abbreviation: Alq) was deposited over the fourth light-emitting layer 2324 to a thickness of 10 nm by an evaporation method using resistive heating to form an electron-transporting layer 2325.

Furthermore, bathophenanthroline (abbreviation: BPhen) and lithium (Li) were co-evaporated to faun an electron-injecting layer 2326 with a thickness of 20 nm over the electron-transporting layer 2325. Here, the weight ratio of BPhen to Li was set to be 1:0.01 (=BPhen:Li).

Lastly, aluminum was deposited over the electron-injecting layer 2326 to a thickness of 200 nm by an evaporation method using resistive heating to form a second cathode 2327. Accordingly, a light-emitting element 3 was fabricated. The light-emitting element 3 includes a first light-emitting element 2310 and a second light-emitting element 2320 which are connected in series to each other.

(Comparative Light-emitting Element 4)

A comparative light-emitting element 4 was fabricated using 9,10-bis{4-[N-(4-diphenylaminophenyl)-N-phenylamino]phenyl}-2-tert-butylanthracene (abbreviation: DPABPA) for the second light-emitting layer instead of using 2PCAPPA. That is, CzPA and 9,10-bis{4-[N-(4-diphenylaminophenyl)-N-phenylamino]phenyl}-2-tert-butylanthracene (abbreviation: DPABPA) were co-evaporated to form the second light-emitting layer with a thickness of 20 nm. Here, the weight ratio of CzPA to DPABPA was adjusted so as to be 1:0.1 (=CzPA:DPABPA). The comparative light-emitting element 4 was fabricated in a similar manner to the light-emitting element 3 other than the second light-emitting layer. It is to be noted that DPABPA, which is a guest material, emitted blue green light.

After sealing was performed in a glove box under a nitrogen atmosphere so that the light-emitting element 3 and the comparative light-emitting element 4 obtained as described above were not exposed to the atmosphere, operation characteristics of these light-emitting elements were measured. It is to be noted that the measurements were performed at room temperature (in an atmosphere kept at 25° C.).

Figure 36:
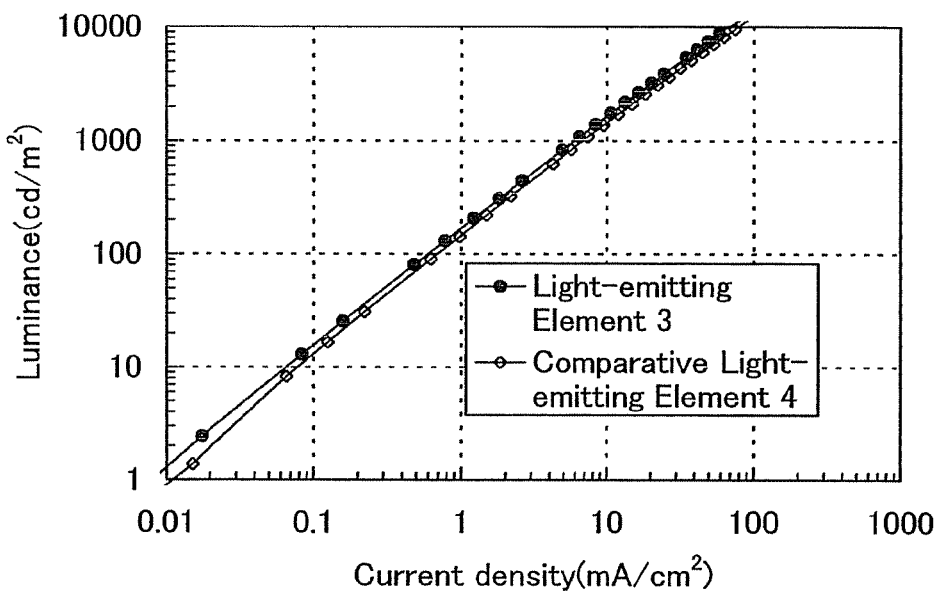
FIG. 36 illustrates current density vs. luminance characteristics of light-emitting elements fabricated in Example 7.
Figure 37:
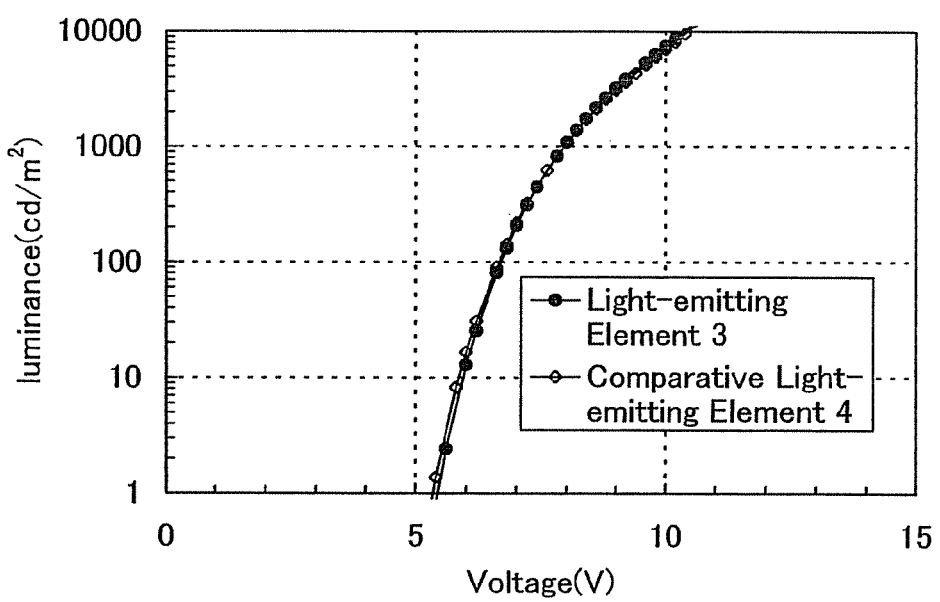
FIG. 37 illustrates voltage vs. luminance characteristics of light-emitting elements fabricated in Example 7.
Figure 38:
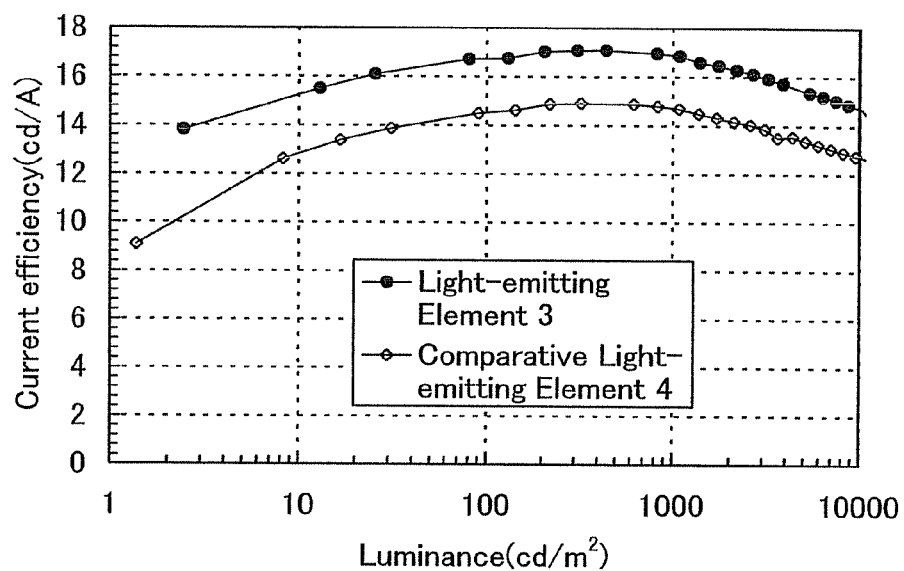
FIG. 38 illustrates luminance vs. current efficiency characteristics of light-emitting elements fabricated in Example 7.

The current density vs. luminance characteristics of the light-emitting element 3 and the comparative light-emitting element 4 are shown in FIG. 36. In addition, the voltage vs. luminance characteristics are shown in FIG. 37. In addition, the luminance vs. current efficiency characteristics are shown in FIG. 38. In addition, the emission spectra at a current of 1 mA are shown in FIG. 39.

Figure 39:
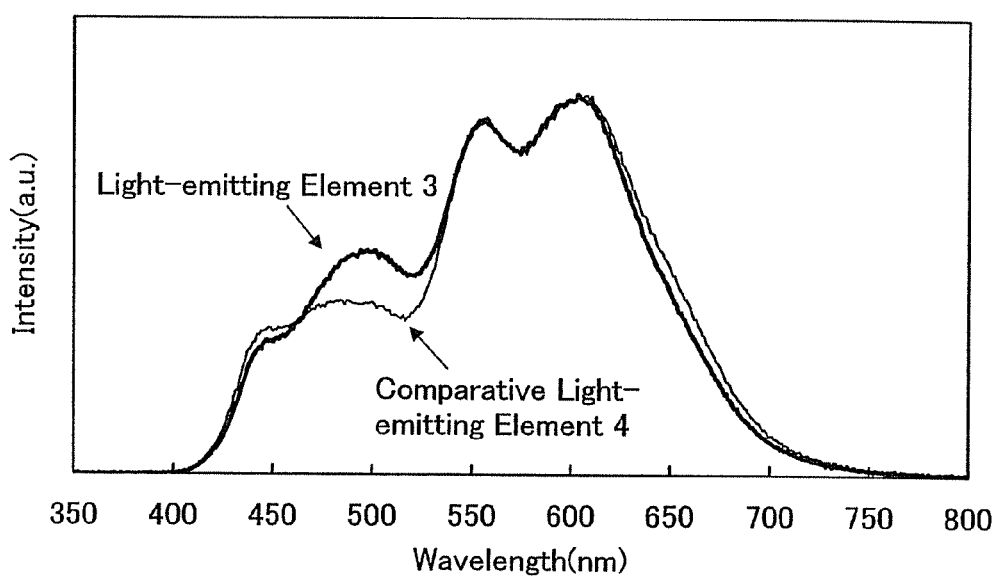
FIG. 39 illustrates emission spectra of light-emitting elements fabricated in Example 7.

As can be seen from FIG. 39, the emission spectrum of the comparative light-emitting element 4 has four different peaks. In addition, the CIE chromaticity coordinate of the comparative light-emitting element 4 at a luminance of 1080 cd/m$^2$ was (x=0.38, y=0.40), and light emission was white. In addition, at a luminance of 1080 cd/m$^2$, the current efficiency was 14.7 cd/A and the external quantum efficiency was 6.2%. In addition, at a luminance of 1080 cd/m$^2$, the voltage was 8.0 V, the current density was 7.4 A/cm$^2$, and the power efficiency was 5.8 lm/W.

Further, as can be seen from FIG. 39, the emission spectrum of the light-emitting element 3 has four different peaks. In addition, the CIE chromaticity coordinates of the light-emitting element 3 at a luminance of 1090 cd/m² was (x=0.37, y=0.41), and light emission was white. In addition, at a luminance of 1090 cd/m², the current efficiency was 16.9 cd/A and the external quantum efficiency was 7.0%, meaning that the emission efficiency was high. In addition, at a luminance of 1090 cd/m², the voltage was 8.0 V, the current density was 6.5 mA/cm², and the power efficiency was 6.6 lm/W, meaning that the power efficiency was high.

Thus, it can be understood that although both the light-emitting element 3 and the comparative light-emitting element 4 emitted white light, the light-emitting element 3 has higher emission efficiency than the comparative light-emitting element 4. In addition, it can be understood that the power consumption of the light-emitting element 3 is more reduced than the comparative light-emitting element 4.

Figure 40:
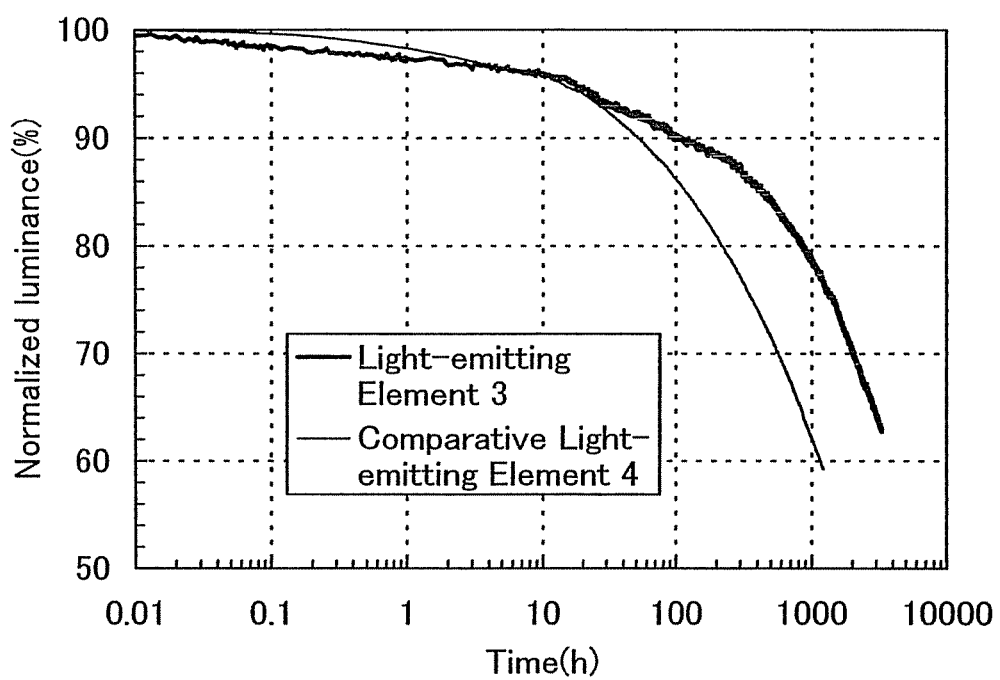
FIG. 40 illustrates time dependence of normalized luminance of light-emitting elements fabricated in Example 7.

In addition, continuous lighting tests in which the light-emitting element 3 and the comparative light-emitting element 4 were continuously lit by constant current driving with the initial luminance set at 1000 cd/m² were conducted. FIG. 40 shows the results of the tests (the vertical axis indicates a standardized luminance where 1000 cd/m² is assumed as 100%).

From FIG. 40, it is understood that the amount of reduction in luminance of the light-emitting element 3 is small compared with the comparative light-emitting element 4 and the light-emitting element 3 has a long life.

Therefore, by applying the present invention, a white light-emitting element with high emission efficiency can be obtained. In addition, a white light-emitting element with low power consumption can be obtained. In addition, a white light-emitting element having a long life can be obtained.

Example 8

In this example, a light-emitting element to which the present invention is applied is described using FIG. 30.
(Light-Emitting Element 5)

First, indium tin oxide containing silicon oxide was deposited over the glass substrate 1300 by a sputtering method to form the first anode 1311. It is to be noted that the thickness of the first anode was set to be 110 nm and the area thereof was set to be 2 mm×2 mm.

Next, the substrate provided with the first anode was fixed on a substrate holder that was provided in a vacuum evaporation apparatus so that a surface provided with the first anode faced downward. The pressure in the vacuum evaporation apparatus was reduced to approximately 10⁻⁴ Pa. Then, over the first anode 1311, NPB and molybdenum(VI) oxide were co-evaporated to form a layer containing a composite material of an organic compound and an inorganic compound, as a hole-injecting layer 1312. The thickness of the hole-injecting layer 1312 was set to be 50 nm and the weight ratio of NPB to molybdenum oxide was adjusted so as to be 4:1 (=NPB:molybdenum oxide). It is to be noted that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited over the hole-injecting layer 1312 to a thickness of 10 nm by an evaporation method using resistive heating to form the hole-transporting layer 1313.

Furthermore, NPB and {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) were co-evaporated to form the first light-emitting layer 1314 with a thickness of 10 nm over the hole-transporting layer 1313. Here, the weight ratio of NPB to BisDCJTM was adjusted so as to be 1:0.01 (=NPB:BisDCJTM). It is to be noted that BisDCJTM, which is a guest material, emitted red light.

Furthermore, 9-[4-(N-carbazolyl)phenyl]-10-phenylanthracene (abbreviation: CzPA) and 2-{4-[N-phenyl-N-(9-phenylcarbazol-3-yl)amino]phenyl}-9,10-diphenylanthracene (abbreviation: 2PCAPPA) represented by the structural formula (132) were co-evaporated to form the second light-emitting layer 1315 with a thickness of 20 nm over the first light-emitting layer 1314. Here, the weight ratio of CzPA to 2PCAPPA was adjusted so as to be 1:0.1 (=CzPA:2PCAPPA). It is to be noted that 2PCAPPA, which is a guest material, emitted blue green light.

Then, tris(8-quinolinolato)aluminum (abbreviation: Alq) was deposited over the second light-emitting layer 1315 to a thickness of 10 nm and then bathophenanthroline (abbreviation: BPhen) was deposited to a thickness of 20 nm by an evaporation method using resistive heating to form the electron-transporting layer 1316 having a two-layer structure.

Furthermore, lithium fluoride (LiF) was deposited over the electron-transporting layer 1316 to a thickness of 1 nm to form the electron-injecting layer 1317.

Lastly, aluminum was deposited over the electron-injecting layer 1317 to a thickness of 200 nm by an evaporation method using resistive heating to form the first cathode 1318. Accordingly, a light-emitting element 5 was fabricated.
(Comparative Light-Emitting Element 6)

A comparative light-emitting element 6 was fabricated using 9,10-bis{4-[N-(4-diphenylaminophenyl)-N-phenylamino]phenyl}-2-tert-butylanthracene (abbreviation: DPABPA) for the second light-emitting layer instead of using 2PCAPPA. That is, CzPA and 9,10-bis{4-[N-(4-diphenylaminophenyl)-N-phenylamino]phenyl}-2-tert-butylanthracene (abbreviation: DPABPA) were co-evaporated to form the second light-emitting layer with a thickness of 20 nm. Here, the weight ratio of CzPA to DPABPA was adjusted so as to be 1:0.1 (=CzPA:DPABPA). The comparative light-emitting element 6 was fabricated in a similar manner to the light-emitting element 5 other than the second light-emitting layer. It is to be noted that DPABPA, which is a guest material, emitted blue green light.

After sealing was performed in a glove box under a nitrogen atmosphere so that the light-emitting element 5 and the comparative light-emitting element 6 obtained as described above were not exposed to the atmosphere, operation characteristics of these light-emitting elements were measured. It is to be noted that the measurements were performed at room temperature (in an atmosphere kept at 25° C.).

Figure 41:
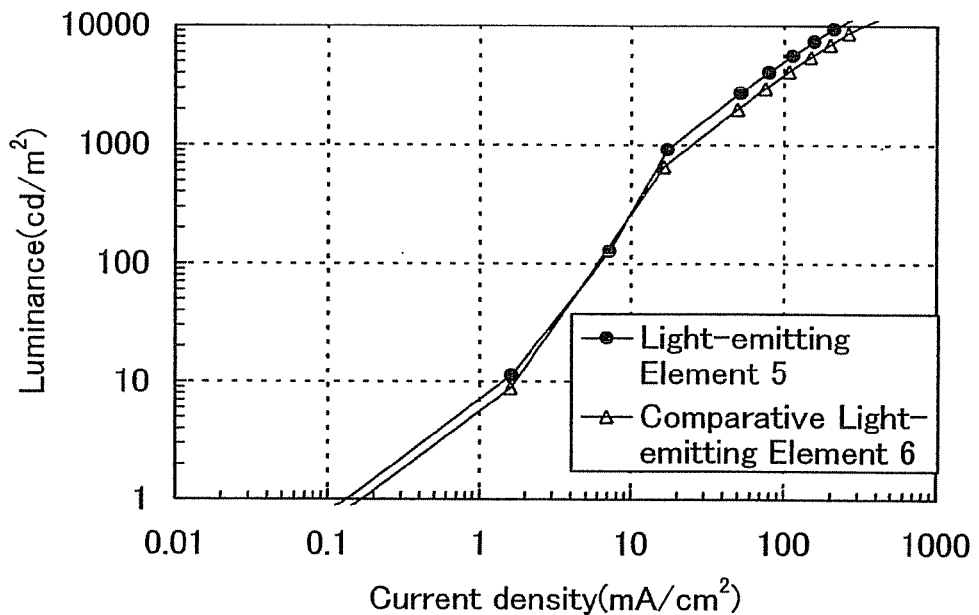
FIG. 41 illustrates current density vs. luminance characteristics of light-emitting elements fabricated in Example 8.
Figure 42:
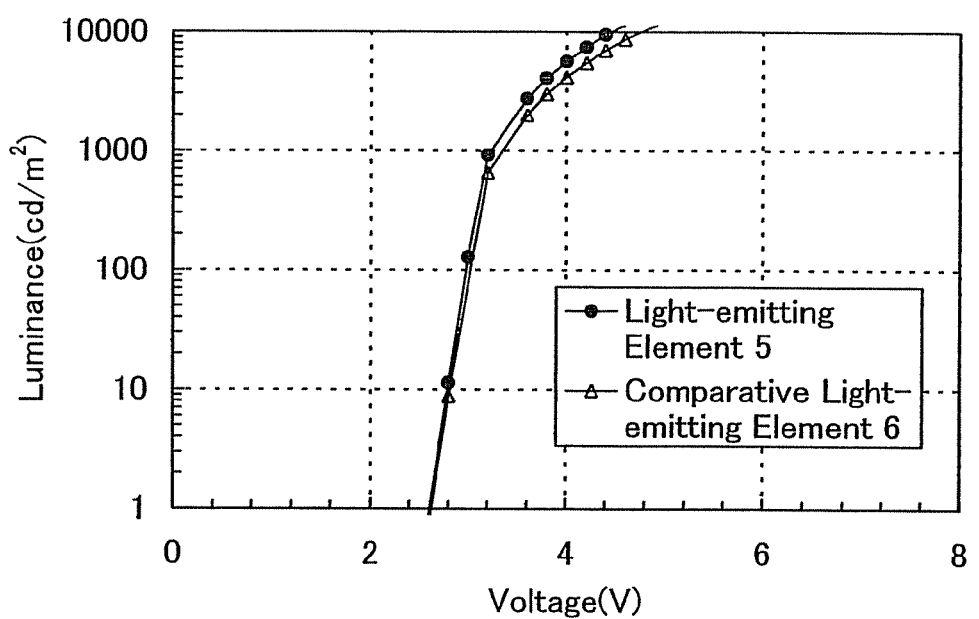
FIG. 42 illustrates voltage vs. luminance characteristics of light-emitting elements fabricated in Example 8.
Figure 43:
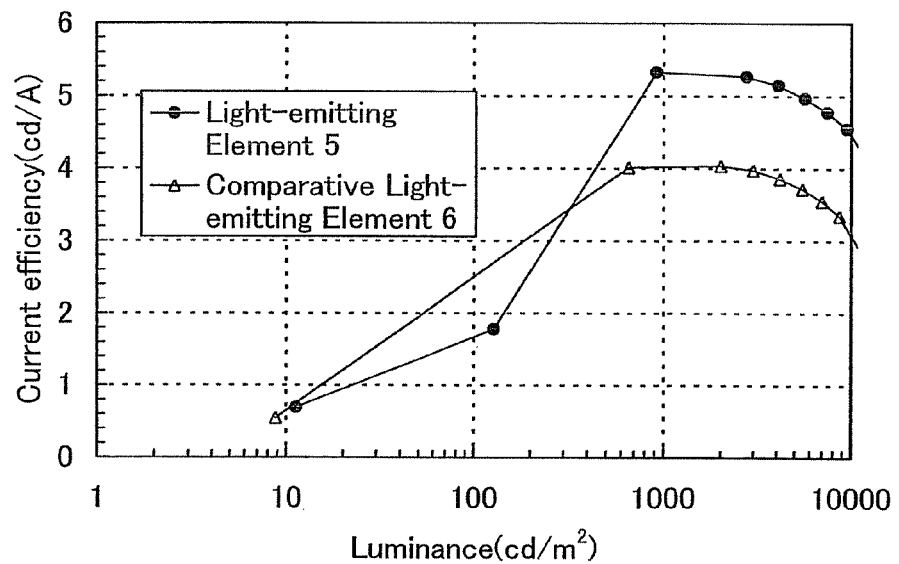
FIG. 43 illustrates luminance vs. current efficiency characteristics of light-emitting elements fabricated in Example 8.
Figure 44:
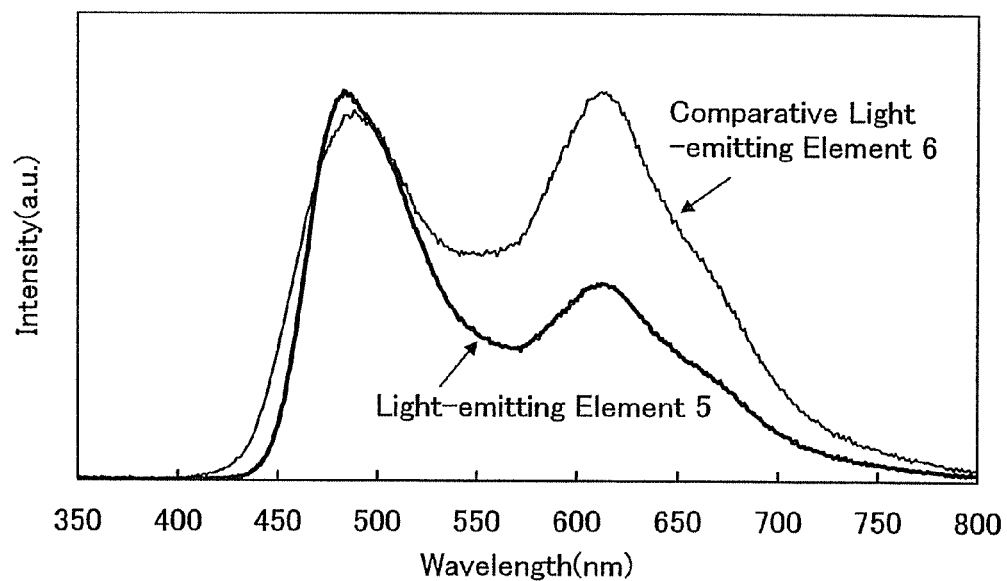
FIG. 44 illustrates emission spectra of light-emitting elements fabricated in Example 8.
Figure 45:
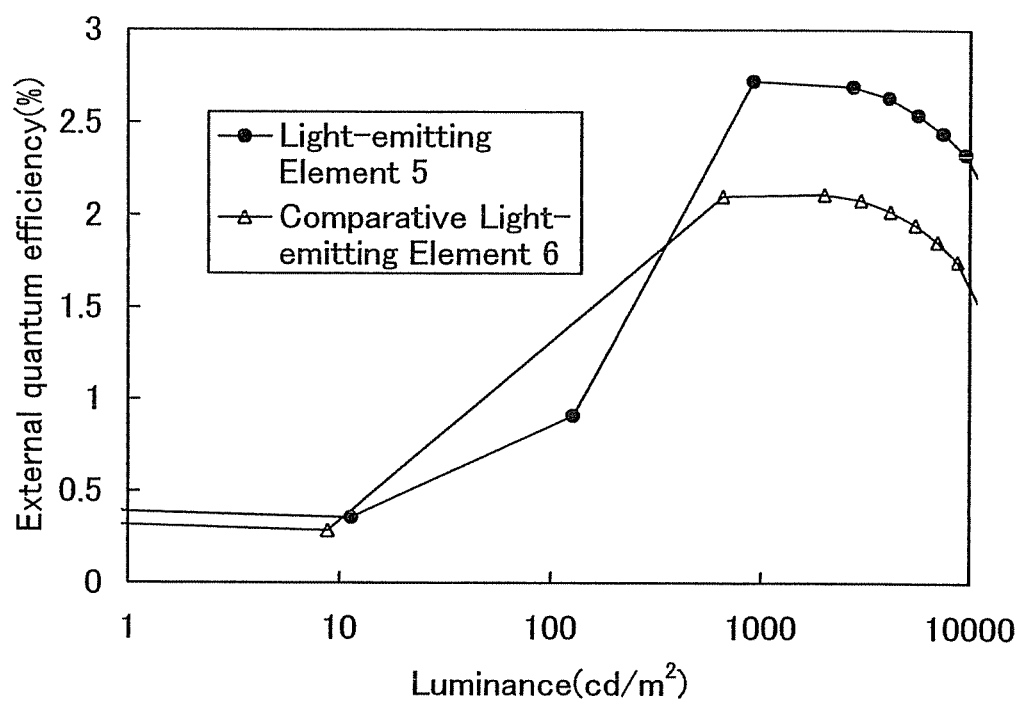
FIG. 45 illustrates luminance vs. external quantum efficiency characteristics of light-emitting elements fabricated in Example 8.

The current density vs. luminance characteristics of the light-emitting element and the comparative light-emitting element 6 are shown in FIG. 41. In addition, the voltage vs. luminance characteristics are shown in FIG. 42. In addition, the luminance vs. current efficiency characteristics are shown in FIG. 43. In addition, the emission spectra at a current of 1 mA are shown in FIG. 44. In addition, the luminance vs. external quantum efficiency characteristics are shown in FIG. 45.

As can be seen from FIG. 44, the emission spectrum of the comparative light-emitting element 6 has two peaks. In addition, the CIE chromaticity coordinate of the comparative light-emitting element 6 at a luminance of 650 cd/m² was (x=0.37, y=0.39), and light emission was white. In addition, at a luminance of 650 cd/m², the current efficiency was 4.0 cd/A and the external quantum efficiency was 2.1%. In addition, at a luminance of 650 cd/m², the voltage was 3.2 V, the current density was 16.3 A/cm², and the power efficiency was 3.9 lm/W.

Further, as can be seen from FIG. 44, the emission spectrum of the light-emitting element 5 has two peaks. In addition, the CIE chromaticity coordinates of the light-emitting element 5 at a luminance of 920 cd/m² was (x=0.31, y=0.40), and light emission was white. In addition, at a luminance of 920 cd/m², the current efficiency was 5.3 cd/A and the external quantum efficiency was 2.7%, meaning that the emission efficiency was high. In addition, at a luminance of 920 cd/m², the voltage was 3.2 V, the current density was 17.2 mA/cm², and the power efficiency was 5.2 lm/W, meaning that the power efficiency was high.

Thus, it can be understood that although both the light-emitting element 5 and the comparative light-emitting element 6 emitted white light, the light-emitting element 5 has higher emission efficiency than the comparative light-emitting element 6. In addition, it can be understood that the power consumption of the light-emitting element 5 is more reduced than the comparative light-emitting element 6.

Figure 46:
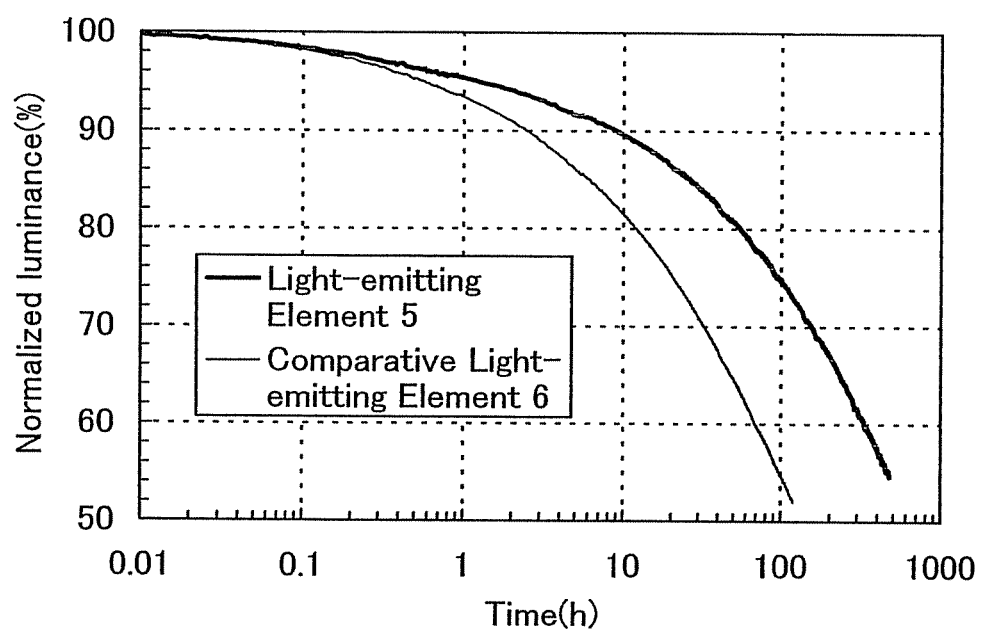
FIG. 46 illustrates time dependence of normalized luminance of light-emitting elements fabricated in Example 8.

In addition, continuous lighting tests in which the light-emitting element 5 and the comparative light-emitting element 6 were continuously lit by constant current driving with the initial luminance set at 1000 cd/m² were conducted. FIG. 46 shows the results of the tests (the vertical axis indicates a standardized luminance where 1000 cd/m² is assumed as 100%).

From FIG. 46, it is understood that the amount of reduction in luminance of the light-emitting element 5 is small compared with the comparative light-emitting element 6 and the light-emitting element 5 has a long life.

Therefore, by applying the present invention, a white light-emitting element with high emission efficiency can be obtained. In addition, a white light-emitting element with low power consumption can be obtained. In addition, a white light-emitting element having a long life can be obtained.

Example 9

In this example, a light-emitting element to which the present invention is applied is described using FIG. 35.
(Light-Emitting Element 7)

First, indium tin oxide containing silicon oxide was deposited over the glass substrate 2300 by a sputtering method to form the first anode 2311. It is to be noted that the thickness of the first anode was set to be 110 nm and the area thereof was set to be 2 mm×2 mm.

Next, the substrate provided with the first anode was fixed on a substrate holder that was provided in a vacuum evaporation apparatus so that a surface provided with the first anode faced downward. The pressure in the vacuum evaporation apparatus was reduced to approximately $10^{-4}$ Pa. Then, over the first anode 2311, NPB and molybdenum(VI) oxide were co-evaporated to form the layer containing a composite material of an organic compound and an inorganic compound, as the hole-injecting layer 2312. The thickness of the hole-injecting layer 2312 was set to be 50 nm and the weight ratio of NPB to molybdenum oxide was adjusted so as to be 4:1 (=NPB:molybdenum oxide). It is to be noted that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited over the hole-injecting layer 2312 to a thickness of 10 nm by an evaporation method using resistive heating to form the hole-transporting layer 2313.

Furthermore, NPB and {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) were co-evaporated to form the first light-emitting layer 2314 with a thickness of 10 nm over the hole-transporting layer 2313. Here, the weight ratio of NPB to BisDCJTM was adjusted so as to be 1:0.005 (=NPB:BisDCJTM). It is to be noted that BisDCJTM, which is a guest material, emitted red light.

Furthermore, 9-[4-(N-carbazolyl)phenyl]-10-phenylanthracene (abbreviation: CzPA) and 2-{4-[N-phenyl-N-(9-phenylcarbazol-3-yl)amino]phenyl}-9,10-diphenylanthracene (abbreviation: 2PCAPPA) represented by the structural formula (132) were co-evaporated to form the second light-emitting layer 2315 with a thickness of 20 nm over the first light-emitting layer 2314. Here, the weight ratio of CzPA to 2PCAPPA was adjusted so as to be 1:0.1 (=CzPA:2PCAPPA). It is to be noted that 2PCAPPA, which is a guest material, emitted blue green light.

Then, tris(8-quinolinolato)aluminum (abbreviation: Alq) was deposited over the second light-emitting layer 2315 to a thickness of 10 nm by an evaporation method using resistive heating to form the electron-transporting layer 2316.

Furthermore, bathophenanthroline (abbreviation: BPhen) and lithium (Li) were co-evaporated to form the first cathode 2317 with a thickness of 20 nm over the electron-transporting layer 2316. Here, the weight ratio of BPhen to Li was set to be 1:0.01 (=BPhen:Li).

Next, over the first cathode 2317, NPB and molybdenum (VI) oxide were co-evaporated to form the layer containing a composite material of an organic compound and an inorganic compound, as the second anode 2321. The thickness of the second anode 2321 was set to be 100 nm, and the weight ratio of NPB and molybdenum oxide was adjusted so as to be 4:1 (=NPB:molybdenum oxide).

Next, 4,4'-bis[N-(1-naphthyl)-N-phenylamino]biphenyl (abbreviation: NPB) was deposited over the second anode 2321 to a thickness of 10 nm by an evaporation method using resistive heating to form the hole-transporting layer 2322.

Furthermore, NPB and rubrene were co-evaporated to form the third light-emitting layer 2323 with a thickness of 10 nm over the hole-transporting layer 2322. Here, the weight ratio of NPB to rubrene was set to be 1:0.01 (=NPB:rubrene). It is to be noted that rubrene, which is a guest material, emitted yellow to orange light.

Furthermore, 9-[4-(N-carbazolyl)phenyl]-10-phenylanthracene (abbreviation: CzPA) and 4,4'-bis{N-[4-(carbazol-9-yl)phenyl]-N-phenylamino}stilbene (abbreviation: YGA2S) were co-evaporated to form the fourth light-emitting layer 2324 with a thickness of 20 nm over the third light-emitting layer 2323. Here, the weight ratio of CzPA to YGA2S was adjusted so as to be 1:0.04 (=CzPA:YGA2S). It is to be noted that YGA2S, which is a guest material, emitted blue light.

Then, tris(8-quinolinolato)aluminum (abbreviation: Alq) was deposited over the fourth light-emitting layer 2324 to a thickness of 10 nm to form the electron-transporting layer 2325.

Furthermore, bathophenanthroline (abbreviation: BPhen) and lithium (Li) were co-evaporated to form the electron-injecting layer 2326 with a thickness of 20 nm over the electron-transporting layer 2325. Here, the weight ratio of BPhen to Li was adjusted so as to be 1:0.01 (=BPhen:Li).

Lastly, aluminum was deposited over the electron-injecting layer 2326 to a thickness of 200 nm by an evaporation method using resistive heating to form the second cathode 2327. Accordingly, a light-emitting element 7 was fabricated. The light-emitting element 7 includes the first light-emitting element 2310 and the second light-emitting element 2320 which are connected in series to each other.

(Comparative Light-Emitting Element 8)

A comparative light-emitting element 8 was fabricated using 9,10-bis{4-[N-(4-diphenylaminophenyl)-N-phenylamino]phenyl}-2-tert-butylanthracene (abbreviation: DPABPA) for the second light-emitting layer instead of using 2PCAPPA. That is, CzPA and 9,10-bis{4-[N-(4-diphenylaminophenyl)-N-phenylamino]phenyl}-2-tert-butylanthracene (abbreviation: DPABPA) were co-evaporated to form the second light-emitting layer with a thickness of 20 nm. Here, the weight ratio of CzPA to DPABPA was adjusted so as to be 1:0.1 (=CzPA:DPABPA). The comparative light-emitting element 8 was fabricated in a similar manner to the light-emitting element 7 other than the second light-emitting layer. It is to be noted that DPABPA, which is a guest material, emitted blue green light.

After sealing was performed in a glove box under a nitrogen atmosphere so that the light-emitting element 7 and the comparative light-emitting element 8 obtained as described above were not exposed to the atmosphere, operation characteristics of these light-emitting elements were measured. It is to be noted that the measurements were performed at room temperature (in an atmosphere kept at 25° C.).

Figure 47:
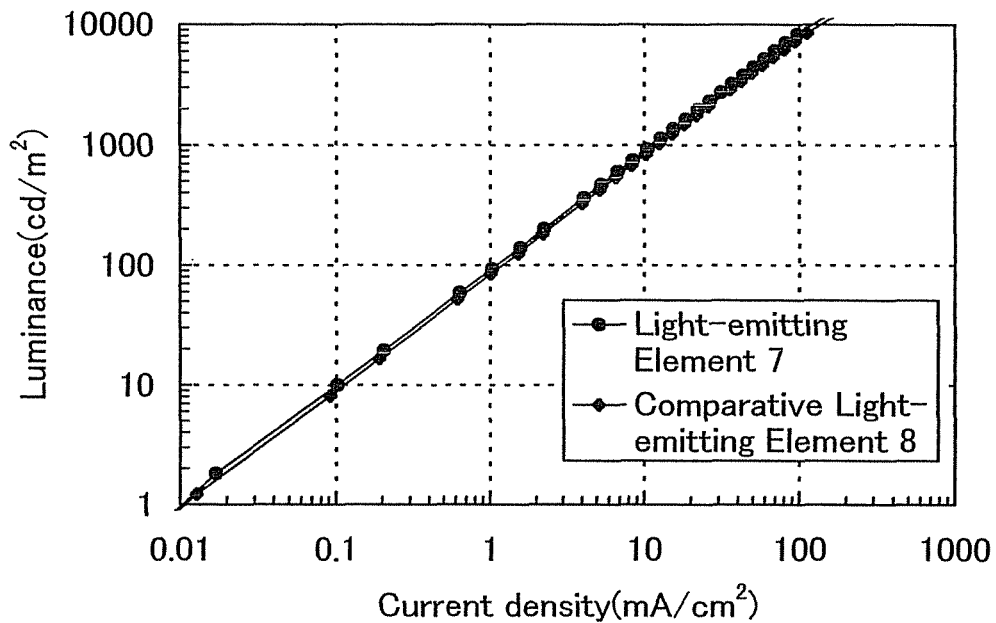
FIG. 47 illustrates current density vs. luminance characteristics of light-emitting elements fabricated in Example 9.
Figure 48:
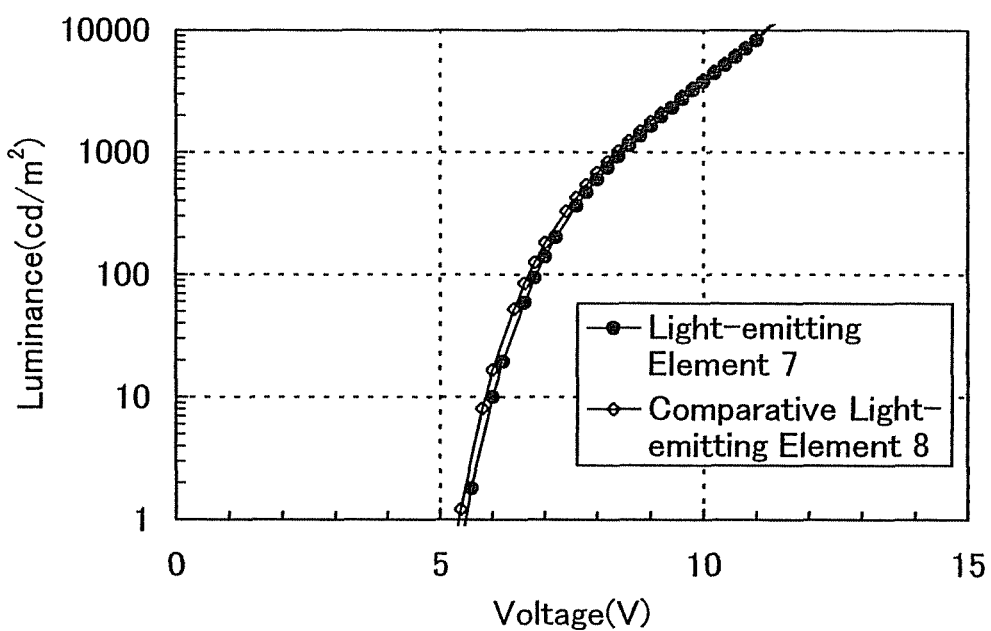
FIG. 48 illustrates voltage vs. luminance characteristics of light-emitting elements fabricated in Example 9.
Figure 49:
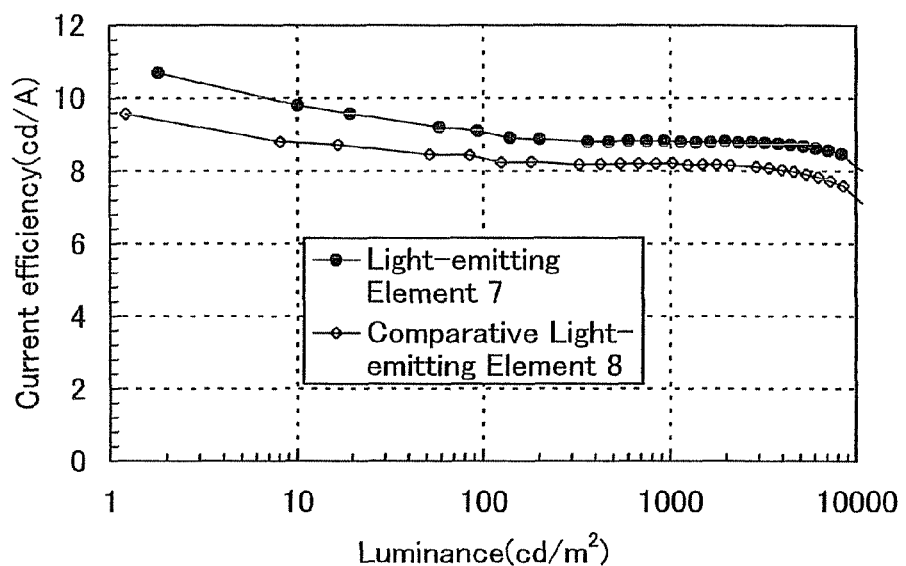
FIG. 49 illustrates luminance vs. current efficiency characteristics of light-emitting elements fabricated in Example 9.

The current density vs. luminance characteristics of the light-emitting element 7 and the comparative light-emitting element 8 are shown in FIG. 47. In addition, the voltage vs. luminance characteristics are shown in FIG. 48. In addition, the luminance vs. current efficiency characteristics are shown in FIG. 49. In addition, the emission spectra at a current of 1 mA are shown in FIG. 50.

Figure 50:
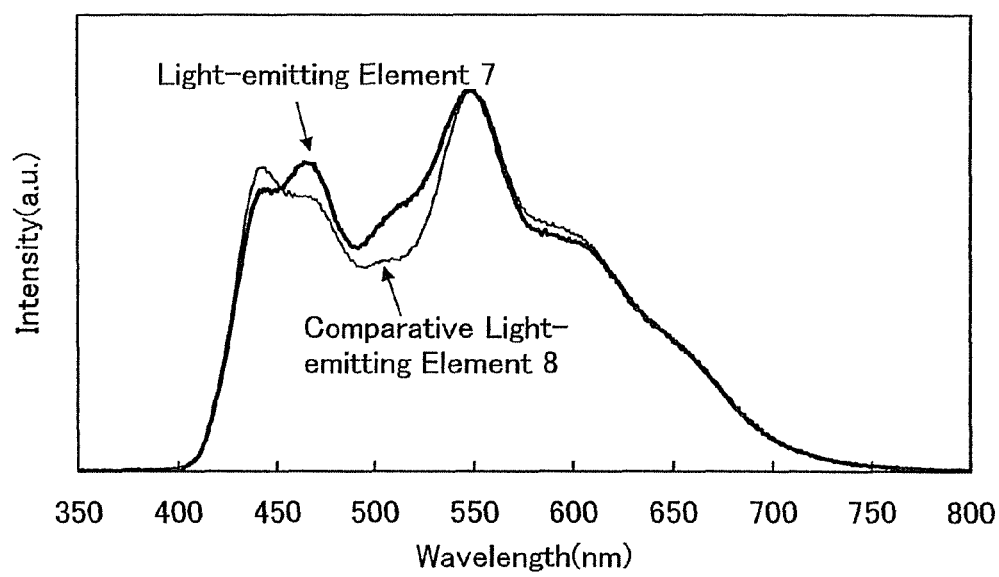
FIG. 50 illustrates emission spectra of light-emitting elements fabricated in Example 9.

As can be seen from FIG. 50, the emission spectrum of the comparative light-emitting element 8 has four different peaks. In addition, the CIE chromaticity coordinate of the comparative light-emitting element 8 at a luminance of 1020 cd/m$^2$ was (x=0.29, y=0.34), and light emission was white. In addition, at a luminance of 1020 cd/m$^2$, the current efficiency was 8.2 cd/A and the external quantum efficiency was 3.7%. In addition, at a luminance of 1020 cd/m$^2$, the voltage was 8.4 V, the current density was 12.5 A/cm$^2$, and the power efficiency was 3.1 lm/W.

Further, as can be seen from FIG. 50, the emission spectrum of the light-emitting element 7 has four different peaks. In addition, the CTE chromaticity coordinates of the light-emitting element 7 at a luminance of 920 cd/m$^2$ was (x=0.29, y=0.34), and light emission was white. In addition, at a luminance of 920 cd/m$^2$, the current efficiency was 8.8 cd/A and the external quantum efficiency was 3.9%, meaning that the emission efficiency was high. In addition, at a luminance of 920 cd/m$^2$, the voltage was 8.4 V, the current density was 10.4 mA/cm$^2$, and the power efficiency was 3.3 lm/W, meaning that the power efficiency was high.

Thus, it can be understood that although both the light-emitting element 7 and the comparative light-emitting element 8 emitted white light, the light-emitting element 7 has higher emission efficiency than the comparative light-emitting element 8. In addition, it can be understood that the power consumption of the light-emitting element 7 is more reduced than the comparative light-emitting element 8.

Figure 51:
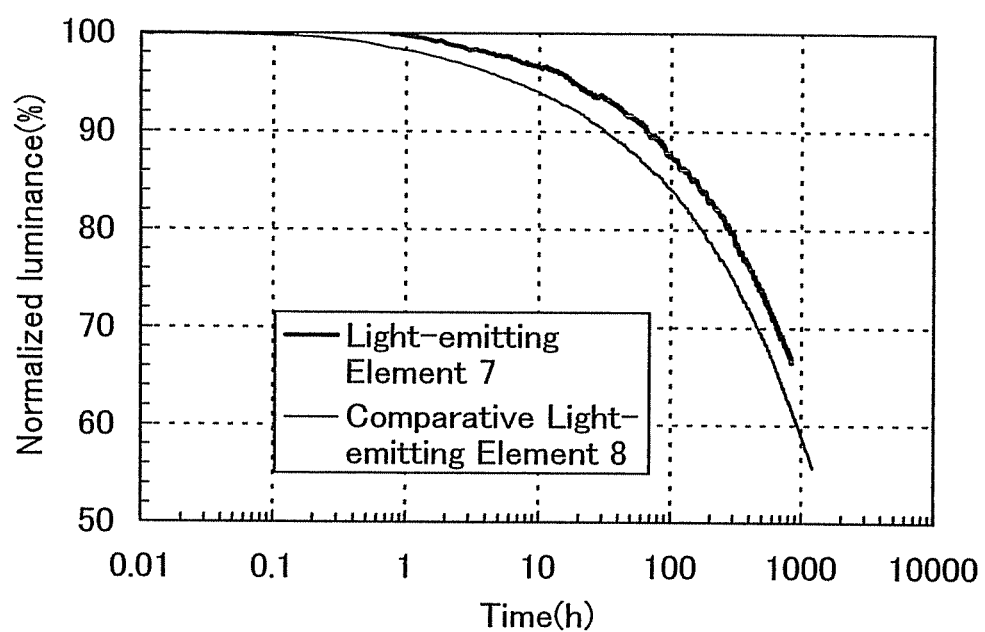
FIG. 51 illustrates time dependence of normalized luminance of light-emitting elements fabricated in Example 9.

In addition, continuous lighting tests in which the light-emitting element 7 and the comparative light-emitting element 8 were continuously lit by constant current driving with the initial luminance set at 1000 cd/m$^2$ were conducted. FIG. 51 shows the results of the tests (the vertical axis indicates a standardized luminance where 1000 cd/m$^2$ is assumed as 100%).

From FIG. 51, it is understood that the amount of reduction in luminance of the light-emitting element 7 is small compared with the comparative light-emitting element 8 and the light-emitting element 7 has a long life.

Therefore, by applying the present invention, a white light-emitting element with high emission efficiency can be obtained. In addition, a white light-emitting element with low power consumption can be obtained. In addition, a white light-emitting element having a long life can be obtained.

Example 10

In this example, a light-emitting element to which the present invention is applied is described using FIG. 30.
(Light-Emitting Element 9)

First, indium tin oxide containing silicon oxide was deposited over the glass substrate 1300 by a sputtering method to form the first anode 1311. It is to be noted that the thickness of the first anode was set to be 110 nm and the area thereof was set to be 2 mm×2 mm.

Next, the substrate provided with the first anode was fixed on a substrate holder that was provided in a vacuum evaporation apparatus so that a surface provided with the first anode faced downward. The pressure in the vacuum evaporation apparatus was reduced to approximately 10$^{-4}$ Pa. Then, over the first anode 1311, NPB and molybdenum(VI) oxide were co-evaporated to form the layer containing a composite material of an organic compound and an inorganic compound, as the hole-injecting layer 1312. The thickness of the hole-injecting layer 1312 was set to be 50 nm and the weight ratio of NPB to molybdenum oxide was adjusted so as to be 4:1 (=NPB:molybdenum oxide). It is to be noted that a co-evaporation method is an evaporation method in which evaporation is pertained using a plurality of evaporation sources in one treatment chamber at the same time.

Next, 4,4'-bis[N-(1-naphthyl)-N-phenylamino]biphenyl (abbreviation: NPB) was deposited over the hole-injecting layer 1312 to a thickness of 10 nm by an evaporation method using resistive heating to form the hole-transporting layer 1313.

Furthermore, NPB and {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) were co-evaporated to form the first light-emitting layer 1314 with a thickness of 10 nm over the hole-transporting layer 1313. Here, the weight ratio of NPB to BisDCJTM was adjusted so as to be 1:0.01 (=NPB:BisDCJTM). It is to be noted that BisDCJTM, which is a guest material, emitted red light.

Furthermore, 9-[4-(N-carbazolyl)phenyl]-10-phenylanthracene (abbreviation: CzPA) and 2-{4-[N-(4-diphenylaminophenyl)-N-phenylamino]phenyl}-9,10-diphenylanthracene (abbreviation: 2DPAPPA) represented by the structural formula (101) were co-evaporated to form the second light-emitting layer 1315 with a thickness of 20 nm over the first light-emitting layer 1314. Here, the weight ratio of CzPA to 2DPAPPA was set to be 1:0.05 (=CzPA:2DPAPPA). It is to be noted that 2DPAPPA, which is a guest material, emitted blue green light.

Then, tris(8-quinolinolato)aluminum (abbreviation: Alq) was deposited over the second light-emitting layer 1315 to a thickness of 10 nm and then bathophenanthroline (abbreviation: BPhen) was deposited to a thickness of 20 nm by an evaporation method using resistive heating to form the electron-transporting layer 1316 having a two-layer structure.

Furthermore, lithium fluoride (LiF) was deposited over the electron-transporting layer 1316 to a thickness of 1 nm to form the electron-injecting layer 1317.

Lastly, aluminum was deposited over the electron-injecting layer 1317 to a thickness of 200 nm by an evaporation method using resistive heating to form the first cathode 1318. Accordingly, a light-emitting element 9 was fabricated.
(Comparative Light-Emitting Element 10)

A comparative light-emitting element 10 was fabricated using 9,10-bis{4-[N-(4-diphenylaminophenyl)-N-phenylamino]phenyl}-2-tert-butylanthracene (abbreviation: DPABPA) for the second light-emitting layer instead of using 2DPAPPA. That is, CzPA and 9,10-bis{4-[N-(4-diphenylaminophenyl)-N-phenylamino]phenyl}-2-tert-butylanthracene (abbreviation: DPABPA) were co-evaporated to form the second light-emitting layer with a thickness of 20 nm. Here, the weight ratio of CzPA to DPABPA was adjusted so as to be 1:0.1 (=CzPA:DPABPA). The comparative light-emitting element 10 was fabricated in a similar manner to the light-emitting element 9 other than the second light-emitting layer. It is to be noted that DPABPA, which is a guest material, emitted blue green light.

After sealing was performed in a glove box under a nitrogen atmosphere so that the light-emitting element 9 and the comparative light-emitting element 10 obtained as described above were not exposed to the atmosphere, operation characteristics of these light-emitting elements were measured. It is to be noted that the measurements were performed at room temperature (in an atmosphere kept at 25° C.).

Figure 52:
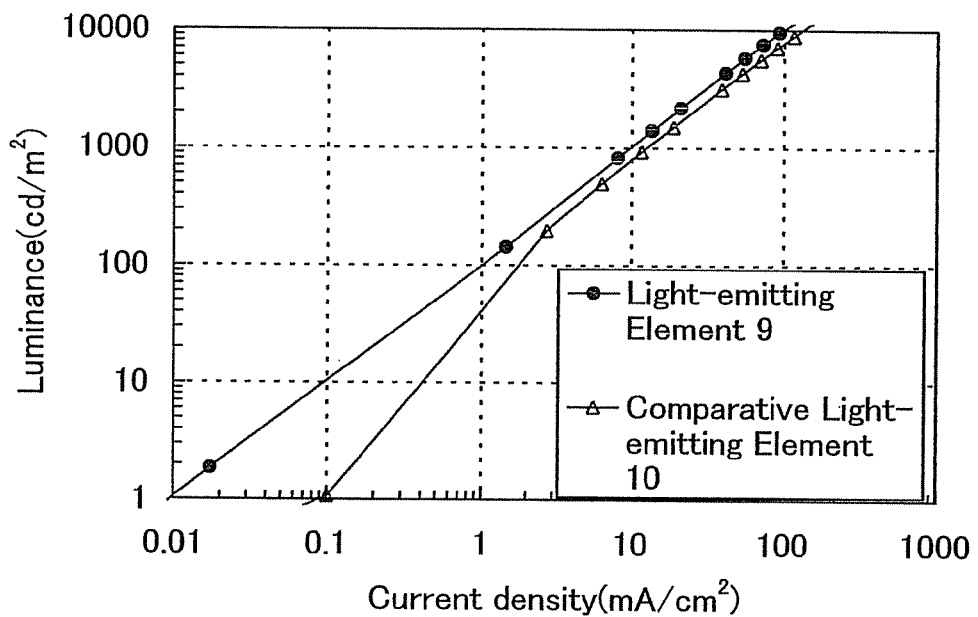
FIG. 52 illustrates current density vs. luminance characteristics of light-emitting elements fabricated in Example 10.
Figure 53:
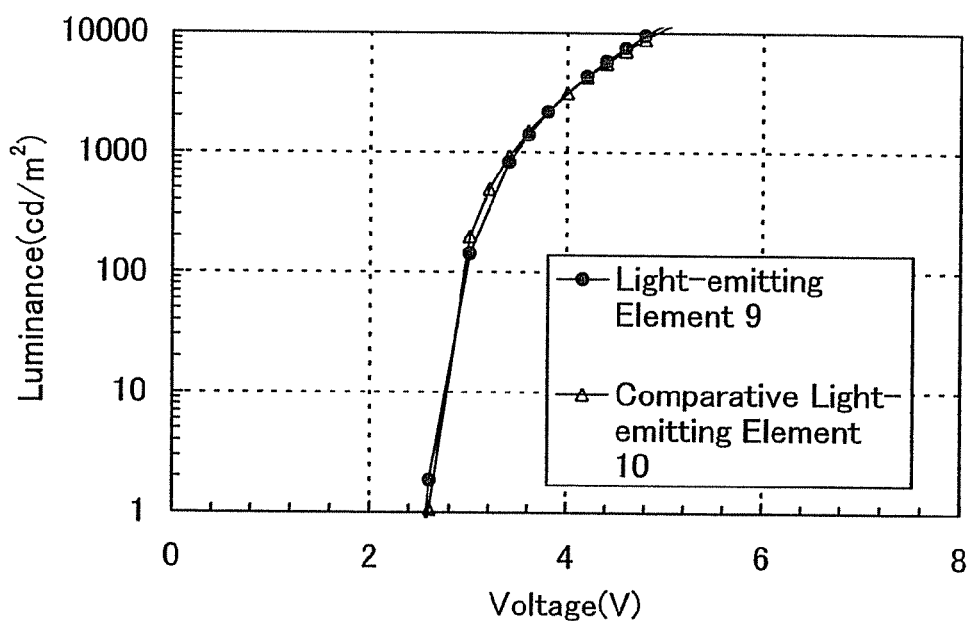
FIG. 53 illustrates voltage vs. luminance characteristics of light-emitting elements fabricated in Example 10.
Figure 54:
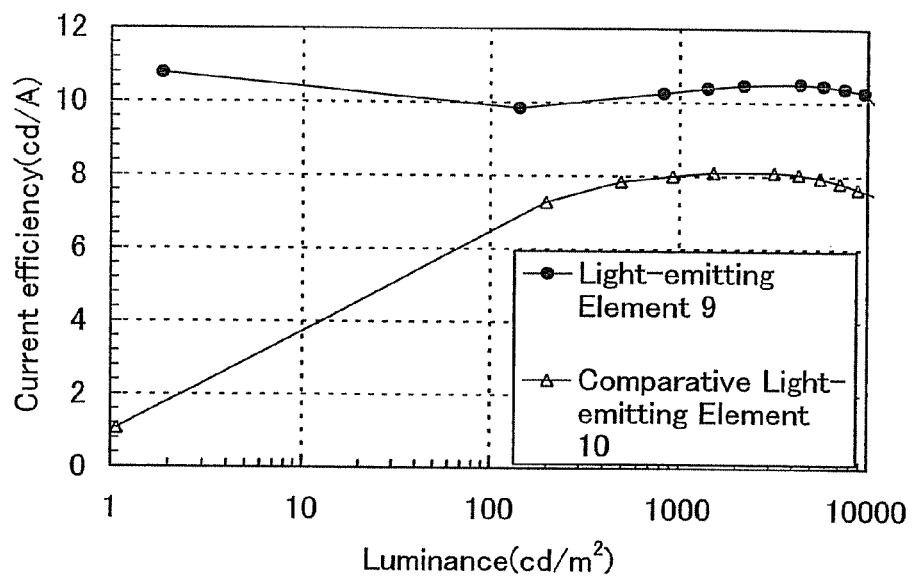
FIG. 54 illustrates luminance vs. current efficiency characteristics of light-emitting elements fabricated in Example 10.
Figure 55:
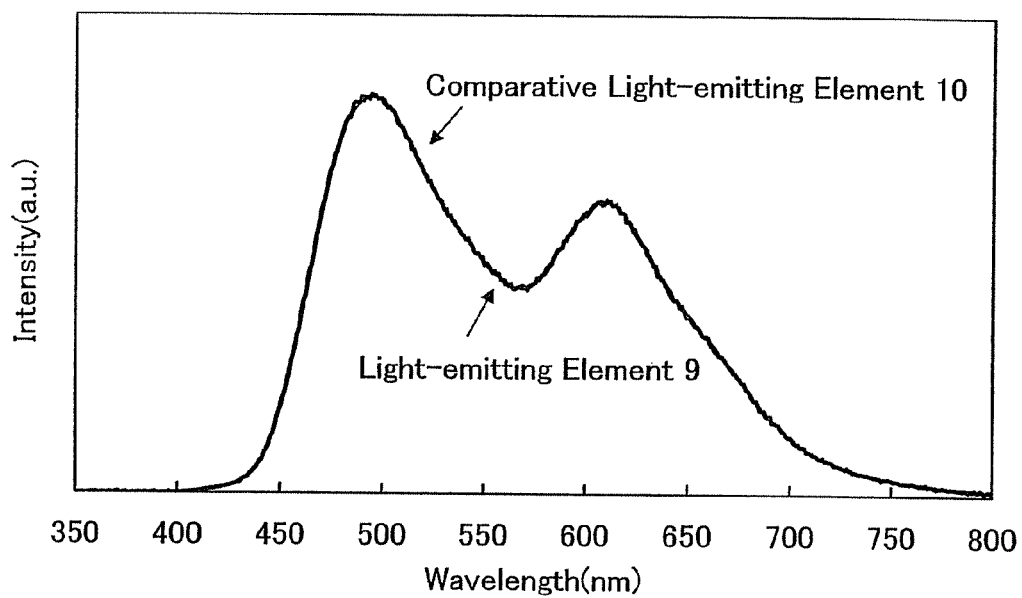
FIG. 55 illustrates emission spectra of light-emitting elements fabricated in Example 10.
Figure 56:
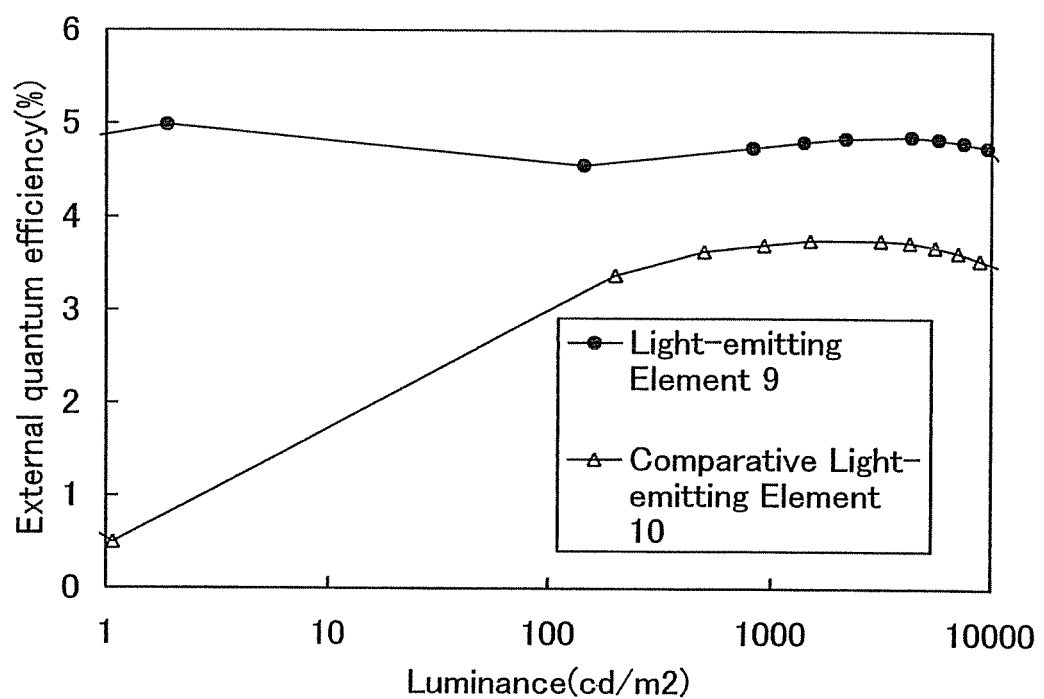
FIG. 56 illustrates luminance vs. external quantum efficiency characteristics of light-emitting elements fabricated in Example 10.

The current density vs. luminance characteristics of the light-emitting element 9 and the comparative light-emitting element 10 are shown in FIG. 52. In addition, the voltage vs. luminance characteristics are shown in FIG. 53. In addition, the luminance vs. current efficiency characteristics are shown in FIG. 54. In addition, the emission spectra at a current of 1 mA are shown in FIG. 55. In addition, the luminance vs. external quantum efficiency characteristics are shown in FIG. 56.

As can be seen from FIG. 55, the emission spectrum of the comparative light-emitting element 10 has two peaks. In addition, the CIE chromaticity coordinate of the comparative light-emitting element 10 at a luminance of 920 cd/m$^2$ was (x=0.30, y=0.40), and light emission was white. In addition, at a luminance of 920 cd/m$^2$, the current efficiency was 8.0 cd/A and the external quantum efficiency was 3.7%. In addition, at a luminance of 920 cd/m$^2$, the voltage was 3.4 V, the current density was 10.5 A/cm$^2$, and the power efficiency was 7.4 lm/W.

Further, as can be seen from FIG. 55, the emission spectrum of the light-emitting element 9 has two peaks. In addition, the CIE chromaticity coordinates of the light-emitting element 9 at a luminance of 820 cd/m$^2$ was (x=0.34, y=0.42), and light emission was white. In addition, at a luminance of 820 cd/m$^2$, the current efficiency was 10.2 cd/A and the external quantum efficiency was 4.7%, meaning that the emission efficiency was high. In addition, at a luminance of 820 cd/m$^2$, the voltage was 3.4 V, the current density was 8.0 mA/cm$^2$, and the power efficiency was 9.5 lm/W, meaning that the power efficiency was high.

Thus, it can be understood that although both the light-emitting element 9 and the comparative light-emitting element 10 emitted white light, the light-emitting element 9 has higher emission efficiency than the comparative light-emitting element 10. In addition, it can be understood that the power consumption of the light-emitting element 9 is more reduced than the comparative light-emitting element 10.

Therefore, by applying the present invention, a white light-emitting element with high emission efficiency can be obtained. In addition, a white light-emitting element with low power consumption can be obtained.

Example 11

In this example, a light-emitting element to which the present invention is applied is described using FIG. 30.
(Light-Emitting Element 11)

First, indium tin oxide containing silicon oxide was deposited over the glass substrate 1300 by a sputtering method to form the first anode 1311. It is to be noted that the thickness of the first anode was set to be 110 nm and the area thereof was set to be 2 mm×2 mm.

Next, the substrate provided with the first anode was fixed on a substrate holder that was provided in a vacuum evaporation apparatus so that a surface provided with the first anode faced downward. The pressure in the vacuum evaporation apparatus was reduced to approximately 10$^{-4}$ Pa. Then, over the first anode 1311, NPB and molybdenum(VI) oxide were co-evaporated to fowl the layer containing a composite material of an organic compound and an inorganic compound, as the hole-injecting layer 1312. The thickness of the hole-injecting layer 1312 was set to be 50 nm and the weight ratio of NPB to molybdenum oxide was adjusted so as to be 4:1 (=NPB:molybdenum oxide). It is to be noted that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited over the hole-injecting layer 1312 to a thickness of 10 nm by an evaporation method using resistive heating to form the hole-transporting layer 1313.

Furthermore, NPB and rubrene were co-evaporated to form the first light-emitting layer 1314 with a thickness of 10 nm over the hole-transporting layer 1313. Here, the weight ratio of NPB to rubrene was set to be 1:0.015 (=NPB:rubrene). It is to be noted that rubrene, which is a guest material, emitted yellow to orange light.

Furthermore, 9-[4-(N-carbazolyl)phenyl]-10-phenylanthracene (abbreviation: CzPA) and 2-(4-{N-[4-(carbazol-9-yl)phenyl]-N-phenylamino}phenyl)-9,10-diphenylanthracene (abbreviation: 2YGAPPA) represented by the structural formula (182) were co-evaporated to form second light-emitting layer 1315 with a thickness of 20 nm over the first light-emitting layer 1314. Here, the weight ratio of CzPA to 2YGAPPA was adjusted so as to be 1:0.05 (=CzPA:2YGAPPA). It is to be noted that 2YGAPPA, which is a guest material, emitted blue light.

Then, tris(8-quinolinolato)aluminum (abbreviation: Alq) was deposited over the second light-emitting layer 1315 to a thickness of 10 nm and then bathophenanthroline (abbreviation: BPhen) was deposited to a thickness of 20 nm by an evaporation method using resistive heating to form the electron-transporting layer 1316 having a two-layer structure.

Furthermore, lithium fluoride (LiF) was deposited over the electron-transporting layer 1316 to a thickness of 1 nm to form the electron-injecting layer 1317.

Lastly, aluminum was deposited over the electron-injecting layer 1317 to a thickness of 200 nm by an evaporation method using resistive heating to form the first cathode 1318. Accordingly, a light-emitting element 11 was fabricated.

After sealing was performed in a glove box under a nitrogen atmosphere so that the light-emitting element 11 obtained as described above was not exposed to the atmosphere, operation characteristics of the light-emitting element were measured. It is to be noted that the measurements were performed at room temperature (in an atmosphere kept at 25° C.).

Figure 57:
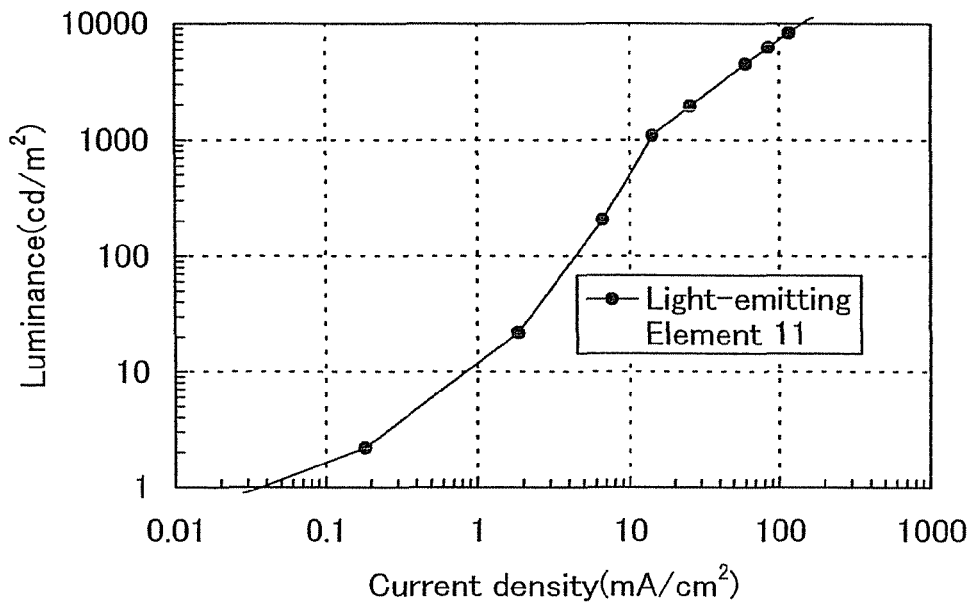
FIG. 57 illustrates current density vs. luminance characteristics of a light-emitting element fabricated in Example 11.
Figure 58:
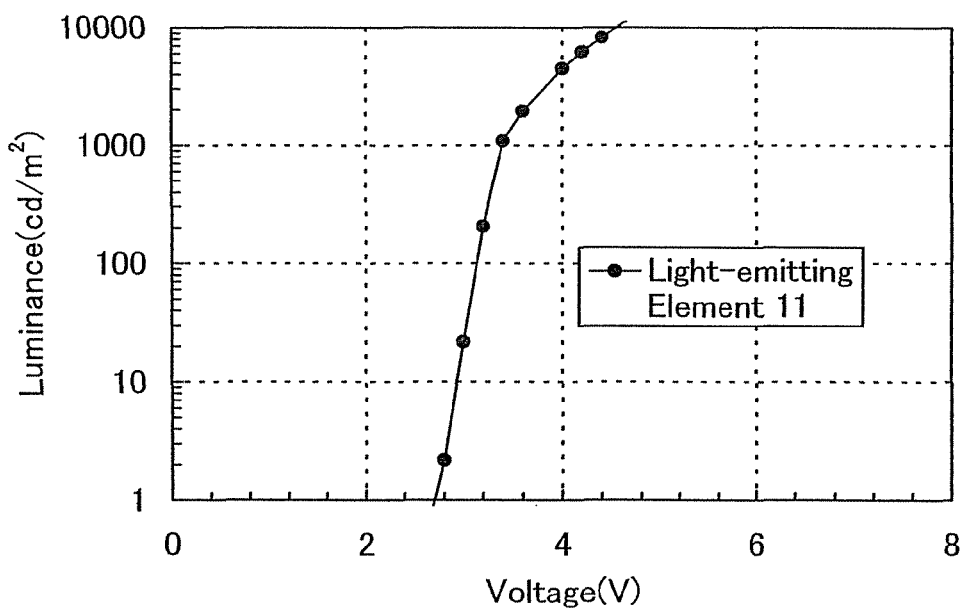
FIG. 58 illustrates voltage vs. luminance characteristics of a light-emitting element fabricated in Example 11.
Figure 59:
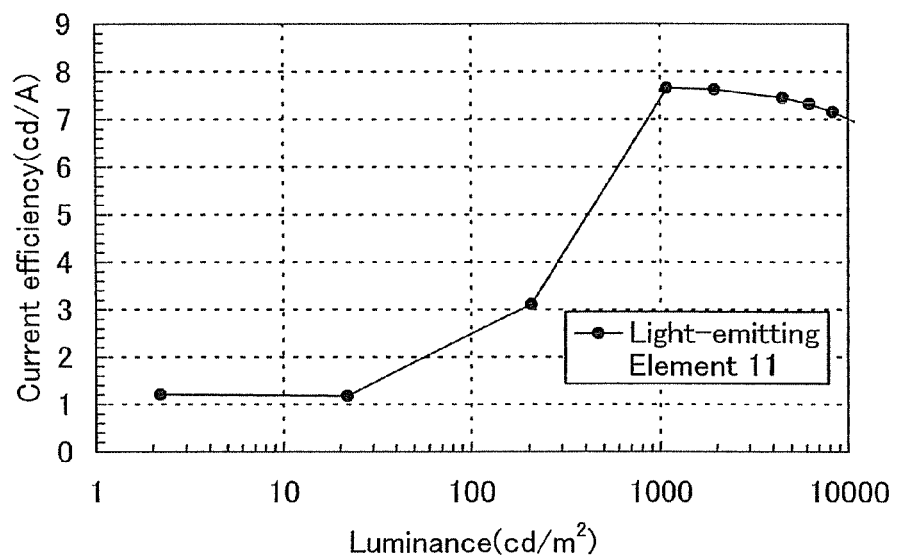
FIG. 59 illustrates luminance vs. current efficiency characteristics of a light-emitting element fabricated in Example 11.

The current density vs. luminance characteristics of the comparative light-emitting element 11 are shown in FIG. 57. In addition, the voltage vs. luminance characteristics are shown in FIG. 58. In addition, the luminance vs. current efficiency characteristics are shown in FIG. 59. In addition, the emission spectrum at a current of 1 mA is shown in FIG. 60.

Figure 60:
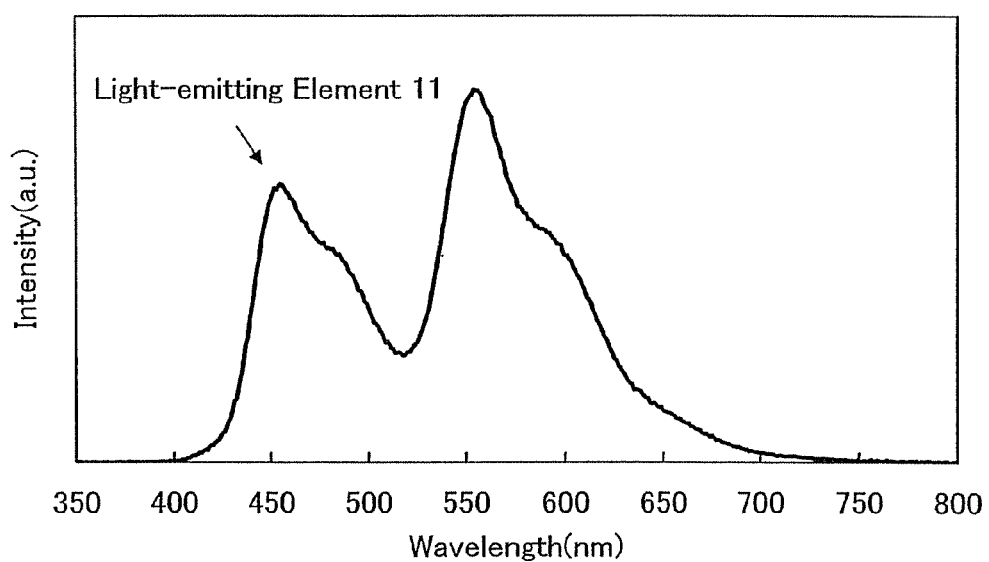
FIG. 60 illustrates an emission spectrum of a light-emitting element fabricated in Example 11.

As can be seen from FIG. 60, the emission spectrum of the light-emitting element 11 has two peaks. In addition, the CIE chromaticity coordinates of the light-emitting element 11 at a luminance of 1090 cd/m$^2$ was (x=0.32, y=0.36), and light emission was white. In addition, at a luminance of 1090 cd/m$^2$, the current efficiency was 7.7 cd/A and the external quantum efficiency was 3.0%, meaning that the emission efficiency was high. In addition, at a luminance of 1090 cd/m$^2$, the voltage was 3.4 V, the current density was 14.2 mA/cm$^2$, and the power efficiency was 7.1 lm/W, meaning that the power efficiency was high.

Thus, it can be understood that the light-emitting element 11 has high emission efficiency. In addition, it can be understood that the power consumption of the light-emitting element 11 is reduced.

Therefore, by applying the present invention, a white light-emitting element with high emission efficiency can be obtained. In addition, a white light-emitting element with low power consumption can be obtained.

This application is based on Japanese Patent Application serial no. 2007-227015 filed with Japan Patent Office on Aug. 31, 2007, the entire contents of which are hereby incorporated by reference.

What is claimed is:

1. A light emitting device comprising:
a first anode;
a first light emitting layer over the first anode;
a second light emitting layer in direct contact with the first light emitting layer;
a first cathode over the second light emitting layer;
a second anode over and in direct contact with the first cathode;
a third light emitting layer over the second anode; and
a second cathode over the third light emitting layer,
wherein each of the first to third light emitting layers has a maximum emission peak,
wherein each of the maximum emission peaks is located in one of a first wavelength region of greater than or equal to 400 nm and less than 500 nm, a second wavelength region of greater than or equal to 500 nm and less than 600 nm, and a third wavelength region of greater than or equal to 600 nm and less than 700 nm,
wherein each of the first to third wavelength regions has only one of the maximum emission peaks,
wherein one of the first and second light emitting layers comprises an anthracene derivative represented by a general formula (I):

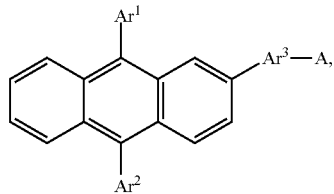

and
wherein:
$Ar^1$ and $Ar^2$ individually represent an aryl group having 6 to 25 carbon atoms;
$Ar^3$ represents an arylene group having 6 to 25 carbon atoms;
A represents any of substituents represented by general formulae (1-1) to (1-3),

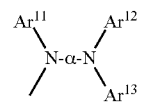

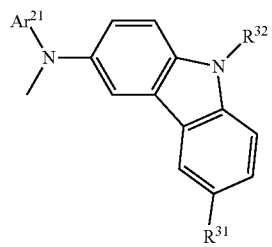

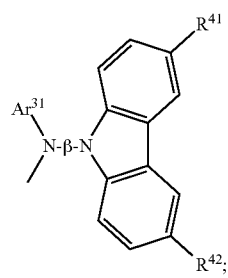

$Ar^{11}$ to $Ar^{13}$ individually represent an aryl group having 6 to 25 carbon atoms;
α represents an arylene group having 6 to 25 carbon atoms;
$Ar^{21}$ represents an aryl group having 6 to 25 carbon atoms;
$R^{31}$ represents any of a hydrogen atom, an alkyl group having 1 to 4 carbon atoms, an aryl group having 6 to 25 carbon atoms, and a haloalkyl group having 1 to 4 carbon atoms;
$R^{32}$ represents any of an alkyl group having 1 to 4 carbon atoms, an aryl group having 6 to 25 carbon atoms, and a haloalkyl group having 1 to 4 carbon atoms;
$Ar^{31}$ represents an aryl group having 6 to 25 carbon atoms;
β represents an arylene group having 6 to 25 carbon atoms; and
$R^{41}$ and $R^{42}$ individually represent any of a hydrogen atom, an alkyl group having 1 to 4 carbon atoms, an aryl group having 6 to 25 carbon atoms, and a haloalkyl group having 1 to 4 carbon atoms.

2. The light emitting device according to claim 1, wherein the first cathode is transparent and comprises lithium oxide, lithium fluoride, or cesium carbonate.

3. The light emitting device according to claim 1,
wherein the first cathode is transparent and comprises an electron transporting material and a donor to the electron transporting material, and
wherein the electron transporting material has an electron mobility larger than an hole mobility.

4. The light emitting device according to claim 1, wherein the second anode is transparent and comprises molybdenum oxide, vanadium oxide, rhenium oxide, or ruthenium oxide.

5. The light emitting device according to claim 1,
wherein the second anode is transparent and comprises a hole transporting material and an acceptor to the hole transporting material, and
wherein the hole transporting material has a hole mobility larger than an electron mobility.

6. The light emitting device according to claim 1,
wherein one of the first and second light emitting layers emits blue light and the other of the first and second light emitting layers emits green light, and
wherein the third light emitting layers emit red light.

7. A lighting apparatus comprising:
a housing; and
the light emitting device according to claim 1 included in the housing.

8. A module comprising:
a first substrate and a second substrate; and
the light emitting device according to claim 1, the light emitting device being sealed between the first substrate and the second substrate with a sealant.

9. The module according to claim 8, further comprising a connector selected from a flexible printed circuit, a tape automated bonding tape, and a tape carrier package.

10. A display device comprising:
a housing; and
the module according to claim 8.

11. A light emitting device comprising:
a first light emitting element and a second light emitting element which is stacked over the first light emitting element,
wherein the first light emitting element comprises:
a first anode;
a first light emitting layer over the first anode;
a second light emitting layer in direct contact with the first light emitting layer; and
a first cathode over the second light emitting layer,
wherein the second light emitting element comprises:
a second anode over and in direct contact with the first cathode;
a third light emitting layer over the second anode;
a fourth light emitting layer over and in direct contact with the third light emitting layer; and
a second cathode over the third light emitting layer,
wherein one of the first and second light emitting layers comprises an anthracene derivative represented by a general formula (I):

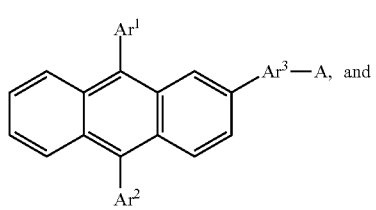

(1)

wherein:
$Ar^1$ and $Ar^2$ individually represent an aryl group having 6 to 25 carbon atoms;
$Ar^3$ represents an arylene group having 6 to 25 carbon atoms;
A represents any of substituents represented by general formulae (1-1) to (1-3),

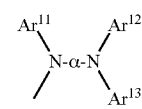

(1-1)

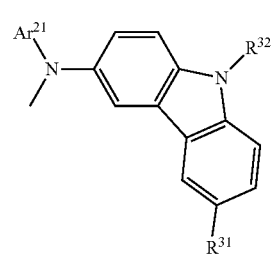

(1-2)

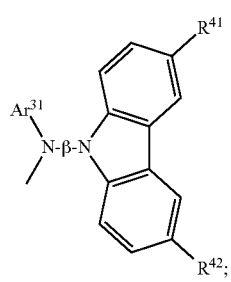

(1-3)

$Ar^{11}$ to $Ar^{13}$ individually represent an aryl group having 6 to 25 carbon atoms;
α represents an arylene group having 6 to 25 carbon atoms;
$Ar^{21}$ represents an aryl group having 6 to 25 carbon atoms;
$R^{31}$ represents any of a hydrogen atom, an alkyl group having 1 to 4 carbon atoms, an aryl group having 6 to 25 carbon atoms, and a haloalkyl group having 1 to 4 carbon atoms;
$R^{32}$ represents any of an alkyl group having 1 to 4 carbon atoms, an aryl group having 6 to 25 carbon atoms, and a haloalkyl group having 1 to 4 carbon atoms;
$Ar^{31}$ represents an aryl group having 6 to 25 carbon atoms;
β represents an arylene group having 6 to 25 carbon atoms; and
$R^{41}$ and $R^{42}$ individually represent any of a hydrogen atom, an alkyl group having 1 to 4 carbon atoms, an aryl group having 6 to 25 carbon atoms, and a haloalkyl group having 1 to 4 carbon atoms.

12. The light emitting device according to claim 11, wherein the first cathode is transparent and comprises lithium oxide, lithium fluoride, or cesium carbonate.

13. The light emitting device according to claim 11,
wherein the first cathode is transparent and comprises an electron transporting material and a donor to the electron transporting material, and
wherein the electron transporting material has an electron mobility larger than an hole mobility.

14. The light emitting device according to claim 11, wherein the second anode is transparent and comprises molybdenum oxide, vanadium oxide, rhenium oxide, or ruthenium oxide.

15. The light emitting device according to claim 11,
wherein the second anode is transparent and comprises a hole transporting material and an acceptor to the hole transporting material, and
wherein the hole transporting material has a hole mobility larger than an electron mobility.

16. The light emitting device according to claim 11,
wherein emission color of the first light emitting element and emission color of the second light emitting element are white.

17. The light emitting device according to claim 11,
wherein each of the first to fourth light emitting layers has a maximum emission peak,
wherein each of the maximum emission peaks is located in one of a first wavelength region of greater than or equal to 400 nm and less than 470 nm, a second wavelength region of greater than or equal to 470 nm and less than 540 nm, a third wavelength region of greater than or equal to 540 nm and less than 600 nm, and a fourth wavelength region of greater than or equal to 600 nm and less than 700 nm, and
wherein each of the first to fourth wavelength regions has only one of the maximum emission peaks.

18. A lighting apparatus comprising:
a housing; and
the light emitting device according to claim 11 included in the housing.

19. A module comprising:
a first substrate and a second substrate; and
the light emitting device according to claim 11, the light emitting device being sealed between the first substrate and the second substrate with a sealant.

20. The module according to claim 19, further comprising a connector selected from a flexible printed circuit, a tape automated bonding tape, and a tape carrier package.

21. A display device comprising:
a housing; and
the module according to claim 19.

* * * * *